(12) United States Patent
Chae et al.

(10) Patent No.: US 11,804,512 B2
(45) Date of Patent: Oct. 31, 2023

(54) LIGHT EMITTING STACKED STRUCTURE AND DISPLAY DEVICE HAVING THE SAME

(71) Applicant: Seoul Viosys Co., Ltd., Ansan-si (KR)

(72) Inventors: Jong Hyeon Chae, Ansan-si (KR); Seong Gyu Jang, Ansan-si (KR); Ho Joon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 413 days.

(21) Appl. No.: 17/141,071

(22) Filed: Jan. 4, 2021

(65) Prior Publication Data
US 2021/0126044 A1 Apr. 29, 2021

Related U.S. Application Data

(63) Continuation of application No. 16/219,716, filed on Dec. 13, 2018, now Pat. No. 10,886,327.
(Continued)

(51) Int. Cl.
*H01L 27/15* (2006.01)
*H01L 33/62* (2010.01)
(Continued)

(52) U.S. Cl.
CPC ......... *H01L 27/153* (2013.01); *G09G 3/2003* (2013.01); *G09G 3/32* (2013.01);
(Continued)

(58) Field of Classification Search
CPC ..... H01L 33/405; H01L 33/62; H01L 27/153; H01L 25/0756; H01L 33/24;
(Continued)

(56) References Cited

U.S. PATENT DOCUMENTS

| 5,583,349 A | 12/1996 | Norman et al. |
| 5,583,350 A | 12/1996 | Norman et al. |

(Continued)

FOREIGN PATENT DOCUMENTS

| CN | 1423345 | 6/2003 |
| CN | 102593290 | 7/2012 |

(Continued)

OTHER PUBLICATIONS

Notice of Allowance issued in U.S. Appl. No. 16/228,621 dated Feb. 17, 2022.
(Continued)

*Primary Examiner* — Didarul A Mazumder
(74) *Attorney, Agent, or Firm* — H.C. Park & Associates, PLC

(57) ABSTRACT

A light emitting stacked structure including a first epitaxial stack including a first n-type semiconductor layer, a first p-type semiconductor layer, and a first active layer disposed therebetween, a second epitaxial stack disposed on the first epitaxial stack and including a second n-type semiconductor layer, a second p-type semiconductor layer, and a second active layer disposed therebetween, a third epitaxial stack disposed on the second epitaxial layer and including a third n-type semiconductor layer, a third p-type semiconductor layer, and a third active layer disposed therebetween, and a shared electrode disposed between two adjacent epitaxial stacks facing each other, in which two semiconductor layers of the two adjacent epitaxial stacks with the shared electrode therebetween have a same polarity.

16 Claims, 66 Drawing Sheets

Related U.S. Application Data

(60) Provisional application No. 62/617,038, filed on Jan. 12, 2018, provisional application No. 62/598,863, filed on Dec. 14, 2017, provisional application No. 62/598,823, filed on Dec. 14, 2017.

(51) Int. Cl.
  *H01L 33/24* (2010.01)
  *G09G 3/32* (2016.01)
  *G09G 3/3225* (2016.01)
  *H01L 33/40* (2010.01)
  *G09G 3/20* (2006.01)
  *H01L 25/075* (2006.01)

(52) U.S. Cl.
  CPC ....... *G09G 3/3225* (2013.01); *H01L 25/0753* (2013.01); *H01L 33/24* (2013.01); *H01L 33/405* (2013.01); *H01L 33/62* (2013.01); *G09G 2300/023* (2013.01); *G09G 2300/0426* (2013.01); *G09G 2310/08* (2013.01)

(58) Field of Classification Search
  CPC ... H01L 25/0753; H01L 25/075; H01L 33/38; H01L 27/156; H01L 33/10; H01L 33/30; H01L 33/504; H01L 25/167; H01L 33/58; H01L 33/385; H01L 33/60; H01L 33/0093; H01L 33/0008; H01L 33/46; H01L 33/08; H01L 29/45; H01L 33/382; H01L 27/1214; H01L 33/22; H01L 33/42; H01L 27/0756; H01L 23/5286; G09G 3/3225; G09G 3/32; G09G 3/2003; G09G 2310/08; G09G 2300/023; G09G 2300/0426; H10K 59/353; H10K 59/352; H10K 59/32; H10K 59/35; H10K 2102/00; H10K 59/38
  USPC ........................... 257/88; 438/22, 24, 46, 47
  See application file for complete search history.

(56) References Cited

U.S. PATENT DOCUMENTS

| | | |
|---|---|---|
| 5,696,389 A | 12/1997 | Ishikawa et al. |
| 5,703,436 A | 12/1997 | Forrest et al. |
| 5,707,745 A | 1/1998 | Forrest et al. |
| 5,739,552 A | 4/1998 | Kimura et al. |
| 6,046,543 A | 4/2000 | Bulovic et al. |
| 6,100,103 A | 8/2000 | Shim et al. |
| 6,365,270 B2 | 4/2002 | Forrest et al. |
| 6,717,358 B1 | 4/2004 | Liao et al. |
| 6,888,305 B2 | 5/2005 | Weaver |
| 6,934,309 B2 | 8/2005 | Nishikawa et al. |
| 7,282,741 B2 | 10/2007 | Kim et al. |
| 7,514,720 B2 | 4/2009 | Kim et al. |
| 7,570,310 B2 | 8/2009 | Harada et al. |
| 7,732,803 B2 | 6/2010 | Shum et al. |
| 7,745,986 B2 | 6/2010 | Ito et al. |
| 7,982,228 B2 | 7/2011 | Choi et al. |
| 8,017,955 B2 | 9/2011 | Wang et al. |
| 8,022,421 B2 | 9/2011 | Hsueh et al. |
| 8,035,115 B2 | 10/2011 | Ogihara et al. |
| 8,058,663 B2 | 11/2011 | Fan et al. |
| 8,089,074 B2 | 1/2012 | Kim et al. |
| 8,269,229 B2 | 9/2012 | Suzuki et al. |
| 8,283,191 B2 | 10/2012 | Rode et al. |
| 8,324,803 B2 | 12/2012 | Forrest et al. |
| 8,390,020 B2 | 3/2013 | Tanaka et al. |
| 8,436,346 B2 | 5/2013 | Ushikubo et al. |
| 8,466,542 B2 | 6/2013 | Kriman et al. |
| 8,546,836 B2 | 10/2013 | Kamiya et al. |
| 8,563,144 B2 | 10/2013 | Kim et al. |
| 8,618,551 B2 | 12/2013 | Nishikawa et al. |
| 8,624,274 B2 | 1/2014 | Hsueh et al. |
| 8,766,295 B2 | 7/2014 | Kim |
| 8,835,948 B2 | 9/2014 | Chang et al. |
| 8,884,316 B2 | 11/2014 | Weaver et al. |
| 8,941,566 B2 | 1/2015 | Haase |
| 9,006,752 B2 | 4/2015 | So et al. |
| 9,018,834 B2 | 4/2015 | Ide et al. |
| 9,052,096 B2 | 6/2015 | Nishimura et al. |
| 9,076,929 B2 | 7/2015 | Katsuno et al. |
| 9,099,631 B2 | 8/2015 | Yang et al. |
| 9,136,498 B2 | 9/2015 | Skipor |
| 9,142,748 B2 | 9/2015 | Ohmae et al. |
| 9,153,750 B2 | 10/2015 | Seo et al. |
| 9,202,994 B2 | 12/2015 | Hashimoto et al. |
| 9,252,380 B2 | 2/2016 | Seo et al. |
| 9,281,446 B2 | 3/2016 | Suh et al. |
| 9,312,249 B2 | 4/2016 | Choi et al. |
| 9,337,400 B2 | 5/2016 | Hashimoto et al. |
| 9,362,335 B2 | 6/2016 | Von Malm |
| 9,406,908 B2 | 8/2016 | Kim et al. |
| 9,419,031 B1 | 8/2016 | Or-Bach et al. |
| 9,443,833 B2 | 9/2016 | Oraw |
| 9,515,278 B2 | 12/2016 | Suzuki et al. |
| 9,559,263 B2 | 1/2017 | Matsui et al. |
| 9,577,012 B2 | 2/2017 | Ooki et al. |
| 9,748,313 B2 | 8/2017 | Tsuji et al. |
| 9,786,817 B2 | 10/2017 | Kim et al. |
| 9,786,859 B2 | 10/2017 | Yamae et al. |
| 9,847,051 B2 | 12/2017 | Choi et al. |
| 9,853,187 B2 | 12/2017 | Kim |
| 9,893,233 B2 | 2/2018 | Kong et al. |
| 9,905,725 B2 | 2/2018 | Lee |
| 9,960,212 B2 | 5/2018 | Gee et al. |
| 9,960,390 B2 | 5/2018 | Höfle et al. |
| 9,966,369 B2 | 5/2018 | Kim et al. |
| 10,056,535 B2 | 8/2018 | Chang et al. |
| 10,069,036 B2 | 9/2018 | Atanackovic |
| 10,079,265 B1 | 9/2018 | Wu et al. |
| 10,134,813 B2 | 11/2018 | Choi |
| 10,170,666 B2 | 1/2019 | Cha et al. |
| 10,205,058 B2 | 2/2019 | Lee |
| 10,326,056 B2 | 6/2019 | Jung et al. |
| 10,381,519 B2 | 8/2019 | Seo et al. |
| 10,388,978 B2 | 8/2019 | Morris-Cohen et al. |
| 10,418,577 B2 | 9/2019 | Yoo et al. |
| 10,475,957 B2 | 11/2019 | Cha et al. |
| 10,515,580 B2 | 12/2019 | Henry et al. |
| 10,559,557 B2 | 2/2020 | Chang et al. |
| 10,686,099 B2 | 6/2020 | Huppmann et al. |
| 10,686,149 B2 | 6/2020 | Park et al. |
| 10,811,475 B2 | 10/2020 | Zhang et al. |
| 10,886,327 B2 * | 1/2021 | Chae ...................... H01L 33/24 |
| 2002/0154259 A1 | 10/2002 | Freidhoff et al. |
| 2003/0047742 A1 | 3/2003 | Hen |
| 2003/0168989 A1 | 9/2003 | Hen |
| 2003/0213967 A1 | 11/2003 | Forrest et al. |
| 2004/0232433 A1 | 11/2004 | Doverspike et al. |
| 2005/0067627 A1 | 3/2005 | Shen et al. |
| 2005/0140278 A1 | 6/2005 | Kato |
| 2005/0264550 A1 | 12/2005 | Ohshima et al. |
| 2006/0027820 A1 | 2/2006 | Cao |
| 2006/0231852 A1 | 10/2006 | Kususe et al. |
| 2007/0069220 A1 | 3/2007 | Ogihara |
| 2007/0170444 A1 | 7/2007 | Cao |
| 2007/0222922 A1 | 9/2007 | Jin et al. |
| 2008/0068315 A1 | 3/2008 | Kurosaki et al. |
| 2008/0099770 A1 | 5/2008 | Mendendorp et al. |
| 2008/0128728 A1 | 6/2008 | Nemchuk et al. |
| 2008/0130278 A1 | 6/2008 | Ushikubo et al. |
| 2008/0251799 A1 | 10/2008 | Ikezawa |
| 2008/0308819 A1 | 12/2008 | Louwsma et al. |
| 2009/0009101 A1 | 1/2009 | Kang et al. |
| 2009/0078955 A1 | 3/2009 | Fan et al. |
| 2009/0114931 A1 | 5/2009 | Hsueh et al. |
| 2009/0272989 A1 | 11/2009 | Shum et al. |
| 2010/0032691 A1 | 2/2010 | Kim |
| 2010/0045175 A1 | 2/2010 | Mathai et al. |
| 2010/0051975 A1 * | 3/2010 | Suzuki ................ H01L 25/0756 |
| | | 257/E33.056 |
| 2010/0065867 A1 | 3/2010 | Unno |

(56) References Cited

U.S. PATENT DOCUMENTS

| | | |
|---|---|---|
| 2010/0066239 A1 | 3/2010 | Spindler et al. |
| 2010/0076527 A1 | 3/2010 | Hammond et al. |
| 2010/0084668 A1 | 4/2010 | Choi et al. |
| 2010/0144073 A1 | 6/2010 | Louwsma et al. |
| 2010/0159792 A1 | 6/2010 | Msser et al. |
| 2010/0224860 A1 | 9/2010 | Ibbetson et al. |
| 2010/0276706 A1 | 11/2010 | Herrmann |
| 2011/0057211 A1 | 3/2011 | Lee et al. |
| 2011/0086486 A1 | 4/2011 | Lee et al. |
| 2011/0156114 A1 | 6/2011 | Park et al. |
| 2011/0204376 A1 | 8/2011 | Su et al. |
| 2011/0215714 A1 | 9/2011 | Seo et al. |
| 2012/0034714 A1 | 2/2012 | Tsai et al. |
| 2012/0094414 A1 | 4/2012 | Or-Bach et al. |
| 2012/0223875 A1 | 9/2012 | Lau et al. |
| 2012/0231572 A1 | 9/2012 | Or-Bach et al. |
| 2012/0236532 A1 | 9/2012 | Koo et al. |
| 2012/0305959 A1 | 12/2012 | Yu et al. |
| 2013/0056717 A1 | 3/2013 | Ishihara et al. |
| 2013/0069191 A1 | 3/2013 | Or-Bach et al. |
| 2013/0264587 A1 | 10/2013 | Chang |
| 2013/0285076 A1 | 10/2013 | Liu et al. |
| 2013/0292711 A1 | 11/2013 | Ogihara et al. |
| 2014/0184062 A1 | 7/2014 | Kolodin |
| 2014/0191243 A1 | 7/2014 | Singh et al. |
| 2014/0252382 A1 | 9/2014 | Hashimoto et al. |
| 2014/0284633 A1 | 9/2014 | Tsay et al. |
| 2015/0001572 A1 | 1/2015 | Katsuno et al. |
| 2015/0099728 A1 | 4/2015 | Frank et al. |
| 2015/0221627 A1 | 8/2015 | Nielson et al. |
| 2015/0325555 A1 | 11/2015 | Hashimoto et al. |
| 2015/0340348 A1 | 11/2015 | Katsuno et al. |
| 2016/0005375 A1 | 1/2016 | Naijo et al. |
| 2016/0043290 A1 | 2/2016 | Sogo et al. |
| 2016/0064439 A1 | 3/2016 | Or-Bach et al. |
| 2016/0099384 A1 | 4/2016 | Kim et al. |
| 2016/0155378 A1 | 6/2016 | Hack et al. |
| 2016/0155892 A1 | 6/2016 | Li et al. |
| 2016/0163940 A1 | 6/2016 | Huang et al. |
| 2016/0315068 A1 | 10/2016 | Lee et al. |
| 2016/0322293 A1 | 11/2016 | Kimura et al. |
| 2016/0336482 A1 | 11/2016 | Lu et al. |
| 2016/0359143 A1 | 12/2016 | Osawa et al. |
| 2017/0012173 A1 | 1/2017 | Lee et al. |
| 2017/0025593 A1 | 1/2017 | Bower et al. |
| 2017/0062680 A1 | 3/2017 | Yoo et al. |
| 2017/0064785 A1 | 3/2017 | Kim et al. |
| 2017/0084876 A1 | 3/2017 | Suzuki |
| 2017/0104035 A1* | 4/2017 | Lee .................. H10K 59/38 |
| 2017/0117259 A1 | 4/2017 | Xu |
| 2017/0133357 A1 | 5/2017 | Kuo et al. |
| 2017/0162746 A1 | 6/2017 | Cha et al. |
| 2017/0194298 A1 | 7/2017 | Negley et al. |
| 2017/0213502 A1 | 7/2017 | Henry et al. |
| 2017/0236866 A1 | 8/2017 | Lee et al. |
| 2017/0250329 A1 | 8/2017 | Takeya et al. |
| 2017/0286044 A1 | 10/2017 | Kim et al. |
| 2017/0288088 A1* | 10/2017 | Won Cheol ............ H01L 33/44 |
| 2017/0331009 A1 | 11/2017 | Shioji |
| 2017/0331021 A1 | 11/2017 | Chae et al. |
| 2017/0338275 A1 | 11/2017 | Banna et al. |
| 2017/0345801 A1 | 11/2017 | Lin et al. |
| 2018/0083170 A1 | 3/2018 | Shepherd |
| 2018/0151548 A1 | 5/2018 | Pfeuffer et al. |
| 2018/0156965 A1 | 6/2018 | El-Ghoroury et al. |
| 2018/0158808 A1 | 6/2018 | Zhang et al. |
| 2018/0166499 A1 | 6/2018 | Pfeuffer et al. |
| 2018/0233492 A1 | 8/2018 | Liu et al. |
| 2018/0240952 A1 | 8/2018 | Moon et al. |
| 2018/0283642 A1 | 10/2018 | Liao et al. |
| 2019/0053347 A1 | 2/2019 | Lee et al. |
| 2019/0074324 A1 | 3/2019 | Kim et al. |
| 2019/0097088 A1 | 3/2019 | Huppmann et al. |
| 2019/0148612 A1 | 5/2019 | Lee et al. |
| 2019/0165038 A1* | 5/2019 | Chae .................. H01L 33/504 |
| 2019/0165207 A1 | 5/2019 | Kim et al. |
| 2019/0181181 A1 | 6/2019 | Yeon et al. |
| 2019/0229149 A1 | 7/2019 | Yoo |
| 2019/0267436 A1 | 8/2019 | Zhang et al. |
| 2019/0333964 A1 | 10/2019 | Lee et al. |
| 2020/0063920 A1 | 2/2020 | Vampola |
| 2020/0212017 A1 | 7/2020 | Oh et al. |
| 2020/0219858 A1 | 7/2020 | Chang |

FOREIGN PATENT DOCUMENTS

| | | |
|---|---|---|
| CN | 102593303 | 7/2012 |
| CN | 105789237 | 7/2016 |
| CN | 106848043 | 6/2017 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2007-305909 | 11/2007 |
| JP | 2008-263127 | 10/2008 |
| JP | 2009-302201 | 12/2009 |
| JP | 2010-062351 | 3/2010 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2017153123 | 9/2017 |

OTHER PUBLICATIONS

Notice of Allowance issued in U.S. Appl. No. 16/673,184 dated Mar. 15, 2022.

Notice of Allowance issued in U.S. Appl. No. 16/198,873 dated Mar. 16, 2022.

Notice of Allowance issued in U.S. Appl. No. 16/228,601 dated Mar. 17, 2022.

Notice of Allowance issued in U.S. Appl. No. 16/198,850 dated Mar. 30, 2022.

(56) References Cited

OTHER PUBLICATIONS

Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Extended European Search Report issued in European Patent Application 18886954.9 dated Aug. 3, 2021.
Examination Report issued in Indian Patent Application 202037026094 dated Mar. 28, 2022.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873 dated Aug. 9, 2022.
Notice of Allowance issued in U.S. Appl. No. 16/228,601 dated Aug. 9, 2022.
Non-Final Office Action dated Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 dated Sep. 26, 2022.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 14, 2021, in European Patent Application No. 18881496.6.
Notice of Allowance dated Sep. 14, 2021, in U.S. Appl. No. 16/899,522.
Notice of Allowance dated Sep. 22, 2021, in U.S. Appl. No. 16/200,036.
Final Office Action dated Sep. 27, 2021, in U.S. Appl. No. 16/915,384.
Extended European Search Report dated Sep. 29, 2021, in European Patent Application No. 18891199.4.
Final Office Action dated Sep. 30, 2021, in U.S. Appl. No. 16/228,601.
Final Office Action dated Sep. 30, 2021, in U.S. Appl. No. 16/198,850.
Extended European Search Report dated Oct. 5, 2021, in European Patent Application No. 18882087.2.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal drafted on Sep. 14, 2021, in Japanese Patent Application No. 2020-532747.
Final Office Action dated Dec. 2, 2021, in U.S. Appl. No. 16/228,621.
Notice of Allowance dated Dec. 9, 2021, in U.S. Appl. No. 16/915,384.
Final Office Action dated Dec. 24, 2021, in U.S. Appl. No. 16/198,873.
Non-Final Office Action dated Jan. 12, 2022, in U.S. Appl. No. 16/988,272.
Non-Final Office Action dated Jan. 21, 2022, in U.S. Appl. No. 16/673,114.
Final Office Action dated Nov. 12, 2021, in U.S. Appl. No. 16/673,184.
Non-Final Office Action dated Mar. 18, 2021 in U.S. Appl. No. 16/228,601.
Final Office Action dated Apr. 21, 2021, in U.S. Appl. No. 16/198,784.
Non-Final Office Action dated Apr. 7, 2021, in U.S. Appl. No. 16/915,384.
Non-Final Office Action dated Apr. 15, 2021, in U.S. Appl. No. 16/673,184.
Final Office Action dated Mar. 25, 2021 in U.S. Appl. No. 16/200,036.
Non-Final Office Action for U.S. Appl. No. 16/198,784 dated Nov. 19, 2020.
Non-Final Office Action for U.S. Appl. No. 16/219,716 dated Mar. 23, 2020.
Notice of Allowance for U.S. Appl. No. 16/219,716 dated Sep. 3, 2020.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR2018/014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.

(56) References Cited

OTHER PUBLICATIONS

Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Nov. 7, 2019, in U.S. Appl. No. 16/207,881.
Non-Final Office Action dated Oct. 24, 2019, in U.S. Appl. No. 16/228,621.
Non-Final Office Action dated Nov. 4, 2019, in U.S. Appl. No. 16/198,784.
Non-Final Office Action dated Nov. 19, 2019, in U.S. Appl. No. 16/198,792.
Ex Parte Quayle Action issued on Nov. 19, 2019, in U.S. Appl. No. 16/198,796.
Non-Final Office Action dated Oct. 31, 2019, in U.S. Appl. No. 16/198,850.
Non-Final Office Action dated Jan. 9, 2020, in U.S. Appl. No. 16/673,184.
Notice of Allowance dated Feb. 10, 2020, in U.S. Appl. No. 16/198,796.
Non-Final Office Action dated Mar. 5, 2020, in U.S. Appl. No. 16/228,601.
Notice of Allowance dated Mar. 31, 2020, in U.S. Appl. No. 16/234,541.
Notice of Allowance dated Apr. 9, 2020, in U.S. Appl. No. 16/198,792.
Non-Final Office Action dated Apr. 15, 2020, in U.S. Appl. No. 16/198,873.
Final Office Action dated Apr. 20, 2020, in U.S. Appl. No. 16/228,621.
Notice of Allowance dated Mar. 12, 2020, in U.S. Appl. No. 16/198,784.
Final Office Action dated May 29, 2020, in U.S. Appl. No. 16/198,850.
Final Office Action for U.S. Appl. No. 16/673,184 dated Jul. 23, 2020.
Notice of Allowance for U.S. Appl. No. 16/198,796 dated Aug. 26, 2020.
Final Office Action for U.S. Appl. No. 16/228,601 dated Jun. 25, 2020.
Non-Final Office Action for U.S. Appl. No. 16/673,114 dated Sep. 3, 2020.
Non-Final Office Action for U.S. Appl. No. 16/236,737 dated Jun. 24, 2020.
Final Office Action for U.S. Appl. No. 16/198,873 dated Oct. 15, 2020.
Non-Final Office Action for U.S. Appl. No. 16/200,036 dated Sep. 24, 2020.
Non-Final Office Action for U.S. Appl. No. 16/228,621 dated Sep. 29, 2020.
Notice of Allowance for U.S. Appl. No. 16/236,737 dated Oct. 28, 2020.
Notice of Allowance issued in U.S. Appl. No. 16/915,384 dated Apr. 21, 2022.
Non-Final Office Action dated May 11, 2022, in U.S. Appl. No. 17/164,829.
Notice of Allowance issued in U.S. Appl. No. 16/988,272 dated Jun. 8, 2022.
Notice of Allowance issued in U.S. Appl. No. 16/228,621 dated Jun. 15, 2022.
Substantive Examination Report Notice dated Jun. 15, 2022, in Saudi Arabian Patent Application No. 520412046.
Notice of Allowance issued in U.S. Appl. No. 16/673,184 dated Jun. 23, 2022.
Office Action dated Jul. 5, 2022 for Japanese Patent Application No. 2020-536804(with English Translation).
Notice of Allowance dated Aug. 26, 2021, in U.S. Appl. No. 16/789,877.
Notice of Allowance dated Jul. 12, 2021, in U.S. Appl. No. 16/198,784.
Non-Final Office Action dated Jul. 8, 2021, in U.S. Appl. No. 16/228,621.
Non-Final Office Action dated Jun. 10, 2021, in U.S. Appl. No. 16/198,873.
Office Action dated Jun. 13, 2023 for Japanese Patent Application No. 2022-106571(with English Translation).

* cited by examiner

LIGHT EMITTING STACKED STRUCTURE AND DISPLAY DEVICE HAVING THE SAME

CROSS-REFERENCE TO RELATED APPLICATIONS

This application is a continuation of U.S. patent application Ser. No. 16/219,716, filed on Dec. 13, 2018, which claims priority from and claims the benefit of U.S. Provisional Application No. 62/598,863, filed on Dec. 14, 2017, U.S. Provisional Application No. 62/598,823, filed on Dec. 14, 2017, and U.S. Provisional Application No. 62/617,038, filed on Jan. 12, 2018, each of which is hereby incorporated by reference for all purposes as if fully set forth herein.

BACKGROUND

Field

Exemplary embodiments of the invention relate generally to a light emitting stacked structure and a display device including the same and, more specifically, to a micro light emitting device having a stacked structure and a display apparatus having the same.

Discussion of the Background

A light emitting diode has been widely used as an inorganic light source in various fields such as a display apparatus, an automobile lamp, and general lighting. With advantages of long lifespan, low power consumption, and high response speed, the light emitting diode has been rapidly replacing an existing light source.

Meanwhile, a light emitting diode of the related art has been mainly used as a backlight light source in a display apparatus. However, a micro LED display has been recently developed as a next-generation display that directly implements an image using a light emitting diode.

In general, the display apparatus implements various colors by using mixed colors of blue, green, and red. The display apparatus includes a plurality of pixels to implement an image with various images, and each pixel includes subpixels of has blue, green, and red. The color of a specific pixel is determined by the colors of the subpixels, and the image is implemented by the combination of these subpixels. In addition, a display device using LEDs may be generally manufactured by forming individually grown red, green, and blue LED structures on a final substrate, which may increase manufacturing complexity.

In the case of a micro LED display, micro LEDs corresponding to each subpixel are arranged on a two-dimensional plane. Therefore, a large number of micro LEDs are required to be disposed on one substrate. However, the micro LED has a very small size having a surface area of 10,000 square μm or less, and thus, there are various problems due to this small size. Particularly, it is difficult to handle a light emitting diode having a small size, and it is not easy to mount the light emitting diode on a display panel, especially over hundreds of thousands or millions, and to replace a defective LED of mounted micro LEDs with a good LED.

In addition, since the subpixels are arranged on the two-dimensional plane, the area occupied by one pixel including the blue, green, and red subpixels is relatively increased. Therefore, in order to arrange the subpixels within a limited area, it is required to reduce the area of each subpixel, thereby causing deterioration in brightness through reduction in luminous area.

The above information disclosed in this Background section is only for understanding of the background of the inventive concepts, and, therefore, it may contain information that does not constitute prior art.

SUMMARY

Light emitting stacked structures according to the principles and some exemplary implementations of the invention are capable of increasing a light emitting area of each subpixel without increasing the pixel area.

Light emitting diodes and display using the light emitting diodes, e.g., micro LEDs, constructed according to the principles and some exemplary implementations of the invention provide an improved color purity and color reproduction.

Light emitting diodes and display using the light emitting diodes, e.g., micro LEDs, constructed according to the principles and some exemplary implementations of the invention has a simple structure that can improve connectivity between elements and/or reduce manufacturing complexities.

A light emitting stacked structure according to an exemplary embodiment includes a plurality of epitaxial sub-units disposed one over another, each epitaxial sub-unit configured to emit light having different wavelength bands from each other in a first direction, and a plurality of contact parts disposed under the epitaxial sub-units to apply a common voltage and light emitting signals to the epitaxial sub-units.

The light emitting stacked structure may further include a substrate disposed under the epitaxial sub-units and having wirings connected to the contact parts.

The epitaxial sub-units may include a first epitaxial stack, a second epitaxial stack, and a third epitaxial stack sequentially disposed on the substrate.

The contact parts may include a common contact part to apply the common voltage to the first, second, and third epitaxial stacks, and a first contact part, a second contact part, and a third contact part may apply the light emitting signals to the first, second, and third epitaxial stacks, respectively.

Each of the first, second, and third epitaxial stacks may include a p-type semiconductor layer, an active layer, and an n-type semiconductor layer, and the common contact part may be connected to the p-type semiconductor layers of the first, second, and third epitaxial stacks, and the first, second, and third contact parts may be connected to the n-type semiconductor layers of the first, second, and third epitaxial stacks, respectively.

The first epitaxial stack may have a recess exposing the n-type semiconductor layer of the first epitaxial stack, and the first contact part may be connected to the exposed n-type semiconductor layer of the first epitaxial stack in the recess.

The first contact part may include a first pad electrode disposed under the first epitaxial stack, the first pad electrode may have a greater width than the recess.

The first contact part may further include a first pad disposed under the first pad electrode, the first pad having a greater width than the recess.

The second contact part and the third contact part may include a second pad electrode and a third pad electrode disposed under the first epitaxial stack, respectively.

The common contact part may include a common pad electrode disposed under the first epitaxial stack.

The common pad electrode, the first, second, and third pad electrodes may include substantially the same material and are disposed on the same layer.

At least one of the n-type semiconductor layers of the second and third epitaxial stacks may have a concave-convex pattern formed on one surface thereof.

The light emitting stacked structure may further include a first p-type electrode, a second p-type electrode, and a third p-type electrode connected to the p-type semiconductor layers of the first, second, and third epitaxial stacks, respectively.

The first p-type electrode may be disposed between the substrate and the first epitaxial stack.

The second p-type electrode may be disposed between the first epitaxial stack and the second epitaxial stack, and the third p-type electrode may be disposed between the second epitaxial stack and the third epitaxial stack.

At least one of the second p-type electrode and the third p-type electrode may include a transparent conductive material.

At least one of the second and third epitaxial stacks may have a first contact hole, and at least one of the second and third p-type electrodes may have a second contact hole having a diameter different from the diameter of the first contact hole.

At least one of the epitaxial sub-units may include a micro LED having a surface area less than about 10,000 µm or less.

The epitaxial sub-units may include a first epitaxial sub-unit disposed on the substrate and configured to emit a first color light, a second epitaxial sub-unit disposed on the first epitaxial sub-unit and configured to emit a second color light having a wavelength band different from the first color light, and a third epitaxial sub-unit disposed on the second epitaxial sub-unit and configured to emit a third color light having a wavelength band different from the first and second color light.

The first color light, the second color light, and the third color light may be red light, green light, and blue light, respectively.

The light emitting stacked structure may further include a first wavelength pass filter disposed between the first epitaxial sub-unit and the second epitaxial sub-unit.

The light emitting stacked structure may further include a second wavelength pass filter disposed between the second epitaxial sub-unit and the third epitaxial sub-unit.

The wirings may include a first signal line, a second signal line, and a third signal line to apply the light emitting signals to n-type semiconductor layers of the first, second, and third epitaxial sub-units, respectively.

The light emitted from the epitaxial sub-units may have energy bands different from each other, and the energy bands of the light may increase along the first direction.

The epitaxial sub-units may be independently drivable.

Light emitted from a lower epitaxial sub-unit may be configured to be transmitted through an upper epitaxial sub-unit.

Each of the epitaxial sub-unit may be configured to transmit at least about 80% of light emitted from a lower epitaxial stack.

A display device may include a plurality of pixels, at least one of pixels may include the light emitting stacked structure according to an exemplary embodiment.

The display device may be configured to be driven in a passive matrix manner.

The display device may be configured to be driven in an active matrix manner.

A light emitting stacked structure according to an exemplary embodiment includes a plurality of epitaxial sub-units disposed one over another, each epitaxial sub-unit configured to emit colored light having different wavelength band from each other, and a common electrode disposed between and connected to adjacent epitaxial sub-units, in which light emitting regions of the epitaxial sub-units overlap each other.

The epitaxial sub-units may include a first epitaxial stack, a second epitaxial stack, and a third epitaxial stack sequentially disposed one over another.

The common electrode may include a shared electrode disposed between one of i) the first epitaxial stack and the second epitaxial stack, and ii) the second epitaxial stack and the third epitaxial stack.

The light emitting stacked structure may further include a contact part disposed on the epitaxial sub-units to apply a common voltage and light emitting signals, the contact part may include a common contact part to apply the common voltage to the first, second, and third epitaxial stacks, and a first contact part, a second contact part, and a third contact part to apply the light emitting signals to the first, second, and third epitaxial stacks, respectively.

The light emitting stacked structure may further include a first signal line, a second signal line, and a third signal line to apply the light emitting signals to the first, second, and third epitaxial stacks, respectively, and a common line applying the common voltage to the first, second, and third epitaxial stacks, and the first, second, and third signal lines may be connected to the first, second, and third contact parts, respectively, and the common line may be connected to the common contact part.

The first, second, and third signal lines may extend in a first direction and the common line may extend in a second direction intersecting the first direction.

The common contact part may include a first common contact electrode, a second common contact electrode, and a third common contact electrode to apply the common voltage to the first, second, and third epitaxial stacks, respectively, and the second and third common contact electrodes may include the shared electrode.

Each of the first, second, and third epitaxial stacks may include a p-type semiconductor layer, an active layer, and an n-type semiconductor layer.

A stacked sequence of the n-type semiconductor layer, the active layer, and the p-type semiconductor layer in the second epitaxial stack may be different from that in at least one of the first and third epitaxial stacks.

The shared electrode may directly contact the p-type semiconductor layer of the second epitaxial stack and the p-type semiconductor layer of the third epitaxial stack.

In the second epitaxial stack, the p-type semiconductor layer, the active layer, and the n-type semiconductor layer may be stacked sequentially, and in the third epitaxial stack, the n-type semiconductor layer, the active layer, and the p-type semiconductor layer may be stacked sequentially.

The shared electrode may directly contact the n-type semiconductor layer of the second epitaxial stack and the n-type semiconductor layer of the third epitaxial stack.

The light emitting stacked structure may further include a wavelength pass filter disposed between the second common contact electrode and the third common contact electrode.

The second and third common contact electrodes may be connected to each other through a contact hole provided in the wavelength pass filter.

The first common contact electrode may be disposed under the first epitaxial stack.

The light emitting stacked structure may further include an insulating layer covering the first, second, and third epitaxial stacks, in which the first common contact electrode may be connected to the second and third common contact electrodes through a contact hole formed in the insulating layer.

Energy bands of light emitted from the epitaxial sub-units may increase from a lowermost epitaxial sub-unit to an uppermost epitaxial sub-unit.

The epitaxial sub-units may be independently drivable.

Light emitted from a lower epitaxial sub-unit may be configured to transmit through an upper epitaxial sub-unit.

Each of the epitaxial sub-units may be configured to transmit at least about 80% of light emitted from a lower epitaxial sub-unit.

The epitaxial sub-units may include a first epitaxial stack disposed on a substrate and configured to emit a first color light, a second epitaxial stack disposed on the first epitaxial stack and configured to emit a second color light having a wavelength band different from the first color light, and a third epitaxial stack disposed on the second epitaxial stack and configured to emit a third color light having a wavelength band different from the first and second color light.

The first color light, the second color light, and the third color light may be red light, green light, and blue light, respectively.

The light emitting stacked structure may further include a first wavelength pass filter disposed between the first epitaxial stack and the second epitaxial stack.

The light emitting stacked structure may further include a second wavelength pass filter disposed between the second epitaxial stack and the third epitaxial stack.

At least one of the first to third epitaxial stacks may have a concave-convex pattern formed on one upper surface thereof.

A display device may include a plurality of pixels, at least one which may be comprised the light emitting stacked structure according to an exemplary embodiment.

The display device may be driven in a passive matrix manner.

The display device may be driven in an active matrix manner.

A display apparatus according to an exemplary embodiment includes a thin film transistor (TFT) substrate, electrode pads disposed on an upper surface of the TFT substrate, a first light emitting diode (LED) sub-unit disposed on the TFT substrate, a second LED sub-unit disposed on the first LED sub-unit, a third LED sub-unit disposed on the second LED sub-unit, connectors electrically connecting the first, second, and third LED sub-units to the electrode pads, and a first layer disposed between the first LED sub-unit and the TFT substrate, the first layer being electrically connected to n-type semiconductor layers of the first, second, and third LED sub-units, in which the first, second, and third LED sub-units are independently drivable, light generated in the first LED sub-unit is configured to be emitted to the outside of the display device through the second and third LED sub-units, and light generated in the second LED sub-unit is configured to be emitted to the outside of the display device through the third LED sub-unit.

The first, second, and third LED sub-units may include first, second, and third LED stacks configured to emit red light, green light, and blue light, respectively.

The display apparatus may further include pads disposed between the first LED sub-unit and the TFT substrate and bonded to the electrode pads, in which p-type semiconductor layers of the first, second, and third LED sub-units may be electrically connected to different pads, respectively.

At least one of the pads may be electrically connected to the first layer.

The display apparatus may further include second auxiliary electrodes each disposed between the pads and the first LED sub-unit, the second auxiliary electrodes and the first layer may include substantially the same material.

The first layer may include a ground layer continuously disposed over a plurality of pixel regions.

The display apparatus may further include a first reflective electrode in ohmic contact with the p-type semiconductor layer of the first LED sub-unit, in which the first reflective electrode may be insulated from the first layer, and a portion of the first reflective electrode is interposed between the first layer and the TFT substrate.

The first reflective electrode may include an ohmic contact layer and a reflective layer.

The display apparatus may further include first auxiliary electrodes disposed on the same layer and comprising the same material as the reflective layer.

The connectors may include a first lower connector, a second lower connector, and a third lower connector passing through the first LED sub-unit, the first lower connector may be electrically connected to the n-type semiconductor layer of the first LED sub-unit, and the second lower connector and the third lower connector may be electrically insulated from the first LED sub-unit and are electrically connected to the electrode pads, respectively.

The connectors may further include a first middle connector, a second middle connector, and a third middle connector passing through the second LED sub-unit, the first middle connector may electrically connect the n-type semiconductor layer of the second LED sub-unit to the first lower connector, the second middle connector may electrically connect a p-type semiconductor layer of the second LED sub-unit to the second lower, and the third middle connector may be electrically insulated from the second LED sub-unit and be connected to the third lower connector.

The display apparatus may further include a second transparent electrode interposed between the first LED sub-unit and the second LED sub-unit and in ohmic contact with the p-type semiconductor layer of the second LED sub-unit, in which the second lower connector may be connected to the second transparent electrode.

The connectors may further include a first upper connector and a second upper connector passing through the third LED sub-unit, the first upper connector may electrically connect the n-type semiconductor layer of the third LED sub-unit to the first middle connector, and the second upper connector may electrically connect a p-type semiconductor layer of the third LED sub-unit to the third middle connector.

The display apparatus may further include a third transparent electrode interposed between the second LED sub-unit and the third LED sub-unit and in ohmic contact with the p-type semiconductor layer of the third LED sub-unit, in which the second upper connector may be connected to the third transparent electrode.

The first lower connector, the first middle connector, and the first upper connector may be stacked in a substantially vertical direction, the second lower connector and the second middle connector may be stacked in a substantially vertical direction, and the third lower connector, the third middle connector, and the second upper connector may be stacked in a substantially vertical direction.

The display apparatus may further include a first color filter interposed between the first LED sub-unit and the second LED sub-unit to transmit light generated in the first LED sub-unit, and reflect light generated in the second LED sub-unit, and a second color filter interposed between the second LED sub-unit and the third LED sub-unit to transmit light generated in the first and second LED sub-units, and reflect light generated in the third LED sub-unit.

The display apparatus may further include an underfill interposed between the TFT substrate and the first LED sub-unit.

The display apparatus may further include a first bonding layer interposed between the first LED sub-unit and the second LED sub-unit, and a second bonding layer interposed between the second LED sub-unit and the third LED sub-unit, in which the first bonding layer may be configured to transmit light generated in the first LED sub-unit, and the second bonding layer may be configured to transmit light generated in the first LED sub-unit and the second LED sub-unit.

The display apparatus may further include a light guide disposed above the third LED sub-unit.

The display apparatus may further include a micro lens disposed on the light guide.

The display apparatus may further include a plurality of unit pixels disposed on the TFT substrate, in which at least one of the unit pixels may include the electrode pads, the first LED sub-unit, the second LED sub-unit, the third LED sub-unit, the connectors, and the first layer.

At least one of the unit pixels may include a micro LED having a surface area less than about 10,000 µm It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
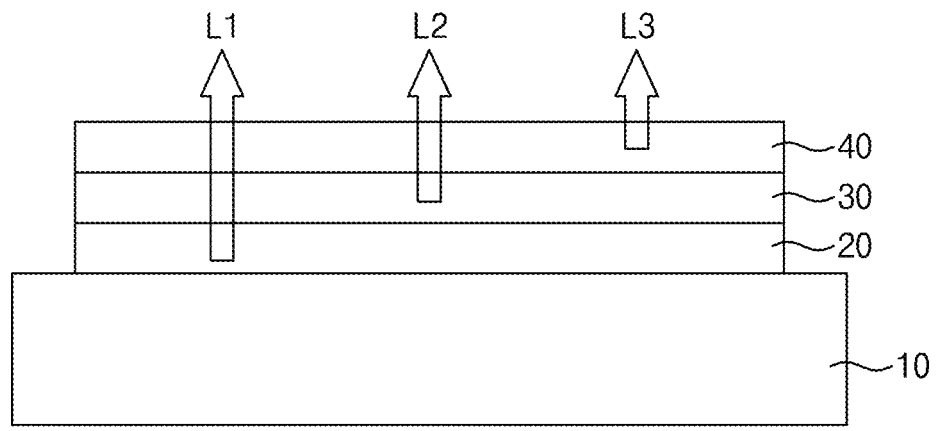
FIG. 1 is a schematic cross-sectional view of a light emitting stacked structure according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, a light emitting stacked structure or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application. In addition, a light emitting device may be mounted in various configurations, such as flip bonding, and thus, the inventive concepts are not limited to a particular stacked sequence of the first, second, and third LED stacks.

FIG. 1 is a schematic cross-sectional view of a light emitting stacked structure according to an exemplary embodiment.

Referring to FIG. 1, a light emitting stacked structure according to an exemplary embodiment includes a plurality of epitaxial stacks, which are sequentially stacked on a substrate 10. The substrate 10 is provided in the form of a plate having a front surface and a back surface.

The epitaxial stacks may be mounted on the front surface of the substrate 10, and the substrate 10 may be provided in various forms. For example, the substrate 10 may be formed of an insulating material. The material of the substrate 10 may include glass, quartz, organic polymer, organic/inorganic composite, etc. However, the inventive concepts are not limited to a particular material forming the substrate 10, and the substrate 10 may include various materials as long as it has an insulating property. In an exemplary embodiment, a wire part providing a light emitting signal and a common voltage to each epitaxial stack may be disposed on the substrate 10. In particular, when each epitaxial stack is driven in an active matrix manner, a driving element including a thin film transistor may be further disposed on the substrate 10 in addition to the wire part. In this case, the substrate 10 may be formed as a printed circuit substrate, or as a complex substrate, in which the wire part and/or the driving element are formed on the glass, silicon, quartz, organic polymer, or organic/inorganic composite.

The epitaxial stacks may be sequentially stacked on the front surface of the substrate 10. Each of the plurality of epitaxial stacks emits a light.

In an exemplary embodiment, the number of epitaxial stacks may be two or more, and the epitaxial stacks may emit light in different wavelength bands, respectively. In particular, the epitaxial stacks may have different energy bands. Hereinafter, the light emitting stacked structure will be described as including three epitaxial stack layers 20, 30, and 40 sequentially stacked on the substrate 10, however, the inventive concepts are not limited to a particular number of epitaxial stacked layers.

Each epitaxial stack may emit a color light in a visible light band among various wavelength bands. In an exemplary embodiment, light emitted from an epitaxial stack disposed on the lowermost may be a color light having the longest wavelength, which has the lowest energy band. Epitaxial stacks disposed thereon may sequentially emit color light having a shorter wavelength from the lowermost toward the uppermost. In this manner, light emitted from an epitaxial stack disposed on the uppermost may be a color light of the shortest wavelength, which has the highest energy band. For example, the first epitaxial stack 20 may emit a first color light L1, a second epitaxial stack 30 may emit a second color light L2, and a third epitaxial stack 40 may emit a third color light L3. Here, the first to third color lights L1 to L3 may correspond to different color lights, the first to third color lights L1 to L3 may be color light in different wavelength bands, and the wavelengths of the first to third color lights L1 to L3 may become sequentially short. In particular, the first to third color lights L1 to L3 may have different wavelength bands, and color light may have a shorter wavelength band, the energy of which become higher, as it goes from the first color light L1 toward the third color light L3.

In the illustrated exemplary embodiment, the first color light L1 may be a red light, the second color light L2 may be a green light, and the third color light L3 may be a blue light. However, the inventive concepts are not limited thereto. When the light emitting stacked structure includes a micro LED, which has a surface area less than about 10,000 square μm as known in the art, or less than about 4,000 square μm or 2,500 square μm in other exemplary embodiments, the first epitaxial stack 20 may emit any one of red, green, and blue light, and the second and third epitaxial stacks 30 and 40 may emit a different one of red, green, and blue light, without adversely affecting operation, due to the small form factor of a micro LED.

Each of the epitaxial stacks 20, 30, and 40 emits a light in the direction (hereinafter referred to as a "front direction") of the front surface of the substrate 10. For example, light emitted from one epitaxial stack travels in the front direction through any other epitaxial stack(s) located in a path of light. Here, the "front direction" may refer to a direction in which the first, second, and third epitaxial stacks 20, 30, and 40 are stacked from the substrate 10.

Hereinafter, the "front direction" of the substrate 10 may refer to an "upper direction" and the "back direction" of the substrate 10 may refer to a "lower direction." However, the terms above defined, that is, the "upper direction" and the "lower direction" are relative directions, and may vary with a direction in which epitaxial stacks of the light emitting stacked structure is arranged or stacked.

Each of the epitaxial stacks 20, 30, and 40 emits light in the upper direction, and each of the epitaxial stacks 20, 30, and 40 transmits most of light emitted from a epitaxial stack disposed thereunder. In particular, light emitted from the first epitaxial stack 20 passes through the second epitaxial stack 30 and the third epitaxial stack 40 to travel in the front direction, and light emitted from the second epitaxial stack 30 passes through the third epitaxial stack 40 to travel in the front direction. As such, at least some or all of the remaining epitaxial stacks other than the lowermost epitaxial stack may be formed of a light-transmitting material. The light-transmitting material may be a material transmitting light of a particular wavelength or a portion of light of the particular wavelength, or a material transmitting whole light. In an exemplary embodiment, each of the epitaxial stacks 20, 30, and 40 may transmit 60% or more of light emitted from an epitaxial stack disposed thereunder. In another exemplary embodiment, each of the epitaxial stacks 20, 30, and 40 may transmit 80% or more of light emitted from an epitaxial stack disposed thereunder. In another exemplary embodiment, each of the epitaxial stacks 20, 30, and 40 may transmit 90% or more of light emitted from an epitaxial stack disposed thereunder.

The epitaxial stacks 20, 30, and 40 of the light emitting stacked structure according to an exemplary embodiment may be independently driven by connecting signal lines that apply light emitting signals to the epitaxial stacks, respectively. Also, the light emitting stacked structure according to an exemplary embodiment may implement various colors depending on whether light is emitted from the epitaxial stacks 20, 30, and 40. Also, since epitaxial stacks emitting light of different wavelengths are formed to vertically overlap each other, it is possible to form the light emitting stacked structure.

Figure 2A:
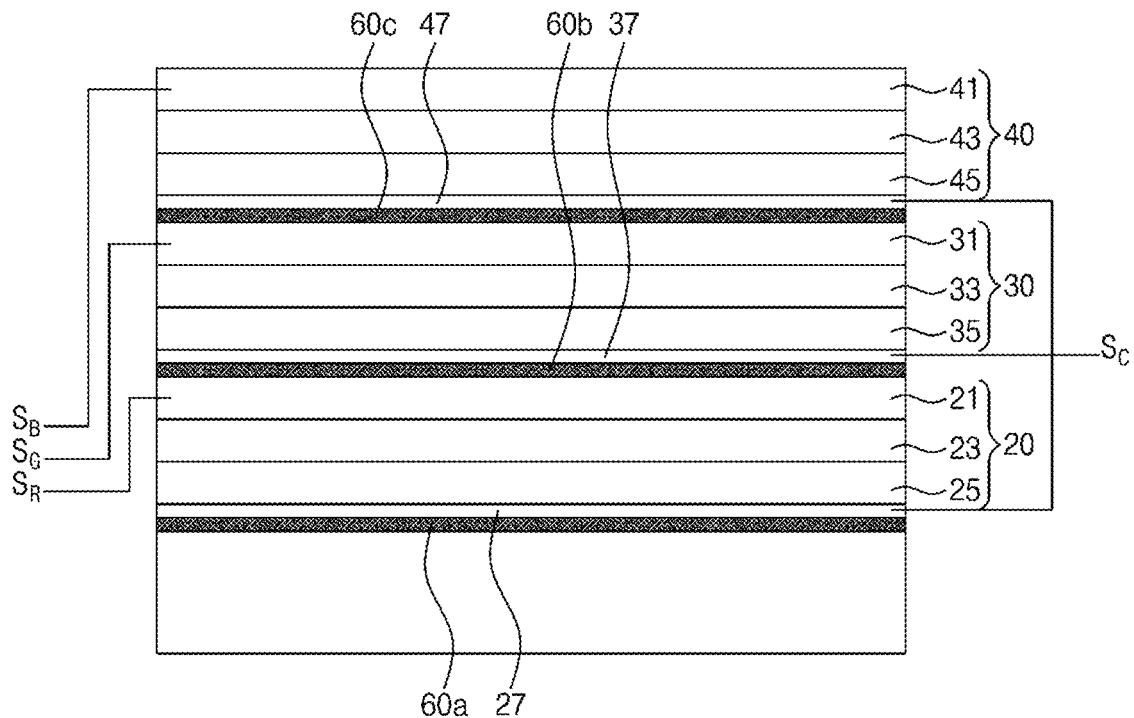
FIGS. 2A and 2B are cross-sectional views of a light emitting stacked structure according to exemplary embodiments.
Figure 2B:
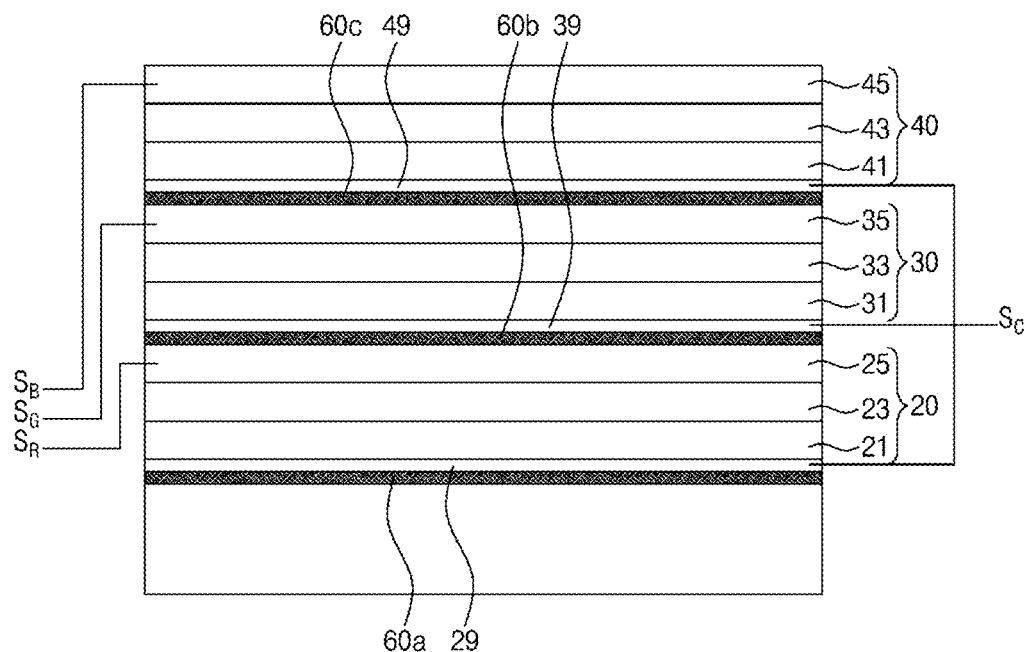

FIGS. 2A and 2B are cross-sectional views of a light emitting stacked structure according to exemplary embodiments.

Referring to FIG. 2A, the light emitting stacked structure according to an exemplary embodiment includes the first, second, and third epitaxial stacks 20, 30, and 40 disposed on the substrate 10 with first, second, and third adhesive layers 60a, 60b, and 60c interposed therebetween. The first adhesive layer 60a may be formed of a conductive or non-conductive material. In some exemplary embodiments, a portion of the first adhesive layer 60a may have conductivity to electrically connect the first adhesive layer 60a to the substrate 10. The first adhesive layer 60a may be formed of a transparent or opaque material. In an exemplary embodiment, when the substrate 10 is formed of an opaque material and a wire part and the like are formed on the substrate 10, the first adhesive layer 60a may be formed of an opaque material, for example, a material that absorbs light. Various polymer adhesives, for example, an epoxy-based polymer adhesive may be used as a light absorption material for the first adhesive layer 60a.

The second and third adhesive layers 60b and 60c are formed of a non-conductive material and may include a light-transmitting material. For example, an optically clear adhesive may be used as the second and third adhesive layers 60b and 60c. The second and third adhesive layers 60b and 60c may include various materials as long as they are optically clear and can be stably adhered to each epitaxial stack. For example, the second and third adhesive layers 60b and 60c may include epoxy polymer, various photoresists, parylene, PMMA (Poly(methyl methacrylate)), BCB (benzocyclobutene), etc., such as SU-8, as an organic material, and may include silicon oxide, aluminum oxide, molten glass, etc., as an inorganic material. In some exemplary embodiments, conductive oxide may be used as an adhesive layer. In this case, the conductive oxide should be insulated from any other element. When an organic material or molten glass of the inorganic materials is used as an adhesive layer, the material may be coated on an adhesive surface and may be bonded thereon at a high temperature and a high pressure in a vacuum state. When an inorganic material (except for molten glass) is used as an adhesive layer, the inorganic material may be bonded on an adhesive layer through deposition of the inorganic material on the adhesive layer, chemical-mechanical planarization (CMP), plasma processing on a surface of a resultant structure, and bonding at high vacuum, for example.

The first epitaxial stack 20 includes a p-type semiconductor layer 25, an active layer 23, and an n-type semiconductor layer 21 sequentially stacked one over one another. The second epitaxial stack 30 includes a p-type semiconductor layer 35, an active layer 33, and an n-type semiconductor layer 31 sequentially stacked one over one another. The third epitaxial stack 40 include a p-type semiconductor layer 45, an active layer 43, and an n-type semiconductor layer 41 sequentially stacked one over one another.

The p-type semiconductor layer 25, the active layer 23, and the n-type semiconductor layer 21 of the first epitaxial stack 20 may include a semiconductor material emitting a red light, for example.

The semiconductor material emitting a red light may include aluminum gallium arsenide (AlGaAs), gallium arsenide phosphide (GaAsP), aluminum gallium indium phosphide (AlGaInP), gallium phosphide (GaP), etc., without being limited thereto.

A first p-type contact electrode 27 may be provided under the p-type semiconductor layer 25 of the first epitaxial stack 20. The first p-type contact electrode 27 of the first epitaxial stack 20 may be formed of a single-layered or multi-layered metal. For example, various materials including metals, such as Al, Ti, Cr, Ni, Au, Ag, Sn, Ni, W, and Cu, or an alloy thereof may be used as the first p-type contact electrode 27. The first p-type contact electrode 27 may include a metal have high reflectivity to improve light output efficiency of the first epitaxial stack 20 in the upper direction.

The second epitaxial stack 30 includes the p-type semiconductor layer 35, the active layer 33, and the n-type semiconductor layer 31 sequentially stacked. The p-type semiconductor layer 35, the active layer 33, and the n-type semiconductor layer 31 may include a semiconductor material emitting a green light, for example. The semiconductor material emitting a green light may include indium gallium nitride (InGaN), gallium nitride (GaN), allium phosphide (GaP), AlGaInP, AlGaP, etc., without being limited thereto.

A second p-type contact electrode 37 is provided under the p-type semiconductor layer 35 of the second epitaxial stack 30. The second p-type contact electrode 37 is interposed between the first epitaxial stack 20 and the second epitaxial stack 30, in detail, between the second adhesive layer 60b and the second epitaxial stack 30.

The third epitaxial stack 40 includes the p-type semiconductor layer 45, the active layer 43, and the n-type semiconductor layer 41 sequentially stacked. The p-type semiconductor layer 45, the active layer 43, and the n-type semiconductor layer 41 may include a semiconductor material emitting a blue light, for example. The semiconductor material emitting a blue light may include GaN, InGaN, zinc selenide (ZnSe), etc., without being limited thereto.

A third p-type contact electrode 47 is provided under the p-type semiconductor layer 45 of the third epitaxial stack 40. The third p-type contact electrode 47 is interposed between the second epitaxial stack 30 and the third epitaxial stack 40, in detail, between the third adhesive layer 60c and the third epitaxial stack 40.

In the illustrated exemplary embodiment, each of the n-type semiconductor layers 21, 31, and 41 and the p-type semiconductor layers 25, 35, and 45 of the first, second, and third epitaxial stacks 20, 30, and 40 is illustrated as having a single layer structure, but in some exemplary embodiments, each layer may have a multi-layer structure or may include a supperlattice layer. Also, the active layers 23, 33, and 43 of the first, second, and third epitaxial stacks 20, 30, and 40 may include a single quantum well structure or a multiple quantum well structure.

The second and third p-type contact electrodes 37 and 47 substantially cover the second and third epitaxial stacks 30 and 40. The second and third p-type contact electrodes 37 and 47 may be formed of a transparent conductive material, which may transmit light emitted from an epitaxial stack disposed thereunder. For example, each of the second and third p-type contact electrodes 37 and 47 may be formed of transparent conductive oxide (TCO). The transparent conductive oxide may include tin oxide (SnO), indium oxide ($InO_2$), zinc oxide (ZnO), indium tin oxide (ITO), indium tin zinc oxide (ITZO). etc. A transparent conductive compound may be deposited through chemical vapor deposition (CVD) and physical vapor deposition (PVD) by using an evaporator and a sputter. The second and third p-type contact electrodes 37 and 47 may have a thickness enough to function as an etch stopper in a fabricating process, which will be described in more detail later, within the limits satisfying transmittance, for example, a thickness of approximately 2000 angstroms or approximately 2 micrometers.

A common line may be connected to the first, second, and third p-type contact electrodes 27, 37, and 47. The common line may be a line supplying a common voltage. Also, light emitting signal lines may be respectively connected to the n-type semiconductor layers 21, 31, and 41 of the first, second, and third epitaxial stacks 20, 30, and 40. In an exemplary embodiment, a common voltage Sc is applied to the first p-type contact electrode 27, the second p-type contact electrode 37, and the third p-type contact electrode 47 through the common line, and the light emission of the first, second, and third epitaxial stacks 20, 30, and 40 are controlled by applying light emitting signals to the n-type semiconductor layers 21, 31, and 41 of the first, second, and third epitaxial stacks 20, 30, and 40 through the light emitting signal lines, respectively. The light emitting signals may include first, second, and third light emitting signals $S_R$, $S_G$, and $S_B$ respectively corresponding to the first, second, and third epitaxial stacks 20, 30, and 40. In an exemplary embodiment, the first light emitting signal $S_R$ may be a signal for emitting a red light, the second light emitting signal $S_G$ may be a signal for emitting a green light, and the third light emitting signal $S_B$ may be a signal for emitting a blue light.

Although the common voltage is described as being applied to the p-type semiconductor layers 25, 35, and 45 of the first, second, and third epitaxial stacks 20, 30, and 40 and the light emitting signals $S_R$, $S_G$, and $S_B$ are described as being respectively applied to the n-type semiconductor layers 21, 31, and 41 of the first, second, and third epitaxial stacks 20, 30, and 40, the inventive concepts are not limited thereto. In another exemplary embodiment, the common voltage may be applied to the n-type semiconductor layers 21, 31, and 41 of the first, second, and third epitaxial stacks 20, 30, and 40, and the light emitting signals $S_R$, $S_G$, and $S_B$ may be applied to the p-type semiconductor layers 25, 35, and 45 of the first, second, and third epitaxial stacks 20, 30, and 40, respectively.

FIG. 2B is a cross-sectional view of a light emitting stacked structure according to an exemplary embodiment of the inventive concept, in which the common voltage is applied to the n-type semiconductor layers 21, 31, and 41 of the first, second, and third epitaxial stacks 20, 30, and 40, and the light emitting signals $S_R$, $S_G$, and $S_B$ are respectively applied to the p-type semiconductor layers 25, 35, and 45 of the first, second, and third epitaxial stacks 20, 30, and 40.

Referring to FIG. 2B, light emitting stacked structure according to the illustrated exemplary embodiment is substantially similar to that of FIG. 2A, except that layers of the epitaxial stacks 20, 30, and 40 are formed in the order of the n-type semiconductor layers 21, 31, and 41, the active layers 23, 33, and 43, and the p-type semiconductor layers 25, 35, and 45. In this case, n-type contact electrodes 29, 39, and 49 may be provided under the n-type semiconductor layers 21, 31, and 41, respectively. As such, detailed descriptions of the substantially similar elements will be omitted to avoid redundancy.

According to the exemplary embodiments, the first, second, and third epitaxial stacks 20, 30, and 40 are driven in response to relevant light emitting signals, respectively. More particularly, the first epitaxial stack 20 is driven by the first light emitting signal $S_R$, the second epitaxial stack 30 is driven by the second light emitting signal $S_G$, and the third epitaxial stack 40 is driven by the third light emitting signal $S_B$. The first, second, and third light emitting signals $S_R$, $S_G$, and $S_B$ are independently applied to the first, second, and third epitaxial stacks 20, 30, and 40, and thus, the first, second, and third epitaxial stacks 20, 30, and 40 may be driven independently of each other. The light emitting stacked structure may generate light of a color, which may be variously determined by a combination of the first, second, and third color lights emitted from the first, second, and third epitaxial stacks 20, 30, and 40 in the upper direction.

When displaying a color, different color lights are not emitted from different planes, but different color lights are emitted from an overlapping region, and thus, the light emitting stacked structure according to an exemplary embodiment is capable of integrating a light emitting element with reduce size. In general, conventional light emitting elements emitting different color lights, for example, red, green, and blue lights, are spaced from each other on the same plane to implement a full color. In this case, as each light emitting element is disposed on the same plane, the elements occupy a relatively large area. However, light emitting elements according to exemplary embodiments include a stacked structure in which the elements overlap each other in one area to emit different color lights, and thus, a full color may be implemented in a significantly less area. As such, a high-resolution device may be fabricated in a small area.

In addition, even if a conventional light emitting device was fabricated in a stack manner, the conventional light emitting device may be manufactured by forming an individual contact part for a connection with the individual light emitting element through a line for each light emitting element, which would increase manufacturing complexities due to a complicated structure. However, the light emitting stacked structure according to an exemplary embodiment may be formed by forming a multiple epitaxial stack structure on one substrate, forming a contact part at the multiple epitaxial stack structure through a minimum process, and connecting the contact part and the multiple epitaxial stack structure. Also, as compared to a conventional display device fabricating method in which a light emitting element of an individual color is fabricated and is individually mounted, according to the inventive concepts, only one light emitting stacked structure is mounted, instead of a plurality of light emitting elements, thereby significantly simplifying a fabricating method.

The light emitting stacked structure according to an exemplary embodiment may further include various elements to provide a high-purity and high-efficiency color light. For example, the light emitting stacked structure according to an exemplary embodiment may include a wavelength pass filter for blocking light of a relatively short wavelength from traveling toward an epitaxial stack that emits light with a longer wavelength.

Hereinafter, descriptions of a light emitting stacked structure according to exemplary embodiments will be focused on a difference from that of FIGS. 1 to 2B. In addition, hereinafter, light emitting signals will be described as being applied to the n-type semiconductor layers 21, 31, and 41 of the first, second, and third epitaxial stacks 20, 30, and 40, and a common voltage will be described as being applied to the p-type semiconductor layers 25, 35, and 45 of the first, second, and third epitaxial stacks 20, 30, and 40, however, the inventive concepts are not limited thereto.

Figure 3:
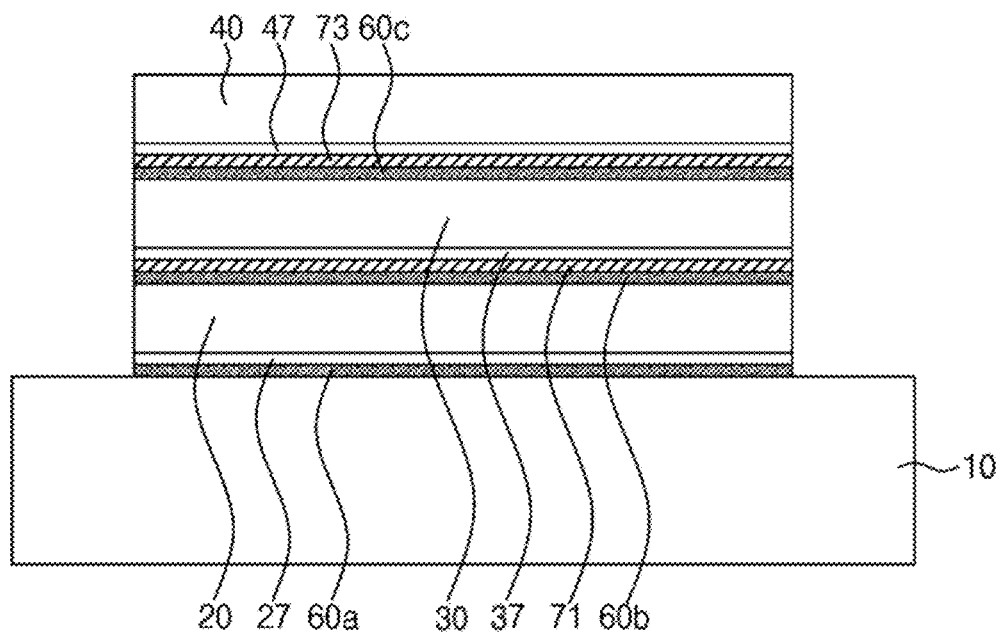
FIG. 3 is a cross-sectional view of a light emitting stacked structure according to an exemplary embodiment.

FIG. 3 is a schematic view a light emitting stacked structure according to an exemplary embodiment.

Referring to FIG. 3, a light emitting stacked structure according to an exemplary embodiment may include a first wavelength pass filter 71 between the first epitaxial stack 20 and the second epitaxial stack 30.

The first wavelength pass filter 71 may transmit a first color light emitted from the first epitaxial stack 20 and may block or reflect any other light except for the first color light. As such, the first color light emitted from the first epitaxial stack 20 may travel in the upper direction, but second and third color light emitted from the second and third epitaxial stacks 30 and 40 may not travel toward the first epitaxial stack 20 and may be reflected or blocked by the first wavelength pass filter 71.

When the second and third color light, which has a higher energy and a shorter wavelength than the first color light, is incident onto the first epitaxial stack 20, the second and third color light may induce additional light emission in the first epitaxial stack 20. In the illustrated exemplary embodiment, the second and third color light is prevented from being incident onto the first epitaxial stack 20 by the first wavelength pass filter 71.

A second wavelength pass filter 73 may be provided between the second epitaxial stack 30 and the third epitaxial stack 40. The second wavelength pass filter 73 may transmit the first and second color light emitted from the first and second epitaxial stacks 20 and 30, and may reflect or block any other light except for the first and second color light. As such, the first and second color light emitted from the first and second epitaxial stacks 20 and 30 may travel in the upper direction, but the third color light emitted from the third epitaxial stack 40 may not travel toward the first and second epitaxial stacks 20 and 30, and may be reflected or blocked by the second wavelength pass filter 73.

When the third color light, which has a higher energy and a shorter wavelength than the first and second color light, is incident onto the first and second epitaxial stacks 20 and 30, the third color light may induce additional light emission of the first and second epitaxial stacks 20 and 30. In the illustrated exemplary embodiment, the third color light is prevented from being incident onto the first and second epitaxial stacks 20 and 30 by the second wavelength pass filter 73.

The light emitting stacked structure according to an exemplary embodiment may further include various elements to provide a uniform light. For example, the light emitting stacked structure in some exemplary embodiments may have various concavo-convex portions on a light output surface.

Figure 4:
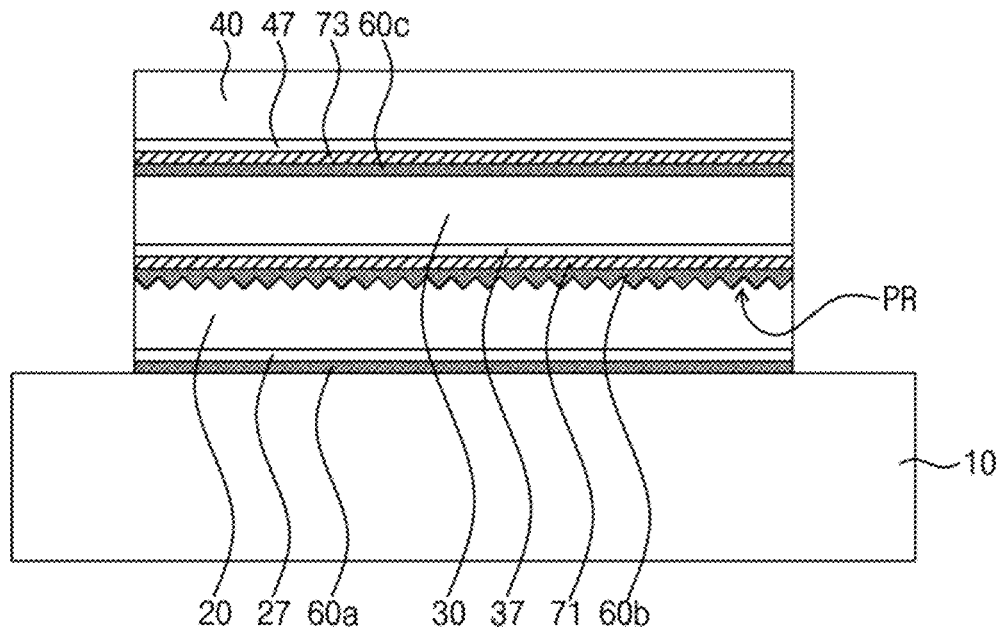
FIGS. 4, 5, and 6 are cross-sectional view of a light emitting stacked structure according to exemplary embodiments.
Figure 5:
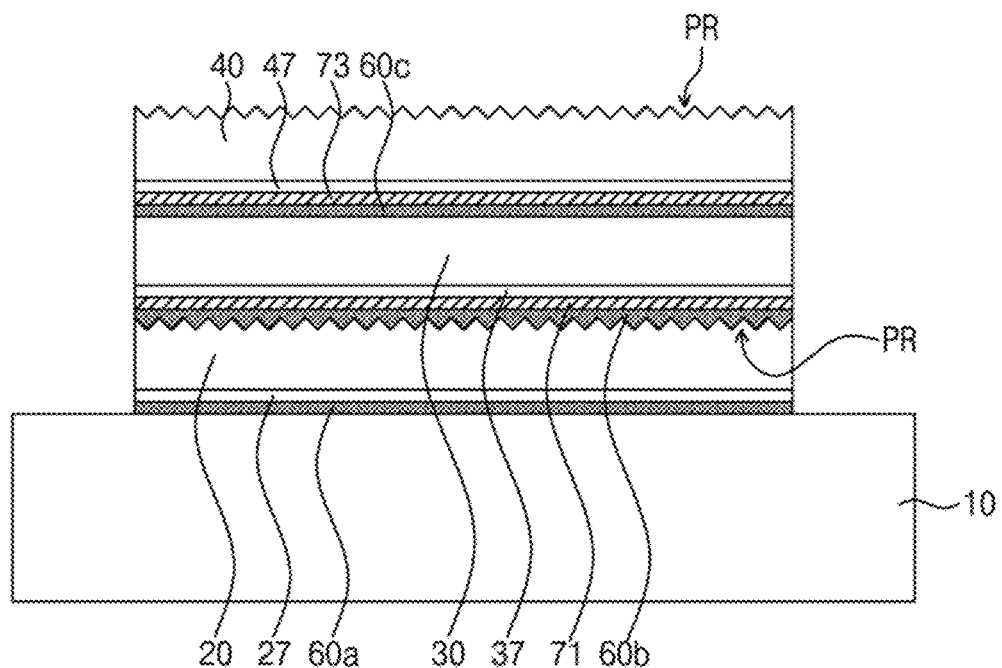
Figure 6:
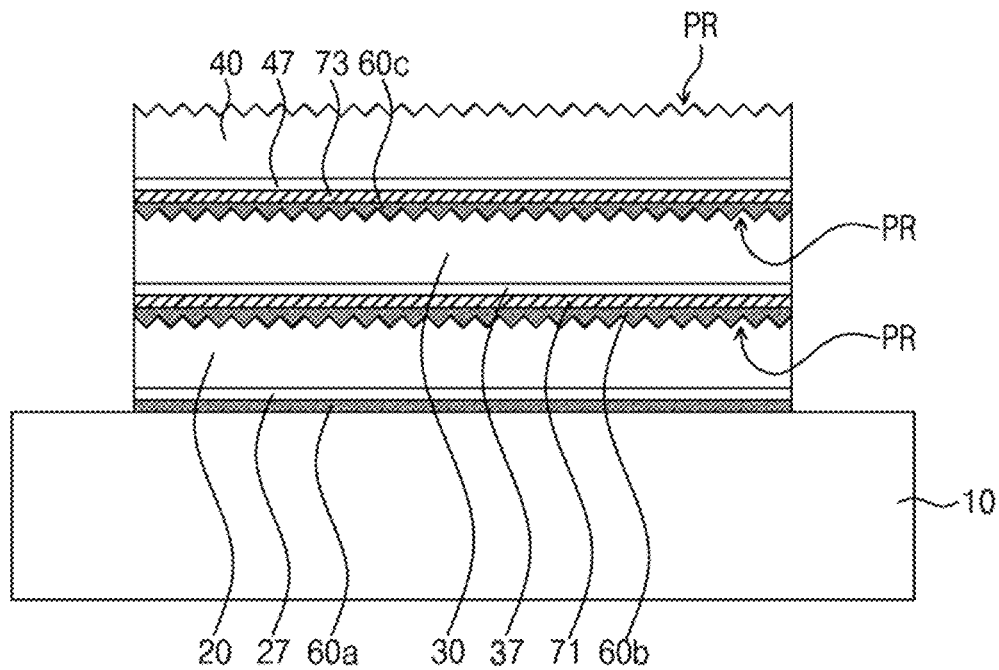

FIGS. 4 to 6 are cross-sectional views of a light emitting stacked structure according to exemplary embodiments.

Referring to FIGS. 4 to 6, the light emitting stacked structure according to exemplary embodiments may include a concavo-convex portion PR on an upper surface of an n-type semiconductor layer of at least one of the first, second, and third epitaxial stacks 20, 30, and 40.

Referring to FIG. 4, the concavo-convex portions PR may be formed on the first epitaxial stack 20. Referring to FIG. 5, the concavo-convex portions PR may be respectively provided on the first and third epitaxial stacks 20 and 40. Referring to FIG. 6, the concavo-convex portions PR may be respectively provided on the first, second, and third epitaxial stacks 20, 30, and 40. In an epitaxial stack including the concavo-convex portion PR, the concavo-convex portion PR may be provided on an n-type semiconductor layer, which may correspond to a light output surface of the epitaxial stack.

The concavo-convex portion PR may be formed in various shapes to improve the light emitting efficiency, such as a many-sided pyramid, a hemisphere, and rough surfaces arranged randomly. The concavo-convex portion PR may be formed through texturing using various etching processes. Alternatively, the concavo-convex portion PR may be formed by using a patterned sapphire substrate with concavo-convex portion. When the patterned sapphire substrate is removed from corresponding epitaxial stack, the concavo-convex portion on the patterned sapphire substrate may be transferred to the corresponding epitaxial stack.

In an exemplary embodiment, light emitted from each of the first, second, and third epitaxial stacks 20, 30, and 40 may have different intensities, which may cause a difference in visibility. According to an exemplary embodiment, the light emission efficiency may be improved by selectively forming the concavo-convex portion PR on light output surfaces of the first, second, and third epitaxial stacks 20, 30, and 40, thus reducing the difference in visibility with regard to the first to third color light. For example, a red color and/or a blue color light may have lower visibility than a green color light. As such, texturing the first epitaxial stack 20 and/or the third epitaxial stack 40 may reduce the difference in visibility between light emitted from the epitaxial stacks. In particular, since an epitaxial stack corresponding to a red light may be disposed on the lowermost of the light emitting stacked structure, the intensity of the red light may be small. As such, the light efficiency may be improved by forming the concavo-convex portion PR on an upper surface of the epitaxial stack emitting the red light.

The light emitting stacked structure according to an exemplary embodiment may be formed as a light emitting element, which may express various colors, and thus, the light emitting stacked structure may be adopted as a pixel, which will be described in more detail below.

Figure 7:
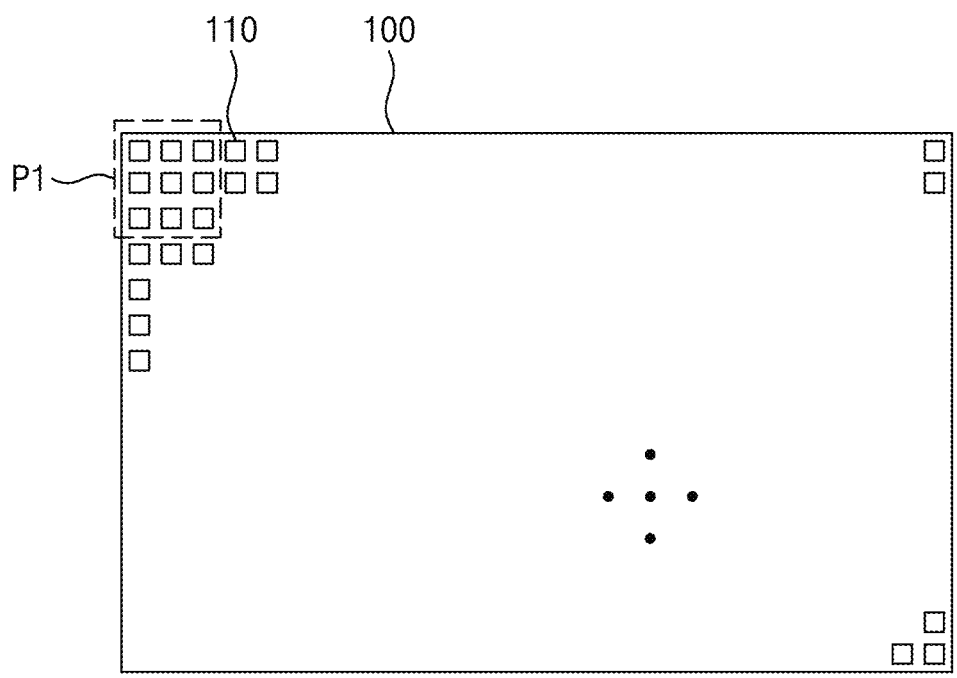
FIG. 7 is a plan view of a display device according to an exemplary embodiment.
Figure 8:
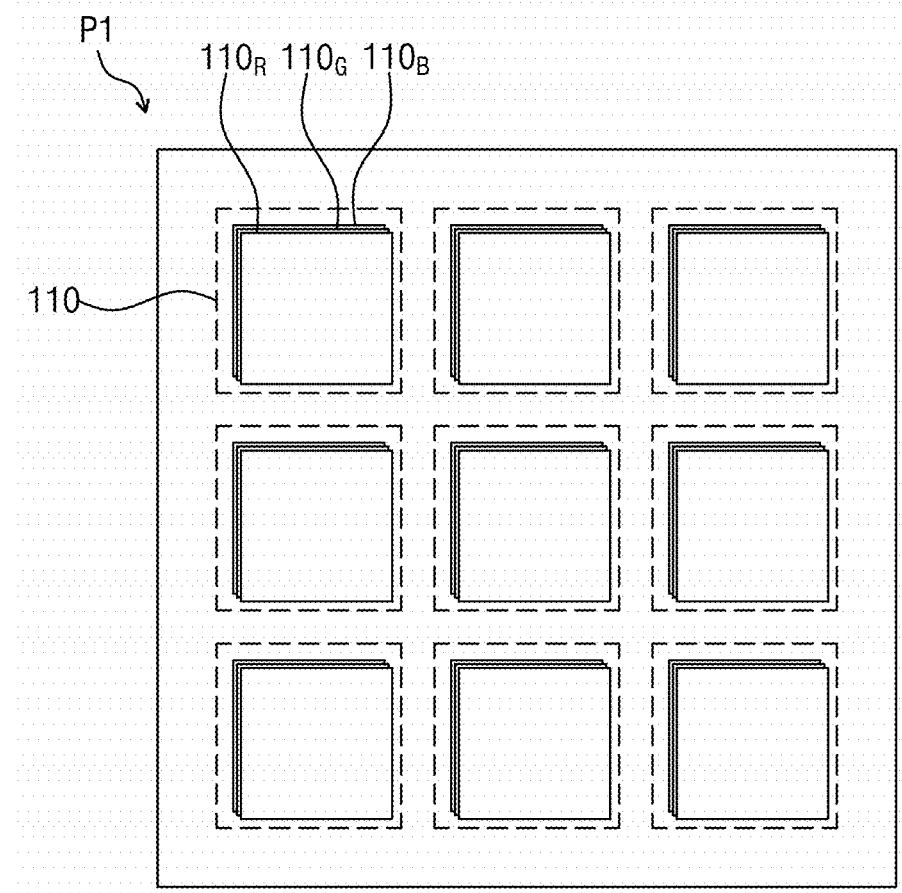
FIG. 8 is an enlarged plan view of portion P1 of FIG. 7.

FIG. 7 is a plan view of a display device according to an exemplary embodiment, and FIG. 8 is an enlarged plan view of portion P1 of FIG. 7.

Referring to FIGS. 7 and 8, a display device 100 according to an exemplary embodiment may display any visual information, for example, a text, a video, a photo, a two-dimensional or three-dimensional image, etc.

The display device 100 may be provided in various shapes, such as a polygon including straight line segments with closed loop to form a closed polygonal chain or circuit, a circular, an elliptical, etc. including a curved side, and a semicircular, a semi-elliptical, etc. including a straight or curved side. Hereinafter, the display device 100 will be described as having substantially a rectangular shape, but the inventive concepts are not limited thereto.

The display device 100 includes a plurality of pixels 110 displaying an image. Each of the pixels 110 may correspond to a minimum unit displaying an image. Each pixel 110 may include the light emitting stacked structure according to exemplary embodiments illustrated with reference to FIGS. 1 to 6, and may emit a white light and/or a color light.

In an exemplary embodiment, each pixel 110 includes a first subpixel $110_R$ emitting a red light, a second subpixel $110_G$ emitting a green light, and a third subpixel $110_B$ emitting a blue light. The first, second, and third subpixels $110_R$, $110_G$, and $110_E$ may correspond to the first, second, and third epitaxial stacks 20, 30, and 40 of the above-described light emitting stacked structure, respectively.

The pixels 110 are arranged in the matrix of rows and columns. As used herein, the pixels 110 being arranged in the matrix of rows and columns may refer to the pixels 110 being arranged exactly in line along a row or a column, or substantially arranged along a row or a column in a zigzag shape whereby the locations of the pixels 110 may be changed, etc.

Figure 9:
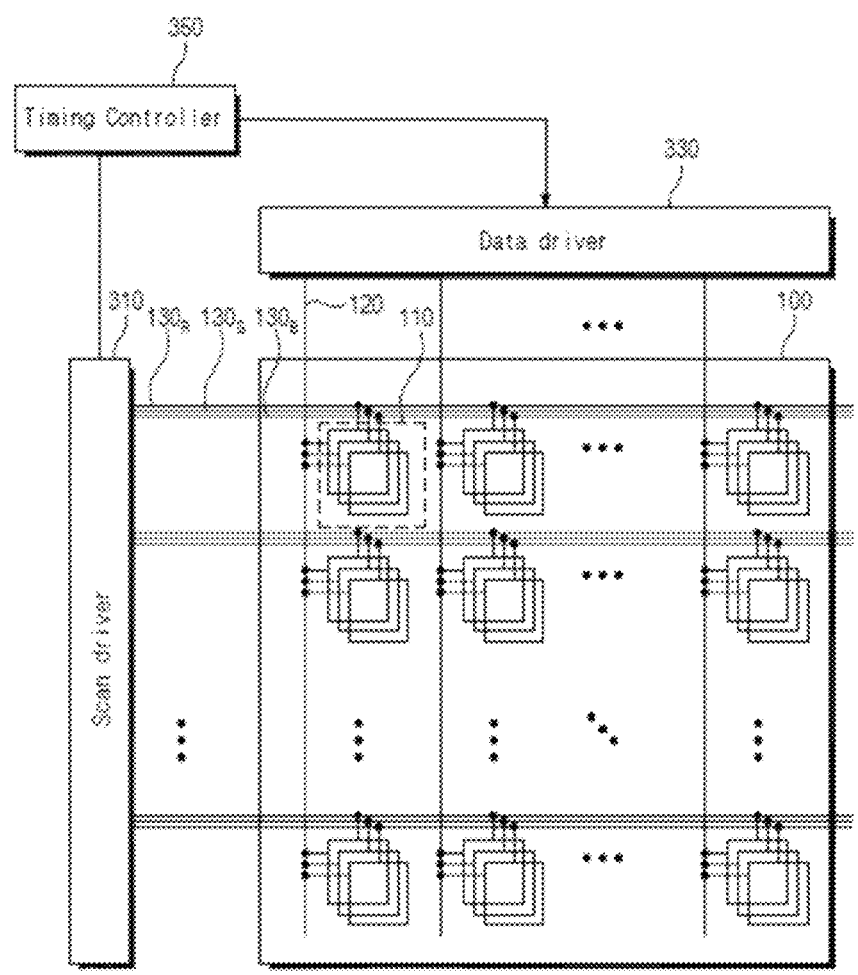
FIG. 9 is a block diagram illustrating a display device according to an exemplary embodiment.

FIG. 9 is a block diagram of a display device according to an exemplary embodiment.

Referring to FIG. 9, the display device 100 according to an exemplary embodiment includes a timing controller 350, a scan driver unit 310, a data driver unit 330, a wire part, and pixels. When each pixel includes a plurality of subpixels, each subpixel may be connected to the scan driver unit 310, the data driver unit 330, etc., through the wire part.

The timing controller 350 receives various control signals and image data from the outside (e.g., an external system which transmits image data) to drive the display device 100. The timing controller 350 may rearrange the received image data and provide the rearranged data to the data driver unit 330. The timing controller 350 may generate scan control signals and data control signals to drive the scan driver unit 310 and the data driver unit 330, and provide the generated scan control signals and the generated data control signals to the scan driver unit 310 and the data driver unit 330.

The scan driver unit 310 may generate a scan signal corresponding to the scan control signal provided from the timing controller 350. The data driver unit 330 may generate a data signal corresponding to the data control signal and the image data provided from the timing controller 350.

The wire part includes a plurality of signal lines. In particular, the wire part includes scan lines $130_R$, $130_G$, and $130_B$ (hereinafter, collectively indicated with reference numeral "130") connecting the scan driver unit 310 and the subpixels, and data lines 120 connecting the data driver unit 330 and the subpixels. The scan lines 130 may be connected to the subpixels of each pixel 110. Accordingly, scan lines connected to the subpixels of each pixel 110 are referred to as "first, second, and third scan lines $130_R$, $130_G$, and $130_B$".

The wire part may connect the timing controller 350 and the scan driver unit 310, the timing controller 350 and the data driver unit 330, or any other elements, and may include a plurality of lines for transferring relevant signals that may be used to drive the display device 100.

The scan lines 130 provide scan signals generated by the scan driver unit 310 to the subpixels. Data signals generated by the data driver unit 330 are output to the data lines 120.

The subpixels are connected to the scan lines 130 and the data lines 120. The subpixels selectively emit light in response to data signals received from the data lines 120 when scan signals are supplied from the scan lines 130. For example, during each frame period, each subpixel emits light with luminance corresponding to the received data signal. A subpixel supplied with a data signal corresponding to black luminance may not emit light during a relevant frame period, thus displaying a black color.

In an exemplary embodiment, the subpixels may be driven in a passive driving manner or an active driving manner. When the display device 100 is driven in the active driving manner, the display device 100 may be driven based on first and second pixel voltages additionally supplied thereto, in addition to a scan signal and a data signal.

Figure 10:
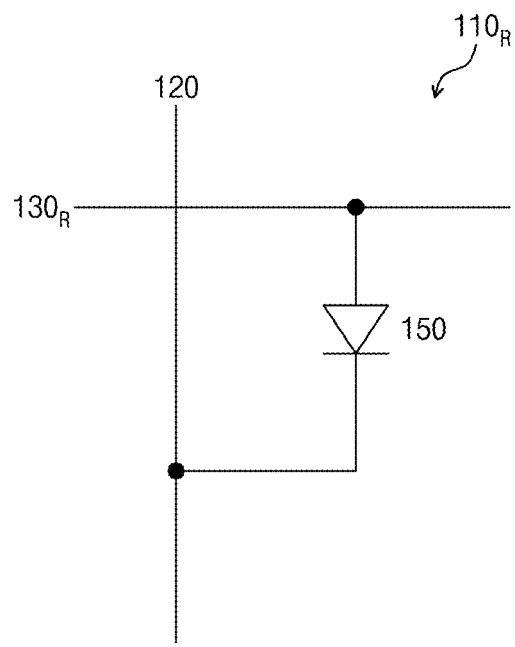
FIG. 10 is a circuit diagram illustrating one subpixel in a passive-type display device according to an exemplary embodiment.

FIG. 10 is a circuit diagram illustrating one subpixel according to an exemplary embodiment. In particular, the circuit diagram according to the illustrated exemplary embodiment may correspond to a subpixel, such as a red subpixel $110_R$, included in a passive-type display device. The second and third subpixels $110_G$ and $110_B$ may be driven in substantially the same manner as the first subpixel $110_R$, and thus, repeated descriptions as to the second and third subpixels $110_G$ and $110_B$ will be omitted to avoid redundancy.

Referring to FIG. 10, the first subpixel $110_R$ includes a light emitting element 150 connected between the first scan line $130_R$ and the data line 120. The light emitting element 150 may correspond to the first epitaxial stack 20. When a voltage of a threshold voltage or higher is applied between a p-type semiconductor layer and an n-type semiconductor layer, the first epitaxial stack 20 emits light with luminance corresponding to the magnitude of the applied voltage. In particular, the light emission of the first subpixel $110_R$ may be controlled by adjusting a voltage of a scan signal applied to the first scan line $130_R$ and/or a voltage of a data signal applied to the data line 120.

Figure 11:
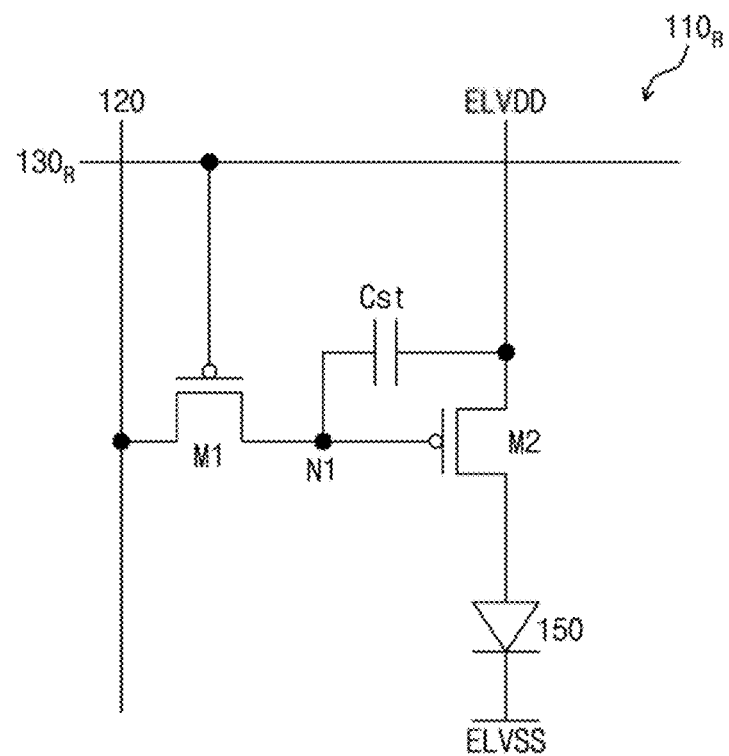
FIG. 11 is a circuit diagram illustrating one subpixel in an active-type display device according to an exemplary embodiment.

FIG. 11 is a circuit diagram illustrating a first subpixel according to an exemplary embodiment. The circuit diagram according to the illustrated exemplary embodiment may correspond to a subpixel included in an active-type display device.

When the display device 100 is an active-type display device, the first subpixel $110_R$ may be further supplied with first and second pixel voltages ELVDD and ELVSS, as well as a scan signal and a data signal.

Referring to FIG. 11, the first subpixel $110_R$ include at least one light emitting element 150 and a transistor unit connected to the light emitting element 150.

The light emitting element 150 may correspond to the first epitaxial stack 20. An n-type semiconductor layer of the light emitting element 150 may be connected to the first pixel voltage ELVDD through the transistor unit, and a p-type semiconductor layer thereof may be connected to the second pixel voltage ELVSS. The first pixel voltage ELVDD and the second pixel voltage ELVSS may have different potentials. For example, a potential of the second pixel voltage ELVSS may be lower than a potential of the first pixel voltage ELVDD by not smaller than a threshold voltage of the light emitting element 150. The light emitting element 150 may emit light with luminance corresponding to a driving current controlled by the transistor unit.

According to an exemplary embodiment, the transistor unit includes first and second transistors M1 and M2 and a storage capacitor Cst. However, a structure of the transistor unit may be variously modified and is not limited to that shown in FIG. 11.

A source electrode of the first transistor M1 (a switching transistor) is connected to the data line 120, and a drain electrode thereof is connected to a first node N1. A gate electrode of the first transistor M1 is connected to the first scan line $130_R$. When a scan signal of a voltage enough to turn on the first transistor M1 is supplied from the first scan line $130_R$, the first transistor M1 is turned on, thus connecting the data line 120 and the first node N1. In this case, a data signal of a relevant frame is supplied to the data line 120, and thus, the data signal is transferred to the first node N1. The data signal transferred to the first node N1 is charged in the storage capacitor Cst.

A source electrode of the second transistor M2 (a driving transistor) is connected to the first pixel voltage ELVDD, and a drain electrode thereof is connected to an n-type semiconductor layer. A gate electrode of the second transistor M2 is connected to the first node N1. The second transistor M2 controls the amount of driving current, which is supplied to the light emitting element 150, based on a voltage of the first node N1.

A first end of the storage capacitor Cst is connected to the first pixel voltage ELVDD, and a second end thereof is connected to the first node N1. The storage capacitor Cst charges a voltage corresponding to a data signal supplied to the first node N1, and maintains the charged voltage until a data signal of a next frame is supplied.

Although FIG. 11 shows the transistor unit including two transistors, however, the inventive concepts are not limited thereto, and the structure of the transistor unit may be variously changed or modified. For example, the transistor unit may include more transistors, more capacitors, etc. Since the structure of first and second transistors, a storage capacitor, and signal lines are well known in the art, and thus, detailed descriptions thereof will be omitted.

Figure 12:
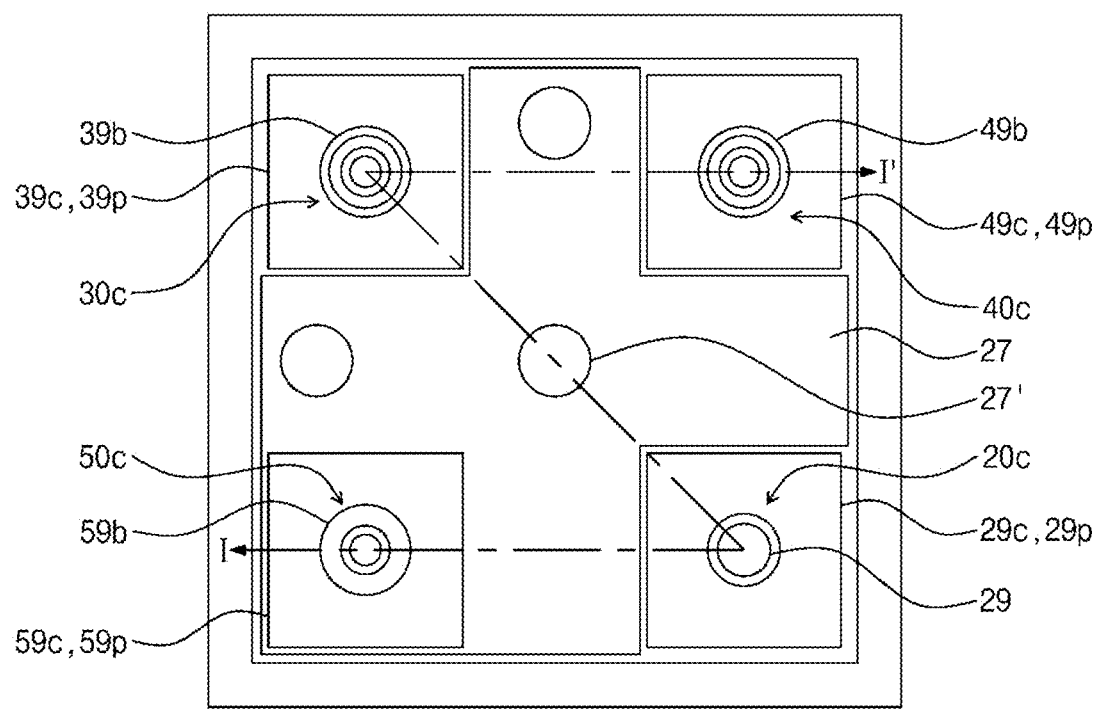
FIG. 12 is a plan view of a pixel according to an exemplary embodiment.
Figure 13:
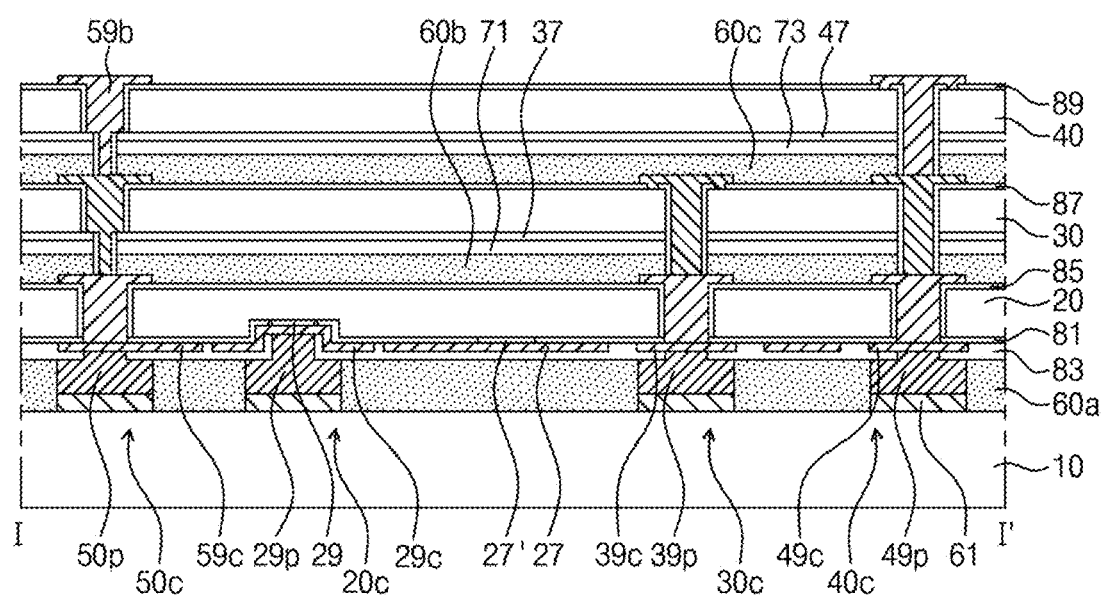
FIG. 13 is a cross-sectional view taken along line I-I' of FIG. 12.

FIG. 12 is a plan view of a pixel according to an exemplary embodiment, and FIG. 13 is a cross-sectional view taken along line I-I' of FIG. 12.

Referring to FIGS. 12 and 13, a pixel according to an exemplary embodiment includes a light emitting region, in which a plurality of epitaxial stacks are stacked, and a peripheral region surrounding the light emitting region in a plan view. The plurality of epitaxial stacks include the first, second, and third epitaxial stacks 20, 30, and 40.

A contact part for connecting a wire part to the first, second, and third epitaxial stacks 20, 30, and 40 is provided on at least one side of the light emitting region. The contact part includes a common contact part 50c for applying a common voltage to the first, second, and third epitaxial stacks 20, 30, and 40, a first contact part 20c for providing a light emitting signal to the first epitaxial stack 20, a second contact part 30c for providing a light emitting signal to the second epitaxial stack 30, and a third contact part 40c for providing a light emitting signal to the third epitaxial stack 40.

When the light emitting stacked structure has substantially a quadrangular shape in a plan view, the contact parts 20c, 30c, 40c, and 50c may be disposed in regions corresponding to respective corners of the quadrangle. However, the inventive concepts are not limited thereto, and the locations of the contact parts 20c, 30c, 40c, and 50c may be variously changed according to a shape of the light emitting stacked structure.

A common pad electrode 59c and a common pad 59p are provided at the common contact part 50c. The common pad electrode 59c is electrically connected to the first, second, and third epitaxial stacks 20, 30, and 40 through the first, second, and third p-type contact electrodes 27, 37, and 47 by a common bridge electrode 59b or by a direct contact. A first pad electrode 29c and a first pad 29p are provided at the first contact part 20c. The first pad electrode 29c is electrically connected with the first epitaxial stack 20 through a first n-type contact electrode 29.

A second pad electrode 39c and a second pad 39p are provided at the second contact part 30c. The second pad electrode 39c is electrically connected with the second epitaxial stack 30 through second bridge electrodes 39b.

A third pad electrode 49c and a third pad 49p are provided at the third contact part 40c. The third pad electrode 49c is electrically connected with the third epitaxial stack 40 through third bridge electrodes 49b.

The common pad electrode 59c and the common pad 59p, the first pad electrode 29c and the first pad 29p, the second pad electrode 39c and the second pad 39p, and the third pad electrode 49c and the third pad 49p, may be provided to overlap each other, and may have substantially the same shape and substantially the same area in a plan view. However, the inventive concepts are not limited thereto, and the common pad electrode 59c and the common pad 59p, the first pad electrode 29c and the first pad 29p, the second pad electrode 39c and the second pad 39p, and the third pad electrode 49c and the third pad 49p may have various shapes and areas. In the illustrated exemplary embodiment, the common pad electrode 59c and the common pad 59p, the first pad electrode 29c and the first pad 29p, the second pad electrode 39c and the second pad 39p, and the third pad electrode 49c and the third pad 49p will be described as having substantially the same shape and substantially the same area to fully overlap each other.

An ohmic electrode 27' is provided in the light emitting region except for the contact part, so as to overlap the first p-type contact electrode 27. The ohmic electrode 27' may be provided to electrically connect the first p-type contact electrode 27 and a p-type semiconductor layer of the first epitaxial stack 20, and may include one or more ohmic electrodes. For example, as shown in the illustrated exemplary embodiment, three ohmic electrodes 27' may be provided. The ohmic electrode 27' for an ohmic contact may be formed of various materials. For example, the ohmic electrode 27' corresponding to a p-type ohmic electrode may include Au(Zn) or Au(Be). In this case, since reflectance of a material for the ohmic electrode 27' is lower than that of a material, such as Ag, Al, or Au, an additional reflection electrode may be further disposed. In particular, Ag, Au, etc. may be used as a material for the additional reflection electrode, and a metallic adhesive layer which is formed of a material, such as Ti, Ni, Cr, or Ta, may be disposed for adhesion with an adjacent element. In this case, the metallic adhesive layer may be thinly deposited on an upper surface and a lower surface of a reflection electrode including Ag, Au, etc.

The ohmic electrode 27' may be disposed in a region spaced apart from the first contact part 20c. For example, the ohmic electrode 27' may be spaced apart from the first contact part 20c as much as possible for current spreading. Also, the ohmic electrode 27' may be disposed in the region spaced from the second and third contact parts 30c and 40c. As such, a step, which would otherwise may be formed on a lower portion of the light emitting stacked structure upon forming the first, second, and third pads 29p, 39p, and 49p or when bonded with the substrate 10, may be minimized.

A wire part, which may correspond to the common contact part 50c and the first, second, and third contact parts 20c, 30c, and 40c and is electrically connected with the common pad 59p and the first, second, and third pads 29p, 39p, and 49p, and/or a driving element, such as a thin film transistor, may be further provided on the substrate 10. In this case, a common line may be connected to the common pad 59p, and first, second, and third light emitting signal lines may be respectively connected to the first, second, and third pads 29p, 39p, and 49p.

An adhesive layer, a contact electrode, and a wavelength pass filter are provided between the substrate 10, the first epitaxial stack 20, the second epitaxial stack 30, and the third epitaxial stack 40.

In particular, according to an exemplary embodiment, the light emitting stacked structure is provided on the substrate 10, with the first adhesive layer 60a interposed therebetween.

The light emitting stacked structure includes the sequentially stacked first, second, and third epitaxial stacks 20, 30, and 40, the common contact part 50c and the first, second, and third contact parts 20c, 30c, and 40c connected to the first, second, and third epitaxial stacks 20, 30, and 40. The wire part may be formed on the substrate 10, and the common contact part 50c and the first, second, and third contact parts 20c, 30c, and 40c may electrically connect the common contact part 50c and the first, second, and third contact parts 20c, 30c, and 40c with the wire part of the substrate 10 through a conductive adhesive layer 61.

The conductive adhesive layer 61 may include a conductive paste, such as a solder paste or a silver paste, a conductive resin, or an anisotropic conductive film.

When the substrate 10 does not include the conductive adhesive layer 61, the first adhesive layer 60a for attaching the light emitting stacked structure to the substrate 10 may be provided between the substrate 10 and the light emitting stacked structure.

The first epitaxial stack 20 is provided on the lowermost portion of the light emitting stacked structure. A partial region of the first epitaxial stack 20 may have a mesa structure protruding toward a lower side and being depressed toward an upper side. In particular, portions of a p-type semiconductor layer, an active layer, and an n-type semiconductor layer of the first epitaxial stack 20 may be removed to expose the n-type semiconductor layer in the lower direction. A portion which is depressed by removing portions of the p-type semiconductor layer, the active layer, and the n-type semiconductor layer of the first epitaxial stack 20 may be hereinafter be referred to as a "recess", and a portion where a mesa is formed may be referred to as a "protrusion". In this case, in a plan view, the recess is provided within a region corresponding to the first contact part 20c, in detail, a region where the first pad 29p is formed. In an exemplary embodiment, the size of the recess may be smaller than the size of the first pad 29p to minimize a step, which may be formed upon bonding the light emitting stacked structure and the substrate 10 to be discussed later.

A first insulating layer 81 is disposed on a lower surface of the first epitaxial stack 20, in particular, a surface of the first epitaxial stack 20 that faces the substrate 10. A plurality of contact holes are formed in the first insulating layer 81. The contact holes are respectively provided in the regions of the first insulating layer 81, which correspond to the recess and the protrusion.

The first n-type contact electrode 29, which contacts the n-type semiconductor layer of the first epitaxial stack 20, is provided in the contact hole corresponding to the recess. The ohmic electrode 27', which contacts the p-type semiconductor layer of the first epitaxial stack 20, is provided in the contact hole corresponding to the protrusion.

The first n-type contact electrode 29 may be formed of various conductive materials, and may be formed of at least one of various metals and an alloy thereof. In an exemplary embodiment, the first n-type contact electrode 29 may be formed of an Au alloy, such as AuGe or AuTe. The first p-type ohmic electrode 27' may include Au(Zn) or Au(Be). Here, since reflectance of a material for the ohmic electrode 27' is lower than that of a material, such as Ag, Al, or Au, an additional reflection electrode may be further disposed. In an exemplary embodiment, Ag, Au, etc. may be used as a material for an additional reflection electrode, and a metallic adhesive layer formed of a material such as Ti, Ni, Cr, or Ta may be disposed for adhesion with an adjacent element. In this case, the adhesive layer may be thinly deposited on an upper surface and a lower surface of the reflection electrode including Ag, Au, etc. However, the inventive concepts are not limited thereto, and the first n-type contact electrode 29 or the ohmic electrode 27' may be formed with various other materials.

The first p-type contact electrode 27, the common pad electrode 59c, and the first, second, and third pad electrodes 29c, 39c, and 49c are provided on the ohmic electrode 27' and the first insulating layer 81. The common pad electrode 59c is provided at the common contact part 50c, and the first, second, and third pad electrodes 29c, 39c, and 49c are respectively provided at the first, second, and third contact parts 20c, 30c, and 40c. Here, the first p-type contact electrode 27 and the common pad electrode 59c may be integrally formed, and contact the ohmic electrode 27' for electrical connection.

The first p-type contact electrode 27 may be formed of a material having a reflectivity to reflect light emitted from the first epitaxial stack 20. The first insulating layer 81 may have reflectivity to assist reflection of light emitted from the first epitaxial stack 20. For example, the first insulating layer 81 may have an omni-directional reflector (ODR) structure.

The common pad electrode 59c and the first, second, and third pad electrodes 29c, 39c, and 49c are spaced from each other, and thus, are electrically/physically insulated from each other. The common pad electrode 59c and the first, second, and third pad electrodes 29c, 39c, and 49c may have a size enough to cover regions corresponding to the common contact part 50c and the first, second, and third contact parts 20c, 30c, and 40c, respectively. Also, the common pad electrode 59c and the first, second, and third pad electrodes 29c, 39c, and 49c may include substantially the same material and disposed on the same layer.

In particular, the first pad electrode 29c covers the region corresponding to the first contact part 20c and formed to be larger than the recess of the first epitaxial stack 20. Also, the second and third pad electrodes 39c and 49c and the common pad electrode 59c may cover the regions respectively corresponding to the second contact part 30c, the third contact part 40c, and the common contact part 50c, and may be provided to have a size identical or similar to the size of the first pad electrode 29c. As the size of the first pad electrode 29c is larger than the size of the recess, the influence of the step due to the recess upon forming the first pad 29p later may be minimized. In addition to the first pad electrode 29c, also, the second and third pad electrodes 39c and 49c and the common pad electrode 59c may be provided on the same insulating layer with substantially the same height, and may be provided with the sufficient large area, even though a contact with bridge electrodes (to be described later) connected to the second and third pads 39p and 49p and the common pad 59p may be formed narrowly. As such, the step that may be formed on a back surface of the first epitaxial stack 20 due to the first, second, and third pad electrodes 29c, 39c, and 49c and the common pad electrode 59c may be minimized.

A second insulating layer 83 is provided on the back surface of the first epitaxial stack 20, to which the first, second, and third pad electrodes 29c, 39c, and 49c and the common pad electrode 59c are formed. The second insulating layer 83 includes contact holes at regions corresponding to the common contact part 50c and the first, second, and third contact parts 20c, 30c, and 40c. Portions of lower surfaces of the common pad electrode 59c and the first, second, and third pad electrodes 29c, 39c, and 49c are exposed through the contact holes formed in the second insulating layer 83. The contact holes of the second insulating layer 83 may be formed to be smaller than the common pad electrode 59c and the first, second, and third pad electrodes 29c, 39c, and 49c.

The common pad 59p and the first, second, and third pads 29p, 39p, and 49p are provided under the second insulating layer 83. The common pad 59p is disposed on the common contact part 50c and is connected to the common pad electrode 59c through a contact hole. The first, second, and third pads 29p, 39p, and 49p are respectively disposed on the first, second, and third contact parts 20c, 30c, and 40c, and are respectively connected to the first, second, and third pad electrodes 29c, 39c, and 49c through the contact holes. The common pad 59p and the first, second, and third pads 29p, 39p, and 49p protrude in the lower direction from a lower surface of the second insulating layer 83. The conductive adhesive layers 61 are respectively provided on lower surfaces of the common pad 59p and the first, second, and third pads 29p, 39p, and 49p, such that the common pad 59p and the first, second, and third pads 29p, 39p, and 49p are attached to the substrate 10. The first adhesive layer 60a is provided between the substrate 10 and the second insulating layer 83, where the common pad 59p and the first, second, and third pads 29p, 39p, and 49p are not provided.

A third insulating layer 85 is provided on an upper surface of the first epitaxial stack 20. The first epitaxial stack 20 has contact holes vertically penetrating at the common contact part 50c and the second and third contact parts 30c and 40c. Portions of upper surfaces of the common pad electrode 59c and the second and third pad electrodes 39c and 49c are exposed by the contact holes in the first epitaxial stack 20. The common bridge electrode 59b connecting the common pad electrode 59c and the second and third epitaxial stacks 30 and 40, a second bridge electrode 39b connecting the second pad electrode 39c and the second epitaxial stack 30, and a third bridge electrode 49b connecting the third pad electrode 49c and the third epitaxial stack 40 are provided in the contact holes of the first epitaxial stack 20. The third insulating layer 85 for insulation from the first epitaxial stack 20 is provided on inner side walls of the contact holes.

The second adhesive layer 60b is provided on the first epitaxial stack 20, and the third insulating layer 85, and the first wavelength pass filter 71, the second p-type contact electrode 37, the second epitaxial stack 30, and a fourth insulating layer 87 are sequentially provided on the second adhesive layer 60b. The second epitaxial stack 30 may include a p-type semiconductor layer, an active layer, and an n-type semiconductor layer stacked in the upper direction from the bottom.

The first wavelength pass filter 71, the second p-type contact electrode 37, the second epitaxial stack 30, and the fourth insulating layer 87 have contact holes vertically penetrating at the common contact part 50c and the second and third contact parts 30c and 40c.

In the common contact part 50c, the first wavelength pass filter 71 and the second p-type contact electrode 37 have contact holes having a first diameter, and the second epitaxial stack 30 and the fourth insulating layer 87 have contact holes having a second diameter greater than the first diameter. The fourth insulating layer 87 is provided on side walls of all the contact holes, and thus, the common bridge electrodes 59b formed in the contact holes are insulated from elements disposed around the contact holes. However, since the contact hole in the second epitaxial stack 30 has a diameter greater than a diameter of a lower contact hole, a portion of an upper surface of the second p-type contact electrode 37 is exposed in the contact hole having the greater diameter. The common bridge electrode 59b is provided in the contact hole provided at the common contact part 50c, and thus, the common bridge electrode 59b and the second p-type contact electrode 37 may directly contact each other and be connected.

In the second contact part 30c, the first wavelength pass filter 71, the second p-type contact electrode 37, the second epitaxial stack 30, and the fourth insulating layer 87 have contact holes that have substantially the same diameter. A contact hole formed in the fourth insulating layer 87 may expose an upper surface of the second epitaxial stack 30 along an outer surface of the contact hole. Since the second bridge electrode 39b is provided in the contact hole, the second bridge electrode 39b covers a portion of an upper surface of the second epitaxial stack 30, in particular, the contact hole of the fourth insulating layer 87 provided on the second epitaxial stack 30. As such, the second bridge electrode 39b may directly contact an upper portion of the second epitaxial stack 30 and be connected therewith. The upper portion of the second epitaxial stack 30 may correspond to an n-type semiconductor layer. The fourth insulating layer 87 is provided on side walls of the contact holes provided in the first wavelength pass filter 71, the second p-type contact electrode 37, the second epitaxial stack 30, and the fourth insulating layer 87, and thus, the second bridge electrode 39b provided therein is insulated from elements disposed around the contact holes.

In the third contact part 40c, the first wavelength pass filter 71, the second p-type contact electrode 37, the second epitaxial stack 30, and the fourth insulating layer 87 have contact holes having substantially the same diameter. The fourth insulating layer 87 is provided on side walls of the contact holes provided in the first wavelength pass filter 71, the second p-type contact electrode 37, the second epitaxial stack 30, and the fourth insulating layer 87, and thus, the second bridge electrodes 39b provided therein are insulated from elements disposed around the contact holes.

The third adhesive layer 60c is provided on the second epitaxial stack 30. The second wavelength pass filter 73, the third p-type contact electrode 47, the third epitaxial stack 40, and a fifth insulating layer 89 are sequentially provided on the third adhesive layer 60c. The third epitaxial stack 40 may include a p-type semiconductor layer, an active layer, and an n-type semiconductor layer stacked in the upper direction from the bottom.

The second wavelength pass filter 73, the third p-type contact electrode 47, the third epitaxial stack 40, and the fifth insulating layer 89 have contact holes vertically penetrating at the common contact part 50c and the third contact part 40c. A contact hole is not provided at the second wavelength pass filter 73, the third p-type contact electrode 47, the third epitaxial stack 40, and the fifth insulating layer 89 corresponding to the second contact part 30c.

In the common contact part 50c, the second wavelength pass filter 73 and the third p-type contact electrode 47 have contact holes having a third diameter, and the third epitaxial stack 40 and the fifth insulating layer 89 have contact holes having a fourth diameter greater than the third diameter. The fifth insulating layer 89 is provided on side walls of all the contact holes, and thus, the common bridge electrodes 59b provided therein are insulated from elements disposed around the contact holes. However, as a contact hole formed in the third epitaxial stack 40 has a diameter greater than a diameter of a lower contact hole, a portion of an upper surface of the third p-type contact electrode 47 is exposed in the contact hole having the greater diameter. The common bridge electrode 59b is provided in the contact hole provided at the common contact part 50c, and thus, the common bridge electrode 59b and the third p-type contact electrode 47 may directly contact each other and be connected.

In the third contact part 40c, the second wavelength pass filter 73, the third p-type contact electrode 47, the third epitaxial stack 40, and the fifth insulating layer 89 have contact holes having substantially the same diameter. The fifth insulating layer 89 has a contact hole which exposes an upper surface of the third epitaxial stack 40 along an outer surface of the contact hole. Since the third bridge electrode 49b is provided in the contact hole, the third bridge electrode 49b covers a portion of an upper surface of the third epitaxial stack 40, in particular, the contact hole of the fifth insulating layer 89 provided on the third epitaxial stack 40. As such, the third bridge electrode 49b may directly contact an upper portion of the third epitaxial stack 40 and be connected therewith. The upper portion of the third epitaxial stack 40 may correspond to an n-type semiconductor layer. The fifth insulating layer 89 is provided on side walls of the contact holes provided in the second wavelength pass filter 73, the third p-type contact electrode 47, the third epitaxial stack 40, and the fifth insulating layer 89, and thus, the third bridge electrodes 49b provided therein are insulated from elements disposed around the contact holes.

The first, second, third, fourth, and fifth insulating layers 81, 83, 85, 87, and 89 may be formed of a various organic/inorganic insulation materials, but the inventive concepts are not limited to a particular material forming the insulating layers. For example, the first, second, third, fourth, and fifth insulating layers 81, 83, 85, 87, and 89 may be formed of an inorganic insulation material including silicon nitride, silicon oxide, etc., or organic insulation materials including polyimide.

In an exemplary embodiment, a concavo-convex portion may be selectively provided on an upper surface of each of the first, second, and third epitaxial stacks 20, 30, and 40, in particular, an upper surface of each of n-type semiconductor layers of the first, second, and third epitaxial stacks 20, 30, and 40. The concavo-convex portion may be provided only in a portion corresponding to a light emitting region, or may be provided on the entire upper surface of each n-type semiconductor layer.

In some exemplary embodiments, the fifth insulating layer 89 may be provided on a side surface of the light emitting stacked structure, and an additional light-opaque layer may be further provided in addition to the fifth insulating layer 89. The light-opaque layer may be a light blocking layer for preventing lights from the first, second, and third epitaxial stacks 20, 30, and 40 from being output toward sides of the light emitting stacked structure, and may include a material which absorbs a light or reflects a light. The light-opaque layer is not specifically limited as long as it absorbs or reflects light. In an exemplary embodiment, the light-opaque layer may be a distributed Bragg reflector (DBR) dielectric mirror or a metallic reflection layer formed on an insulating layer, or may be an organic polymer layer of a black color. When the metallic reflection layer is used as the light-opaque layer, the metallic reflection layer may be electrically insulated from an element of other light emitting stacked structure.

When the light-opaque layer is provided on a side surface of the light emitting stacked structure, it may be possible to prevent light emitted from a particular light emitting stacked structure from having an influence on an adjacent light emitting stacked structure, or to prevent a color mixing phenomenon that may occur between adjacent light emitting stacked structures.

In the light emitting stacked structure according to an exemplary embodiment, a common voltage is applied to the first, second, and third epitaxial stacks 20, 30, and 40 through the common pad electrode 59c, and first, second, and third light emitting signals are respectively applied to the first, second, and third epitaxial stacks 20, 30, and 40 through the first, second, and third pad electrodes 29c, 39c, and 49c. In particular, the common pad electrode 59c is electrically connected to a p-type semiconductor layer of the first epitaxial stack 20 through the first p-type contact electrode 27 and the ohmic electrode 27', electrically connected to a p-type semiconductor layer of the second epitaxial stack 30 through the common bridge electrode 59b and the second p-type contact electrode 37, and electrically connected to a p-type semiconductor layer of the third epitaxial stack 40 through the common bridge electrode 59b and the third p-type contact electrode 47. The first pad electrode 29c is electrically connected to an n-type semiconductor layer of the first epitaxial stack 20 through the first n-type contact electrode 29, the second pad electrode 39c is electrically connected to an n-type semiconductor layer of the second epitaxial stack 30 through the second bridge electrode 39b, and the third pad electrode 49c is electrically connected to an n-type semiconductor layer of the third epitaxial stack 40 through the third bridge electrode 49b.

In this manner, as the common voltage is applied to the common contact part 50c and the light emitting signal are respectively applied to the first, second, and third epitaxial stacks 20, 30, and 40, the first, second, and third epitaxial stacks 20, 30, and 40 may be independently controlled to emit light, and thus, a color may be variously implemented depending on whether each epitaxial stack emits light.

The light emitting stacked structure according to an exemplary embodiment may be fabricated by sequentially stacking the first, second, and third epitaxial stacks 20, 30, and 40 on the substrate 10, which will be described below.

FIGS. 14, 16, 18, 20, 22, 24, 26, 28, 30, and 32 are plan views illustrating a method of forming the first, second, and third epitaxial stacks 20, 30, and 40 on the substrate 10. FIGS. 15A, 15B, 17, 19A and 19B, 21, 23, 25A and 25B, 27A and 27B, 29, 31A to 31E, and 33A to 33E are cross-sectional views taken along line I-I' of FIGS. 14, 16, 18, 20, 22, 24, 26, 28, 30, and 32.

Figure 14:
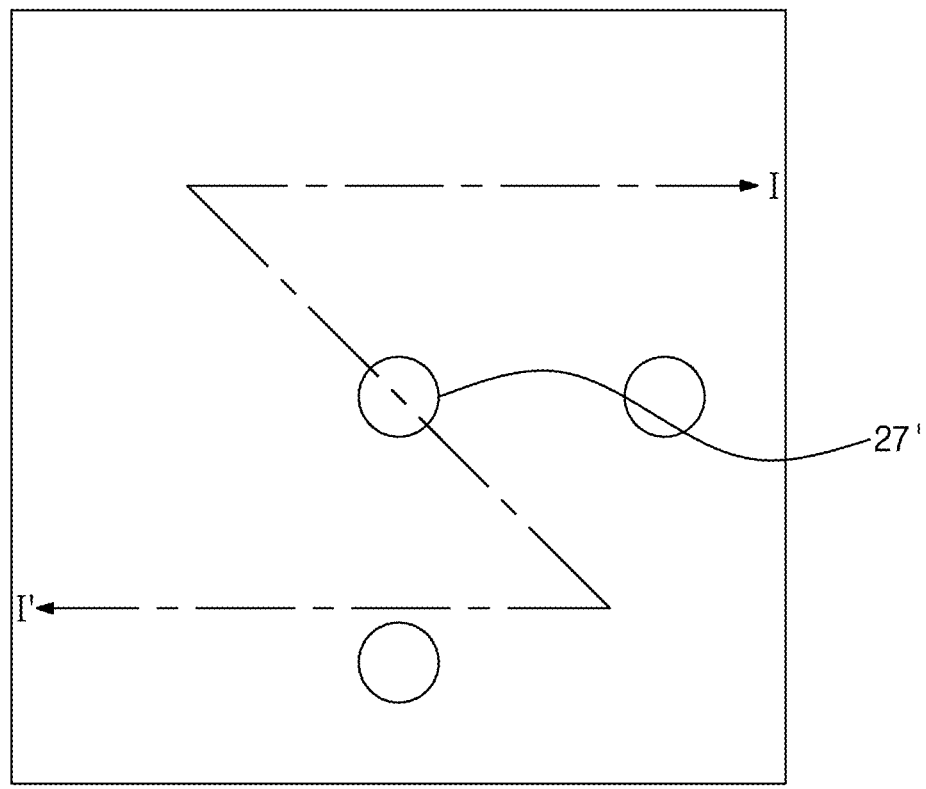
FIGS. 14, 16, 18, 20, 22, 24, 26, 28, 30, and 32 are plan views illustrating a method of forming first, second, and third epitaxial stacks on a substrate according to an exemplary embodiment.
Figure 15A:
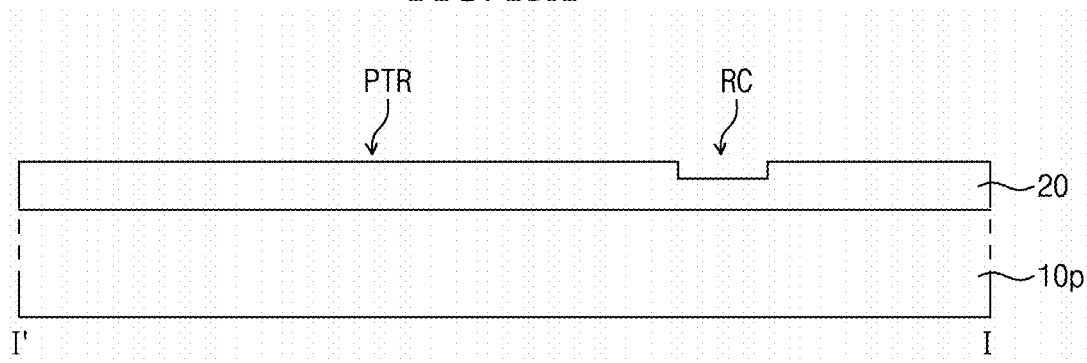
FIGS. 15A, 15B, 17, 19A, 19B, 21, 23, 25A, 25B, 27A, 27B, 29, 31A, 31B, 31C, 31D, 31E, 33A, 33B, 33C, 33D, and 33E are cross-sectional views taken along line I-I' of corresponding plan view according to an exemplary embodiment.

Referring to FIGS. 14 and 15A, the first epitaxial stack 20 is formed on a first temporary substrate 10p. In an exemplary embodiment, the first temporary substrate 10p may be a semiconductor substrate for forming the first epitaxial stack 20, and may be, for example, a GaAs substrate. The first epitaxial stack 20 may be formed to have a mesa structure including a recess RC and a protrusion PTR, which may be formed by forming an n-type semiconductor layer, an active layer, and a p-type semiconductor layer on the first temporary substrate 10p and removing portions of the n-type semiconductor layer, the active layer, and the p-type semiconductor layer. The recess RC is provided in a region corresponding to the first contact part 20c, and may be formed to be smaller than the first pad electrode 29c or the first pad 29p to be formed later, to reduce a step with any other region except for the region where the recess RC will be formed.

Figure 15B:
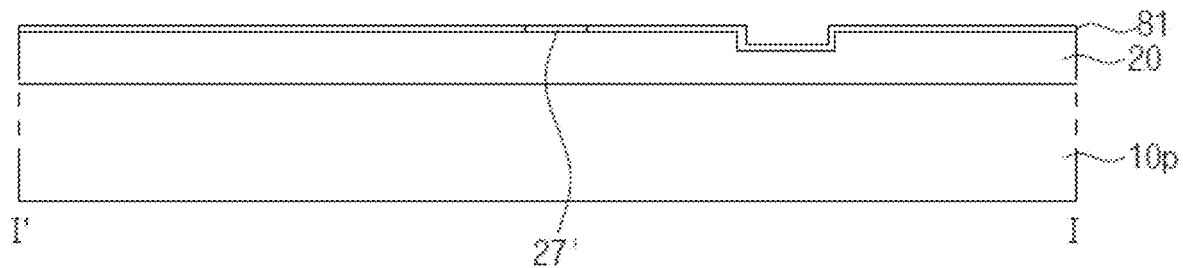

Referring to FIGS. 14 and 15B, the first insulating layer 81 is formed on the first epitaxial stack 20 where the mesa structure is formed, and the ohmic electrode 27' is formed on the p-type semiconductor layer.

The ohmic electrode 27' according to an exemplary embodiment may be formed through the following processes: forming an insulating layer on the first epitaxial stack 20 through deposition, coating a photoresist, patterning the photoresist through exposure and development, forming a contact hole through wet etching or dry etching by using the photoresist pattern as a mask, depositing an ohmic electrode layer on a front surface of the first epitaxial stack 20 on which the photoresist pattern is provided, and lifting off the photoresist pattern. In an exemplary embodiment, the ohmic electrode 27' may be formed by depositing at least one of AuBe and Au layers.

Figure 16:
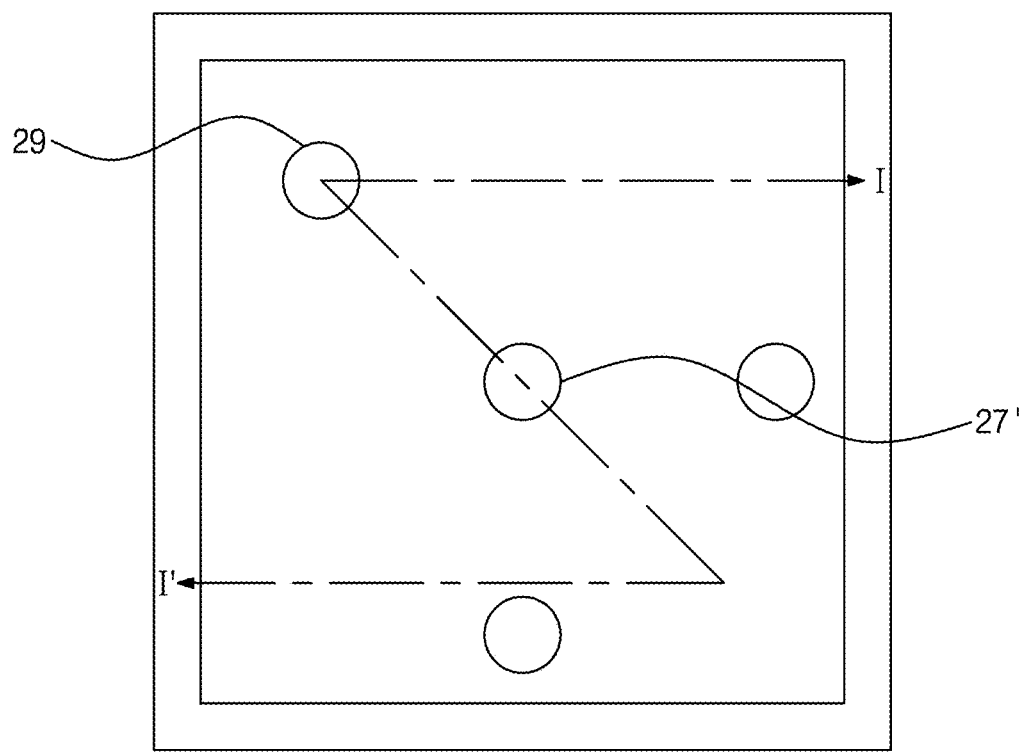
Figure 17:
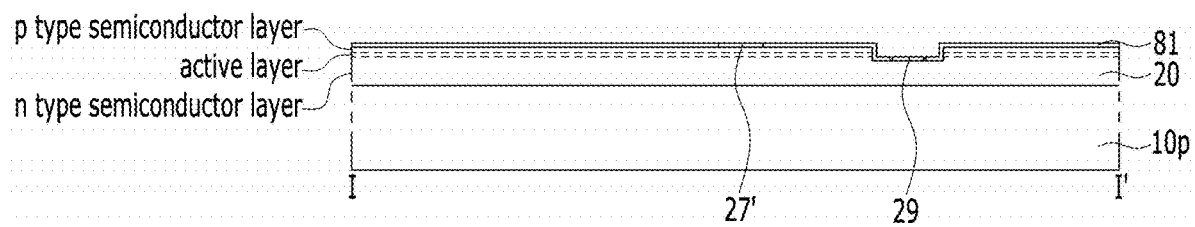

Referring to FIGS. 16 and 17, the first n-type contact electrode 29 is formed on the first insulating layer 81. The first n-type contact electrode 29 may be provided in the recess, and a diameter of the first n-type contact electrode 29 may be smaller than a diameter of the recess.

The first n-type contact electrode 29 according to an exemplary embodiment may be formed through the following processes: coating a photoresist, patterning the photoresist through exposure and development, forming a contact hole through wet etching or dry etching by using the photoresist pattern as a mask, depositing a material for the first n-type contact electrode 29 on a front surface of the first epitaxial stack 20 on which the photoresist pattern is provided, and lifting off the photoresist pattern. In an exemplary embodiment, the first n-type contact electrode 29 may be formed by depositing an AuGe layer.

Figure 18:
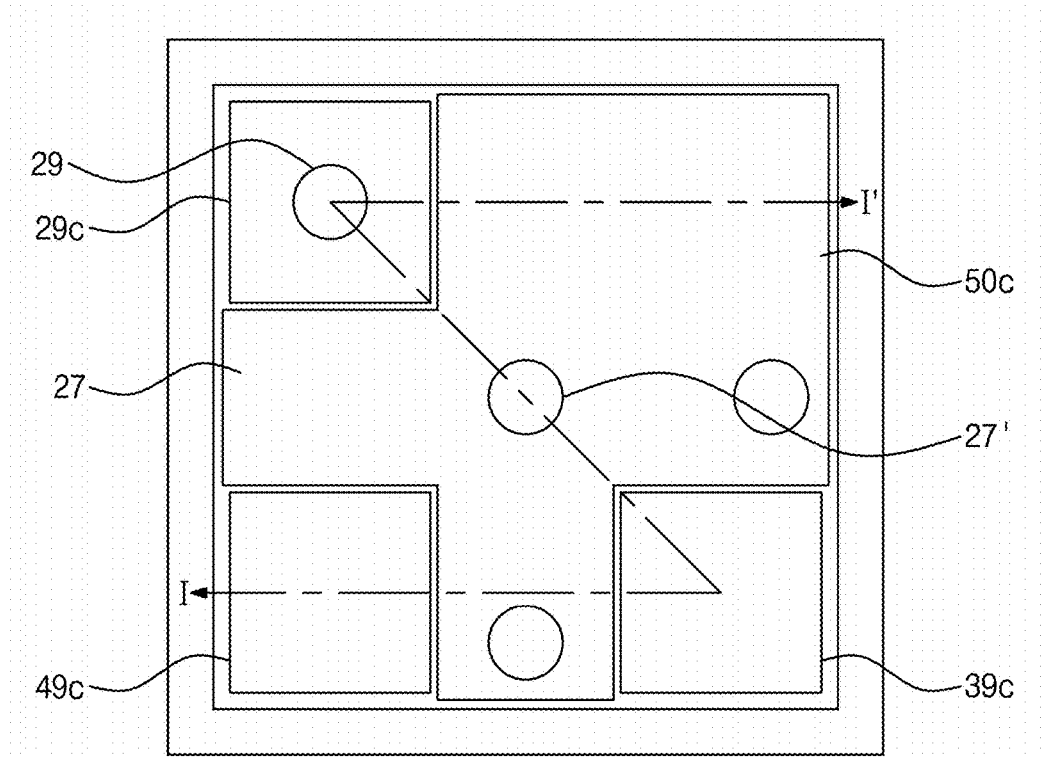
Figure 19A:
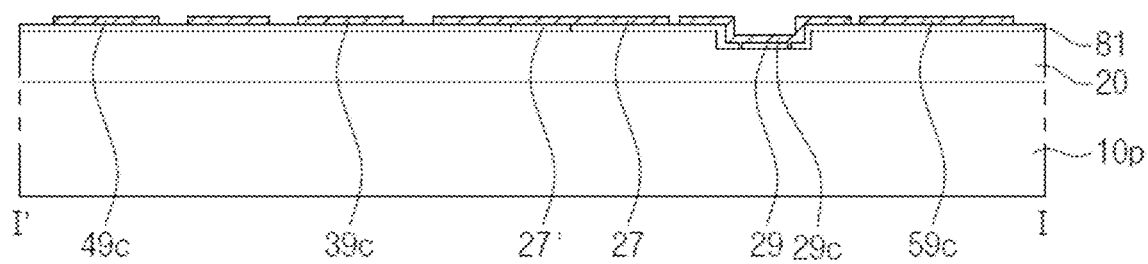

Referring to FIGS. 18 and 19A, the common pad electrode 59c, the first p-type contact electrode 27, and the first, second, and third pad electrodes 29c, 39c, and 49c are formed on the first insulating layer 81 in which the ohmic electrode 27' and the first n-type contact electrode 29 are formed. Here, the common pad electrode 59c and the first p-type contact electrode 27 may be integrally formed.

The common pad electrode 59c, the first p-type contact electrode 27, and the first, second, and third pad electrodes 29c, 39c, and 49c may be formed by depositing a conductive material and patterning the deposited conductive material by using photolithography, for example.

Figure 19B:
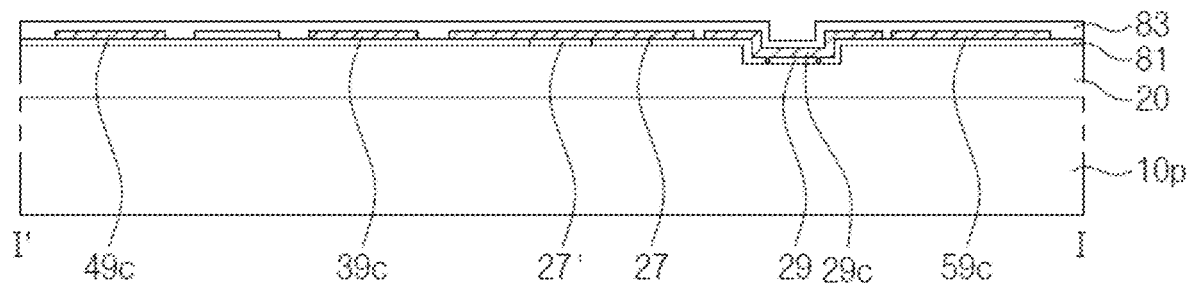

Referring to FIGS. 18 and 19B, the second insulating layer 83 is formed on the common pad electrode 59c, the first p-type contact electrode 27, and the first, second, and third pad electrodes 29c, 39c, and 49c. The second insulating layer 83 may be formed to have a thickness enough to compensate for a step between a recess and a protrusion. After the second insulating layer 83 is formed with a sufficient thickness, planarization may be performed to smooth a surface of the second insulating layer 83. The planarization may be performed by using CMP or the like.

Figure 20:
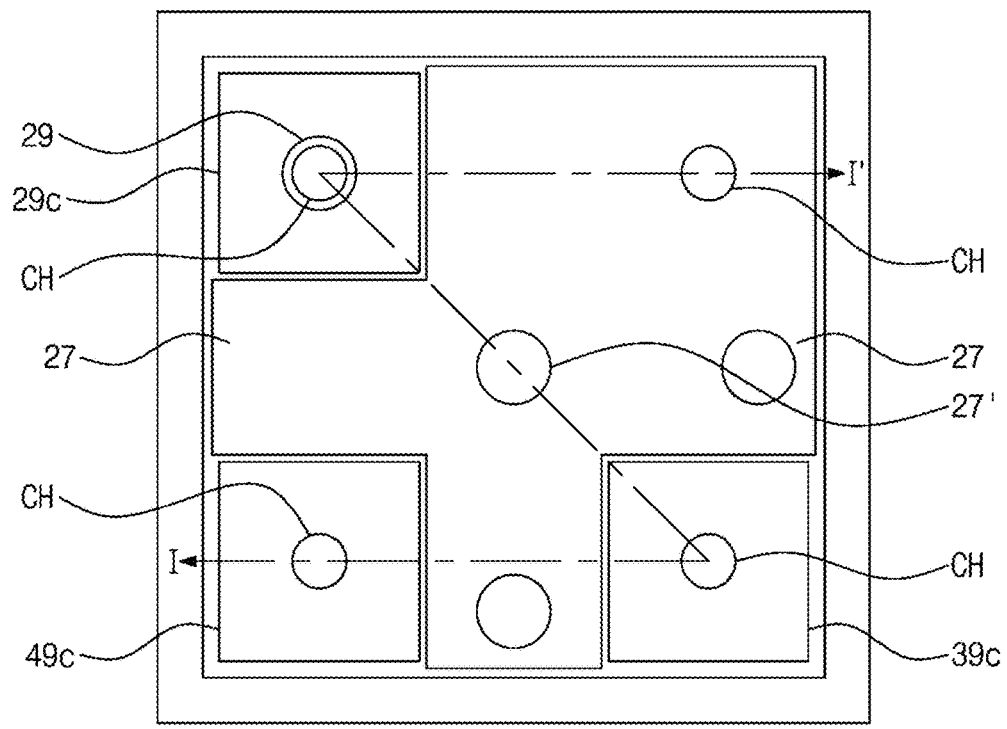
Figure 21:
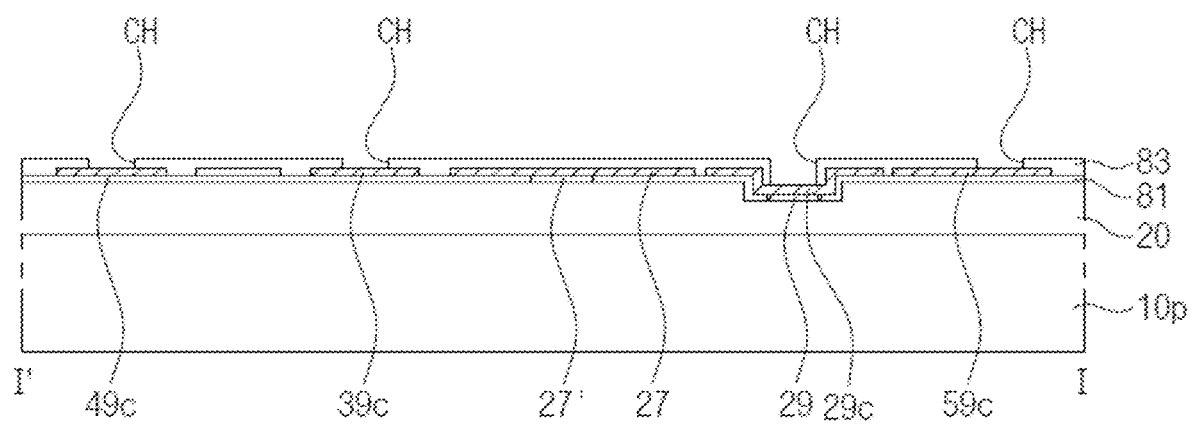

Referring to FIGS. 20 and 21, contact holes are respectively formed at the first, second, and third contact parts 20c, 30c, and 40c, and the common contact part 50c by patterning the second insulating layer 83. The contact holes formed at the first, second, and third contact parts 20c, 30c, and 40c, and the common contact part 50c expose portions of upper surfaces of the first, second, and third pad electrodes 29c, 39c, and 49c, and the common pad electrode 59c.

Figure 22:
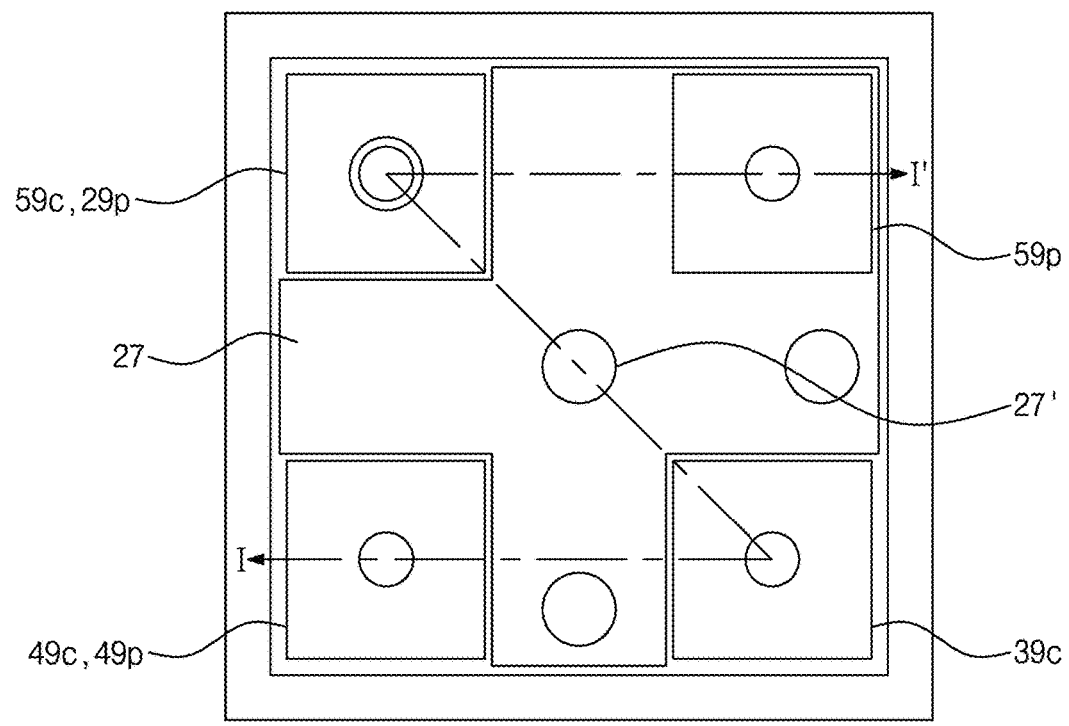
Figure 23:
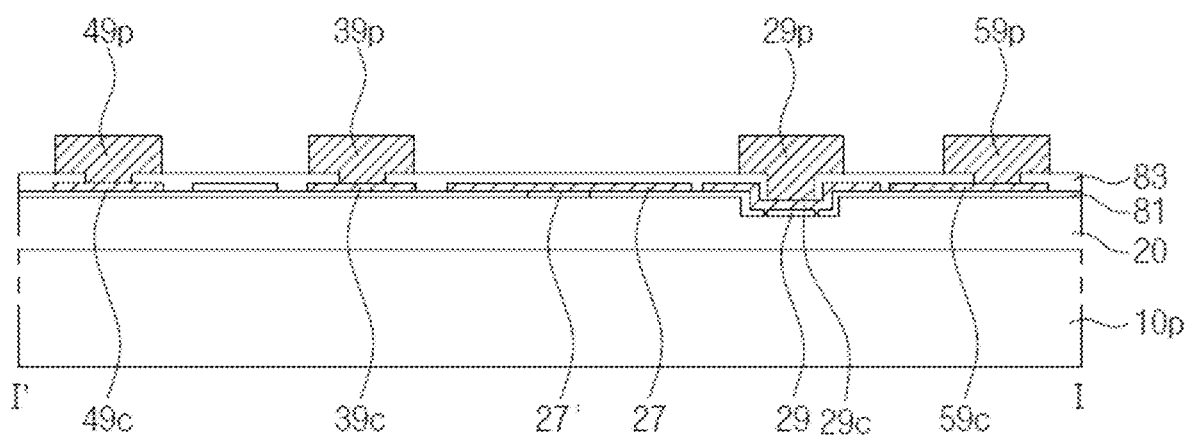

Referring to FIGS. 22 and 23, the common pad 59p and the first, second, and third pads 29p, 39p, and 49p are formed on the first epitaxial stack 20 on which the second insulating layer 83 is formed. In an exemplary embodiment, the common pad electrode 59c and the first, second, and third pad electrodes 29c, 39c, and 49c may be formed in a single process, and thus, may include substantially the same material on the same layer.

The common pad 59p and the first, second, and third pads 29p, 39p, and 49p may be provided in regions corresponding to the common contact part 50c and the first, second, and third contact parts 20c, 30c, and 40c, and may be formed to cover the regions corresponding to the common contact part 50c and the first, second, and third contact parts 20c, 30c, and 40c. As the common pad 59p and the first, second, and third pads 29p, 39p, and 49p are formed as wide as possible, heat generated from each epitaxial stack may be easily dissipated, and reduce the possibility of misalignment when bonded to the substrate. Also, since the first pad 29p is formed to be larger than the region where the recess is formed, a defect in adhesion due to a step of the recess may be prevented.

The common pad 59p and the first, second, and third pads 29p, 39p, and 49p may be formed of a conductive material, and may include, for example, various metals, such as Al, Ti, Cr, Ni, Au, Ag, Ti, Sn, Ni, Cr, W, and Cu, or an alloy thereof. Also, the common pad 59p and the first, second, and third pads 29p, 39p, and 49p may be formed in a single layer or a multi-layer. When the common pad 59p and the first, second, and third pads 29p, 39p, and 49p are formed as a multi-layer, a barrier metal layer may be added to prevent a particular metal from being diffused. In an exemplary embodiment, the common pad 59p and the first, second, and third pads 29p, 39p, and 49p may be formed of AuSn, and a barrier layer including Cr, Ti, Ni, W, or an alloy thereof may be added between the pads 59p, 29p, 39p, and 49p, and the electrodes 50c, 29c, 39c, and 49c to prevent diffusion of Sn.

Figure 24:
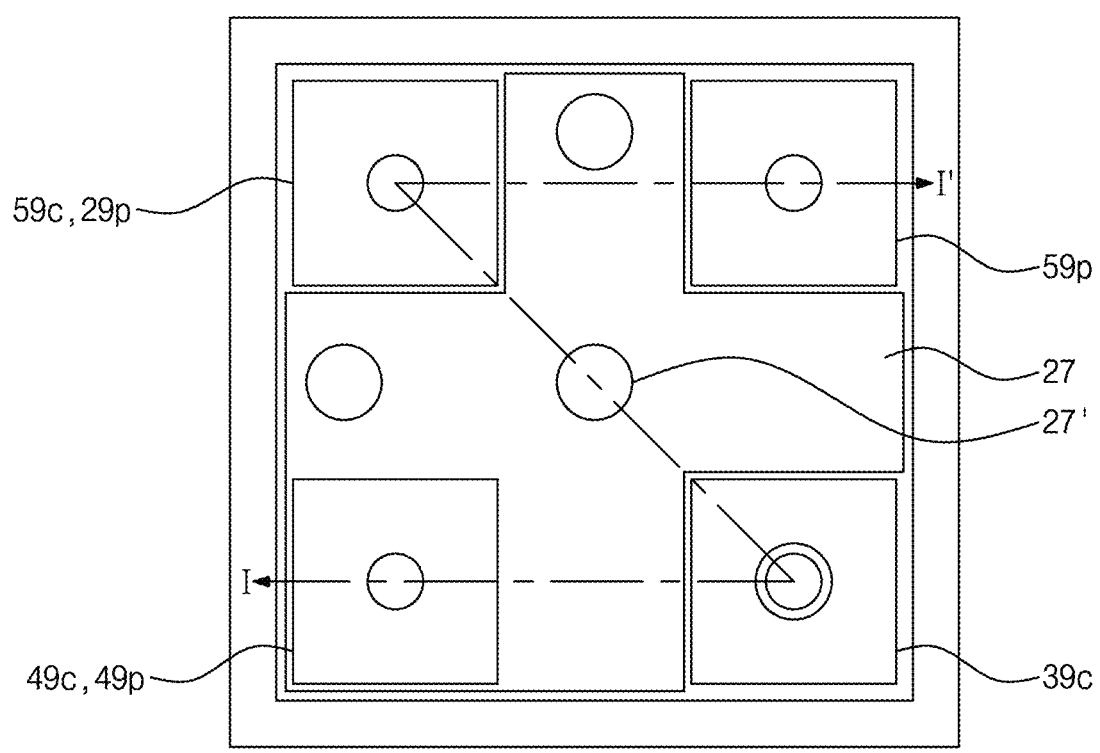
Figure 25A:
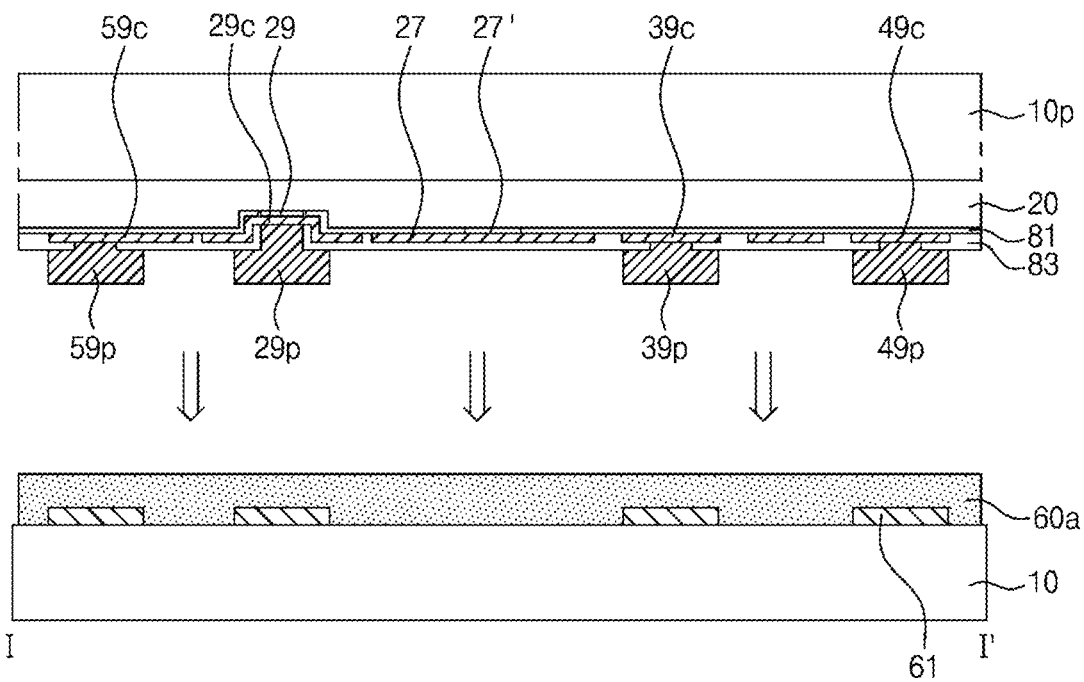
Figure 25B:
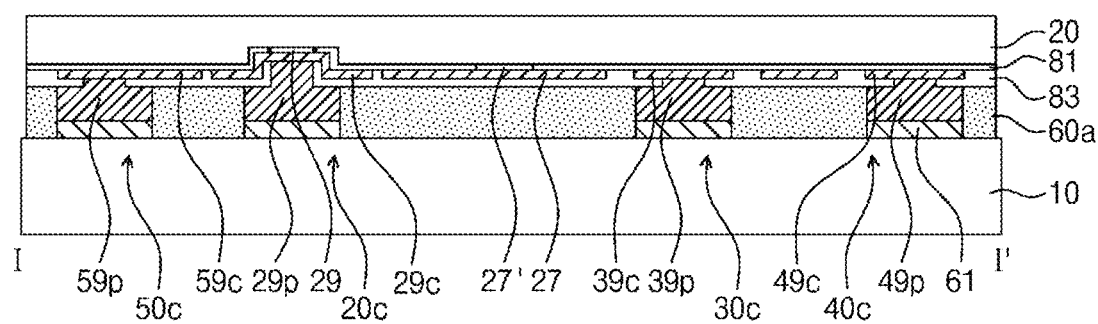

Referring to FIGS. 24, 25A, and 25B, the first epitaxial stack 20 formed on the first temporary substrate 10p may be inverted and attached on the substrate 10, on which the first adhesive layer 60a is formed. As such, layers of the first epitaxial stack 20 are disposed on the upper surface of the substrate 10, in the order of a p-type semiconductor layer, an active layer, and an n-type semiconductor layer.

The conductive adhesive layers 61 are formed at regions of the substrate 10 to correspond to the common pad 59p and the first, second, and third pads 29p, 39p, and 49p. The first temporary substrate 10p may be pressed in the lower direction from the top after aligning the common pad 59p and the first, second, and third pads 29p, 39p, and 49p to the first temporary substrate 10p to face the conductive adhesive layers 61, as shown in FIG. 25B.

Figure 26:
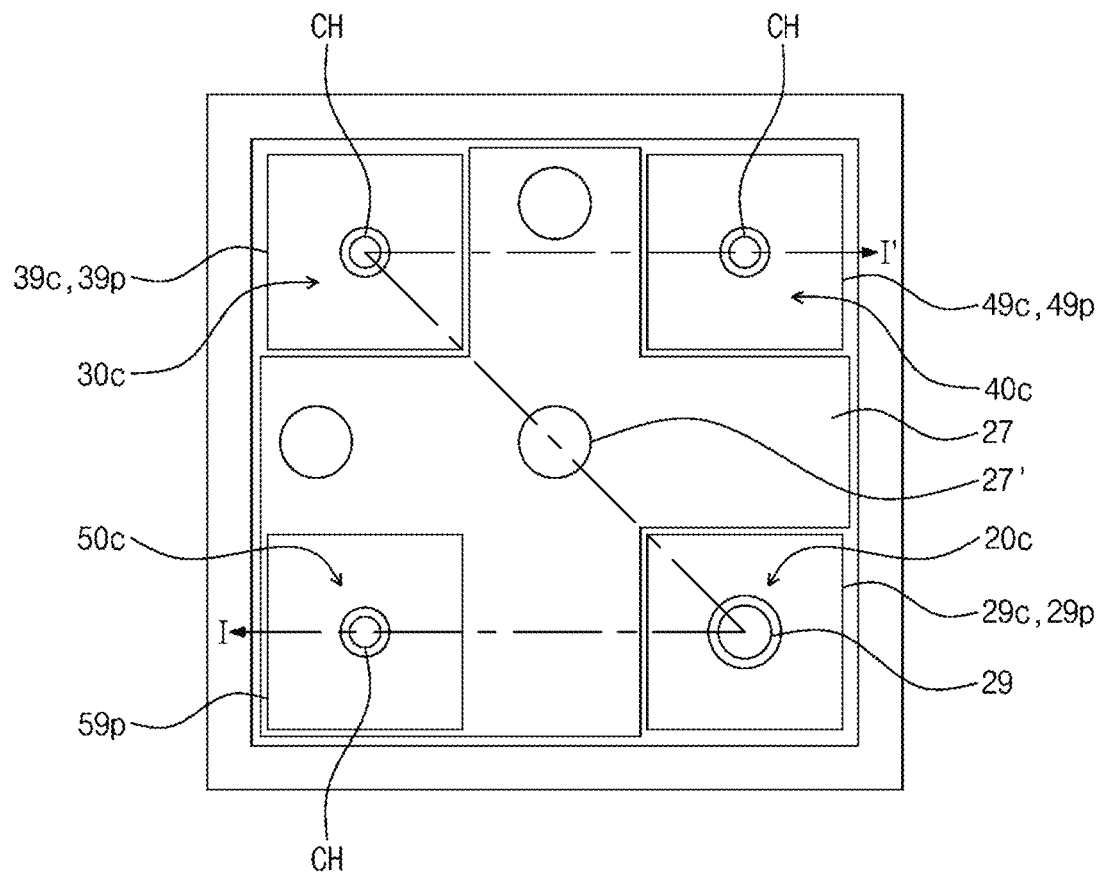
Figure 27A:
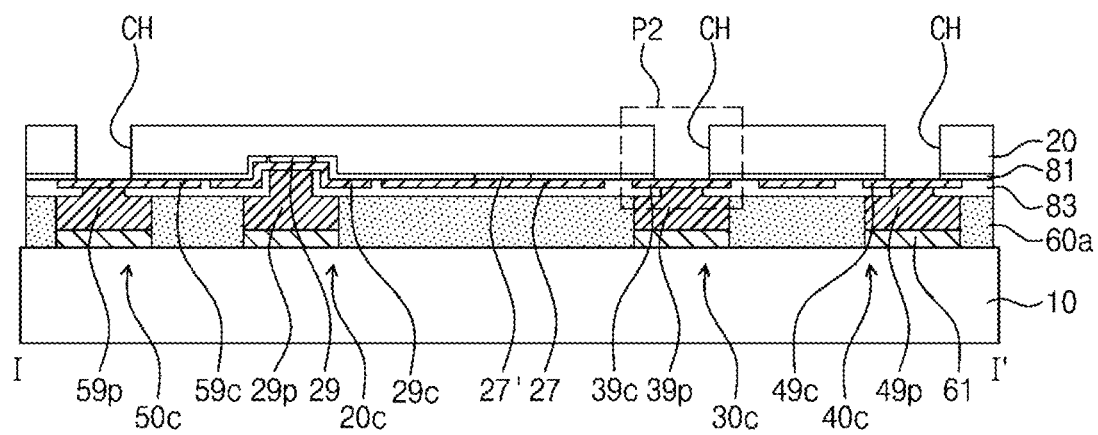

Referring to FIGS. 26 and 27A, contact holes are formed by removing portions of the first epitaxial stack 20 and the first insulating layer 81. Contact holes are respectively formed at the common contact part 50c and the second and third contact parts 30c and 40c, and thus, portions of upper surfaces of the common pad electrode 59c and the second and third pad electrodes 39c and 49c are exposed.

Figure 27B:
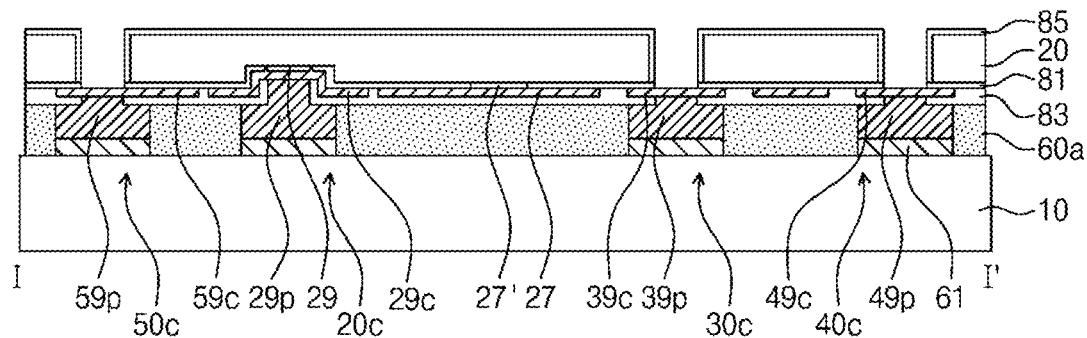

Referring to FIGS. 26 and 27B, the third insulating layer 85 is formed on the first epitaxial stack 20. The third insulating layer 85 is formed on an upper surface of the first epitaxial stack 20 and side surfaces of the contact holes, and thus, portions of upper surfaces of the common pad electrode 59c and the second and third pad electrodes 39c and 49c remain exposed.

The third insulating layer 85 may be formed by forming a layer including an insulating material on an upper surface of the first epitaxial stack 20, and anisotropically etching the interior of the contact holes by using photolithography.

Although the contact holes formed in the first epitaxial stack 20 are illustrated as having a sufficient diameter, however, an actual diameter of each contact hole may be very small, which makes forming the third insulating layer 85 only on an inner side surface of each contact hole difficult when the third insulating layer 85 is formed to have a sufficient thickness on the upper surface of the first epitaxial stack 20. In some exemplary embodiments, a process of forming an additional sub-insulating layer may be used to make it easier to form the third insulating layer 85 on an inner side surface of each contact hole, as described in more detail below.

FIGS. 34A to 34D are enlarged cross-sectional views illustrating a portion corresponding to P2 of FIG. 27A, which sequentially show a process of forming the third insulating layer 85 in a contact hole, according to another exemplary embodiment. It is noted that the process of forming an insulating layer in a contact hole shown in FIGS. 34A to 34C may be applied to forming an insulating layer in a contact hole for any other epitaxial layer.

Figure 34A:
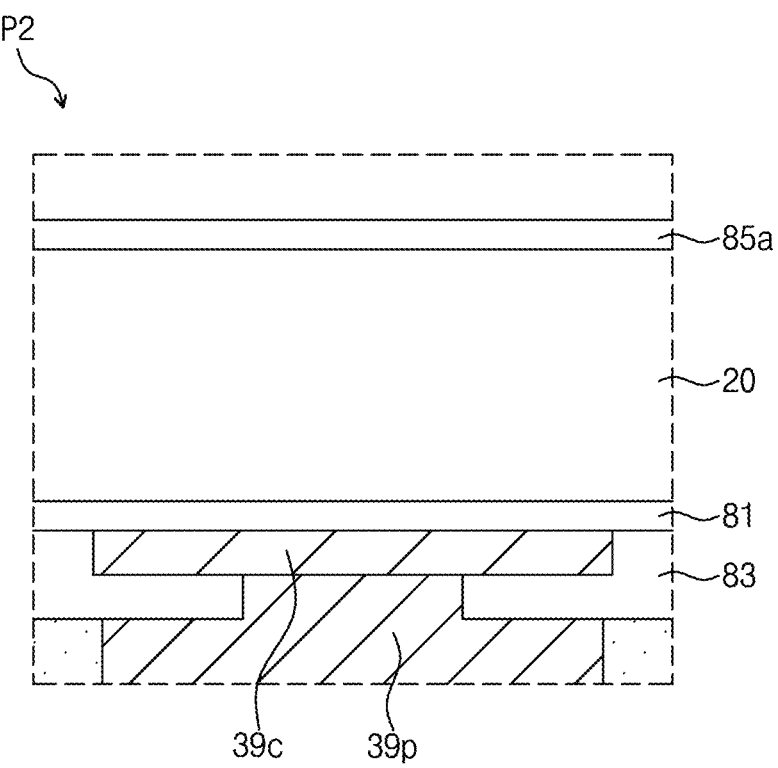
FIGS. 34A to 34D are enlarged sectional views illustrating a portion corresponding to P2 of FIG. 27A.
Figure 34B:
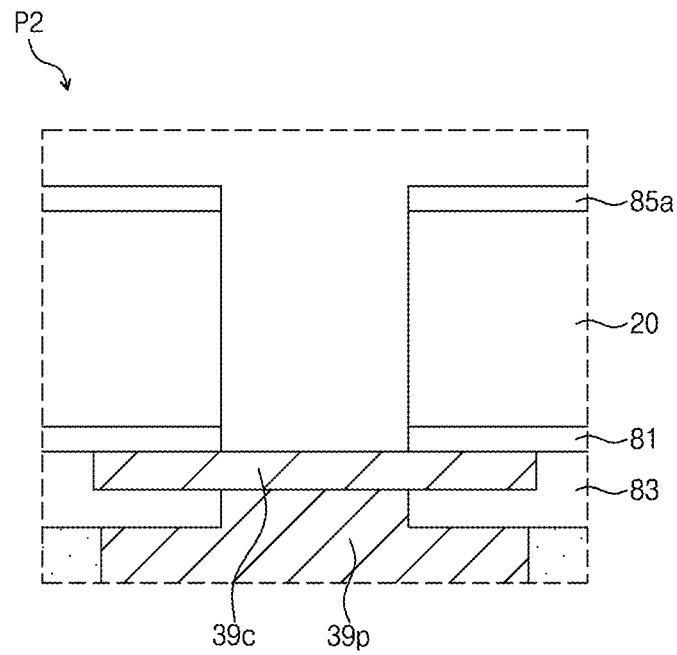
Figure 34C:
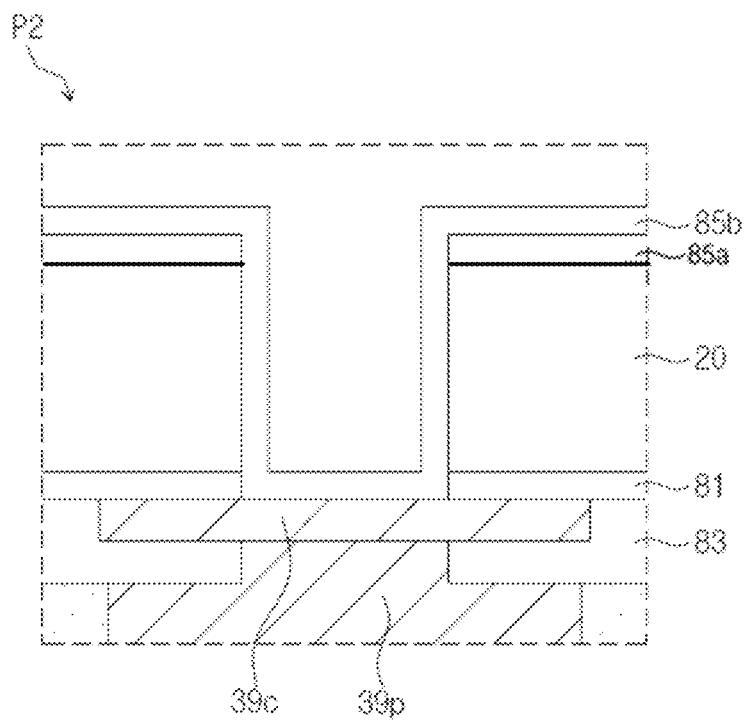
Figure 34D:
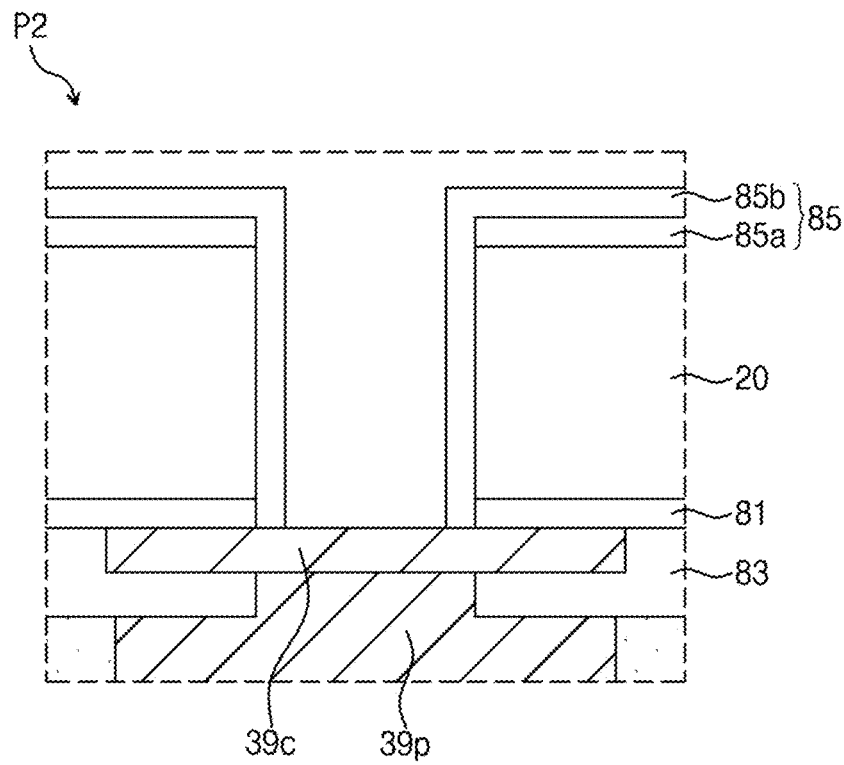

Referring to FIG. 34A, a first sub-insulating layer 85a is formed on an upper surface of the first epitaxial stack 20 before forming a contact hole. Referring to FIG. 34B, an upper surface of the second pad electrode 39c is exposed by etching the first sub-insulating layer 85a and the first epitaxial stack 20. Referring to FIG. 34C, a second sub-insulating layer 85b is formed on the first epitaxial stack 20 and the first sub-insulating layer 85a where the contact hole is formed. Referring to FIG. 34D, the upper surface of the second pad electrode 39c is exposed again by etching the second sub-insulating layer 85b. As such, only the second sub-insulating layer 85b is formed on an inner side surface of the contact hole, and the first and second sub-insulating layers 85a and 85b are formed on the upper surface of the first epitaxial stack 20. In the manner, since a thickness of a final insulating layer 85 provided on the upper surface of the first epitaxial stack 20 is greater than a thickness of an insulating layer provided on an inner side surface of a contact hole, it is possible to form an insulating layer that is thin enough to cover the inner side surface of the contact hole, while having a sufficient thickness on the upper surface of the first epitaxial stack 20.

Referring back to FIG. 27B, an upper surface of the first epitaxial stack 20 and an inner side surface of a contact hole are covered by the third insulating layer 85 as described above.

Figure 28:
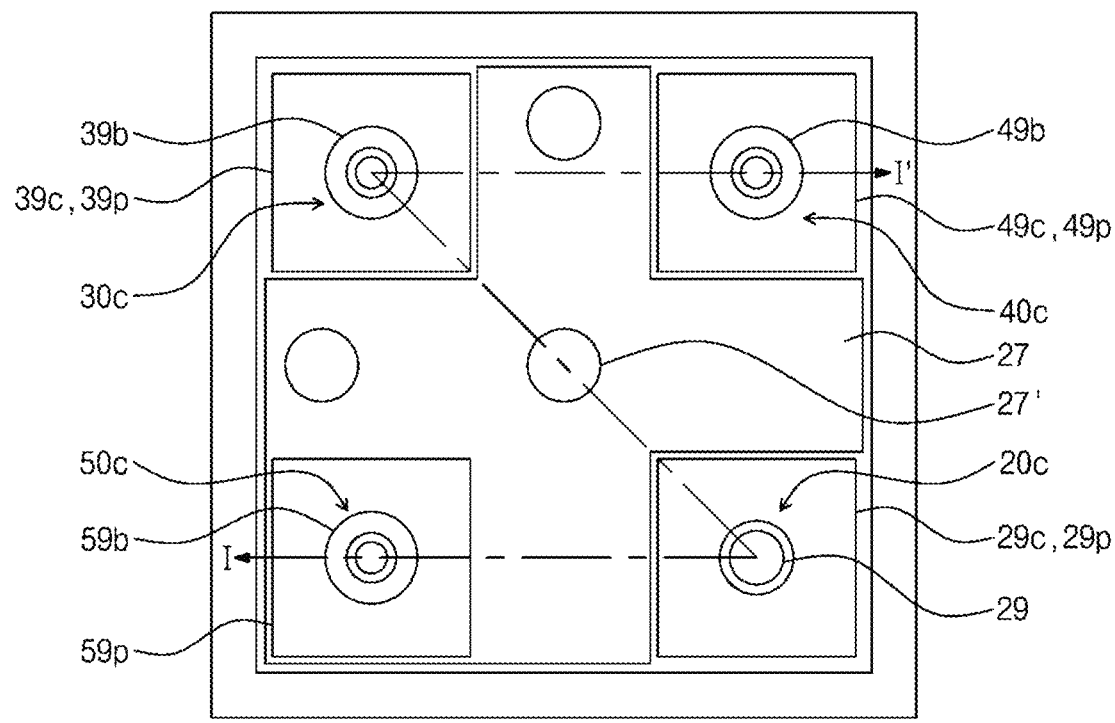
Figure 29:
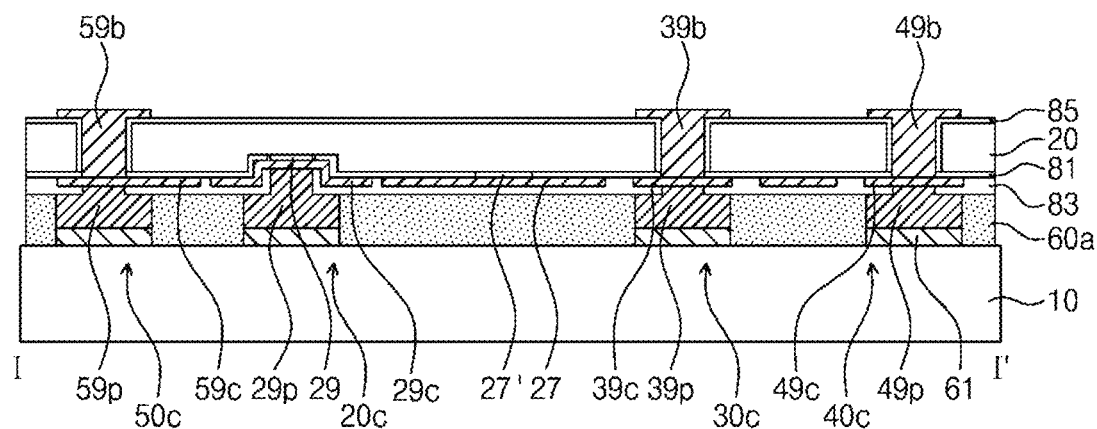

Referring to FIGS. 28 and 29, the common bridge electrode 59b and the second and third bridge electrodes 39b and 49b are formed on the first epitaxial stack 20, on which the third insulating layer 85 is formed. The common bridge electrode 59b is connected with the common pad electrode 59c through the contact hole, the second bridge electrode 39b is connected with the second pad electrode 39c through the contact hole, and the third bridge electrode 49b is connected with the third pad electrode 49c through the contact hole.

Figure 30:
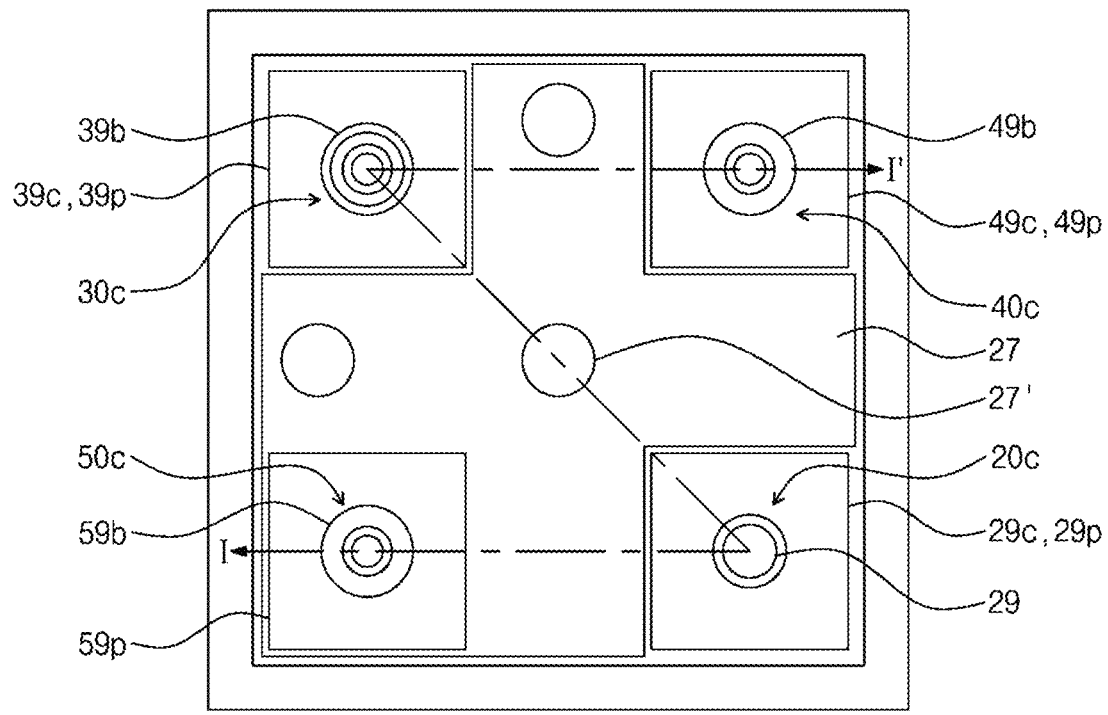
Figure 31A:
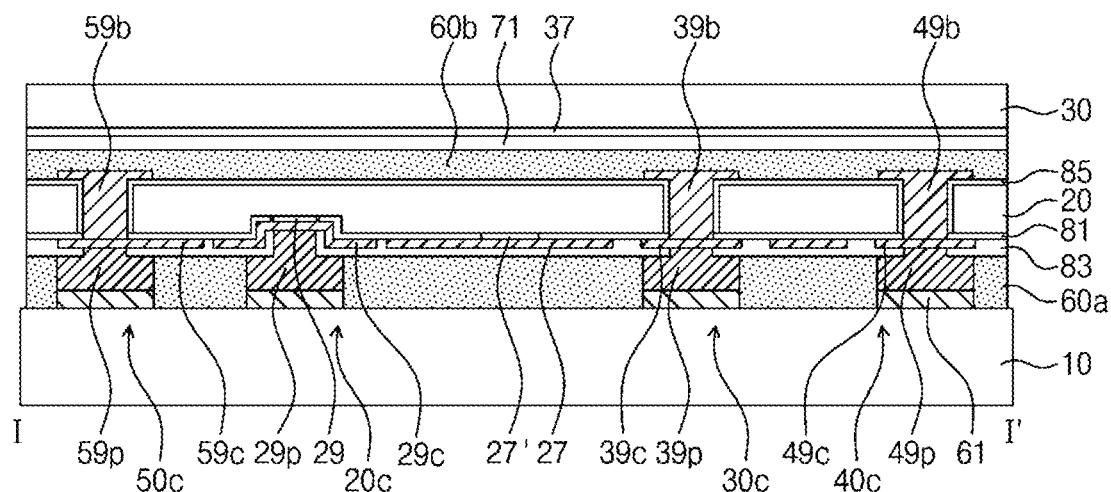

Referring to FIGS. 30 and 31A, the second epitaxial stack 30 is formed on a second temporary substrate, and the second epitaxial stack 30 may be inverted and attached on the first epitaxial stack 20 with the second adhesive layer 60b interposed therebetween. According to an exemplary embodiment, the second p-type contact electrode 37 and the first wavelength pass filter 71 may be formed between the second adhesive layer 60b and the second epitaxial stack 30. The second temporary substrate may be removed after the second epitaxial stack 30 is attached on the first epitaxial stack 20. The second temporary substrate may be removed through various methods. For example, when the second temporary substrate is a sapphire substrate, the sapphire substrate may be removed by a laser lift-off method, a stress lift-off method, a mechanical lift-off method, a physical polishing method, etc.

In some exemplary embodiments, after the second temporary substrate is removed, the concavo-convex portion PR may be formed on an upper surface (or on an n-type semiconductor layer) of the second epitaxial stack 30. The concavo-convex portion PR may be formed through texturing using various etching processes. Alternatively, the concavo-convex portion PR may be formed by using a patterned sapphire substrate with concavo-convex portion as a temporary substrate. When the patterned sapphire substrate is removed from corresponding epitaxial stack, the concavo-convex portion on the patterned sapphire substrate is transferred to the corresponding epitaxial stack. In some exemplary embodiments, a concavo-convex portion may be formed through various other methods, such as dry etching using a micro photo process, wet etching using a crystalline property, texturing using a physical method such as sand-blast, ion beam etching, and texturing using an etching speed difference of block copolymer.

Figure 31B:
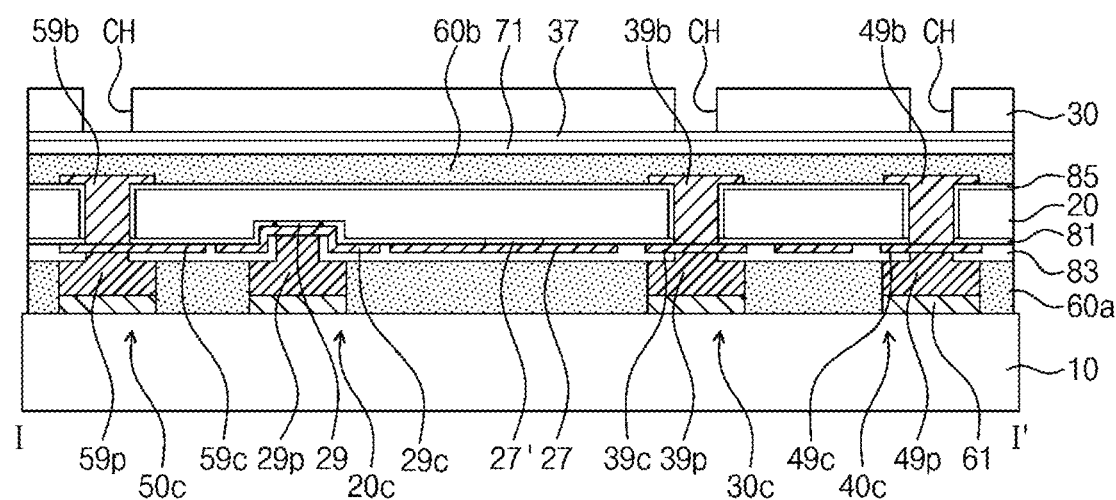

Referring to FIGS. 30 and 31B, contact holes are formed by removing portions of the second epitaxial stack 30. The contact holes are respectively formed at the common contact part 50c and the second and third contact parts 30c and 40c, and thus, portions of an upper surface of the second p-type contact electrode 37 are exposed. The second p-type contact electrode 37 may be formed with a sufficient thickness and function as an etch stopper.

Figure 31C:
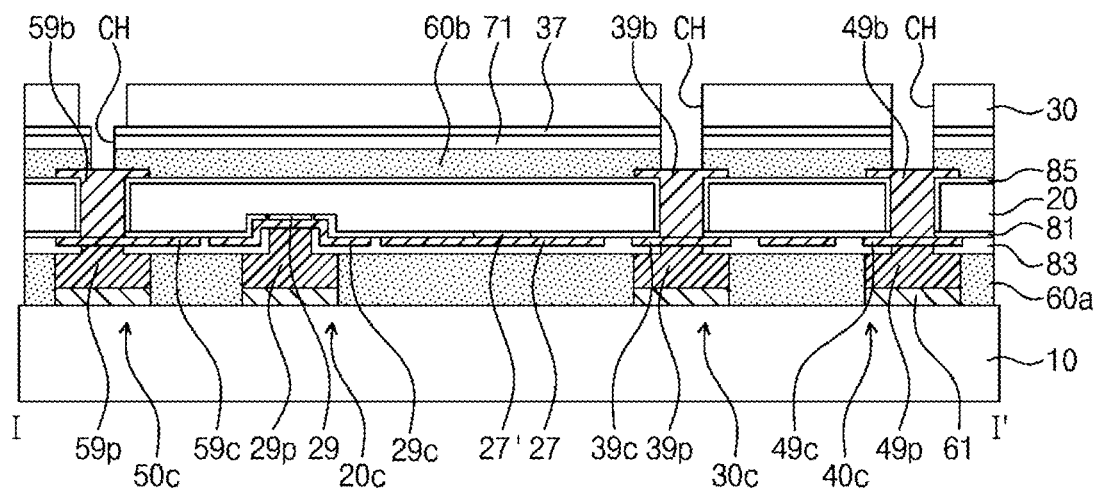

Referring to FIGS. 30 and 31C, additional contact holes are formed in the contact holes by removing portions of the second p-type contact electrode 37, the first wavelength pass filter 71, and the second adhesive layer 60b that correspond to the common contact part 50c and the second and third contact parts 30c and 40c. Portions of upper surfaces of the common bridge electrode 59b, the second bridge electrode 39b, and the third bridge electrode 49b are exposed by the contact holes.

In this case, the additional contact hole formed at the common contact part 50c may have a diameter smaller than the contact hole formed in the second epitaxial stack 30. More particularly, assuming that a contact hole formed by removing a portion of the second epitaxial stack 30 is referred to as an "upper contact hole" and a contact hole formed by removing portions of the second p-type contact electrode 37, the first wavelength pass filter 71, and the second adhesive layer 60b is referred to as a "lower contact hole", a diameter of the upper contact hole is greater than a diameter of the lower contact hole. As such, after contact holes are formed, an upper surface of the second p-type contact electrode 37 is exposed due to a greater diameter of the upper contact hole.

Figure 31D:
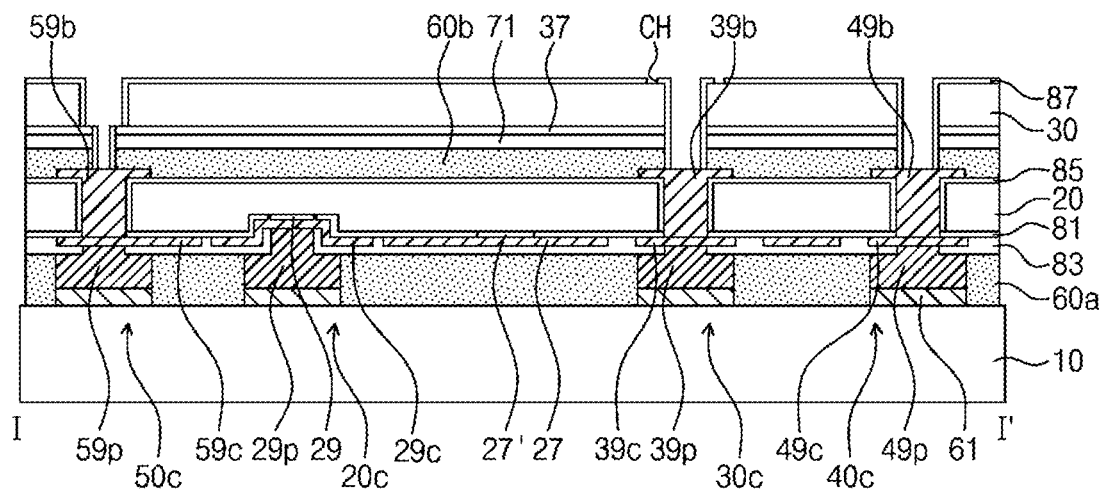

Referring to FIGS. 30 and 31D, the fourth insulating layer 87 is formed on the second epitaxial stack 30 in which the contact holes are formed. The fourth insulating layer 87 is formed to cover an upper surface of the second epitaxial stack 30 and a side surface of each contact hole.

The fourth insulating layer 87 is etched to expose portions of upper surfaces of the common bridge electrode 59b, the second bridge electrode 39b, and the third bridge electrode 49b. In addition, a contact hole is formed in the fourth insulating layer 87 to exposes a portion of an upper surface of the second epitaxial stack 30 that corresponds to the second contact part 30c.

Figure 31E:
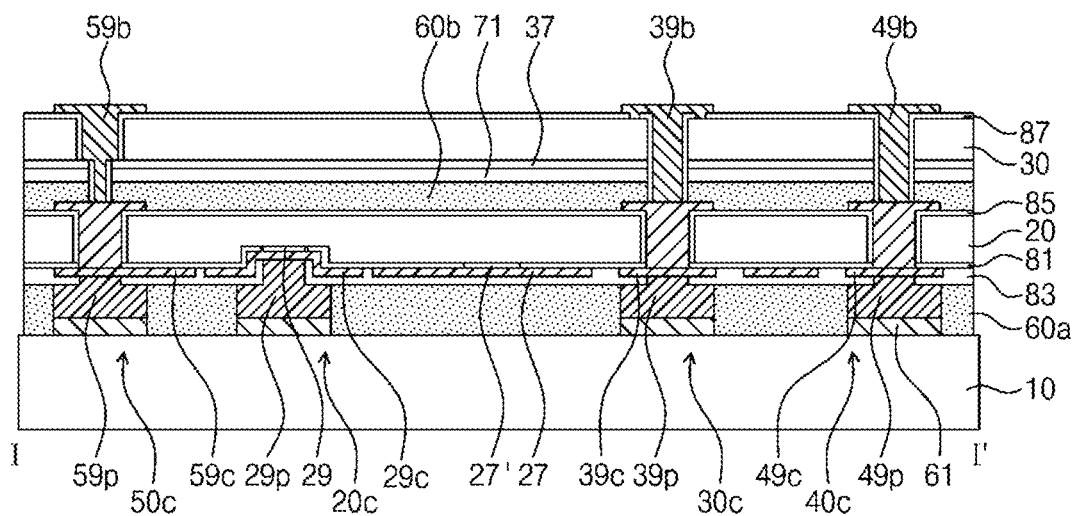

Referring to FIGS. 30 and 31E, the common bridge electrode 59b, the second bridge electrode 39b, and the third bridge electrode 49b are formed on the second epitaxial stack 30 on which the fourth insulating layer 87 is formed. The common bridge electrode 59b may directly contact the exposed second p-type contact electrode 37. Also, the second bridge electrode 39b is formed to cover a contact hole in the fourth insulating layer 87 that exposes a portion of an upper surface of the second epitaxial stack 30 at a region corresponding to the second contact part 30c. In this manner, the second bridge electrode 39b may directly contact the upper surface of the second epitaxial stack 30.

Figure 32:
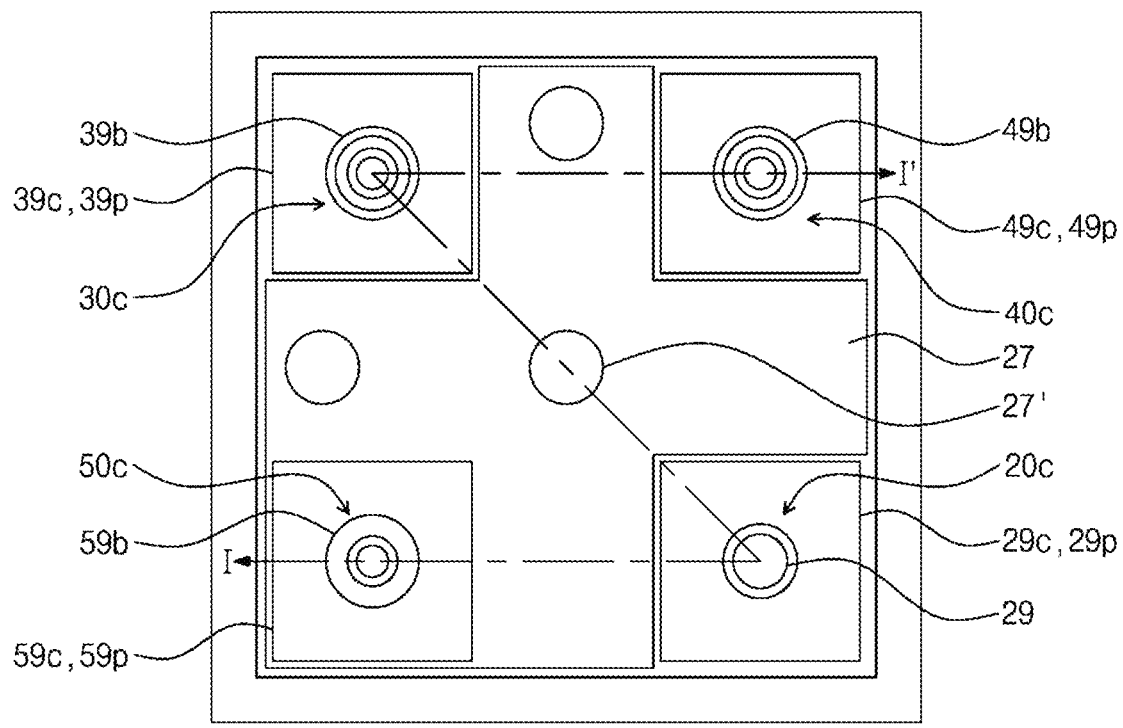
Figure 33A:
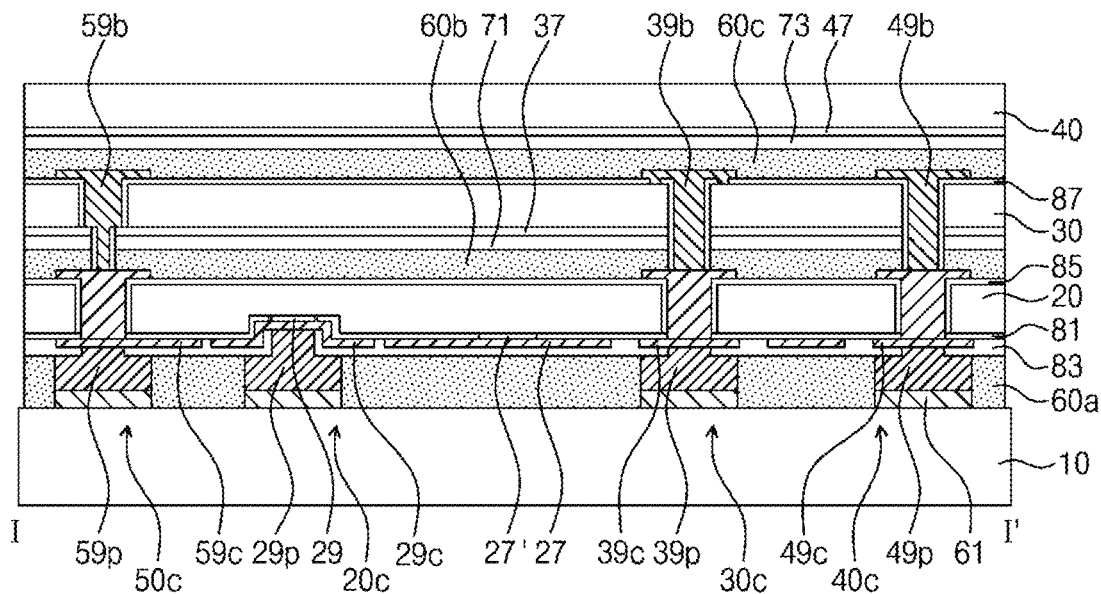

Referring to FIGS. 32 and 33A, the third epitaxial stack 40 is formed on a third temporary substrate, and the third epitaxial stack 40 may be inverted and attached on the second epitaxial stack 30 with the third adhesive layer 60c interposed therebetween. According to an exemplary embodiment, the third p-type contact electrode 47 and the second wavelength pass filter 73 may be formed between the third epitaxial stack 40 and the third adhesive layer 60c. The third temporary substrate may be removed after the third epitaxial stack 40 is attached on the second epitaxial stack 30. The third temporary substrate may be removed through substantially the same process for removing the second temporary substrate described above.

In some exemplary embodiments, after the third temporary substrate is removed, the concavo-convex portion PR may be formed on an upper surface (or on an n-type semiconductor layer) of the third epitaxial stack 40.

Figure 33B:
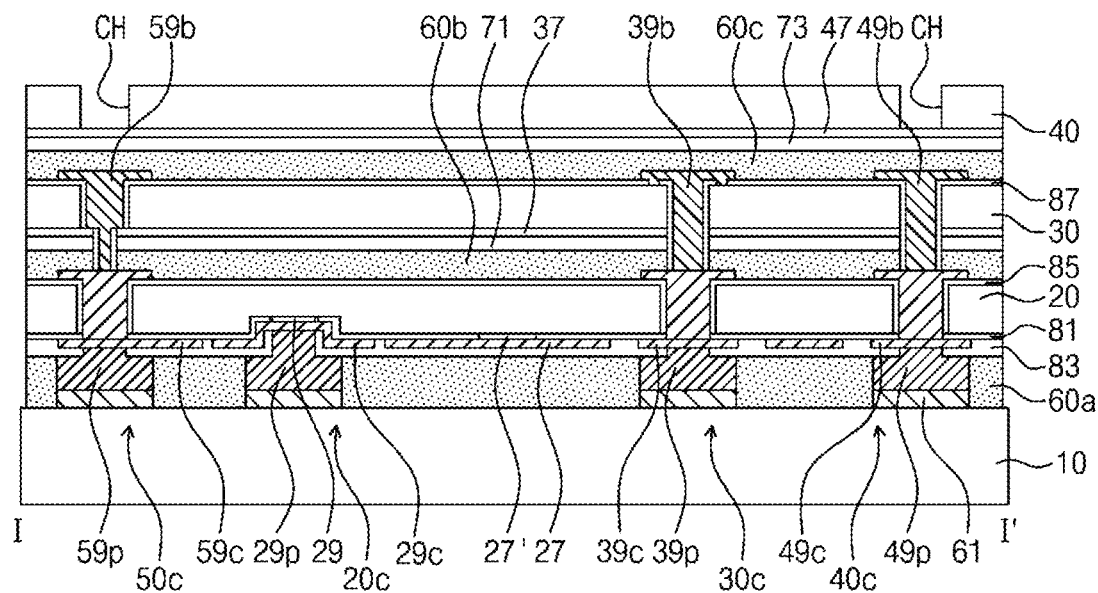

Referring to FIGS. 32 and 33B, contact holes are formed in the third epitaxial stack 40 by removing portions of the third epitaxial stack 40. The contact holes are respectively formed at the common contact part 50c and the third contact part 40c, and thus, portions of an upper surface of the third p-type contact electrode 47 are exposed. The third p-type contact electrode 47 may be formed with a sufficient thickness and function as an etch stopper.

Figure 33C:
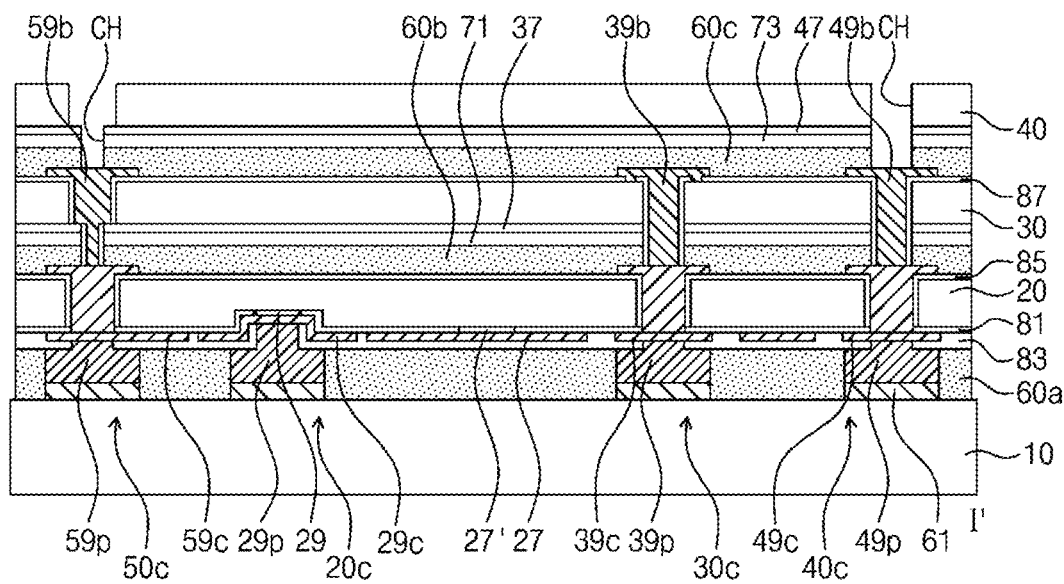

Referring to FIGS. 32 and 33C, contact holes are formed in the third p-type contact electrode 47, the second wavelength pass filter 73, and the third adhesive layer 60c by removing regions that correspond to the common contact part 50c and the third contact part 40c. As such, portions of upper surfaces of the common bridge electrode 59b, the second bridge electrode 39b, and the third bridge electrode 49b are exposed by the contact holes.

The contact hole formed in the third p-type contact electrode 47, the second wavelength pass filter 73, and the third adhesive layer 60c of the common contact part 50c has a diameter smaller a contact hole formed in the third epitaxial stack 40. As such, after contact holes are formed, an upper surface of the third p-type contact electrode 47 is exposed due to a greater diameter of the upper contact hole.

Figure 33D:
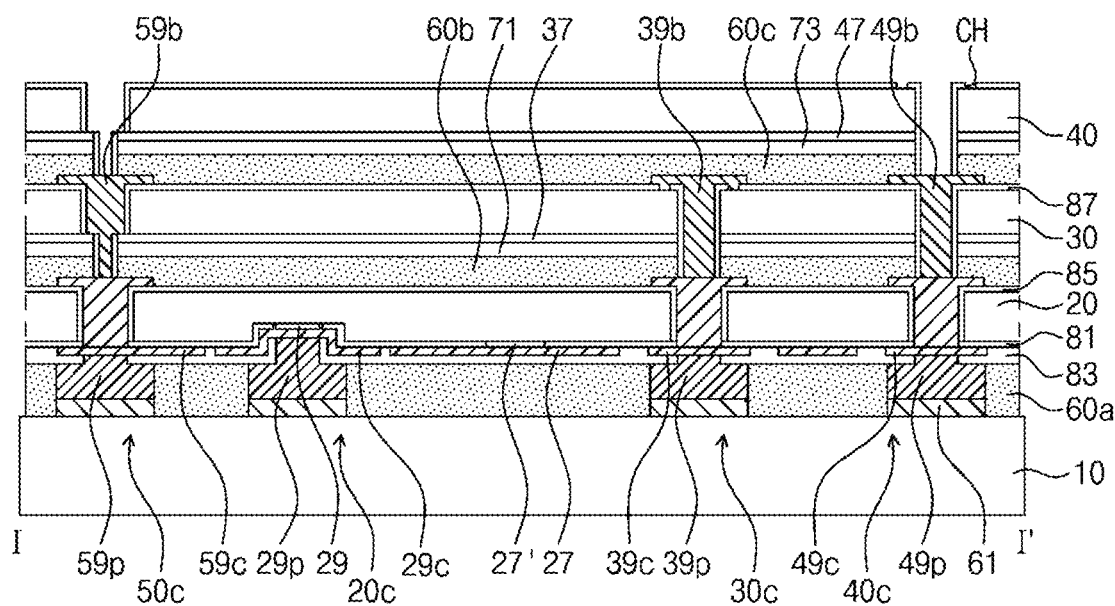

Referring to FIGS. 32 and 33D, the fifth insulating layer 89 is formed on the third epitaxial stack 40 in which the contact holes are formed. The fifth insulating layer 89 is formed to cover an upper surface of the third epitaxial stack 40 and a side surface of each contact hole.

The fifth insulating layer 89 is etched to expose portions of upper surfaces of the common bridge electrode 59b, the second bridge electrode 39b, and the third bridge electrode 49b. A contact hole is formed in the fifth insulating layer 89 to expose a portion of an upper surface of the third epitaxial stack 40 in a region corresponding to the third contact part 40c.

Figure 33E:
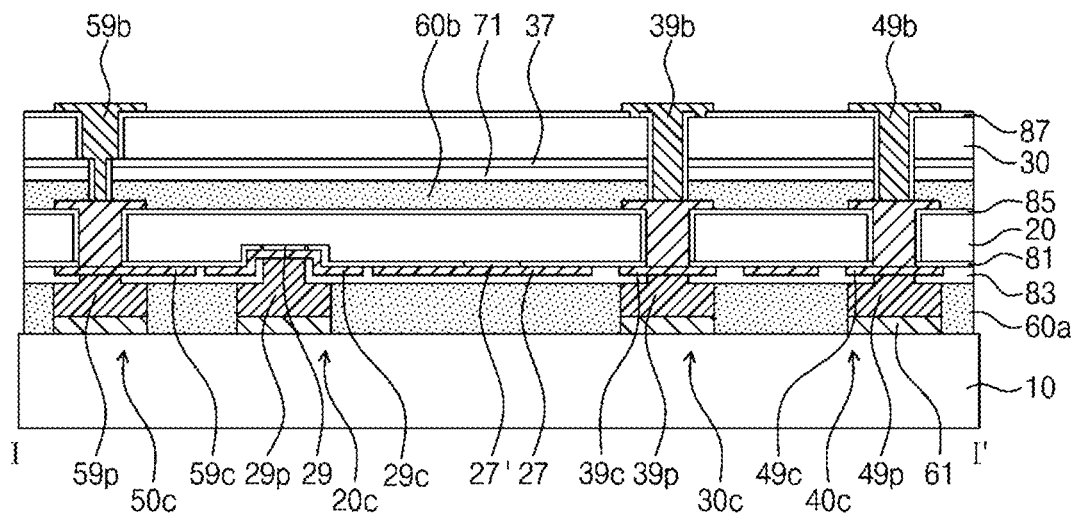

Referring to FIGS. 32 and 33E, the common bridge electrode 59b, the second bridge electrode 39b, and the third bridge electrode 49b are formed on the third epitaxial stack 40 on which the fifth insulating layer 89 is formed. The common bridge electrode 59b may directly contact the exposed third p-type contact electrode 47. Also, the third bridge electrode 49b is formed to cover a contact hole exposing a portion of an upper surface of the third epitaxial stack 40 at a region corresponding to the third contact part 40c, and thus, the third bridge electrode 49b may directly contact the upper surface of the third epitaxial stack 40.

In some exemplary embodiments, the fifth insulating layer 89 may be provided on a side surface of the light emitting stacked structure, and an additional light-opaque layer may be further provided in addition to the fifth insulating layer 89. The light-opaque layer may be a light blocking layer for preventing lights from the first, second, and third epitaxial stacks 20, 30, and 40 from being output through sides of the light emitting stacked structure, and thus, may include a material that absorbs or reflects light. The light-opaque layer may be formed by depositing two insulating layers of different refractive indices. For example, the light-opaque layer may be formed by stacking a material of a low refractive index and a material of a high refractive index sequentially or by stacking insulating layers of different refractive indices. Materials of different refractive indices are not specifically limited, and may include, for example, $SiO_2$ and $SiN_x$.

As described above, according to an exemplary embodiment, it is possible to simultaneously form a wire part and a contact at a plurality of epitaxial stacks after sequentially stacking the plurality of epitaxial stacks.

Figure 35:
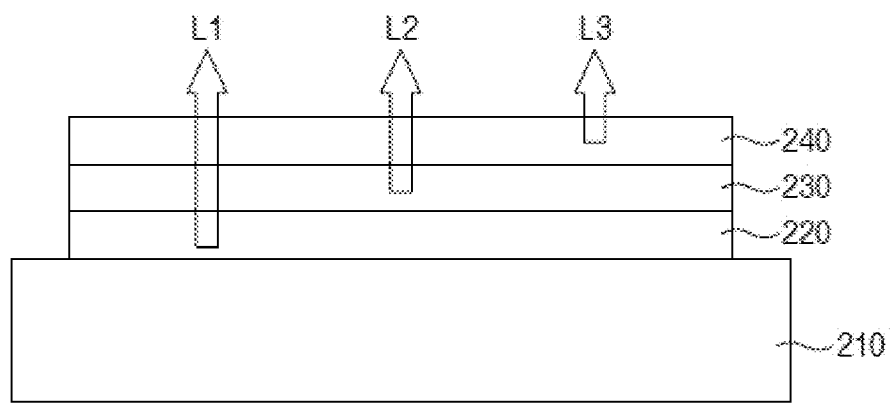
FIG. 35 is a schematic cross-sectional view of a light emitting stacked structure according to an exemplary embodiment.

FIG. 35 is a schematic cross-sectional view of a light emitting stacked structure according to an exemplary embodiment.

Referring to FIG. 35, a light emitting stacked structure according to an exemplary embodiment a plurality of epitaxial stacks, which are sequentially stacked. The epitaxial stacks are disposed a substrate 200, which has substantially a plate shape having a front surface and a back surface.

A plurality of epitaxial stacks may be mounted on the front surface of the substrate 200, and the substrate 200 may be provided in various forms. The substrate 200 may be formed of an insulating material. The material of the substrate 200 may include glass, quartz, organic polymer, organic/inorganic composite, etc. However, the inventive concepts are not limited to a particular material of the substrate 200. For example, the substrate 200 may include various materials as long as it has an insulating property. In an exemplary embodiment, a wire part which may provide a light emitting signal and a common voltage to each epitaxial stack may be further disposed on the substrate 200. In particular, when each epitaxial stack is driven in an active matrix manner, a driving element including a thin film transistor may be further disposed on the substrate 200 in addition to the wire part. As such, the substrate 200 may be formed as a printed circuit substrate, or may be implemented with a complex substrate, in which the wire part and/or the driving element are formed on the glass, silicon, quartz, organic polymer, or organic/inorganic composite.

The plurality of epitaxial stacks may be sequentially stacked on the front surface of the substrate 200. Each of the plurality of epitaxial stacks emits a color light.

In an exemplary embodiment, two or more epitaxial stacks may be disposed over one another, and the epitaxial stacks may emit color lights having different wavelength bands, respectively. More particularly, a plurality of epitaxial stacks may have different energy bands. Hereinafter, a light emitting stacked structure will be described as including three sequentially stacked epitaxial stack layers disposed on the substrate 200, however, the inventive concepts are not limited to a particular number of stacked epitaxial layers.

Each epitaxial stack may emit a color light in a visible wavelength band among various wavelength bands. Light emitted from the lowermost epitaxial stack may have the longest wavelength, which has the lowest energy band, and light emitted from epitaxial stacks disposed thereover may emit light having a shorter wavelength. Light emitted from the uppermost epitaxial stack may have the shortest wavelength, which as the highest energy band. For example, the first epitaxial stack 220 may emit a first color light L1, a second epitaxial stack 230 may emit a second color light L2, and a third epitaxial stack 240 may emit a third color light L3. The first to third color lights L1 to L3 may correspond to light having different colors from each other, e.g., different wavelength bands, and the wavelengths of the first to third color lights L1 to L3 may become sequentially short. In particular, the first to third color lights L1 to L3 may have different wavelength bands, and the energy of light may increase from the first color light L1 toward the third color light L3.

In the illustrated exemplary embodiment, the first color light L1 may be a red light, the second color light L2 may be a green light, and the third color light L3 may be a blue light. However, the inventive concepts are not limited thereto. When the light emitting stacked structure includes a micro LED, which has a surface area less than about 10,000 square μm as known in the art, or less than about 4,000 square μm or 2,500 square μm in other exemplary embodiments, the first epitaxial stack 220 may emit any one of red, green, and blue light, and the second and third epitaxial stacks 230 and 240 may emit a different one of red, green, and blue light, without adversely affecting operation, due to the small form factor of a micro LED.

Each of the epitaxial stacks 220, 230, and 240 emits light in an upward direction (hereinafter referred to as a "front direction") from the substrate 200. In this case, light emitted from one epitaxial stack travels in the front direction through any other epitaxial stack(s) located on a path of the light. The front direction may correspond to a direction in which the first, second, and third epitaxial stacks 220, 230, and 240 are stacked.

Hereinafter, the front direction of the substrate 200 may also be referred to as an "upper direction" and the back direction of the substrate 200 may also be referred to as a "lower direction". However, the terms "upper direction" and the "lower direction" are relative terms, and may vary with a direction in which epitaxial stacks of the light emitting stacked structure is arranged or stacked.

Each of the epitaxial stacks 220, 230, and 240 emits light in the upper direction, and each of the epitaxial stacks 220, 230, and 240 transmits most of light emitted from a lower epitaxial stack. In particular, light emitted from the first epitaxial stack 220 passes through the second epitaxial stack 230 and the third epitaxial stack 240 to travel in the front direction, and light emitted from the second epitaxial stack 230 passes through the third epitaxial stack 240 to travel in the front direction. As such, at least some or all of the remaining epitaxial stacks other than the lowermost epitaxial stack may be formed of a light-transmitting material. For example, the light-transmitting material includes a material transmitting light of a particular wavelength or a portion of light of the particular wavelength, as well as a material transmitting the whole light. In an exemplary embodiment, each of the epitaxial stacks 220, 230, and 240 may transmit 60% or more of light emitted from an epitaxial stack disposed thereunder. In another exemplary embodiment, each of the epitaxial stacks 220, 230, and 240 may transmit 80% or more of light emitted from an epitaxial stack disposed thereunder. In another exemplary embodiment, each of the epitaxial stacks 220, 230, and 240 may transmit 90% or more of light emitted from an epitaxial stack disposed thereunder.

The epitaxial stacks 220, 230, and 240 of the light emitting stacked structure according to an exemplary embodiment may be independently driven by connecting signal lines applying light emitting signals to the epitaxial stacks, respectively. Also, the light emitting stacked structure according to an exemplary embodiment may implement various colors depending on whether light is emitted from the epitaxial stacks 220, 230, and 240. Since epitaxial stacks emitting light of different wavelengths are vertically formed to overlap each other, it is possible to form the light emitting stacked structure.

Figure 36A:
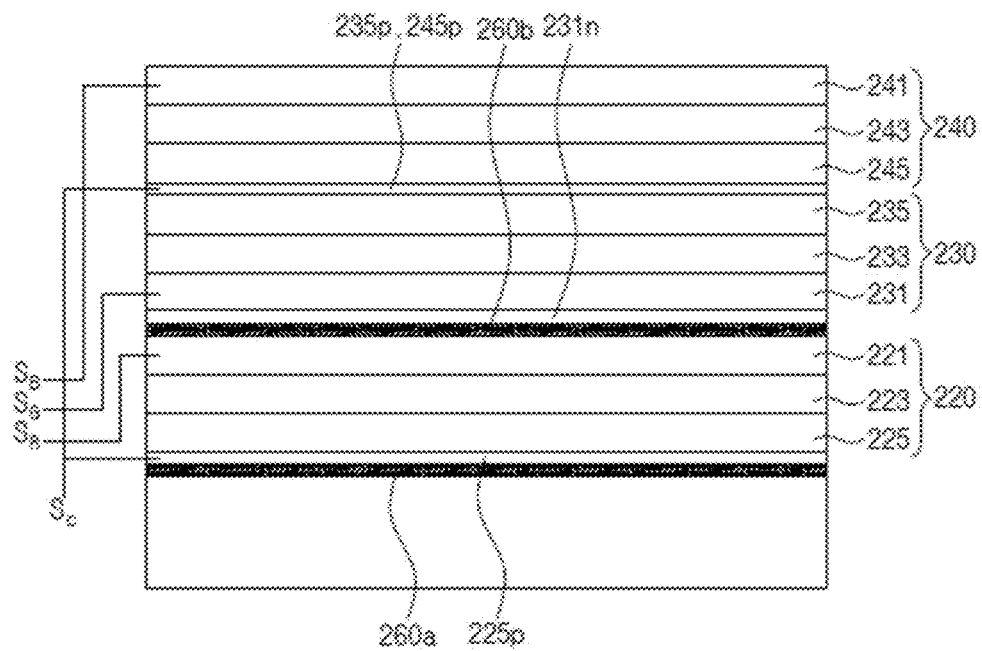
FIGS. 36A and 36B are cross-sectional views a light emitting stacked structure according to exemplary embodiments.
Figure 36B:
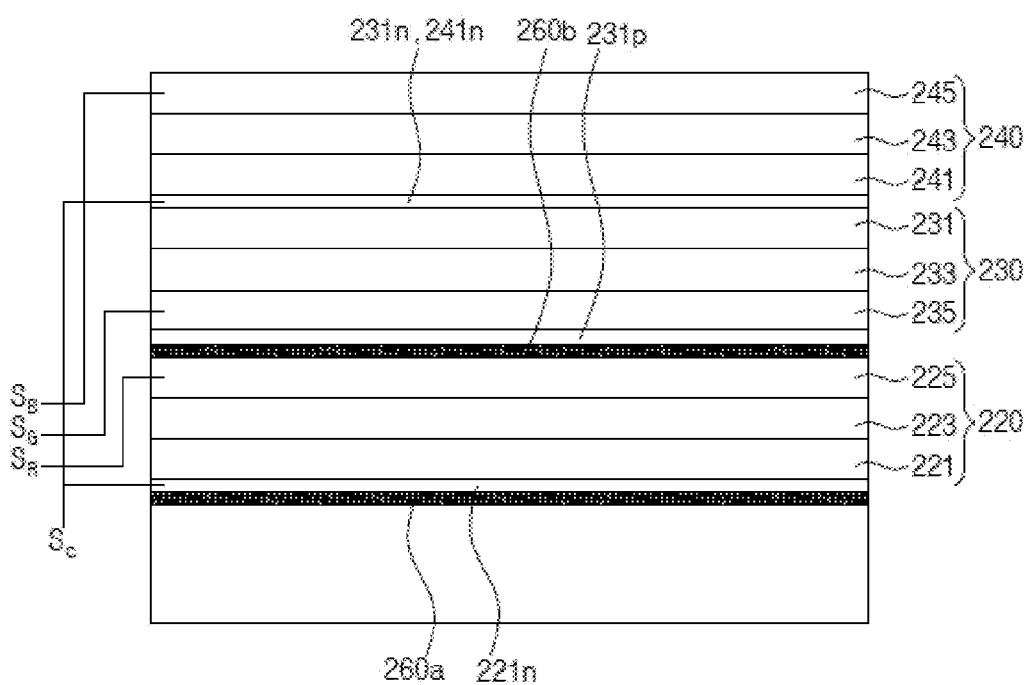

FIGS. 36A and 36B are cross-sectional views of a light emitting stacked structure according to exemplary embodiments.

Referring to FIG. 36A, in the light emitting stacked structure according to an exemplary embodiment, the first epitaxial stack 220 may be disposed on the substrate 200 with a first adhesive layer 60*a* interposed therebetween. The first adhesive layer 260*a* may be formed of a conductive or non-conductive material. When the first adhesive layer 260*a* needs to be electrically connected to the substrate 200, a partial region of the first adhesive layer 260*a* may have a conductivity. The first adhesive layer 260*a* may be formed of a transparent or opaque material. In an exemplary embodiment, when the substrate 200 is formed of an opaque material and a wire part and the like are formed on the substrate 200, the first adhesive layer 260*a* may be formed of an opaque material, for example, that absorbs light. Various polymer adhesives, for example, an epoxy-based polymer adhesive may be used as a light absorption material for the first adhesive layer 260*a*.

The second and third epitaxial stacks 230 and 240 may be disposed on the first epitaxial stack 220 with a second adhesive layer 260*b* interposed therebetween. The second adhesive layer 260*b* is formed of a non-conductive material and may include a light-transmitting material. For example, an optically clear adhesive may be used as the second adhesive layer 260*b*. The material forming the second adhesive layer 260*b* is not particularly limited as long as an adhesive layer may be optically clear and may be stably adhered to each epitaxial stack. For example, the second adhesive layer 260*b* may include epoxy polymer, various photoresists, parylene, PMMA (Poly(methyl methacrylate)), BCB (benzocyclobutene), etc., such as SU-8, as an organic material, and may include silicon oxide, aluminum oxide, melting glass, etc., as an inorganic material. In some exemplary embodiments, conductive oxide may be used as an adhesive layer. In this case, the conductive oxide should be insulated from any other element. When an organic material is used as an adhesive layer, and when molten glass of the inorganic materials is used, the material may be coated on an adhesive surface and may be bonded thereon at a high temperature and a high pressure in a vacuum state. When an inorganic material (except for molten glass) is used as an adhesive layer, the inorganic material may be bonded on an adhesive layer through the following processes: depositing of the inorganic material on the adhesive layer, chemical-mechanical planarization (CMP), plasma processing on a surface of a resultant structure, and bonding at high vacuum.

The first epitaxial stack 220 includes a p-type semiconductor layer 225, an active layer 223, and an n-type semiconductor layer 221. The second epitaxial stack 230 includes a p-type semiconductor layer 235, an active layer 233, and an n-type semiconductor layer 231, and the third epitaxial stack 240 includes a p-type semiconductor layer 245, an active layer 243, and an n-type semiconductor layer 241.

The first epitaxial stack 220 may include the p-type semiconductor layer 225, the active layer 223, and the n-type semiconductor layer 221 sequentially stacked on the substrate 200, and may include a semiconductor material emitting a red light, for example.

The semiconductor material emitting a red light may include aluminum gallium arsenide (AlGaAs), gallium arsenide phosphide (GaAsP), aluminum gallium indium phosphide (AlGaInP), gallium phosphide (GaP), etc. However, the semiconductor material emitting a red light is not limited thereto, and various other materials may be used.

A first p-type contact electrode 225p may be provided under the p-type semiconductor layer 225 of the first epitaxial stack 220. The first p-type contact electrode 225p of the first epitaxial stack 220 may be formed of a single-layered or multi-layered metal. For example, various materials including metals, such as Al, Ti, Cr, Ni, Au, Ag, Ti, Sn, Ni, Cr, W, and Cu, or an alloy thereof may be used as the first p-type contact electrode 225p. The first p-type contact electrode 225p may include a metal having high reflectivity. As the first p-type contact electrode 225p is formed of a metal of high reflectivity, the light emission efficiency from the first epitaxial stack 220 in the upper direction may be improved.

The second epitaxial stack 230 includes the n-type semiconductor layer 231, the active layer 233, and the p-type semiconductor layer 235 sequentially stacked one over another. The n-type semiconductor layer 231, the active layer 233, and the p-type semiconductor layer 235 may include a semiconductor material emitting a green light, for example. The semiconductor material emitting a green light may include indium gallium nitride (InGaN), gallium nitride (GaN), allium phosphide (GaP), AlGaInP, AlGaP, etc. However, the semiconductor material emitting a green light is not limited thereto, and various other materials may be used.

A second n-type contact electrode 231n is provided under the n-type semiconductor layer 231 of the second epitaxial stack 230. The second n-type contact electrode 231n is interposed between the first epitaxial stack 220 and the second epitaxial stack 230, in detail, between the second adhesive layer 260b and the second epitaxial stack 230.

The second n-type contact electrodes 231n may be formed of transparent conductive oxide (TCO). The transparent conductive oxide may include tin oxide (SnO), indium oxide (InO2), zinc oxide (ZnO), indium tin oxide (ITO), indium tin zinc oxide (ITZO), etc. A transparent conductive compound may be deposited through chemical vapor deposition (CVD) and physical vapor deposition (PVD) using an evaporator and a sputter. The second n-type contact electrodes 231n may have a thickness enough to function as an etch stopper in a fabricating process to be described later, while satisfying a predetermined light transmittance, for example, a thickness of approximately 2000 angstroms or approximately 2 micrometers.

A second p-type contact electrode 235p is provided under the p-type semiconductor layer 235 of the second epitaxial stack 230. The second p-type contact electrode 235p is interposed between the second epitaxial stack 230 and the third epitaxial stack 240.

The third epitaxial stack 240 includes the p-type semiconductor layer 245, the active layer 243, and the n-type semiconductor layer 241 sequentially stacked one over another. The p-type semiconductor layer 245, the active layer 243, and the n-type semiconductor layer 241 may include a semiconductor material emitting a blue light, for example. The semiconductor material emitting a blue light may include GaN, InGaN, ZnSe, etc. However, the semiconductor material emitting a blue light is not limited thereto, and various other materials may be used.

A third p-type contact electrode 245p is provided under the p-type semiconductor layer 245 of the third epitaxial stack 240. The third p-type contact electrode 245p is interposed between the second epitaxial stack 230 and the third epitaxial stack 240.

The second p-type contact electrode 235p and the third p-type contact electrode 245p between the p-type semiconductor layer 235 of the second epitaxial stack 230 and the p-type semiconductor layer 245 of the third epitaxial stack 240 may form a shared electrode, which may be shared by the second epitaxial stack 230 and the third epitaxial stack 240.

The second p-type contact electrode 235p and the third p-type contact electrode 245p may at least partially contact each other, and may be physically and/or electrically connected. In this manner, even though a signal is applied to at least one of the second p-type contact electrode 235p and the third p-type contact electrode 245p, the same signal may be applied to the p-type semiconductor layer 235 of the second epitaxial stack 230 and the p-type semiconductor layer 245 of the third epitaxial stack 240. For example, when a common voltage is applied to one side of any one of the second p-type contact electrode 235p and the third p-type contact electrode 245p, the common voltage is applied to the p-type semiconductor layer of each of the second and third p-type epitaxial stacks 230 and 240 through both second p-type contact electrode 235p and the third p-type contact electrode 245p.

In the illustrated exemplary embodiment, each of the n-type semiconductor layers 221, 231, and 241 and the p-type semiconductor layers 225, 235, and 245 of the first, second, and third epitaxial stacks 220, 230, and 240 is illustrated as a single layer, but in some exemplary embodiments, each layer may be a multi-layer or may include a supperlattice layer. Also, the active layers 223, 233, and 243 of the first, second, and third epitaxial stacks 220, 230, and 240 may include a single quantum well structure or a multiple quantum well structure.

In the illustrated exemplary embodiment, the second and third p-type contact electrodes 235p and 245p, which constitute a shared electrode, substantially cover the second and third epitaxial stacks 230 and 240. The second and third p-type contact electrodes 235p and 245p may be formed of a transparent conductive material, which may transmit light emitted from a lower epitaxial stack. For example, each of the second and third p-type contact electrodes 235p and 245p may be formed of transparent conductive oxide (TCO). The transparent conductive oxide may include tin oxide (SnO), indium oxide (InO$_2$), zinc oxide (ZnO), indium tin oxide (ITO), indium tin zinc oxide (ITZO), etc. A transparent conductive compound may be deposited through chemical vapor deposition (CVD) and physical vapor deposition (PVD) using an evaporator and a sputter. The second and third p-type contact electrodes 235p and 245p may have a thickness enough to function as an etch stopper in a fabricating process to be described later, while satisfying a predetermined light transmittance, for example, a thickness of approximately 2000 angstroms or approximately 2 micrometers.

A common line may be connected to the first, second, and third p-type contact electrodes 225p, 235p, and 245p. The common line may apply the common voltage. Also, light emitting signal lines may be respectively connected to the n-type semiconductor layers 221, 231, and 241 of the first, second, and third epitaxial stacks 220, 230, and 240. In an exemplary embodiment, a common voltage SC is applied to the first p-type contact electrode 225p, the second p-type contact electrode 235p, and the third p-type contact electrode 245p through the common line, and the light emission of the first, second, and third epitaxial stacks 220, 230, and 240 are controlled by applying light emitting signals to the n-type semiconductor layer 221 of the first epitaxial stack 220, the second n-type contact electrode 231n of the second epitaxial stack 230, and the n-type semiconductor layer 241 of the third epitaxial stack 240 through the light emitting signal lines, respectively. The light emitting signals may include first, second, and third light emitting signals SR, SG, and SB respectively corresponding to the first, second, and third epitaxial stacks 220, 230, and 240. In an exemplary embodiment, the first light emitting signal SR may be a signal for emitting a red light, the second light emitting signal SG may be a signal for emitting a green light, and the third light emitting signal SB may be a signal for emitting a blue light.

As described above, according to an exemplary embodiment, the same signal may be simultaneously provided to two adjacent epitaxial stacks through the shared electrode. In this case, semiconductor layers of the two adjacent epitaxial stacks facing each other may be doped with impurities of the same polarity type. For example, the two semiconductor layers facing each other with a shared electrode interposed therebetween may be a p-type semiconductor layer.

FIG. 36A shows three epitaxial stacks and the shared electrode provided between the second and third epitaxial stacks 230 and 240, but the inventive concepts are not limited thereto. For example, a location of the shared electrode may be variously changed as long as two epitaxial stacks are adjacent to each other. For example, when applying the same signal to two semiconductor layers in a light emitting stacked structure including four epitaxial stacks, the shared electrode may be provided at any other location between two semiconductor layers that face each other and are doped with impurities of the same polarity type.

According to an exemplary embodiment, since the same signal may be applied to two adjacent epitaxial stacks through the shared electrode, the number of contact parts for applying signals to the respective epitaxial stacks may be reduced. For example, a contact part may be formed for each of three epitaxial stacks to apply a common voltage to the three epitaxial stacks. However, according to an exemplary embodiment, the common voltage may be applied to three epitaxial stacks only through two contact parts. A detailed contact structure will be described in more detail below.

FIG. 36B is a cross-sectional view of a light emitting stacked structure according to another exemplary embodiment. The light emitting stacked structure according to the illustrated exemplary embodiment is substantially similar to that of FIG. 36A, except that the common voltage is applied to the n-type semiconductor layers 221, 231, and 241 of the first, second, and third epitaxial stacks 220, 230, and 240, and light emitting signals are applied to the p-type semiconductor layers 225, 235, and 245 of the first, second, and third epitaxial stacks 220, 230, and 240.

Referring to FIG. 36B, the first epitaxial stack 220 may include the n-type semiconductor layer 221, the active layer 223, and the p-type semiconductor layer 225 sequentially stacked on the substrate 200, and may include a semiconductor material emitting a red light.

A first n-type contact electrode 221n may be provided under the n-type semiconductor layer 221 of the first epitaxial stack 220. The first n-type contact electrode 221n of the first epitaxial stack 220 may be a single-layered or multi-layered metal. In an exemplary embodiment, the first n-type contact electrode 221n may be formed of an Au alloy, such as AuGe or AuTe.

The second epitaxial stack 230 includes the p-type semiconductor layer 235, the active layer 2233, and the n-type semiconductor layer 231 sequentially stacked one over another. The p-type semiconductor layer 235, the active layer 233, and the n-type semiconductor layer 231 may include a semiconductor material emitting a green light.

A second p-type contact electrode 235p is provided under the p-type semiconductor layer 235 of the second epitaxial stack 230. The second p-type contact electrode 235p is interposed between the first epitaxial stack 220 and the second epitaxial stack 230, in detail, between the second adhesive layer 260b and the second epitaxial stack 230.

A second n-type contact electrode 231n is provided on the n-type semiconductor layer 231 of the second epitaxial stack 230. The second p-type contact electrode 231n is interposed between the second epitaxial stack 230 and the third epitaxial stack 240.

The third epitaxial stack 240 includes the n-type semiconductor layer 241, the active layer 243, and the p-type semiconductor layer 245 sequentially stacked one over another. The n-type semiconductor layer 241, the active layer 243, and the p-type semiconductor layer 245 may include a semiconductor material emitting a blue light.

A third n-type contact electrode 241n is provided under the n-type semiconductor layer 241 of the third epitaxial stack 240. The third n-type contact electrode 241n is interposed between the second epitaxial stack 230 and the third epitaxial stack 240.

The second n-type contact electrode 231n and the third n-type contact electrode 241n between the n-type semiconductor layer 231 of the second epitaxial stack 230 and the n-type semiconductor layer 241 of the third epitaxial stack 240 may constitute a shared electrode, which may be shared by the second epitaxial stack 230 and the third epitaxial stack 240.

The second n-type contact electrode 231n and the third n-type contact electrode 241n may at least partially contact each other, and may be physically and/or electrically connected to each other. In this manner, even though a signal is applied to at least one of the second n-type contact electrode 231n and the third n-type contact electrode 241n, the same signal may be applied to the n-type semiconductor layer 231 of the second epitaxial stack 230 and the n-type semiconductor layer 241 of the third epitaxial stack 240.

In the illustrated exemplary embodiment, a common line may be connected to the first, second, and third n-type contact electrodes 221n, 231n, and 241n. Light emitting signal lines may be respectively connected to the p-type semiconductor layers 225, 235, and 245 of the first, second, and third epitaxial stacks 220, 230, and 240. The common voltage SC is applied to the first n-type contact electrode 221n, the second n-type contact electrode 231n, and the third n-type contact electrode 241n through the common line, and the light emission of the first, second, and third epitaxial stacks 220, 230, and 240 are controlled by applying light emitting signals to the p-type semiconductor layer 225 of the first epitaxial stack 220, the second p-type contact electrode 235p of the second epitaxial stack 230, and the p-type semiconductor layer 245 of the third epitaxial stack 240 through the light emitting signal lines, respectively.

According to the exemplary embodiments, the first, second, and third epitaxial stacks 220, 230, and 240 are driven in response to relevant light emitting signals, respectively. More particularly, the first epitaxial stack 220 is driven by the first light emitting signal SR, the second epitaxial stack 230 is driven by the second light emitting signal SG, and the third epitaxial stack 240 is driven by the third light emitting signal SB. The first, second, and third light emitting signals SR, SG, and SB may be independently applied to the first, second, and third epitaxial stacks 220, 230, and 240, and thus, the first, second, and third epitaxial stacks 220, 230, and 240 may be driven independently of each other. As such, the light emitting stacked structure may generate light of a color, which may be variously determined by a combination of the first, second, and third color lights emitted from the first, second, and third epitaxial stacks 220, 230, and 240 in the upper direction.

When displaying a color, different color lights are not emitted from different planes, but different color lights are emitted from an overlapping region, and thus, the light emitting stacked structure according to an exemplary embodiment is capable of integrating a light emitting element with reduced size. In general, conventional light emitting elements emitting different color lights, for example, red, green, and blue lights, are spaced apart from each other on the same plane to implement a full color. In this case, as each light emitting element is disposed on the same plane, the element occupy a relatively large area. However, light emitting elements according to exemplary embodiments include a stacked structure, in which the elements overlap each other in one area to emit different color lights, and thus, a full color may be implemented in a significantly less area. As such, a high-resolution device may be fabricated in a small area.

In addition, even if a conventional light emitting device was fabricated in a stack manner, the conventional light emitting device may be manufactured by forming an individual contact part for a connection with the individual light emitting element through a line for each light emitting element, which would increase manufacturing complexities due to a complicated structure. However, the light emitting stacked structure according to an exemplary embodiment may be formed by forming a multiple epitaxial stack structure on one substrate, forming a contact part at the multiple epitaxial stack structure through a minimum process, and connecting the contact part and the multiple epitaxial stack structure. In particular, since the number of contact points is reduced with the usage of a shared electrode, a structure and the fabricating method thereof may be further simplified. Also, as compared to a conventional display device fabricating method in which a light emitting element of an individual color is fabricated and is individually mounted, according to the inventive concepts, only one light emitting stacked structure is mounted, instead of a plurality of light emitting elements, thereby significantly simplifying a fabricating method.

The light emitting stacked structure according to an exemplary embodiment may further include various elements to provide a high-purity and high-efficiency color light. For example, the light emitting stacked structure according to an exemplary embodiment may include a wavelength pass filter for blocking light of a relatively short wavelength from traveling toward an epitaxial stack that emits light with a longer wavelength.

Hereinafter, descriptions of a light emitting stacked structure according to exemplary embodiments will be focused on a difference from that of FIGS. 36A and 36B. As such, detailed descriptions as to the substantially the same elements will be omitted to avoid redundancy.

Figure 37:
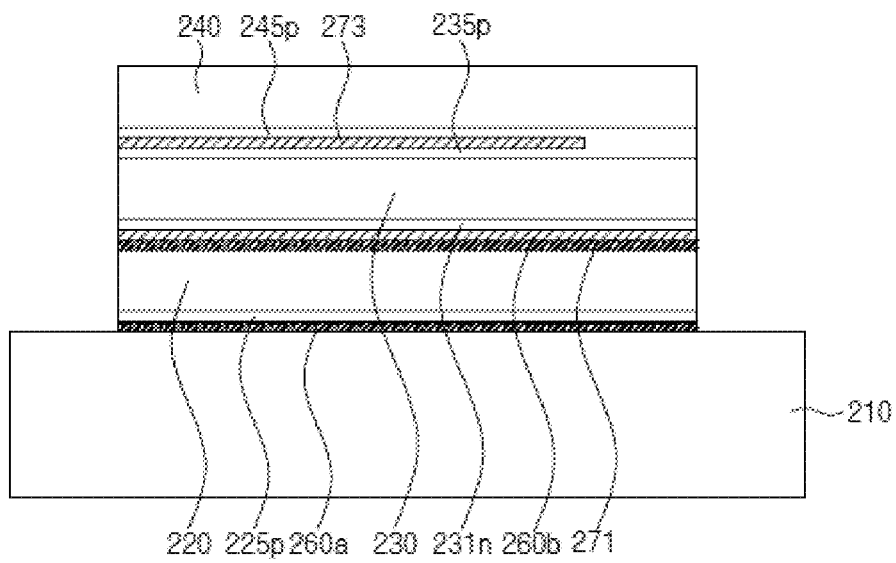
FIG. 37 is a schematic cross-sectional view of a light emitting stacked structure according to an exemplary embodiment.

FIG. 37 is a schematic cross-sectional view of a light emitting stacked structure according to an exemplary embodiment.

Referring to FIG. 37, a light emitting stacked structure according to an exemplary embodiment may include a first wavelength pass filter 271 between the first epitaxial stack 220 and the second epitaxial stack 230.

The first wavelength pass filter 271 may transmit a first color light emitted from the first epitaxial stack 220, and may block or reflect any other lights except for the first color light. As such, the first color light emitted from the first epitaxial stack 220 may travel in the upper direction, but second and third color lights emitted from the second and third epitaxial stacks 230 and 240 may not travel toward the first epitaxial stack 220, and may be reflected or blocked by the first wavelength pass filter 271.

When the second and third color light, which has a higher energy and a shorter wavelength than the first color light are incident onto the first epitaxial stack 220, the second and third color light may induce additional light emission in the first epitaxial stack 220. In the illustrated exemplary embodiment, the second and third color light is prevented from being incident onto the first epitaxial stack 220 by the first wavelength pass filter 271.

In an exemplary embodiment, a second wavelength pass filter 273 may be disposed between the second epitaxial stack 230 and the third epitaxial stack 240. In particular, the second wavelength pass filter 273 may be provided between the second p-type contact electrode 235p and the third p-type contact electrode 245p, together which constitute a shared electrode. The second wavelength pass filter 273 may be formed to be smaller than the second p-type contact electrode 235p and the third p-type contact electrode 245p, such that the second p-type contact electrode 235p and the third p-type contact electrode 245p are connected to each other in a region where the second wavelength pass filter 273 is not formed. For example, the second wavelength pass filter 273 may include at least one contact hole, and the second p-type contact electrode 235p and the third p-type contact electrode 245p may be connected to each other through the contact hole.

The second wavelength pass filter 273 may transmit the first and second color light emitted from the first and second epitaxial stacks 220 and 230, and may reflect or block any other light except for the first and second color light. As such, the first and second color light emitted from the first and second epitaxial stacks 220 and 230 may travel in the upper direction, but the third color light emitted from the third epitaxial stack 240 may not travel toward the first and second epitaxial stacks 220 and 230, and may be reflected or blocked by the second wavelength pass filter 273.

When the third color light, which has a higher energy and a shorter wavelength than the first and second color light is incident onto the first and second epitaxial stacks 220 and 230, the third color light may induce additional light emission in the first and second epitaxial stacks 220 and 230. In the illustrated exemplary embodiment, the third color light is prevented from being incident onto the first and second epitaxial stacks 220 and 230 by the second wavelength pass filter 273.

The light emitting stacked structure according to an exemplary embodiment may further include various elements to provide a uniform light. For example, the light emitting stacked structure according to an exemplary embodiment may have various concavo-convex portions on a light output surface.

Figure 38:
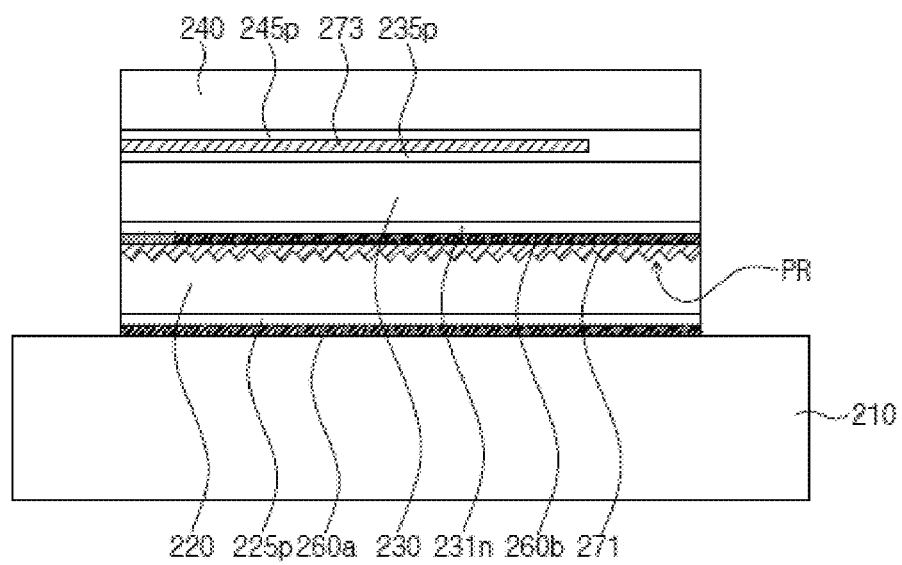
FIGS. 38 and 39 are schematic cross-sectional views of a light emitting stacked structure according to exemplary embodiments.
Figure 39:
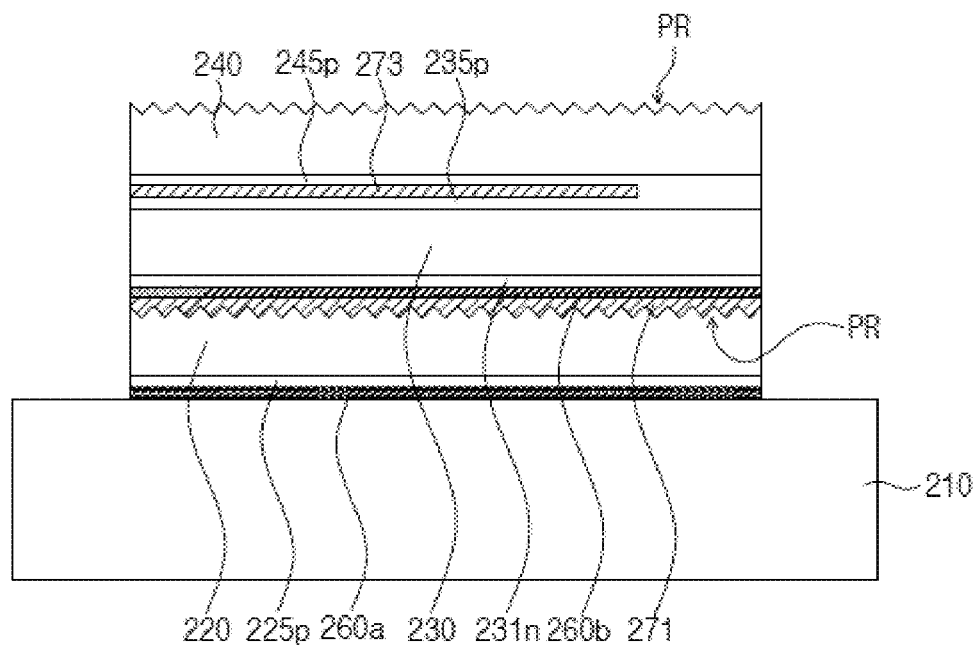

FIGS. 38 and 39 are cross-sectional views of a light emitting stacked structure according to exemplary embodiments.

Referring to FIGS. 38 and 39, the light emitting stacked structure according to exemplary embodiments may include a concavo-convex portion formed on an upper surface of at least one of the first, second, and third epitaxial stacks 220, 230, and 240.

The concavo-convex portion PR may be selectively formed on the first, second, and third epitaxial stacks 220, 230, and 240. For example, as illustrated in FIG. 38, the concavo-convex portions PR may be respectively provided on the first and third epitaxial stacks 220 and 240. According to another exemplary embodiment, the concavo-convex portions PR may be provided on the first and third epitaxial stacks 220 and 240, as shown in FIG. 39. The concavo-convex portion PR may be provided on a semiconductor layer corresponding to a light output surface of the epitaxial stack.

According to an exemplary embodiment, when the concavo-convex portion PR is formed on the first epitaxial stack 220, the first wavelength pass filter 271 may be provided directly on an upper surface thereof. In some exemplary embodiments, an additional insulating layer may be provided between the first epitaxial stack 220 and the first wavelength pass filter 271. An insulating layer provided between the first epitaxial stack 220 and a second wavelength pass filter 273 may be an insulating layer that planarizes a surface thereof, such that the second wavelength pass filter 273 may function efficiently on the first epitaxial stack 220.

The concavo-convex portion PR may improve light emission efficiency and may be formed in various shapes, such as a many-sided pyramid, a hemisphere, and rough surfaces arranged randomly. The concavo-convex portion PR may be formed by using a sapphire substrate textured or patterned through various etching processes.

In an exemplary embodiment, the first, second, and third color light emitted from the first, second, and third epitaxial stacks 220, 230, and 240 may have different light intensities, which may cause a difference in visibility. According to an exemplary embodiment, the light emission efficiency may be improved by selectively forming the concavo-convex portion PR on light output surfaces of the first, second, and third epitaxial stacks 220, 230, and 240, thus reducing the difference in visibility of the first to third color light. For example, a red color and/or a blue color may have lower visibility than a green color. As such, the difference in visibility may be reduced by texturing of the first epitaxial stack 220 and/or the third epitaxial stack 240. For example, when an epitaxial stack emitting a red light is disposed on the lowermost of the light emitting stacked structure, the intensity of the red light may be small. As such, the light efficiency may be improved by forming the concavo-convex portion PR on an upper surface of the epitaxial stack emitting red light.

The light emitting stacked structure according to an exemplary embodiment may express various colors, and thus, may be adopted as a pixel, which will be described in more detail below.

Figure 40:
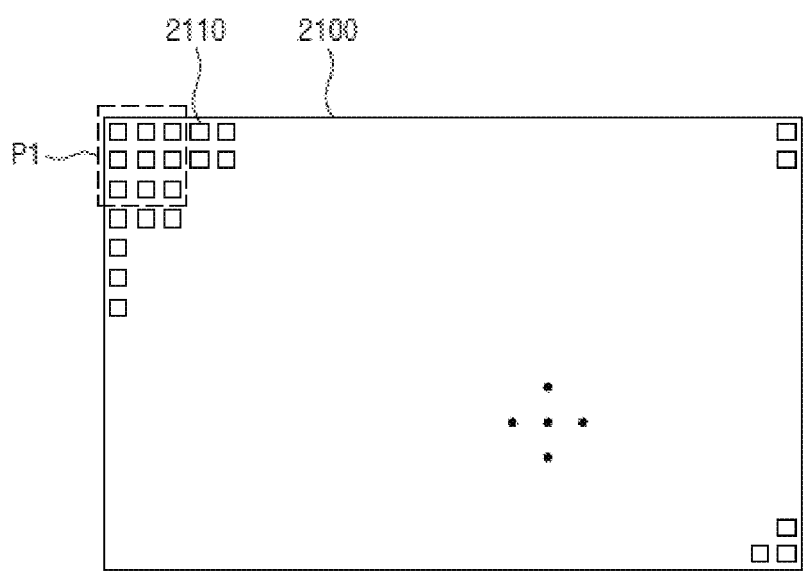
FIG. 40 is a plan view of a display device according to an exemplary embodiment.
Figure 41:
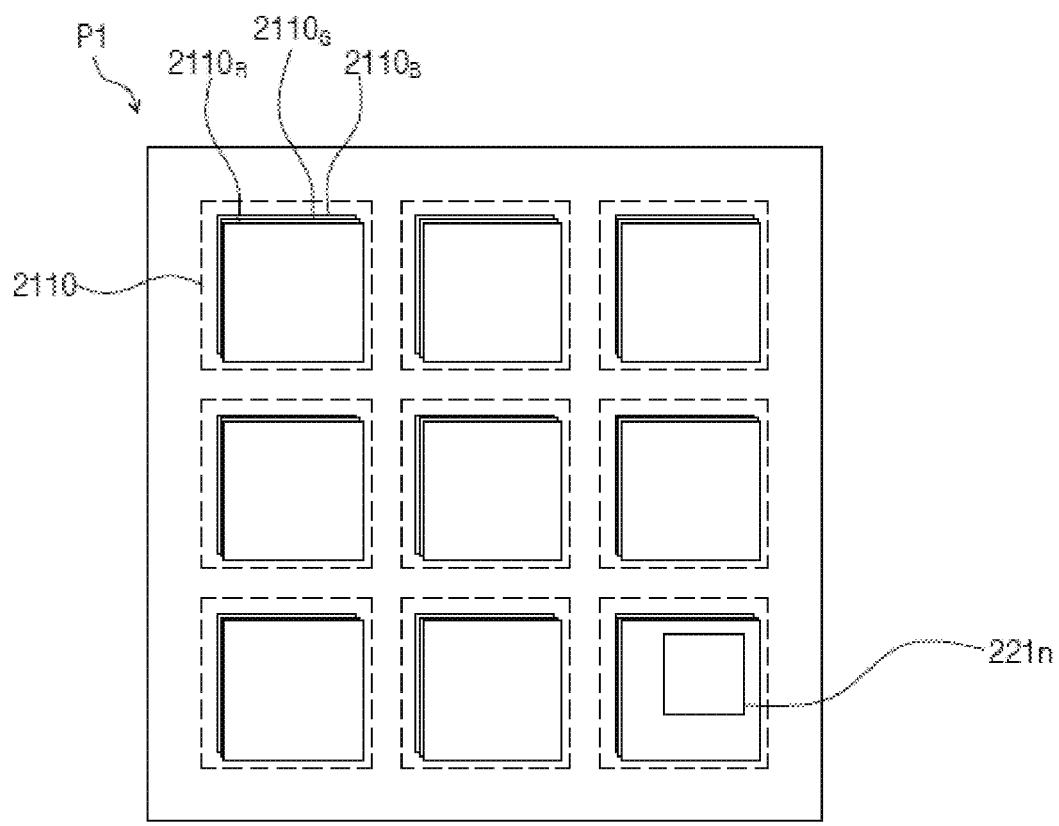
FIG. 41 is an expanded perspective view of portion P1 of FIG. 40.

FIG. 40 is a plan view of a display device according to an exemplary embodiment, and FIG. 41 is an enlarged view of portion P1 of FIG. 41.

Referring to FIGS. 40 and 41, a display device according to an exemplary embodiment may display any visual information, for example, a text, a video, a photo, a two-dimensional or three-dimensional image, etc.

The display device may be provided in various shapes, such as a polygon including straight line segments with closed loop to form a closed polygonal chain or circuit, a circular, an elliptical, etc. including a curved side; and a semicircular, a semi-elliptical, etc. including a straight or curved side. Hereinafter, the display device will be described as having substantially a rectangular shape, but the inventive concepts are not limited thereto.

The display device includes a plurality of pixels 2110 displaying an image. Each of the pixels 2110 may correspond to a minimum unit displaying an image. Each pixel 2110 may include the light emitting stacked structure according to exemplary embodiments illustrated with reference to FIGS. 35 to 39, and may emit a white light and/or a color light.

In an exemplary embodiment, each pixel 2110 includes a first subpixel 2110R emitting a red light, a second subpixel 2110G emitting a green light, and a third subpixel 2110B emitting a blue light. The first, second, and third subpixels 2110R, 2110G, and 2110B may correspond to the first, second, and third epitaxial stacks 220, 230, and 240 of the above-described light emitting stacked structure, respectively.

The pixels 2110 are arranged in the matrix of rows and columns. As used herein, the pixels 2110 being arranged in the matrix of rows and columns may refer to the pixels 2110 being arranged exactly in line along a row or a column, or substantially arranged along a row or a column in a zigzag shape whereby the locations of the pixels 2110 may be changed, etc.

Figure 42:
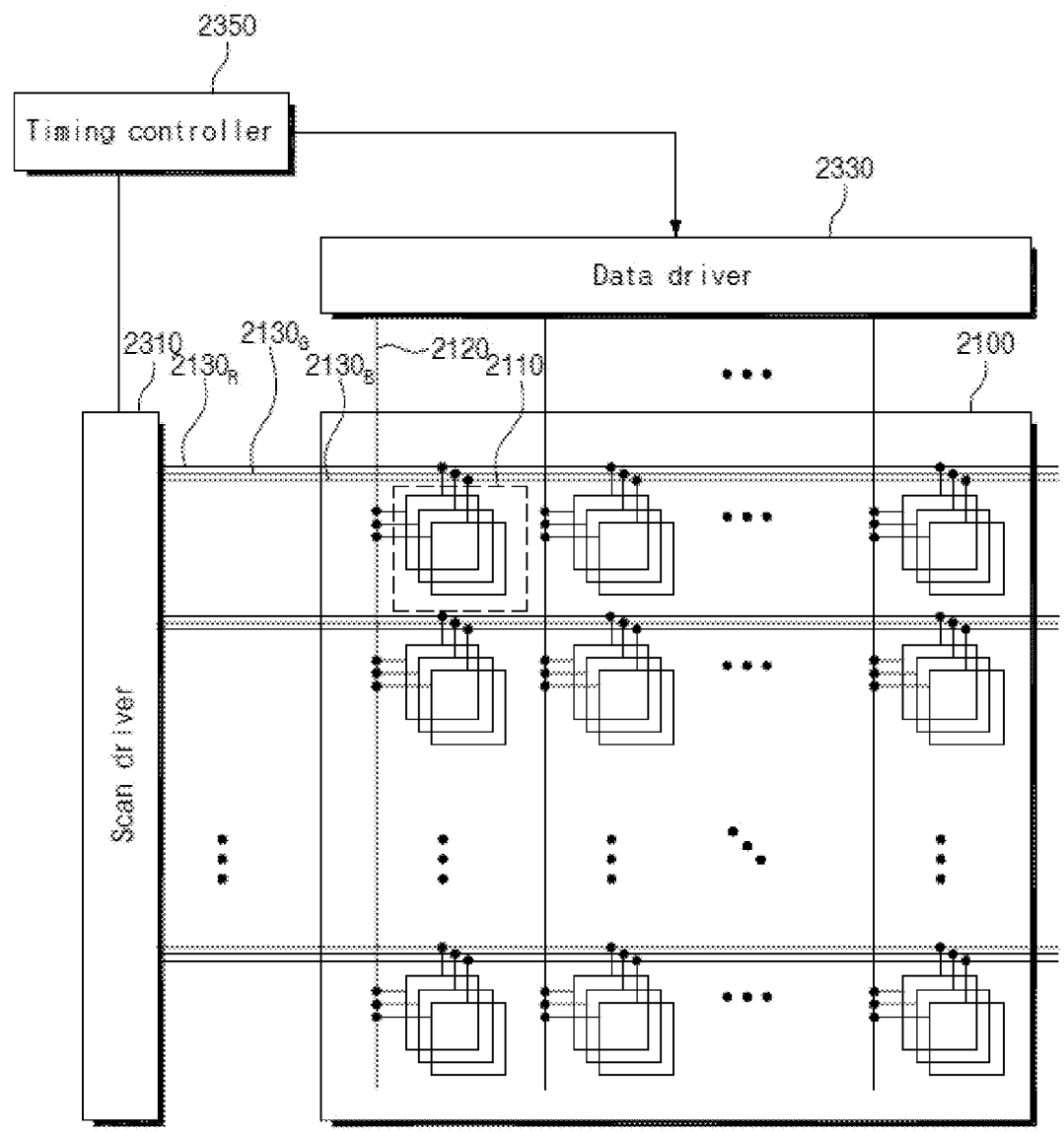
FIG. 42 is a block diagram of a display device according to an exemplary embodiment.

FIG. 42 is a block diagram of a display device according to an exemplary embodiment.

Referring to FIG. 42, the display device according to an exemplary embodiment includes a timing controller 2350, a scan driver unit 2310, a data driver unit 2330, a wire part, and pixels. When each pixel includes a plurality of subpixels, each subpixel may be connected to the scan driver unit 2310, the data driver unit 2330, etc., through the wire part.

The timing controller 2350 receives various control signals and image data from the outside (e.g., an external system which transmits image data) to drive the display device. The timing controller 2350 may rearrange the received image data and provide the rearranged data to the data driver unit 2330. The timing controller 2350 may generate scan control signals and data control signals to drive the scan driver unit 2310 and the data driver unit 2330, and provide the generated scan control signals and the generated data control signals to the scan driver unit 2310 and the data driver unit 2330.

The scan driver unit 2310 may generate a scan signal corresponding to the scan control signal provided from the timing controller 2350.

The data driver unit 2330 may generate a data signal corresponding to the data control signal and the image data provided from the timing controller 2350.

The wire part includes a plurality of signal lines. In particular, the wire part includes scan lines 2130 connecting the scan driver unit 2310 and the subpixels, and data lines 2120 connecting the data driver unit 2330 and the subpixels. The scan lines 2130 may be connected to the subpixels of each pixel 2110. The scan lines include first, second, and third scan lines 2130R, 2130G, and 2130B, and hereinafter, may be collectively indicated with reference numeral "130".

The wire part may connect the timing controller 2350 and the scan driver unit 2310, the timing controller 2350 and the data driver unit 2330, or any other components, and may further includes a plurality of lines for transferring relevant signals.

The scan lines 2130 provide scan signals generated by the scan driver unit 2310 to the subpixels. Data signals generated by the data driver unit 2330 are output to the data lines 2120.

The subpixels are connected to the scan lines 2130 and the data lines 2120. The subpixels selectively emit light in response to data signals received from the data lines 2120 when scan signals are supplied from the scan lines 2130. For example, during each frame period, each subpixel emits light with luminance corresponding to the received data signal. A subpixel supplied with a data signal corresponding to black luminance may not emit light during a relevant frame period, thus displaying a black color.

In an exemplary embodiment, the subpixels may be driven in a passive driving manner or an active driving manner. When the display device is driven in the active driving manner, the display device may be driven based on first and second pixel voltages additionally supplied thereto, in addition to a scan signal and a data signal.

Figure 43:
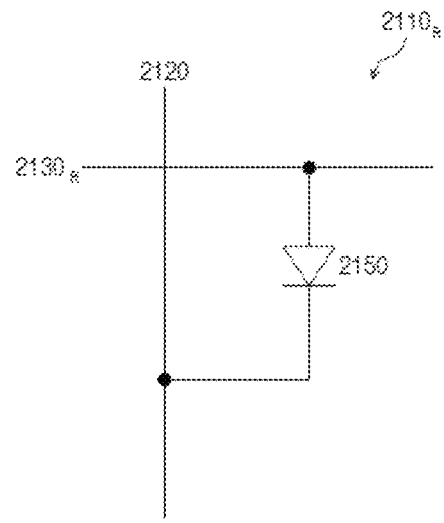
FIG. 43 is a circuit diagram of a subpixel in a passive-type display device according to an exemplary embodiment.

FIG. 43 is a circuit diagram illustrating one subpixel according to an exemplary embodiment. In particular, the circuit diagram according to the illustrated exemplary embodiment may correspond to a subpixel, such as a red subpixel 2110R included in a passive-type display device. The second and third subpixels 2110G and 2110B may be driven in substantially the same manner as the first subpixel 2110R, and thus, repeated descriptions as to the second and third subpixels 2110G and 2110B will be omitted to avoid redundancy.

Referring to FIG. 43, the first subpixel 2110R includes a light emitting element 2150 connected between the scan line 2130 and the data line 2120. The light emitting element 2150 may correspond to the first epitaxial stack 220. When a voltage of a threshold voltage or higher is applied between a p-type semiconductor layer and an n-type semiconductor layer, the first epitaxial stack 220 emits light with luminance corresponding to a magnitude of the applied voltage. In particular, the light emission of the first subpixel 2110R may be controlled by adjusting a voltage of a scan signal applied to the scan line 2130 and/or a voltage of a data signal applied to the data line 2120.

Figure 44:
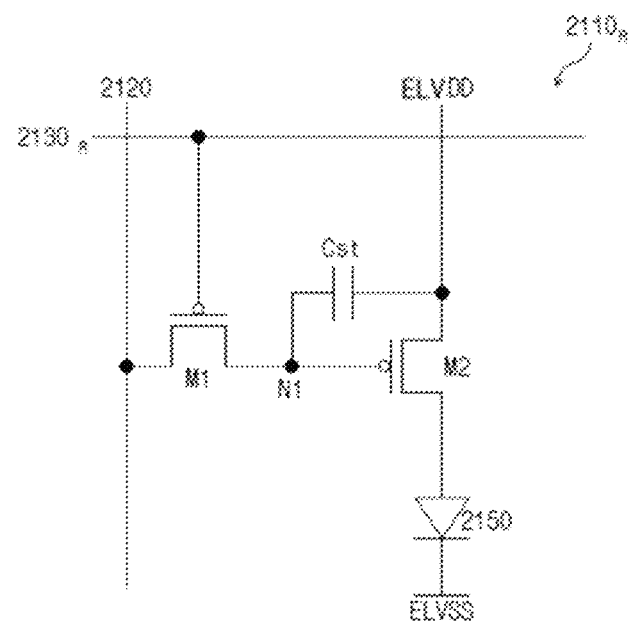
FIG. 44 is a circuit diagram of a subpixel in an active-type display device according to an exemplary embodiment.

FIG. 44 is a circuit diagram illustrating a first subpixel according to an exemplary embodiment. The circuit diagram according to the illustrated exemplary embodiment may correspond to a subpixel included in an active-type display device.

When the display device is an active-type display device, the first subpixel 2110R may be further supplied with first and second pixel voltages ELVDD and ELVSS, as well as a scan signal and a data signal.

Referring to FIG. 44, the first subpixel 2110R include the light emitting element 2150 and a transistor unit connected to the light emitting element 2150.

The light emitting element 2150 may correspond to the first epitaxial stack 220. An n-type semiconductor layer of the light emitting element 2150 may be connected to the first pixel voltage ELVDD through the transistor unit, and a p-type semiconductor layer thereof may be connected to the second pixel voltage ELVSS. The first pixel voltage ELVDD and the second pixel voltage ELVSS may have different potentials. For example, a potential of the second pixel voltage ELVSS may be lower than a potential of the first pixel voltage ELVDD by not smaller than a threshold voltage of the light emitting element 2150. The light emitting element 2150 may emit light with luminance corresponding to a driving current controlled by the transistor unit.

According to an exemplary embodiment, the transistor unit includes first and second transistors M1 and M2 and a storage capacitor Cst. However, a structure of the transistor unit may be variously modified and is not limited to that shown in FIG. 44.

A source electrode of the first transistor M1 (a switching transistor) is connected to the data line 2120, and a drain electrode thereof is connected to a first node N1. A gate electrode of the first transistor M1 is connected to the first scan line 2130R. When a scan signal of a voltage enough to turn on the first transistor M1 is supplied from the first scan line 2130R, the first transistor M1 is turned on, thus connecting the data line 2120 and the first node N1. In this case, a data signal of a relevant frame is supplied to the data line 2120, and thus, the data signal is transferred to the first node N1. The data signal transferred to the first node N1 is charged in the storage capacitor Cst.

A source electrode of the second transistor M2 (a driving transistor) is connected to the first pixel voltage ELVDD, and a drain electrode thereof is connected to an n-type semiconductor layer. A gate electrode of the second transistor M2 is connected to the first node N1. The second transistor M2 controls the amount of driving current, which is supplied to the light emitting element 2150, based on a voltage of the first node N1.

A first end of the storage capacitor Cst is connected to the first pixel voltage ELVDD, and a second end thereof is connected to the first node N1. The storage capacitor Cst charges a voltage corresponding to a data signal supplied to the first node N1, and maintains the charged voltage until a data signal of a next frame is supplied.

Although FIG. 44 shows the transistor unit including two transistors, however, the inventive concepts are not limited thereto. For example, the transistor unit may include more transistors, more capacitors, etc. Since, the structure of first and second transistors, the storage capacitor, and the signal lines are well known in the art, and thus, detailed descriptions thereof will be omitted.

Hereinafter, the pixel will be described with reference to a passive matrix type, however, the inventive concepts are not limited thereto.

Figure 45:
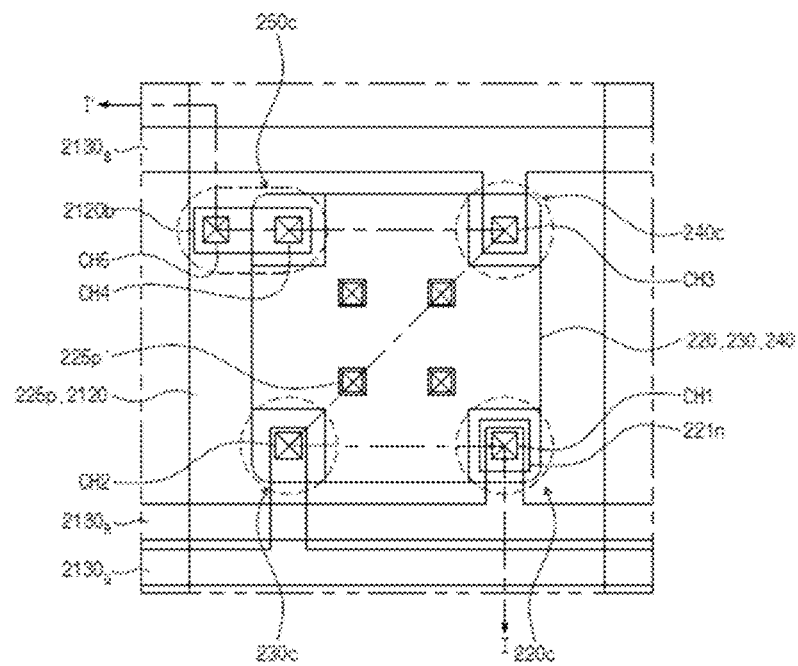
FIG. 45 is a plan view of a pixel according to an exemplary embodiment.
Figure 46:
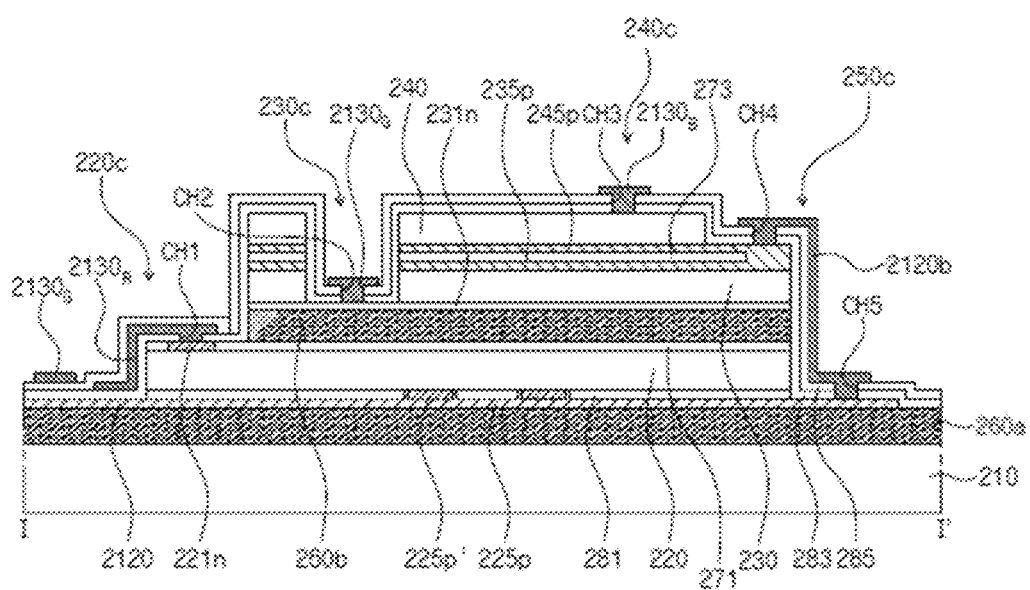
FIG. 46 is a cross-sectional view taken along line I-I' of FIG. 45.

FIG. 45 is a plan view of a pixel according to an exemplary embodiment, and FIG. 46 is a cross-sectional view taken along line I-I' of FIG. 45.

Referring to FIGS. 45 and 46, a pixel according to an exemplary embodiment includes a light emitting region in which a plurality of epitaxial stacks are stacked, and a peripheral region surrounding the light emitting region. In the illustrated exemplary embodiment, the plurality of epitaxial stacks include the first, second, and third epitaxial stacks 220, 230, and 240.

The pixel according to an exemplary embodiment has the light emitting region in which a plurality of epitaxial stacks are stacked in a plan view. A contact part for connecting a wire part to the first, second, and third epitaxial stacks 220, 230, and 240 is provided on at least one side of the light emitting region. The contact part includes a common contact part 250c for applying a common voltage to the first, second, and third epitaxial stacks 220, 230, and 240, a first contact part 220c for providing a light emitting signal to the first epitaxial stack 220, a second contact part 230c for providing a light emitting signal to the second epitaxial stack 230, and a third contact part 240c for providing a light emitting signal to the third epitaxial stack 240.

In an exemplary embodiment, as illustrated in FIGS. 36A and 36B, a stacked structure may be changed depending on the polarity type of a semiconductor layer of the first, second, and third epitaxial stacks 220, 230, and 240 to which a common voltage is applied. In particular, in the common contact part 250c, a contact electrode for applying the common voltage is provided for each of the first, second, and third epitaxial stacks 220, 230, and 240, and the contact electrodes corresponding to the first, second, and third epitaxial stacks 220, 230, and 240 may be referred to as "first, second, and third common contact electrodes." When the common voltage is applied to a p-type semiconductor layer, the first, second, and third common contact electrodes according to an exemplary embodiment may be the first, second, and third p-type common contact electrodes, respectively. When the common voltage is applied to an n-type semiconductor layer, the first, second, and third common contact electrodes according to another exemplary embodiment may be first, second, and third n-type contact electrodes, respectively. Hereinafter, the common voltage will be described as being applied a p-type semiconductor layer, in particular, the first, second, and third common contact electrodes may be the first, second, and third p-type contact electrodes, respectively.

According to an exemplary embodiment, when the light emitting stacked structure has substantially a quadrangular shape in a plan view, the contact parts 220c, 230c, 240c, and 250c may be disposed in regions corresponding to respective corners of the substantially quadrangular shape. However, the inventive concepts are not limited thereto, and the locations of the contact parts 220c, 230c, 240c, and 250c may be variously changed according to a shape of the light emitting stacked structure.

The plurality of epitaxial stacks include the first, second, and third epitaxial stacks 220, 230, and 240. First, second, and third light emitting signal lines providing light emitting signals to the first, second, and third epitaxial stacks 220, 230, and 240, respectively, and a common line providing a common voltage to the first, second, and third epitaxial stacks 220, 230, and 240 are connected to the first, second, and third epitaxial stacks 220, 230, and 240. In the illustrated exemplary embodiment, the first, second, and third light emitting signal lines may correspond to the first, second, and third scan lines 2130R, 2130G, and 2130B, respectively, and the common line may correspond to the data line 2120. The first, second, and third scan lines 2130R, 2130G, and 2130B and the data line 2120 are connected to the first, second, and third epitaxial stacks 220, 230, and 240.

In an exemplary embodiment, the first, second, and third scan lines 2130R, 2130G, and 2130B may extend in a first direction (e.g., a horizontal direction). The data line 2120 may extend in a second direction (e.g., a vertical direction) substantially crossing the first, second, and third scan lines 2130R, 2130G, and 2130B. However, the extending directions of the first, second, and third scan lines 2130R, 2130G, and 2130B and the data line 2120 are not limited thereto, and may be variously changed according to the arrangement of pixels.

As the data line 2120 and the first p-type contact electrode 225p are elongated substantially in the second direction crossing the first direction and provide the common voltage to a p-type semiconductor layer of the first epitaxial stack 220, the data line 2120 and the first p-type contact electrode 225p may be considered as substantially the same element. As such, the terms "first p-type contact electrode 225p" and "data line 2120" will hereinafter be used interchangeably.

An ohmic electrode 225p' for an ohmic contact of the first p-type contact electrode 225p and the first epitaxial stack 220 is disposed in a light emitting region where the first p-type contact electrode 225p is provided. The ohmic electrode 225p' may include a plurality of ohmic electrodes. The ohmic electrode 225p' may be used for an ohmic contact, and may be formed of various materials. In an exemplary embodiment, the ohmic electrode 225p' corresponding to a p-type ohmic electrode may include Au(Zn) or Au(Be). Since reflectance of a material for the ohmic electrode 225p' is lower than that of a material, such as Ag, Al, or Au, an additional reflection electrode may be further disposed. For example, Ag, Au, etc. may be used as a material for an additional reflection electrode, and a metallic adhesive layer formed of a material, such as Ti, Ni, Cr, or Ta, may be disposed for adhesion with an adjacent element. In this case, the adhesive layer may be thinly deposited on an upper surface and a lower surface of the reflection electrode including Ag, Au, etc.

The first scan line 2130R is connected to the first epitaxial stack 220 through a first contact hole CH1, and the data line 2120 is connected to the first epitaxial stack 220 through the ohmic electrode 225p'. The second scan line 2130G is connected to the second epitaxial stack 230 through a second contact hole CH2, and the data line 2120 is connected to the second epitaxial stack 230 through fourth and fifth contact holes CH4 and CH5. The third scan line 2130B is connected to the third epitaxial stack 240 through a third contact hole CH3, and the data line 2120 is connected to the third epitaxial stack 240 through the fourth and fifth contact holes CH4 and CH5. The second and third epitaxial stacks 230 and 240 are simultaneously connected through a bridge line 2120b provided on the fourth and fifth contact holes CH4 and CH5.

An adhesive layer, a contact electrode, and a wavelength pass filter are provided between the substrate 200, the first epitaxial stack 220, the second epitaxial stack 230, and the fourth epitaxial stack 240. Hereinafter, a pixel according to an exemplary embodiment will be described in a stacked order.

According to the illustrated exemplary embodiment, the first epitaxial stack 220 is provided on the substrate 200, with the first adhesive layer 260a interposed therebetween. The first epitaxial stack 220 may include a p-type semiconductor layer, an active layer, and an n-type semiconductor layer stacked in the upper direction from the bottom.

A first insulating layer 281 is disposed on a lower surface of the first epitaxial stack 220, in particular, a surface of the first epitaxial stack 220 facing the substrate 200. A plurality of contact holes are formed in the first insulating layer 281. The ohmic electrode 225p' contacting the p-type semiconductor layer of the first epitaxial stack 220 is provided in the contact hole. The ohmic electrode 225p' may be formed of various materials. In an exemplary embodiment, the ohmic electrode 225p' corresponding to a p-type ohmic electrode may include Au(Zn) or Au(Be). In this case, since the reflectance of a material forming the ohmic electrode 225p' may be lower than that of a material such as Ag, Al, or Au, an additional reflection electrode may be further disposed. For example, Ag, Au, etc. may be used as a material for the additional reflection electrode, and a metallic adhesive layer formed of a material such as Ti, Ni, Cr, or Ta may be disposed for adhesion with an adjacent component. In this case, the metallic adhesive layer may be thinly deposited on an upper surface and a lower surface of a reflection electrode including Ag, Au, etc.

The first p-type contact electrode 225p (e.g., the data line 2120) contacts the ohmic electrode 225p'. The first p-type contact electrode 225p is provided between the first insulating layer 281 and the first adhesive layer 260a.

The first p-type contact electrode 225p may overlap the first epitaxial stack 220, in particular, a light emitting region of the first epitaxial stack 220 in a plan view, and may be provided to cover all or most of the light emitting region. The first p-type contact electrode 225p may include a reflective material to reflect light emitted from the first epitaxial stack 220. The first insulating layer 281 may also include a reflective material to reflect light emitted from the first epitaxial stack 220. For example, the first insulating layer 281 may have an omni-directional reflector (ODR) structure.

The first wavelength pass filter 271 and the first n-type contact electrode 221n are provided on an upper surface of the first epitaxial stack 220.

The first wavelength pass filter 271 is provided on the upper surface of the first epitaxial stack 220 to cover substantially all the light emitting region of the first epitaxial stack 220.

The first n-type contact electrode 221n may be provided in a region corresponding to the first contact part 220c and may be formed of a conductive material. A contact hole is provided in the first wavelength pass filter 271, and the first n-type contact electrode 221n contacts the n-type semiconductor layer of the first epitaxial stack 220 through the contact hole.

The second adhesive layer 260b is provided on the second epitaxial stack 230, and the second n-type contact electrode 231n and the second epitaxial stack 230 are sequentially provided on the second adhesive layer 260b. The second epitaxial stack 230 may include an n-type semiconductor layer, an active layer, and a p-type semiconductor layer stacked in the upper direction from the bottom.

In an exemplary embodiment, the area of the second epitaxial stack 230 may be smaller than the area of the first epitaxial stack 220. A region of the second epitaxial stack 230 that corresponds to the first contact part 220c is removed, and thus, a portion of an upper surface of the first n-type contact electrode 221n is exposed. Also, the area of the second epitaxial stack 230 may be smaller than the area of the second n-type contact electrode 231n. A region of the second epitaxial stack 230 that corresponds to the second contact part 230c is removed, and thus, a portion of an upper surface of the second n-type contact electrode 231n is exposed.

The second p-type contact electrode 235p, the second wavelength pass filter 273, and the third p-type contact electrode 245p are sequentially provided on an upper surface of the second epitaxial stack 230. The area of the second wavelength pass filter 273 may be similar to the area of the second epitaxial stack 230, and the second wavelength pass filter 273 may have a contact hole in a partial region thereof. The second p-type contact electrode 235p and the third p-type contact electrode 245p may be physically and electrically connected to each other through the contact hole. The contact hole may be formed in plural, and may be provided in a region corresponding to a particular contact part, for example, the third contact part 240c. Alternatively, a portion where the second p-type contact electrode 235p and the third p-type contact electrode 245p are connected to each other may be varied.

The third epitaxial stack 240 is provided on the third p-type contact electrode 245p. The second epitaxial stack 230 may include a p-type semiconductor layer, an active layer, and an n-type semiconductor layer stacked in the upper direction from the bottom.

The area of the third epitaxial stack 240 may be smaller than the area of the second epitaxial stack 230. The area of the third epitaxial stack 240 may be smaller than the area of the third p-type contact electrode 245p, and thus, a portion of an upper surface of the third p-type contact electrode 245p may be exposed.

A second insulating layer 283 covering a stacked structure of the first, second, and third epitaxial stacks 220, 230, and 240 is disposed on the third epitaxial stack 240. The second insulating layer 283 may be formed of various organic/inorganic insulation materials, such as an inorganic insulation material including silicon nitride, silicon oxide, etc. or organic insulation materials including polyimide, without being limited thereto.

The first contact hole CH1 exposing the upper surface of the first n-type contact electrode 221n may be formed in the second insulating layer 283. The first scan line 2130R is connected to the first n-type contact electrode 221n through the first contact hole CH1.

A third insulating layer 285 is provided on the second insulating layer 283. The third insulating layer 285 may include substantially the same material as the second insulating layer 283. The third insulating layer 285 may also be formed of various organic/inorganic insulation materials, but the inventive concepts are not limited to a particular material of the second and third insulating layers 283 and 285.

The second and third scan lines 2130G and 2130B and the bridge line 2120b are provided on the third insulating layer 285.

The second contact hole CH2 exposing an upper surface of the second n-type contact electrode 231n at the second contact part 230c, the third contact hole CH3 exposing an upper surface of the third epitaxial stack 240, e.g., the n-type semiconductor layer of the third epitaxial stack 240 at the third contact part 240c, and the fourth and fifth contact holes CH4 and CH5 exposing an upper surface of the third p-type contact electrode 245p and an upper surface of the first p-type contact electrode 225p at the common contact part 250c are provided in the third insulating layer 285.

The second scan line 2130G is connected to the second n-type contact electrode 231n through the second contact hole CH2. The third scan line 2130B is connected to the n-type semiconductor layer of the third epitaxial stack 240 through the third contact hole CH3.

The data line 2120 is connected with the third p-type contact electrode 245p through the bridge line 2120b provided on the fourth contact hole CH4 and the fifth contact hole CH5. Since the third p-type contact electrode 245p is connected with the second p-type contact electrode 235p and forms a shared electrode, and the first p-type contact electrode 225p corresponds to the data line 2120, each of the first, second, and third p-type contact electrodes 225p, 235p, and 245p is connected through the bridge line 2120b.

The third scan line 2130B may directly contact the n-type semiconductor layer of the third epitaxial stack 240 and may be electrically connected thereto. However, the inventive concepts are not limited thereto, and in some exemplary embodiments, a third n-type contact electrode may be further provided between the third scan line 2130B and the n-type semiconductor layer of the third epitaxial stack 240.

In an exemplary embodiment, a concavo-convex portion may be selectively provided on an upper surface of each of the first, second, and third epitaxial stacks 220, 230, and 240. The concavo-convex portion may be provided only in a portion corresponding to a light emitting region of each semiconductor layer, or may be provided over the entire upper surface of each semiconductor layer.

In an exemplary embodiment, a light non-transmissive layer may be further provided on a side surface of the third insulating layer 285, which corresponds to a side surface of a pixel. The light non-transmissive layer may be a light blocking layer including a light absorbing or reflecting material to prevent light from the first, second, and third epitaxial stacks 220, 230, and 240 from being output toward a side of the light emitting stacked structure.

The light non-transmissive layer is not specifically limited as long as it absorbs or reflects light. In an exemplary embodiment, the light non-transmissive layer may be a DBR dielectric mirror or a metallic reflection layer formed on an insulating layer, or may be an organic polymer layer of a black color. When the metallic reflection layer is used as the light non-transmissive layer, the metallic reflection layer may be electrically insulated from an element of pixels.

When the light non-transmissive layer is provided on a side surface of the pixel, light from a particular pixel may be prevented from influencing an adjacent pixel or cause a color mixing phenomenon with light emitted from an adjacent pixel.

A pixel described above may be fabricated by sequentially stacking the first, second, and third epitaxial stacks 220, 230, and 240 on the substrate 200, which will be described in more detail below.

FIGS. 47, 49, 51, 53, 55, and 57 are plan views illustrating a method of sequentially stacking first, second, and third epitaxial stacks on a substrate according to an exemplary embodiment.

FIGS. 48, 50A to 50C, 52A to 52H, 54A to 54D, 56, and 58 are cross-sectional views taken along line I-I' of FIGS. 47, 49, 51, 53, 55, and 57.

Figure 47:
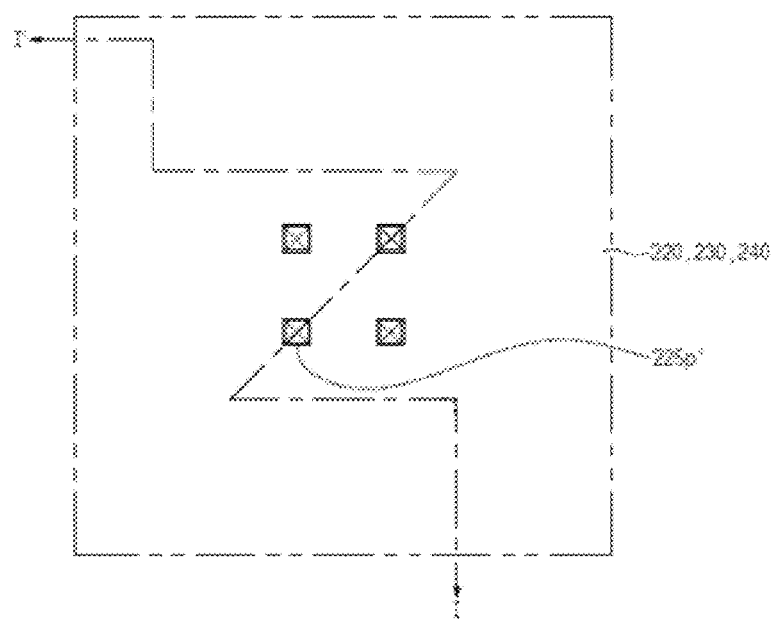
FIGS. 47, 49, 51, 53, 55, and 57 are plan views illustrating a method of sequentially stacking first, second, and third epitaxial stacks on a substrate according to an exemplary embodiment.
Figure 48:
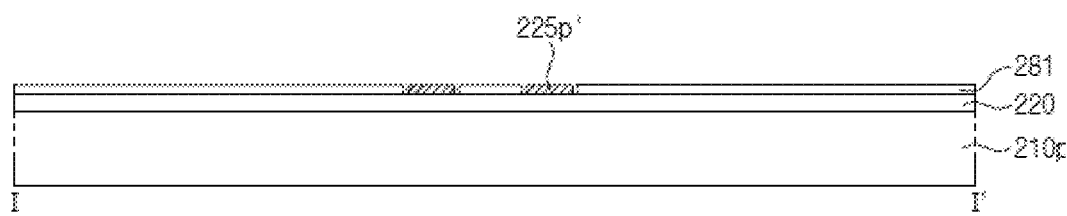
FIG. 48 is a cross-sectional view taken along line I-I' of FIG. 47, FIGS. 50A, 50B, and 50C are cross-sectional views taken along line I-I' of FIG. 49, FIGS. 52A, 52B, 52C, 52D, 52E, 52F, 52G, and 52H are cross-sectional views taken along line I-I' of FIG. 51, FIGS. 54A, 54B, 54C, and 54D are cross-sectional views taken along line I-I' of FIG. 53.

Referring to FIGS. 47 and 48, the first epitaxial stack 220 and the ohmic electrode 225p' are formed on a first temporary substrate 210p.

The first temporary substrate 210p may be a semiconductor substrate for forming the first epitaxial stack 220, and may be, for example, a GaAs substrate. The first epitaxial stack 220 is formed by stacking an n-type semiconductor layer, an active layer, and a p-type semiconductor layer on the first temporary substrate 210p.

The first insulating layer 281 is formed on the first temporary substrate 210p, and the ohmic electrode 225p' is formed in a contact hole of the first insulating layer 281.

The ohmic electrode 225p' may be formed by forming the first insulating layer 281 on the first temporary substrate 210p, coating a photoresist, patterning the photoresist, depositing a material for the ohmic electrode 225p' on the patterned photoresist, and lifting off the photoresist pattern. However, the inventive concepts are not limited thereto. For example, the ohmic electrode 225p' may be formed by forming the first insulating layer 281, patterning the first insulating layer 281 through photolithography, forming an ohmic electrode layer by using a material for the ohmic electrode 225p', and patterning the ohmic electrode layer through photolithography.

Figure 49:
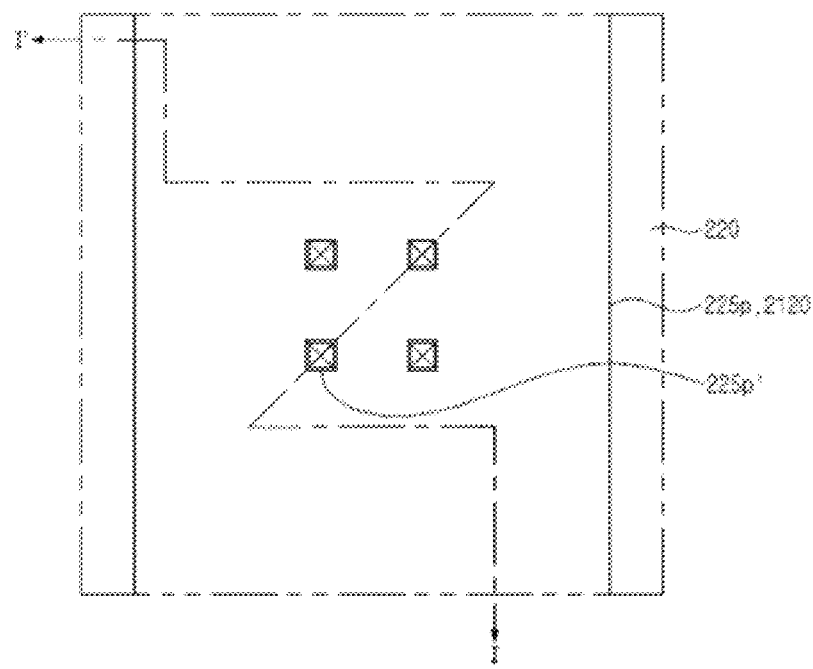
Figure 50A:
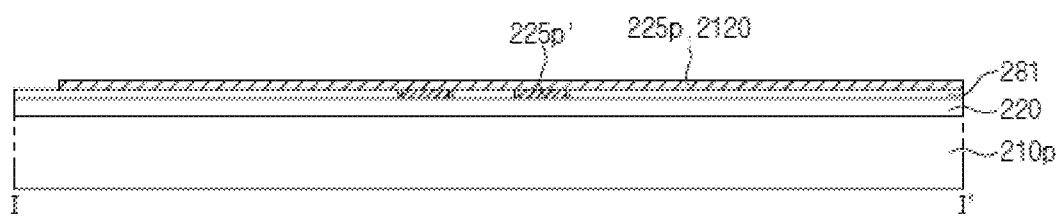

Referring to FIGS. 49 and 50A, a first p-type contact electrode 225p (e.g., data line 2120) is formed on the first temporary substrate 210p on which the ohmic electrode 225p' is formed. The first p-type contact electrode 225p may be formed of a reflective material. The first p-type contact electrode 225p may be formed, for example, by depositing a metallic material and patterning the deposited material by using photolithography.

Figure 50B:
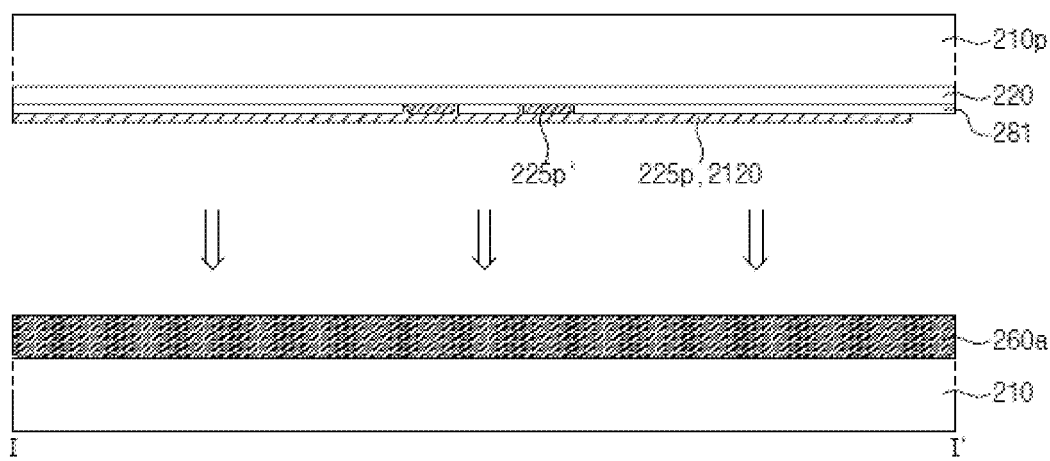

Referring to FIGS. 49 and 50B, the first epitaxial stack 220 formed on the first temporary substrate 201p may be inverted and attached on the substrate 200 on which the first adhesive layer 260a is formed.

Figure 50C:
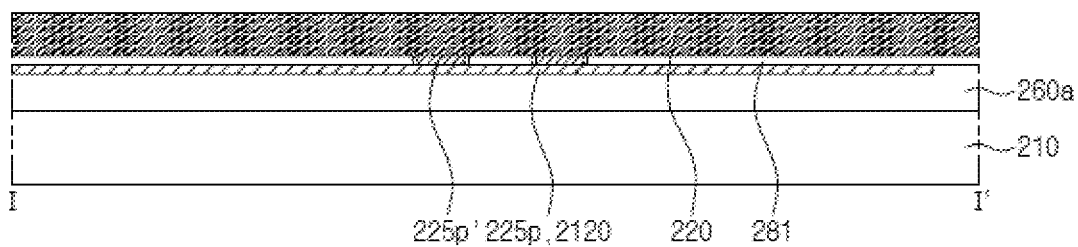

Referring to FIGS. 49 and 50C, the first temporary substrate 210p is removed after the first epitaxial stack 220 is attached on the substrate 200. The first temporary substrate 210p may be removed by various methods such as wet etching, dry etching, physical removal, and laser lift-off.

In some exemplary embodiments, a concavo-convex portion may be formed on an upper surface (or on an n-type semiconductor layer) of the first epitaxial stack 220, after the first temporary substrate 210p is removed. The concavo-convex portion may be formed through texturing using various etching processes. For example, the concavo-convex portion may be formed through various methods, such as dry etching using a micro photo process, wet etching using a crystalline property, texturing using a physical method such as sandblast, ion beam etching, and texturing using an etching speed difference of block copolymer.

Figure 51:
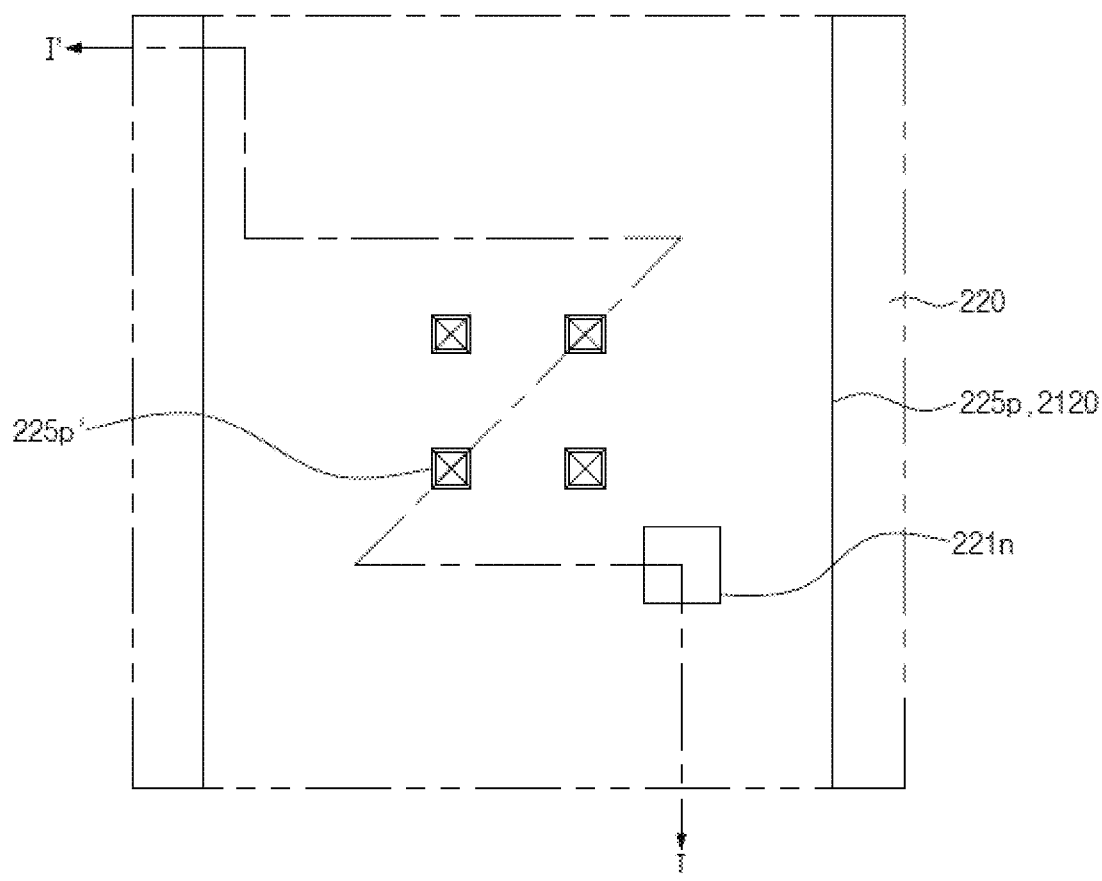
Figure 52A:
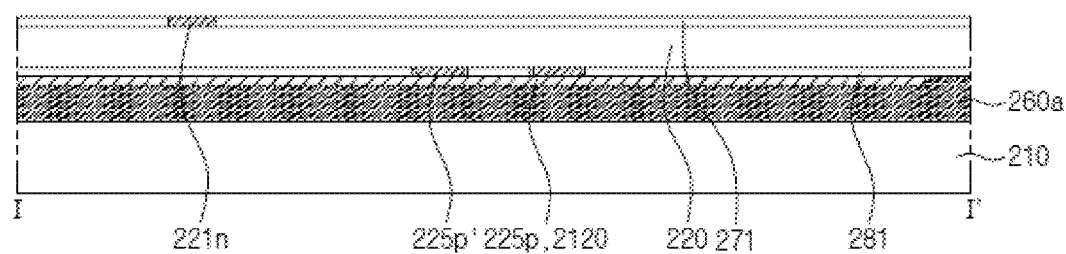

Referring to FIGS. 51 and 52A, the first n-type contact electrode 221n and the first wavelength pass filter 271 are formed on an upper surface of the first epitaxial stack 220.

The first n-type contact electrode 221n may be formed by forming the first wavelength pass filter 271 on the first epitaxial stack 220, coating a photoresist, patterning the photoresist, depositing a material for the first n-type contact electrode 221n on the patterned photoresist, and lifting off the photoresist pattern. However, the inventive concepts are not limited thereto, and may be formed through photolithography using two sheets of masks, for example.

Figure 52B:
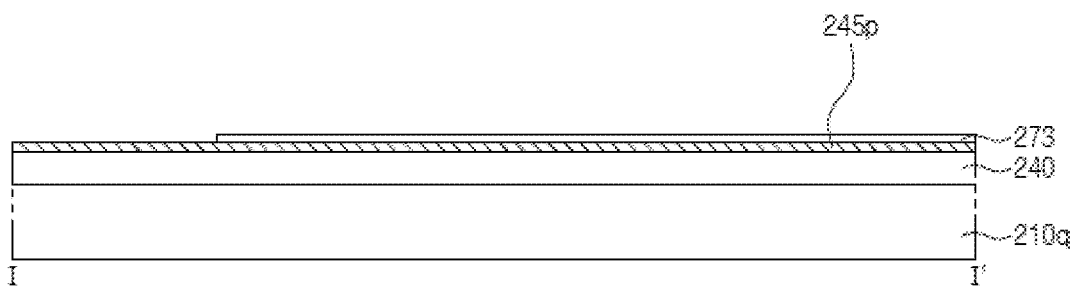

Referring to FIGS. 51 and 52B, the third epitaxial stack 240, the third p-type contact electrode 245p, and the second wavelength pass filter 273 are formed on a second temporary substrate 210q.

The second temporary substrate 210q may include a sapphire substrate. The third epitaxial stack 240 is formed by stacking an n-type semiconductor layer, an active layer, and a p-type semiconductor layer on the second temporary substrate 210q.

The second wavelength pass filter 273 may be formed to be smaller than the third epitaxial stack 240 and the third p-type contact electrode 245p, or may be formed to have a contact electrode therein. The second wavelength pass filter 273 may be patterned through photolithography.

Figure 52C:
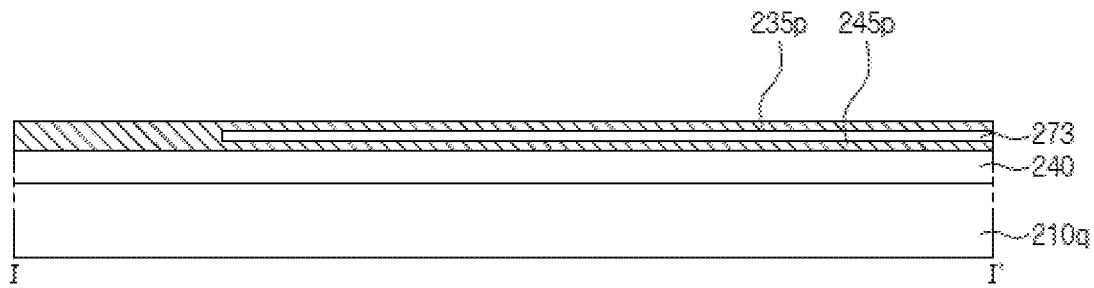

Referring to FIGS. 51 and 52C, the second p-type contact electrode 235p is formed on the second temporary substrate 210q on which the second wavelength pass filter 273 is formed. The second p-type contact electrode 235p may be formed to have a thickness enough to cover a step that may be caused when the second wavelength pass filter 273 is not formed. Since the second p-type contact electrode 235p directly contacts the third p-type contact electrode 245p, the third p-type contact electrode 245p and the second p-type contact electrode 235p are integrally formed in a region where the second wavelength pass filter 273 is not provided.

After the second p-type contact electrode 235p is formed, a planarization process may be performed on an upper surface of the second p-type contact electrode 235p. When forming the second p-type contact electrode 235p, a void may be formed at a step, which may be formed when the second wavelength pass filter 273 is not formed, but light scattering due to the void may not be significant.

Figure 52D:
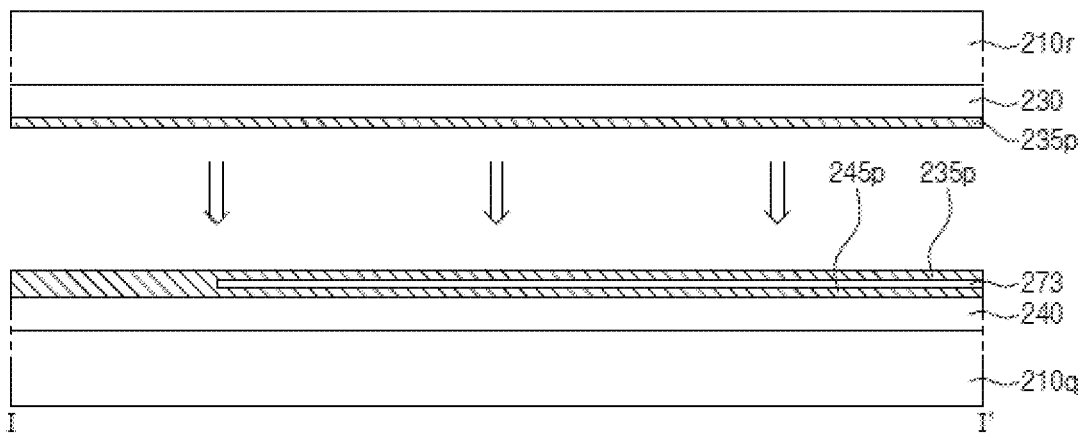

Referring to FIGS. 51 and 52D, the second epitaxial stack 230 and the second p-type contact electrode 235p are formed on a third temporary substrate 201r, and the second epitaxial stack 230 may be inverted and attached on the second temporary substrate 210*q* on which the second p-type contact electrode 235*p* is formed.

The third temporary substrate 210*r* may include a sapphire substrate. The third epitaxial stack 240 is formed by stacking an n-type semiconductor layer, an active layer, and a p-type semiconductor layer on the third temporary substrate 210*r*.

In an exemplary embodiment, the second p-type contact electrode 235*p* may be formed in both sides of the second temporary substrate 200*q* and the third temporary substrate 200*r* facing each other with substantially the same material, to improve bonding between the two substrates.

Figure 52E:
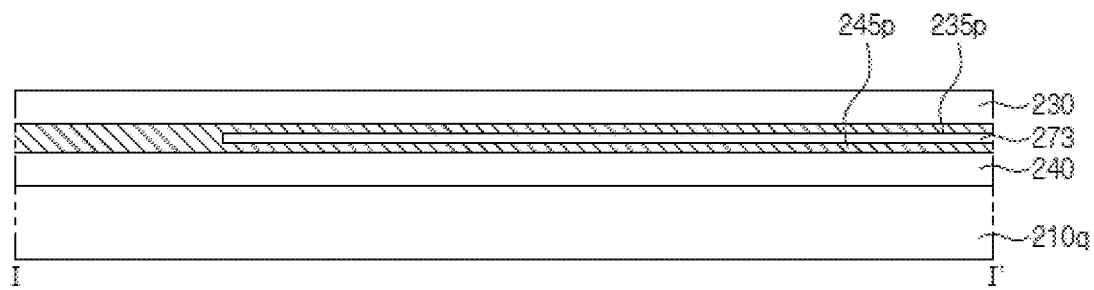

Referring to FIGS. 51 and 52E, the third temporary substrate 210*r* is removed after the second epitaxial stack 230 is attached on the third epitaxial stack 240. The third temporary substrate 210*r* may be removed by various methods, such as wet etching, dry etching, physical removal, and laser lift-off. For example, when the third temporary substrate 210*r* is a sapphire substrate, the sapphire substrate may be removed by a laser lift-off method, a stress lift-off method, a mechanical lift-off method, a physical polishing method, etc.

Figure 52F:
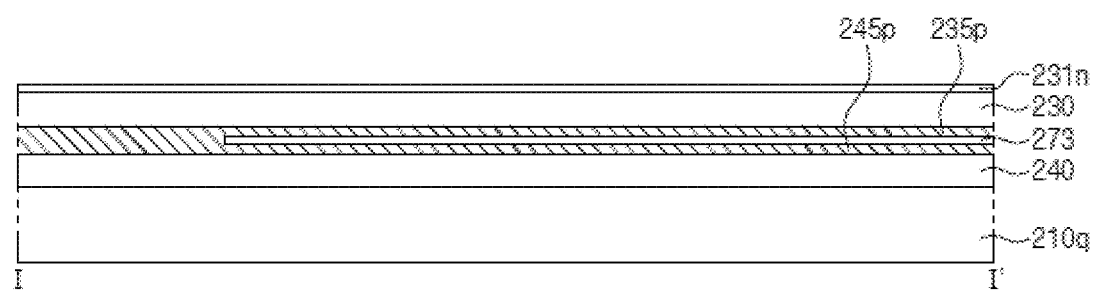

Referring to FIGS. 51 and 52F, the second n-type contact electrode 231*n* is formed on the second epitaxial stack 230 of the second temporary substrate 210*q*, on which the second and third epitaxial stacks 230 and 240 are formed.

Figure 52G:
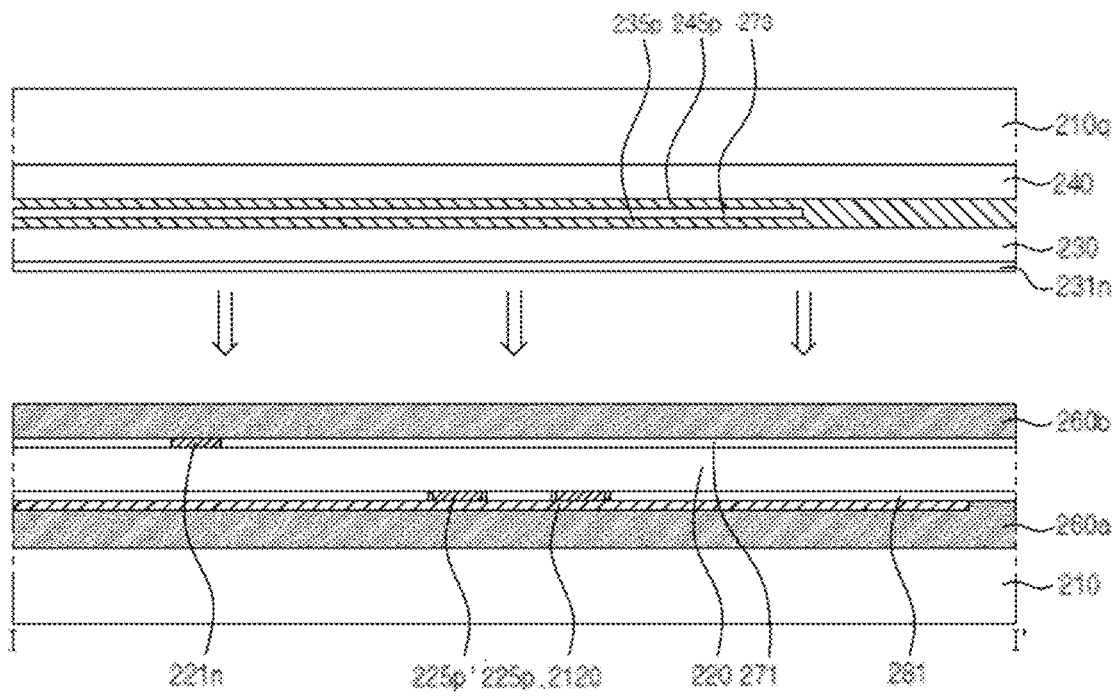

Referring to FIGS. 51 and 52G, the second temporary substrate 210*q*, on which the second and third epitaxial stacks 230 and 240 are formed, is inverted and attached on the first epitaxial stack 220 with the second adhesive layer 260*b* interposed therebetween. In this case, the second n-type contact electrode 231*n* and the first wavelength pass filter 271 are disposed to face each other.

Figure 52H:
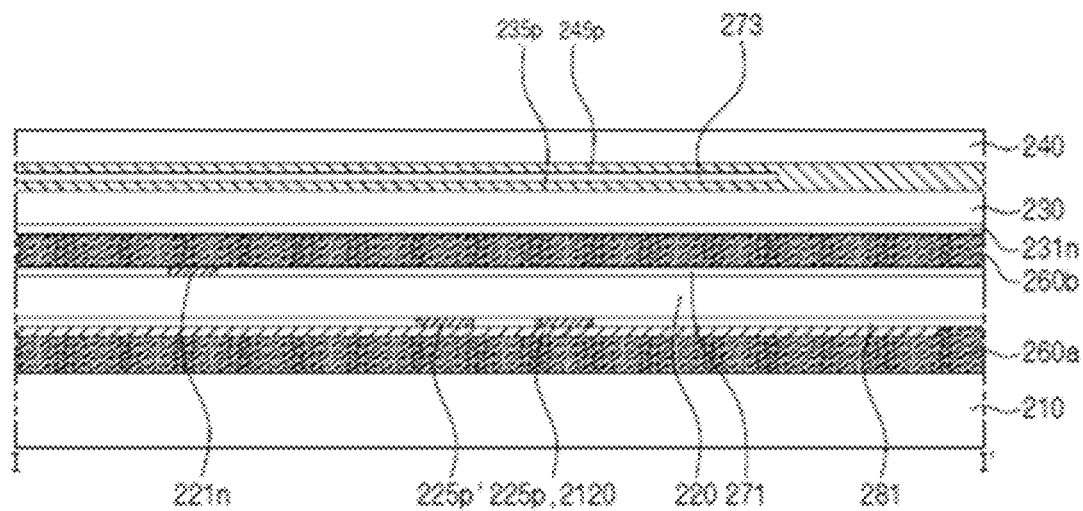

Referring to FIGS. 51 and 52H, the second temporary substrate 210*q* is removed after the second and third epitaxial stacks 230 and 240 are attached on the first epitaxial stack 220. The second temporary substrate 201*q* may be removed by various methods, such as wet etching, dry etching, physical removal, and laser lift-off. For example, when the second temporary substrate 210*q* is a sapphire substrate, the sapphire substrate may be removed by a laser lift-off method, a stress lift-off method, a mechanical lift-off method, a physical polishing method, etc.

As such, the first, second, and third epitaxial stacks 220, 230, and 240 are stacked on the substrate 200. According to an exemplary embodiment, after the second temporary substrate 210*q* is removed, a concavo-convex portion may be formed on an upper surface (or on an n-type semiconductor layer) of the third epitaxial stack 240. The concavo-convex portion may be formed through texturing using various etching processes. The concavo-convex portion may be formed by using a patterned sapphire substrate with concavo-convex as the second temporary substrate. In this case, the concavo-convex portion on the third epitaxial stack 240 may be easily formed. When the patterned sapphire substrate is removed from the third epitaxial stack 240, the concavo-convex portion on the patterned sapphire substrate may be transferred to the third epitaxial stack 240.

Figure 53:
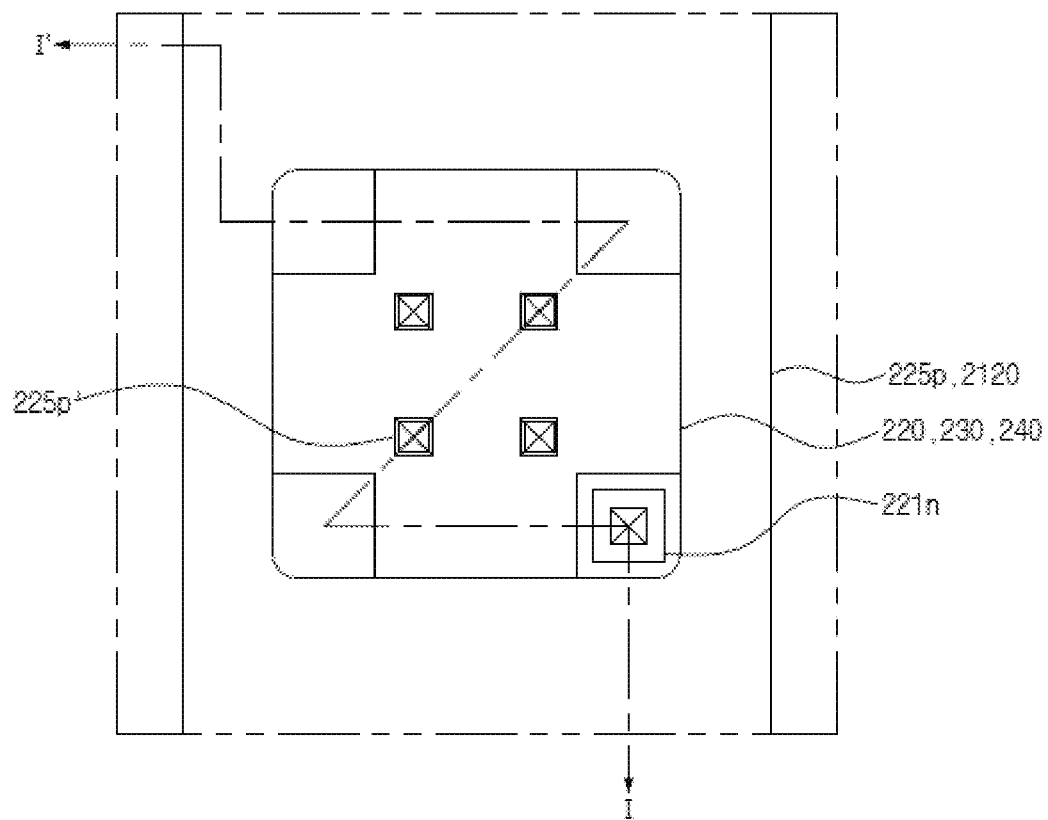
Figure 54A:
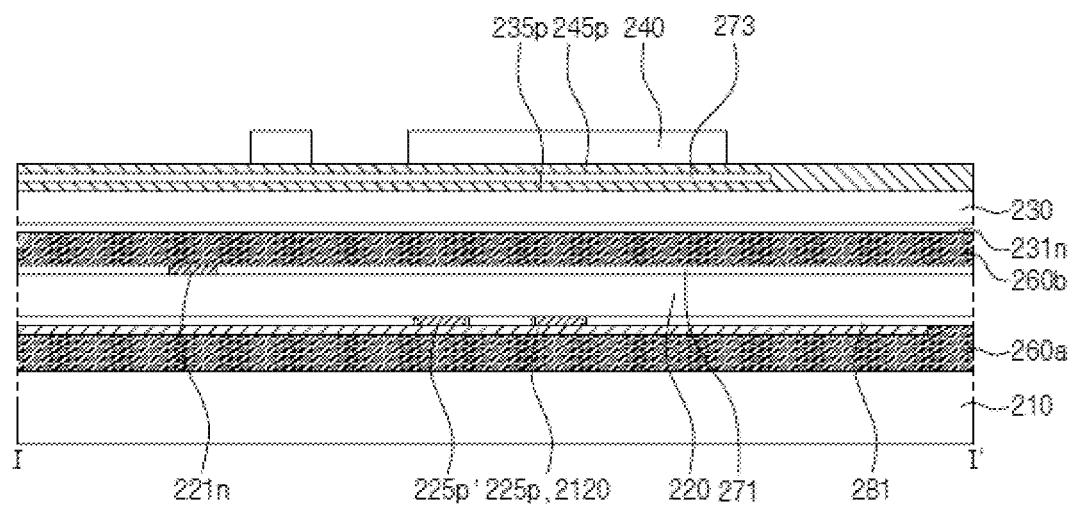

Referring to FIGS. 53 and 54A, the first p-type contact electrode 225*p* of the first epitaxial stack 220 is connected to the data line 2120. However, since the first n-type contact electrode 221*n* of the first epitaxial stack 220 is not connected to the first scan line 2130R, and is also not connected with the second and third scan lines 2130G and 2130B of the second and third epitaxial stacks 230 and 240 and the data line 2120, a process for a connection with the first, second, and third scan lines 2130R, 2130G, and 2130B and the data line 2120 is performed in a later process.

In particular, the third epitaxial stack 240 is patterned. Substantial portions of the third epitaxial stack 240 are removed except for the light emitting region. In particular, portions of the third epitaxial stack 240 corresponding to the first and second contact parts 220*c* and 230*c* and the common contact part 250*c* are removed. The third epitaxial stack 240 may be removed by various methods, such as wet etching or dry etching using photolithography. In this case, the third p-type contact electrode 245*p* may function as an etch stopper.

Figure 54B:
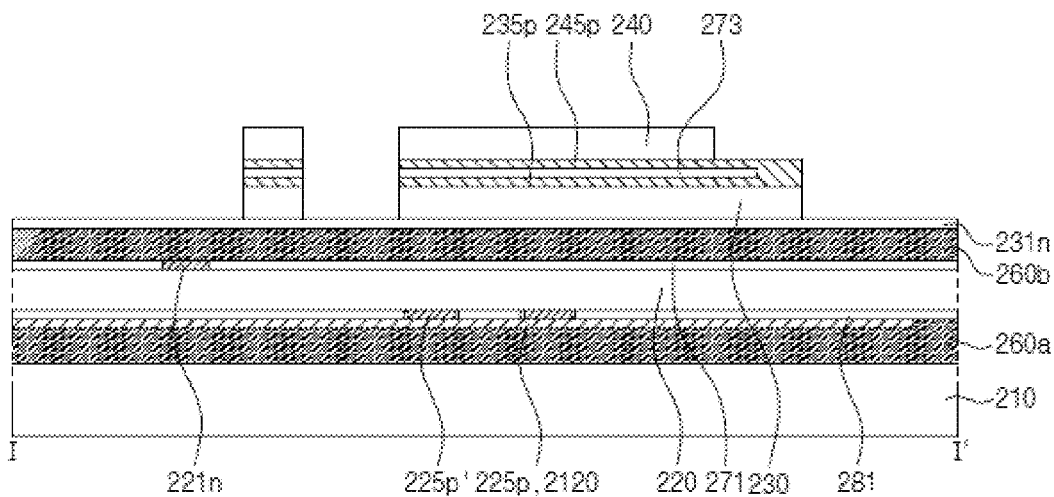

Referring to FIGS. 53 and 54B, the third p-type contact electrode 245*p*, the second wavelength pass filter 273, the second p-type contact electrode 235*p*, and the second epitaxial stack 230 are removed in a region except for the light emitting region. In particular, portions of the third p-type contact electrode 245*p* that correspond to the first contact part 220*c* and the second contact part 230*c*, the second wavelength pass filter 273, the second p-type contact electrode 235*p*, and the second epitaxial stack 230 are removed. The third p-type contact electrode 245*p*, the second wavelength pass filter 273, the second p-type contact electrode 235*p*, and the second epitaxial stack 230 may be removed by various methods, such as wet etching or dry etching using photolithography. In this case, the second n-type contact electrode 231*n* may function as an etch stopper.

Figure 54C:
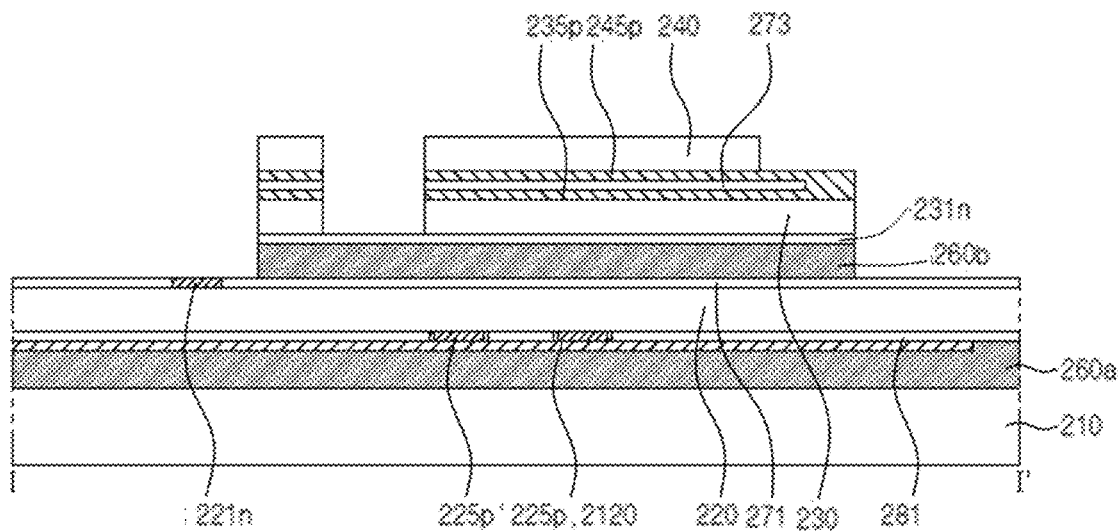

Referring to FIGS. 53 and 54C, the second n-type contact electrode 231*n* and the second adhesive layer 260*b* are removed in a region except for the light emitting region. In particular, portions of the second n-type contact electrode 231*n* and the second adhesive layer 260*b* that correspond to the first contact part 220*c* are removed. As such, an upper surface of the first n-type contact electrode 221*n* on the first contact part 220*c* is exposed. The second n-type contact electrode 231*n* and the second adhesive layer 260*b* may be removed by various methods, such as wet etching or dry etching using photolithography.

Figure 54D:
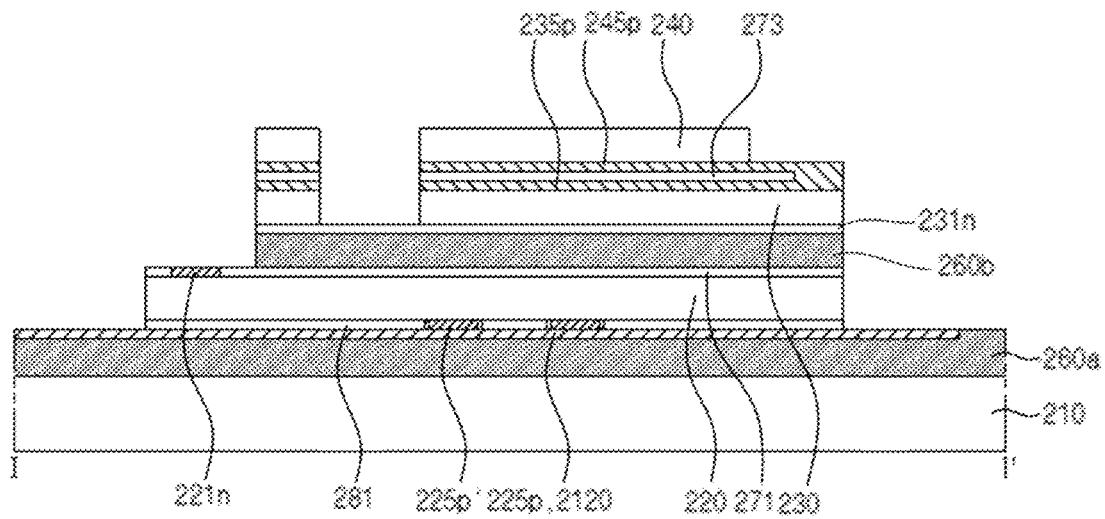

Referring to FIGS. 53 and 54D, the first wavelength pass filter 271, the first epitaxial stack 220, and the first insulating layer 281 are removed in a region except for the light emitting region to expose an upper surface of the first p-type contact electrode 225*p*. The first wavelength pass filter 271, the first epitaxial stack 220, and the first insulating layer 281 may be removed by various methods, such as wet etching or dry etching using photolithography. In this case, the first p-type contact electrode 225*p* may function as an etch stopper.

Figure 55:
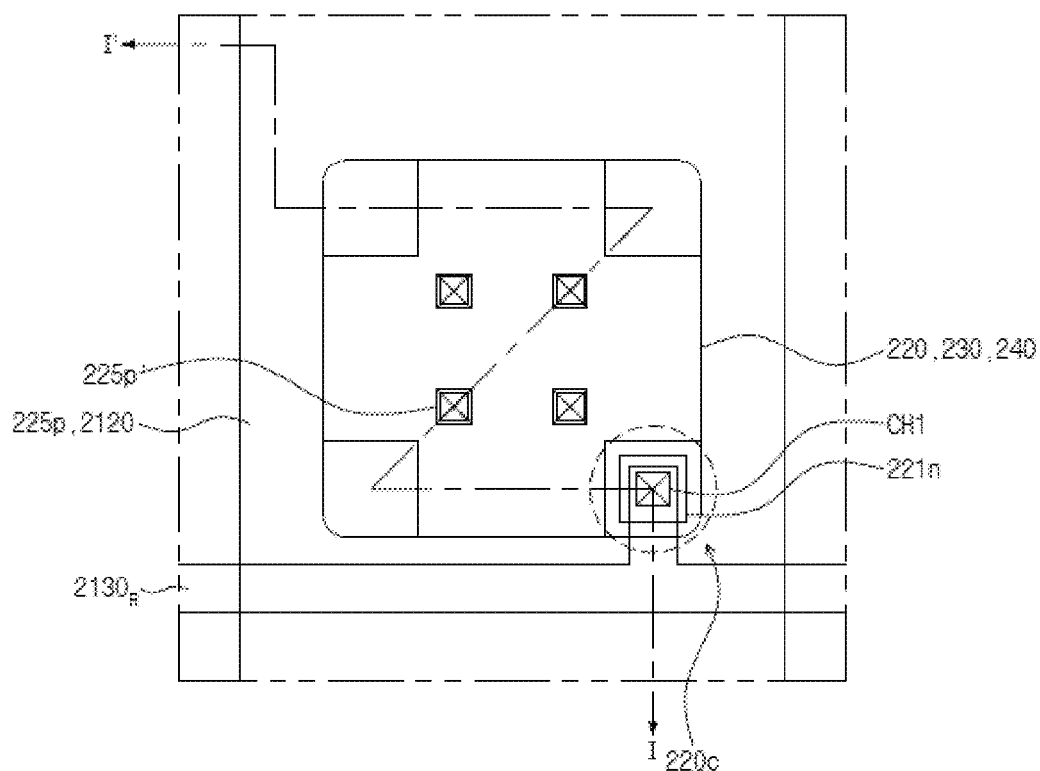
Figure 56:
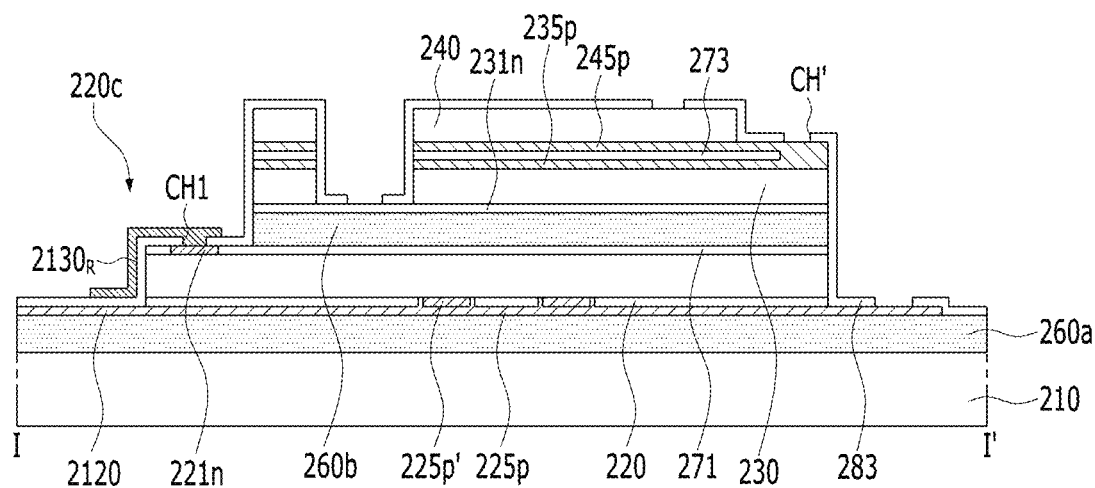
FIG. 56 is a cross-sectional view taken along line I-I' of FIG. 55.

Referring to FIGS. 55 and 56, the second insulating layer 283 having a plurality of contact holes is formed on the first, second, and third epitaxial stacks 220, 230, and 240 that are patterned, and the first scan line 2130R is formed on the second insulating layer 283. The second insulating layer 283 has the first contact hole CH1 in a region corresponding to the first contact part 220*c*, and an upper surface of the first n-type contact electrode 221*n* is exposed by the first contact hole CH1. The first scan line 2130R is connected to the first n-type contact electrode 221*n* through the first contact hole CH1. In some exemplary embodiments, in addition to the first contact hole CH1, dummy contact holes CH' may be selectively formed in the second insulating layer 283. The dummy contact holes CH' may be provided in regions corresponding to the second contact part 230*c*, the third contact part 240*c*, and the common contact part 250*c*. The dummy contact holes CH' may decrease the slope of inner side walls of second to fourth contact holes formed in the second contact part 230c, the third contact part 240c, and the common contact part 250c to be formed later.

The second insulating layer 283 and the first scan line 2130R may be formed by various methods, for example, through photolithography using plural sheets of masks. In an exemplary embodiment, the second insulating layer 283 having the first contact hole CH1 and the dummy contact holes CH' may be formed by forming the insulating layer 283 on substantially the entire surface of the substrate 200, and patterning the insulating layer 283 by using photolithography. Next, the first scan line 2130R may be formed by coating a photoresist on the substrate 200 on which the second insulating layer 283 is formed, patterning the photoresist, depositing a material for the first scan line 2130R on the patterned photoresist, and lifting off the photoresist pattern.

Figure 57:
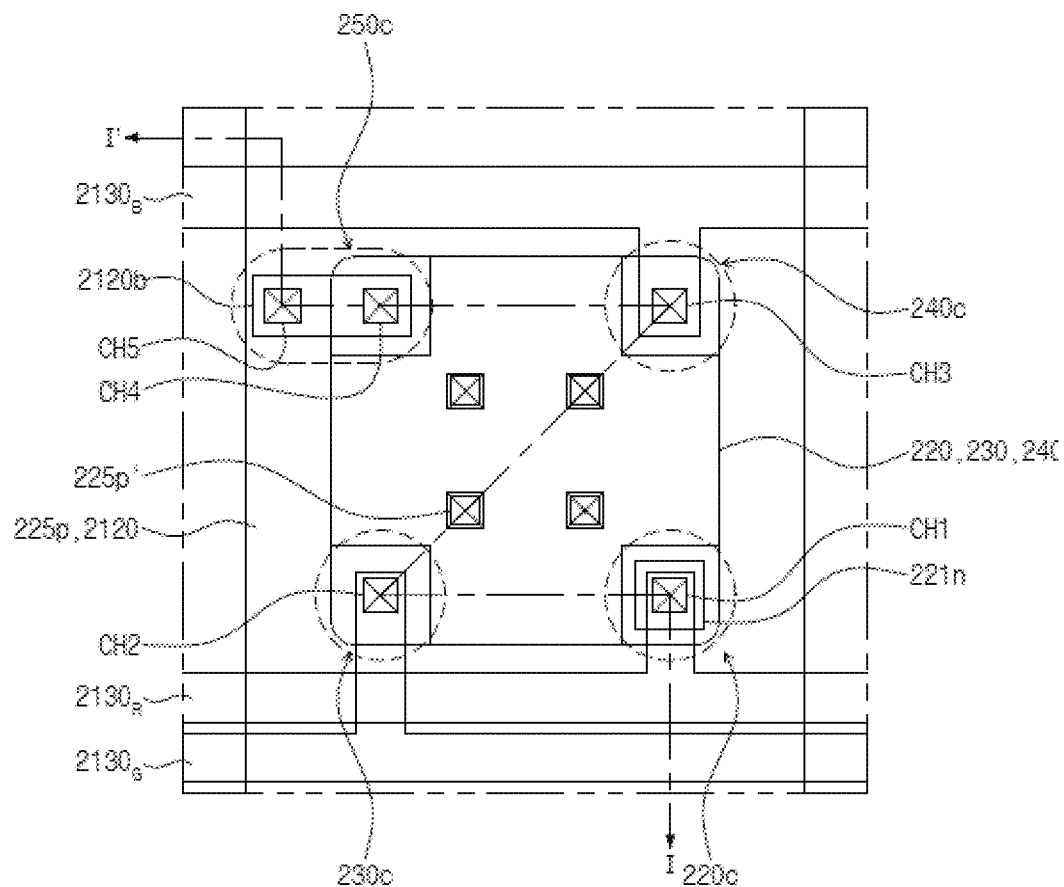
Figure 58:
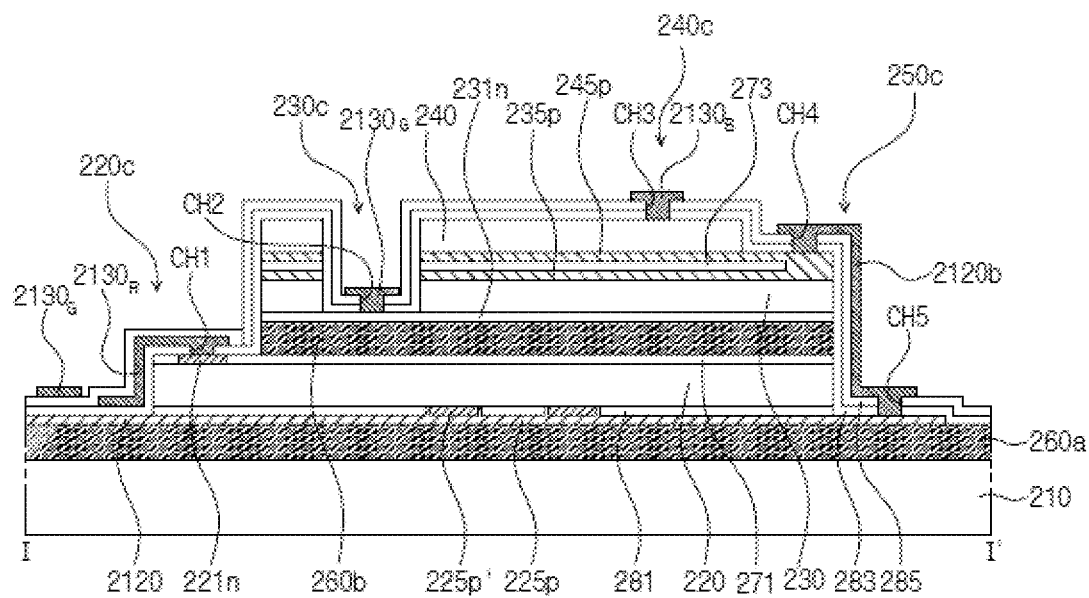
FIG. 58 is a cross-sectional view taken along line I-I' of FIG. 57.

Referring to FIGS. 57 and 58, the third insulating layer 285 is formed on the substrate 200 on which the first scan line 2130R is formed, and the second scan line 2130G, the third scan line 2130B, and the bridge line 2120b are formed on the third insulating layer 285.

The second scan line 2130G, the third scan line 2130B, and the bridge line 2120b may be formed on the third insulating layer 285 by various methods, for example, through photolithography using plural sheets of masks.

In an exemplary embodiment, the third insulating layer 285 having the second, third, fourth, and fifth contact holes CH2, CH3, CH4, and CH5 is formed. Here, the second, third, and fourth contact holes CH2, CH3, and CH4 may be formed by removing the third insulating layer 285 in the dummy contact holes. More particularly, the second contact hole CH2 is formed in a region corresponding to the second contact part 230c, the third contact hole CH3 is formed in a region corresponding to the third contact part 240c, and the fourth contact hole CH4 is formed in a region corresponding to the common contact part 250c. The fifth contact hole CH5 is further formed in the region corresponding to the common contact part 250c, together with the second, third, and fourth contact holes CH2, CH3, and CH4. As such, an upper surface of the second n-type contact electrode 231n is exposed by the second contact hole CH2, an upper surface of the third epitaxial stack 240 is exposed by the third contact hole CH3, an upper surface of the third p-type contact electrode 245p is exposed by the fourth contact hole CH4, and an upper surface of the first p-type contact electrode 225p is exposed by the fifth contact hole CH5.

Next, the second scan line 2130G, the third scan line 2130B, and the bridge line 2120b are formed.

The second scan line 2130G, the third scan line 2130B, and the bridge line 2120b may be formed by coating a photoresist on the substrate 200 on which the third insulating layer 285 is formed, patterning the photoresist, depositing a material for the second scan line 2130G, the third scan line 2130B, and the bridge line 2120b on the patterned photoresist, and lifting off the photoresist pattern. As such, the second scan line 2130G is connected to the second n-type contact electrode 231n through the second contact hole CH2, and the third scan line 2130B is connected to an n-type semiconductor layer of the third epitaxial stack 240 through the third contact hole CH3. The bridge line 2120b is connected to the third p-type contact electrode 245p by the fourth contact hole CH4 and is connected to the first p-type contact electrode 225p by the fifth contact hole CH5.

In an exemplary embodiment, a light non-transmissive layer may be further provided on a side surface of a pixel, in which a second insulating layer 283 and/or a third insulating layer 285 is formed. The light non-transmissive layer may be implemented as a DBR dielectric mirror, a metallic reflection layer formed on an insulating layer, or an organic polymer layer. When the metallic reflection layer is used as the light non-transmissive layer, the light non-transmissive layer may be formed to be in a floating state with other elements of the pixel for electrical insulation. In an exemplary embodiment, the light non-transmissive layer may be formed by depositing two insulating layers of different refractive indices. For example, the light non-transmissive layer may be formed by sequentially stacking a material of a low refractive index and a material of a high refractive index, or by stacking insulating layers of different refractive indices, such as $SiO_2$ and $SiN_x$.

As described above, according to the exemplary embodiments, it is possible to simultaneously form a wire part and contacts at a plurality of epitaxial stacks after sequentially stacking the plurality of epitaxial stacks.

According to an exemplary embodiment, a light emitting stacked structure includes a shared electrode between second and third epitaxial stacks, and p-type and n-type contact electrodes are respectively provided on an upper surface and a lower surface a first epitaxial stack without a mesa structure. However, the inventive concepts are not limited thereto, and the shared electrode may be provided between the second and third epitaxial stacks, and the first epitaxial stack may have a mesa structure, in which both the p-type contact electrode and the n-type contact electrode are provided on a lower surface thereof.

Figure 59A:
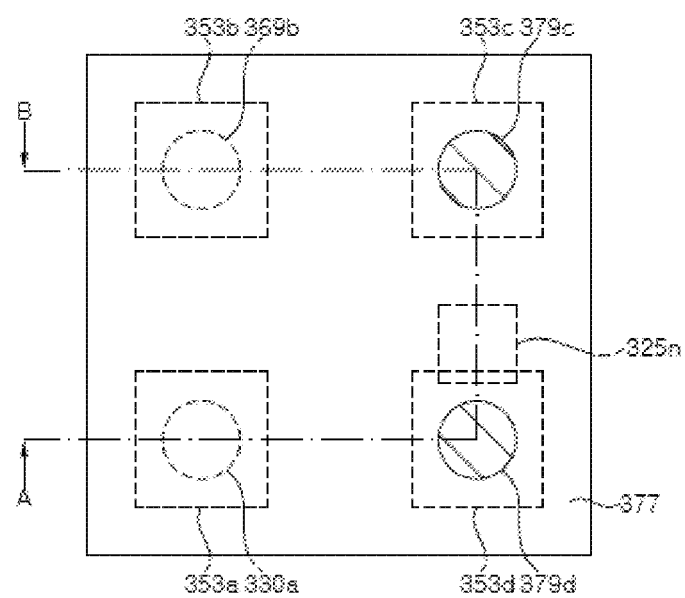
FIG. 59A is a schematic plan view of a display apparatus according to an exemplary embodiment.
Figure 59B:
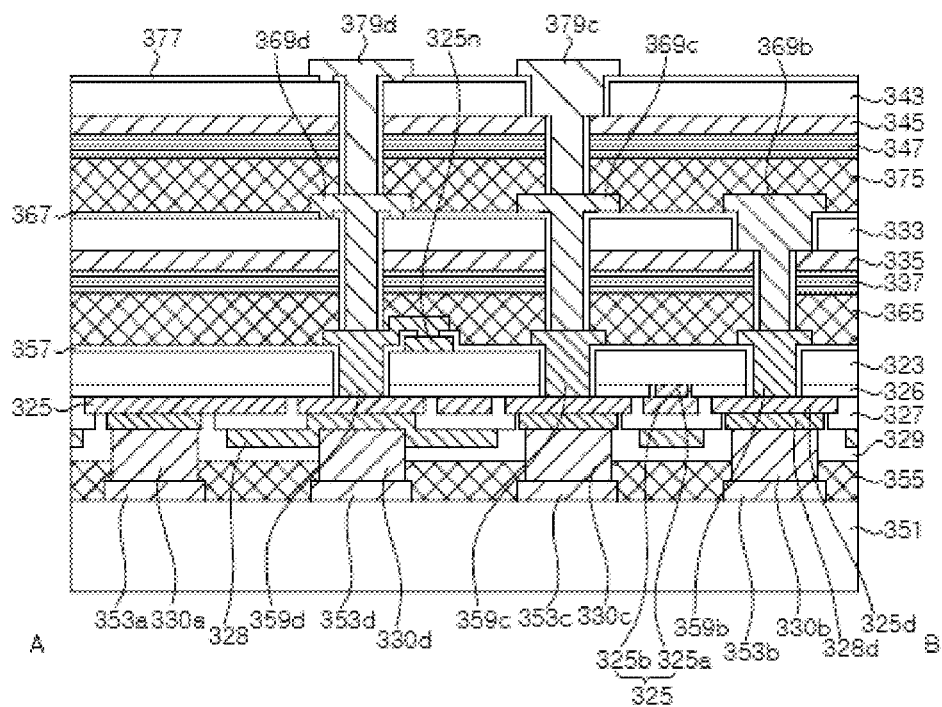
FIG. 59B is a schematic cross-sectional view taken along line A-B of FIG. 59A.

FIG. 59A is a schematic plan view of a display apparatus according to an exemplary embodiment, and FIG. 59B is a cross-sectional view taken along line A-B of FIG. 59A.

Referring to FIGS. 59A and 59B, the display apparatus according to an exemplary embodiment may include a substrate 351, electrode pads 353a, 353b, 353c, and 353d, a first LED stack 323, a second LED stack 333, a third LED stack 343, a first reflective electrode 325, a first ohmic electrode 325n, first auxiliary electrodes 325d, a ground layer 328, second auxiliary electrodes 328d, a second transparent electrode 335, a third transparent electrode 345, a first color filter 337, a second color filter 347, an underfill 355, a first bonding layer 365, and a second bonding layer 375. The display apparatus may further include bump pads 330a, 330b, 330c, and 330d, a plurality of connectors 359b, 359c, 359d, 369b, 369c, 369d, 379c, and 379d, and insulating layers 326, 327, 329, 357, 367, and 377.

The substrate 351 supports the LED stacks 323, 333, and 343. In addition, the substrate 351 may have circuits disposed therein. For example, the substrate 351 may be a silicon substrate in which thin film transistors (TFTs) are formed. A TFT substrate has been widely used for active matrix driving in a display field, such as a liquid crystal display (LCD) field, or the like. Since a structure of the TFT substrate is well known in the art, detailed descriptions thereof will be omitted.

Although FIG. 59B shows a cross-sectional view of a unit pixel disposed on the substrate 351, a plurality of unit pixels may be arranged on the substrate 351, and may be driven by an active matrix method.

The electrode pads 353a, 353b, 353c, and 353d are disposed on the substrate 351. The electrode pads 353a, 353b, 353c, and 353d corresponding to the respective unit pixels are disposed on the substrate 351. The electrode pads 353a, 353b, 353c, and 353d are each connected to the circuits in the substrate 351. Although the electrode pad 353d is described as being provided to each unit pixel, in some exemplary embodiments, the electrode pad 353d may not be provided to all pixels. As will be described in more detail below, the ground layer 328 may be continuously disposed over the pixels. Therefore, the electrode pad 353*d* may be provided to only one of the pixels.

The first LED stack 323, the second LED stack 333, and the third LED stack 343 each includes an n-type semiconductor layer, a p-type semiconductor layer, and an active layer interposed between the n-type semiconductor layer and the p-type semiconductor layer. In particular, the active layer may have a multiple quantum well structure.

The first, second, and third LED stacks 323, 333, and 343 emit light having a longer wavelength as being disposed closer to the substrate 351. For example, the first LED stack 323 may be an inorganic light emitting diode emitting red light, the second LED stack 333 may be an inorganic light emitting diode emitting green light, and the third LED stack 343 may be an inorganic light emitting diode emitting blue light. The first LED stack 323 may include a GaInP based well layer, and the second LED stack 333 and the third LED stack 343 may include a GaInN based well layer. However, the inventive concepts are not limited thereto. When the pixel includes a micro LED, which has a surface area less than about 10,000 square μm as known in the art, or less than about 4,000 square μm or 2,500 square μm in other exemplary embodiments, the first LED stack 323 may emit any one of red, green, and blue light, and the second and third LED stacks 333 and 343 may emit a different one of red, green, and blue light, without adversely affecting operation, due to the small form factor of a micro LED.

In addition, both surfaces of each LED stack 323, 333, or 343 are an n-type semiconductor layer and a p-type semiconductor layer, respectively. Hereinafter, an upper surface of each of the first, second, and third LED stacks 323, 333, and 343 will be described as an n-type and a lower surface of each of the first, second, and third LED stacks 323, 333, and 343 will be described as a p-type. However, the inventive concepts are not limited thereto, and the type of the semiconductor of the upper surface and the lower surface of each of the LED stacks may be reversed.

When the upper surface of the third LED stack 343 is an n-type, a roughened surface may be formed on the upper surface of the third LED stack 343 by surface texturing through chemical etching. Roughened surfaces may also be formed on the upper surfaces of the first LED stack 323 and the second LED stack 333 by surface texturing. In general, green light has higher visibility than red light or blue light. As such, when the second LED stack 333 emits green light, the surface texturing may be applied to first LED stack 323 and the third LED stack, while no surface texturing or less surface texturing may be applied to the second LED stack 333. In this manner, light extraction efficiency may be improved in the first LED stack 323 and the third LED stack to make luminous efficiency substantially uniform between the LED stacks.

The first LED stack 323 is disposed closer to the substrate 351, the second LED stack 333 is disposed on the first LED stack 323, and the third LED stack 343 is disposed on the second LED stack. Since the first LED stack 323 according to an exemplary embodiment may emit light having a longer wavelength than that of the second and third LED stacks 333 and 343, light generated in the first LED stack 323 may be emitted to the outside through the second and third LED stacks 333 and 343. In addition, since the second LED stack 333 according to an exemplary embodiment may emit light having a longer wavelength than that of the third LED stack 343, light generated in the second LED stack 333 may be emitted to the outside through the third LED stack 343.

The first reflective electrode 325 is in ohmic contact with the p-type semiconductor layer of the first LED stack 323, and reflects the light generated in the first LED stack 323. For example, the first reflective electrode 325 may include an ohmic contact layer 325*a* and a reflective layer 325*b*.

The ohmic contact layer 325*a* is in partial contact with the p-type semiconductor layer. The ohmic contact layer 325*a* may be formed in a limited area to prevent absorption of light by the ohmic contact layer 325*a*. The ohmic contact layer 325*a* may be in contact with the first LED stack 323 in at least one region. The ohmic contact layer 325*a* may be formed of a transparent conductive oxide or an Au alloy, such as AuZn or AuBe.

The reflective layer 325*b* covers the ohmic contact layer 325*a* and the lower surface of the first LED stack 323. The reflective layer 325*b* may include a reflective metal layer, such as Al, Ag, or Au. In addition, the reflective layer 325*b* may include an adhesive metal layer, such as Ti, Ta, Ni, or Cr, on upper and lower surfaces of the reflective metal layer to improve adhesion of the reflective metal layer. The reflective layer 325*b* may be formed of a metal layer having a high reflectance to light generated in the first LED stack 323, for example, red light. The reflective layer 325*b* may have a low reflectance to light generated in the second LED stack 333 and the third LED stack 343, for example, green light or blue light. As such, the reflective layer 325*b* may absorb light generated in the second and third LED stacks 333 and 343 and traveling toward the substrate 351 to decrease optical interference. For example, Au may be used as the material forming the reflective layer 325*b* in the first LED stack 323 because of its high reflectance to red light and its low reflectance to blue light and green light.

In some exemplary embodiments, the ohmic contact layer 325*a* may be omitted and the first reflective electrode 325 may include the reflective layer 325*b* including an Au alloy, such as AuZn or AuBe, which has high reflectivity and capable of forming an ohmic contact.

The first reflective electrodes 325 are spaced apart from each other in regions where the connectors 359*b*, 359*c*, and 359*d* are to be formed, and the first auxiliary electrodes 325*d* formed of substantially the same material as that of the reflective layer 325*b* may be disposed in these regions. The first auxiliary electrodes 325*d* may be formed to prevent steps from being generated when the bump pads 330*a*, 330*b*, 330*c*, and 330*d* are formed, but may be omitted in some exemplary embodiments. The first auxiliary electrodes 325*d* are spaced apart from the first LED stack 323 by the insulation layer 326.

The first ohmic electrode 325*n* is disposed on the upper surface of the first LED stack 323, and is in ohmic contact with the n-type semiconductor layer of the first LED stack 323. The first ohmic electrode 325*n* may be formed of an Au alloy, such as AuGe.

The insulation layer 326 may be disposed between the first reflective electrode 325 and the first LED stack 323, and may have at least one openings 326*a* (see FIG. 62B) exposing the lower surface of the LED stack 323. The ohmic contact layer 325*a* may be disposed in the opening 326*a*, or the reflective layer 325*b* may be in ohmic contact with the p-type semiconductor layer of the first LED stack 323 through the opening 326*a*.

The insulation layer 327 may be disposed between the first reflective electrode 325 and the first auxiliary electrodes 325*d*, and the substrate 351, and may have openings exposing the first reflective electrode 325 and the first auxiliary electrodes 325*d*.

The ground layer 328 is disposed between the insulation layer 327 and the substrate 351. The ground layer 328 may be connected to one of the first auxiliary electrodes 325d through the opening of the insulation layer 327. When the auxiliary electrodes 325d are omitted, the ground layer 328 may be in contact with the insulation layer 326 or may be spaced apart from the insulation layer 326 to be disposed on the insulation layer 327. The ground layer 328 may be formed of a conductive material layer, for example, metal. The ground layer 328 may be disposed in only one pixel region or be continuously disposed in a plurality of pixel regions.

The ground layer 328 is electrically insulated from the first reflective electrode 325. The ground layer 328 is electrically connected in common to the n-type semiconductor layers of the first, second, and third LED stacks 323, 333, and 343. Therefore, the ground layer 328 is insulated from the first reflective electrode 325, which is electrically connected to the p-type semiconductor layer of the first LED stack 323.

The second auxiliary electrodes 328d may be disposed in the openings of the insulation layer 327. The second auxiliary electrodes 328d may be formed on the same plane as the ground layer 328 and may include substantially the same material as the ground layer 328. The second auxiliary electrodes 328d are disposed to prevent steps from being generated when the bump pads 330a, 330b, 330c, and 330d are formed, but may be omitted in some exemplary embodiments. One of the second auxiliary electrodes 328d may be connected to the reflective electrode 325, and the others of the second auxiliary electrodes 328d may be disposed on the first auxiliary electrodes 325d, respectively.

The insulation layer 329 may be disposed between the ground layer 328 and the second auxiliary electrodes 328d, and the substrate 351, and may have openings exposing the ground layer 328 and the second auxiliary electrodes 328d.

The bump pads 330a, 330b, 330c, and 330d are disposed between the ground layer 328 and the second auxiliary electrodes 328d, and the electrode pads 353a, 353b, 353c, and 353d to electrically connect the ground layer 328 and the second auxiliary electrodes 328d to the electrode pads 353a, 353b, 353c, and 353d to each other. The bump pads 330a, 330b, 330c, and 330d may be formed on the ground layer 328 and the second auxiliary electrodes 328d through the openings of the insulation layer 329, and may be bonded to the electrode pads 353a, 353b, 353c, and 353d. The bump pad 330d may be provided to all of the pixels, but the inventive concepts are not limited thereto. For example, the bump pad 330d may be selectively formed in the pixels, as the electrode pad 353d.

The underfill 355 fills spaces between the bump pads 330a, 330b, 330c, and 330d and the electrode pads 353a, 353b, 353c, and 353d to protect the bump pads 330a, 330b, 330c, and 330d and the electrode pads 353a, 353b, 353c, and 353d, and to reinforce adhesion of the bump pads 330a, 330b, 330c, and 330d. In some exemplary embodiments, an anisotropic conductive film (ACF) may be used instead of the underfill 355. The ACF may be disposed between the bump pads 330a, 330b, 330c, and 330d, and the electrode pads 353a, 353b, 353c, and 353d to electrically connect the bump pads 330a, 330b, 330c, and 330d and the electrode pads 353a, 353b, 353c, and 353d to each other.

The second transparent electrode 335 may be in ohmic contact with the p-type semiconductor layer of the second LED stack 333. The second transparent electrode 335 may be formed of a metal layer or a conductive oxide layer that is transparent to red light and green light. The third transparent electrode 345 may be in ohmic contact with the p-type semiconductor layer of the third LED stack 333. The third transparent electrode 345 may be formed of a metal layer or a conductive oxide layer that is transparent to red light, green light, and blue light. The second transparent electrode 335 and the third transparent electrode 345 may be in ohmic contact with the p-type semiconductor layer of each LED stack to assist current distribution. For example, the conductive oxide layer used for the second and third transparent electrodes 335 and 345 may include $SnO_2$, $InO_2$, ITO, ZnO, IZO, or others.

The first color filter 337 may be disposed between the first LED stack 323 and the second LED stack 333. The second color filter 347 may be disposed between the second LED stack 333 and the third LED stack 343. The first color filter 337 transmit light generated in the first LED stack 323, and reflects light generated in the second LED stack 333. The second color filter 347 transmits light generated in the first and second LED stacks 323 and 333, and reflects light generated in the third LED stack 343. As such, light generated in the first LED stack 323 may be emitted to the outside through the second LED stack 333 and the third LED stack 343, and light emitted from the second LED stack 333 may be emitted to the outside through the third LED stack 343. Furthermore, light generated in the second LED stack 333 may be prevented from being lost by being incident on the first LED stack 323, or light generated in the third LED stack 343 may be prevented from being lost by being incident on the second LED stack 333.

In some exemplary embodiments, the first color filter 337 may reflect light generated in the third LED stack 343.

The first and second color filters 337 and 347 may be, for example, a low pass filter that passes only a low frequency range, e.g., a long wavelength band, a band pass filter that passes only a predetermined wavelength band, or a band stop filter that blocks only a predetermined wavelength band. In particular, the first and second color filters 337 and 347 may be formed by alternately stacking insulation layers having refractive indices different from each other, for example, may be formed by alternately stacking $TiO_2$ and $SiO_2$ insulation layers. In particular, the first and second color filters 337 and 347 may include a distributed Bragg reflector (DBR). A stop band of the distributed Bragg reflector may be controlled by adjusting thicknesses of $TiO_2$ and $SiO_2$. The low pass filter and the band pass filter may also be formed by alternately stacking insulation layers having refractive indices different from each other.

The first bonding layer 365 couples the second LED stack 333 to the first LED stack 323. As illustrated in the drawing, the first bonding layer 365 may be in contact with the first LED stack 323, and may be in contact with the first color filter 337. The first bonding layer 365 may transmit light generated in the first LED stack 323.

The second bonding layer 375 couples the third LED stack 343 to the second LED stack 333. As illustrated in the drawing, the first bonding layer 375 may be in contact with the second LED stack 333, and may be in contact with the second color filter 347. However, the inventive concepts are not limited thereto, and a transparent conductive layer may be disposed on the second LED stack 333. The second bonding layer 375 may transmits light generated in the first LED stack 323 and the second LED stack 333.

The bonding layers 365 and 375 may be formed by forming transparent organic layers or transparent inorganic layers on each of two targets bonded to each other and bonding the targets to each other. Examples of the organic layer may include SUB, poly(methylmethacrylate)

(PMMA), polyimide, parylene, benzocyclobutene (BCB), or others, and examples of the inorganic layer include $Al_2O_3$, $SiO_2$, $SiN_x$, or others. The organic layers may be bonded at a high vacuum and a high pressure, and the inorganic layers may be bonded under a high vacuum when the surface energy is lowered by using plasma or the like, after flattening surfaces by, for example, a chemical mechanical polishing process. In addition, the first and second bonding layers 365 and 375 may be formed of, for example, light-transmissive spin-on-glass.

Meanwhile, a 1-1-th connector 359d is adopted in order to electrically connect the n-type semiconductor layer of the first LED stack 323 to the ground layer 328. The 1-1-th connector 359d may connect the first ohmic electrode 325n to the first auxiliary electrode 325d to which the ground layer 328 is connected.

The 1-1-th connector 359d may penetrate through the first LED stack 323, and is electrically insulated from the p-type semiconductor layer of the first LED stack 323 by the insulation layer 357. The insulation layer 357 may at least partially cover the upper surface of the first LED stack 323, and may cover the first ohmic electrode 325n. However, the insulation layer 357 may have openings exposing the first auxiliary electrodes 325d and openings exposing the first ohmic electrode 325n. The 1-1-th connector 359d may be connected to the first auxiliary electrode 325d and the first ohmic electrode 325n through the openings of the insulation layer 357.

Although the 1-1-th connector 359d is described as penetrating through the first LED stack 323, in some exemplary embodiments, the 1-1-th connector 359d may be formed on a side surface of the first LED stack 323.

Meanwhile, a 1-2-th connector 359b and a 1-3-th connector 359c may penetrate through the first LED stack 323 and be connected to the first auxiliary electrodes 325d. The 1-2-th connector 359b and the 1-3-th connector 359c are insulated from the first LED stack 323. As such, the insulation layer 357 may be interposed between the first LED stack 323 and the 1-2-th connector 359b and the 1-3-th connector 359c.

Meanwhile, a 2-1-th connector 369d is disposed to electrically connect the n-type semiconductor layer of the second LED stack 333 to the electrode pad 353d. The 2-1-th connector 369d may be connected to the upper surface of the second LED stack 333, and penetrate through the second LED stack 333. However, the inventive concepts are not limited thereto, and the 2-1-th connector 369d may be formed on a side surface of the second LED stack 333. Meanwhile, as illustrated in the drawing, the 2-1-th connector 369d may be connected to the 1-1-th connector 359d to be electrically connected to the electrode pad 353d. In addition, the 2-1-th connector 369d may be stacked on the 1-1-th connector 359d in a vertical direction.

The insulation layer 367 may be interposed between the second LED stack 333 and the 2-1-th connector 369d in order to prevent the 2-1-th connector 369d from being short-circuited to the p-type semiconductor layer of the second LED stack 333 and the second transparent electrode 335. The insulation layer 367 may cover the upper surface of the second LED stack 333, but may have openings in order to allow connection of the 2-1-th connector 369d.

A 2-2-th connector 369b is disposed to electrically connect the second transparent electrode 335 to the electrode pad 353b. The 2-2-th connector 369b is electrically connected to the p-type semiconductor layer of the second LED stack 333 through the second transparent electrode 335. As illustrated in the drawing, the 2-2-th connector 369b may penetrate through the second LED stack 333. However, the inventive concepts are not limited thereto, and the 2-2-th connector 369b may be formed on a side surface of the second LED stack 333. The insulation layer 367 is interposed between the 2-2-th connector 369b and the second LED stack 333 to prevent the 2-2-th connector 369b from being short-circuited to the upper surface of the second LED stack 333.

Additionally, a 2-3-th connector 369c may be disposed to penetrate through the second LED stack 333. The 2-3-th connector 369c may be electrically connected to the electrode pad 353c, and may be connected to, for example, the 1-3-th connector 359c. The 2-3-th connector 369c is insulated from the second LED stack 333. As such, the insulation layer 367 may be interposed between the second LED stack 333 and the 2-3-th connector 369c.

The 2-3-th connector 369c may function as an intermediate connector, and may be omitted in some exemplary embodiments.

Meanwhile, a 3-1-th connector 379d is disposed to electrically connect the upper surface of the third LED stack 343 to the electrode pad 353d. The 3-1-th connector 379d may be connected to the upper surface, that is, the n-type semiconductor layer of the third LED stack 343, and penetrate through the third LED stack 343. As illustrated in the drawing, the 3-1-th connector 379d may be connected to the 2-1-th connector 369d to be electrically connected to the electrode pad 353d.

Meanwhile, the insulation layer 377 may be interposed between the third LED stack 343 and the 3-1-th connector 379d in order to prevent the 3-1-th connector 379d from being short-circuited to the lower surface of the third LED stack 343. The insulation layer 377 may cover the upper surface of the third LED stack 343, but may have openings exposing the upper surface of the third LED stack 343 in order to allow connection of the 3-1-th connector 379d.

A 3-2-th connector 379c is disposed to electrically connect the third transparent electrode 345 to the electrode pad 353c. The 3-2-th connector 379c is electrically connected to the lower surface of the third LED stack 343 through the third transparent electrode 345. As illustrated in the drawing, the 3-2-th connector 379c may penetrate through the third LED stack 343. However, the inventive concepts are not limited thereto, and the 3-2-th connector 379c may be formed on a side surface of the third LED stack 343. The insulation layer 377 is interposed between the 3-2-th connector 379c and the third LED stack 343 to prevent the 3-2-th connector 379c from being short-circuited to the upper surface of the third LED stack 343.

As illustrated in the drawing, the 3-2-th connector 379c may be connected to the 2-3-th connector 369c to be electrically connected to the electrode pad 353c. In this case, the 2-3-th connector 369c and the 1-3-th connector 359c may function as intermediate connectors. In addition, as illustrated in the drawing, the 3-2-th connector 379c may be stacked on the 2-3-th connector 369c in the vertical direction. As such, the 1-3-th connector 359c, the 2-3-th connector 369c, and the 3-2-th connector 379c are electrically connected to each other, and are stacked in the vertical direction. The 1-1-th connector 359d, the 2-1-th connector 369d, and the 3-1-th connector 379d may also be stacked in the vertical direction.

The connectors may be disposed along a path of light and absorb light. When the connectors are disposed to be spaced apart from each other in a transversal direction, an area through which light is emitted may be decreased to increase light loss. According to an exemplary embodiment, since the connectors are stacked in the vertical direction, loss of light generated in the first LED stack 323 and the second LED stack 333 by the connectors may be suppressed.

In some exemplary embodiments, a light reflecting layer or a light blocking material layer covering side surfaces of the first, second, and third LED stacks 323, 333, and 343 may be formed to prevent optical interference between the pixels, which may occur when light is emitted through side surfaces of the first LED stack 323, the second LED stack 333, and the third LED stack 343. For example, the light reflecting layer may include a distributed Bragg reflector (DBR) or an insulation layer formed of $SiO_2$ or the like, with a reflective metal layer or a highly reflective organic layer deposited thereon. As another example, a black epoxy may be used as the light blocking layer. In this manner, a light blocking material may prevent optical interference between light emitting devices to increase a contrast of an image.

According to the illustrated exemplary embodiment, the first LED stack 323 is electrically connected to the electrode pads 353*d* and 353*a*, the second LED stack 333 is electrically connected to the electrode pads 353*d* and 353*b*, and the third LED stack 343 is electrically connected to the electrode pads 353*d* and 353*c*. As such, cathodes of the first LED stack 323, the second LED stack 333, and the third LED stack 343 are electrically connected in common to the electrode pad 353*d*, and anodes of the first LED stack 323, the second LED stack 333, and the third LED stack 343 are electrically connected to different electrode pads 353*a*, 353*b*, and 353*c*, respectively. In this manner, the first, second, and third LED stacks 323, 333, and 343 may be independently drivable. Furthermore, the first, second, and third LED stacks 323, 333, and 343 are disposed on a thin film transistor substrate 351 and are electrically connected to circuits in the substrate 351, so as to be driven in an active matrix manner.

Figure 60:
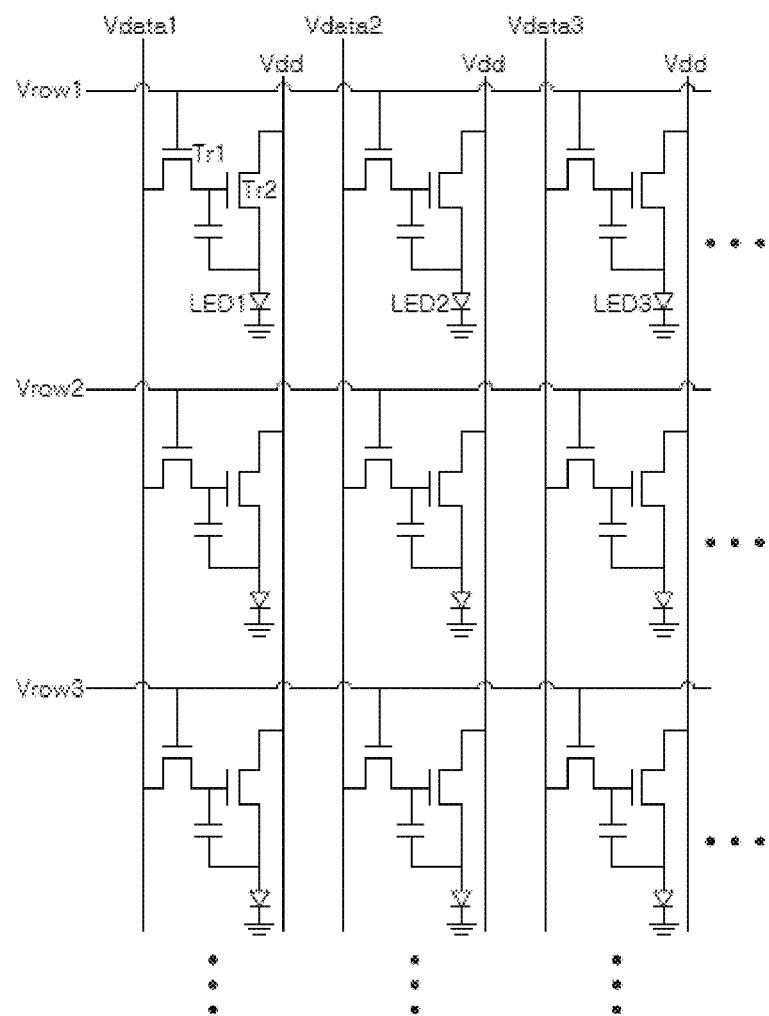
FIG. 60 is a schematic circuit diagram of a display apparatus according to an exemplary embodiment.

FIG. 60 is a schematic circuit diagram of a display apparatus according to an exemplary embodiment.

Referring to FIG. 60, a driving circuit according to an exemplary embodiment includes two or more transistors Tr1 and Tr2 and capacitors. When a power supply is connected to selection lines Vrow1 to Vrow3 and data voltages are applied to data lines Vdata1 to Vdata3, voltages are applied to corresponding light emitting diodes. In addition, electric charges are charged in corresponding capacitors depending on values of Vdata1 to Vdata3. Since a turn-on state of Tr2 may be maintained by a charging voltage of the capacitor, a voltage of the capacitor may be maintained even though power supplied to Vrow1 is blocked, and a voltage may be applied to light emitting diodes LED1 to LED3. In addition, currents flowing to LED1 to LED3 may be changed depending on the values of Vdata1 to Vdata3. The current may continuously supplied through Vdd, and continuous light emission is thus possible.

The transistors Tr1 and Tr2 and the capacitors may be formed in the substrate 351. LED1 to LED3 may correspond to the first, second, and third stacks 323, 333, and 343 stacked in one pixel. Anodes of the first, second, and third LED stacks are connected to the transistor Tr2, and cathodes of the first, second, and third LED stacks are grounded. In the illustrated exemplary embodiment, the first, second, and third LED stacks 323, 333, and 343 may be connected in common to the ground layer 328 to be grounded. Further, the ground layer 328 may be continuously disposed in two or more pixels, and furthermore, in all of the pixels, and may be connected in common to all LED stacks in the display apparatus. The ground layer 328 may be disposed between the pixels and the substrate to remove noise of an active matrix driving circuit.

Figure 61A:
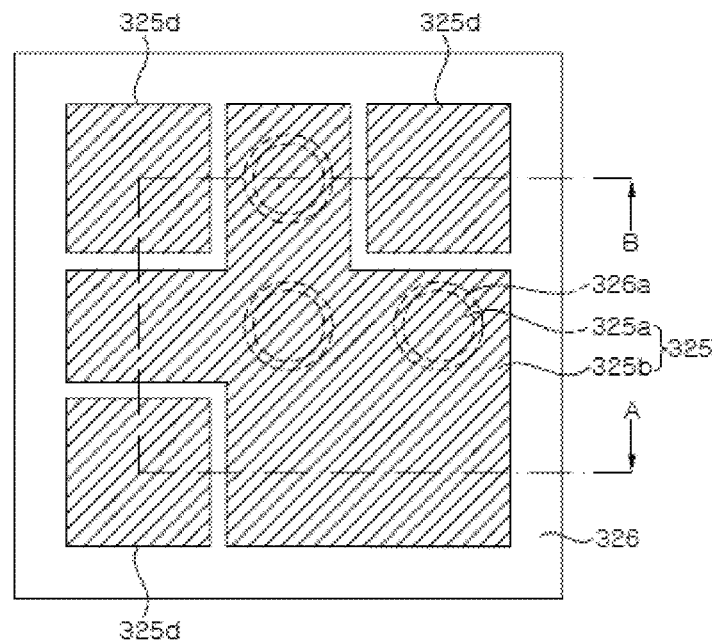
FIGS. 61A, 61B, 62A, 62B, 63A, 63B, 64A, 64B, 65A, 65B, 66A, 66B, 67A, 67B, 68A, 68B, 69A, 69B, 70A, 70B, 71A, 71B, 72A, 72B, 73A, 73B, 74A, 74B, 75A, and 75B are schematic plan views and cross-sectional views illustrating a method of manufacturing a display apparatus according to an exemplary embodiment.

Although FIG. 61A shows a circuit diagram for driving a display apparatus in active matrix manner, the inventive concepts are not limited thereto, and various other circuits may also be used.

FIGS. 61A, 61B, 62A, 62B, 63A, 63B, 64A, 64B, 65A, 65B, 66A, 66B, 67A, 67B, 68A, 68B, 69A, 69B, 70A, 70B, 71A, 71B, 72A, 72B, 73A, 73B, 74A, 74B, 75A, and 75B are schematic plan views and cross-sectional views illustrating a method of manufacturing a display apparatus according to an exemplary embodiment of the present disclosure. In the drawings, each plan view corresponds to a plan view of FIG. 59A, and each cross-sectional view corresponds to a cross-sectional view taken along line A-B of a corresponding plan view.

Figure 61B:
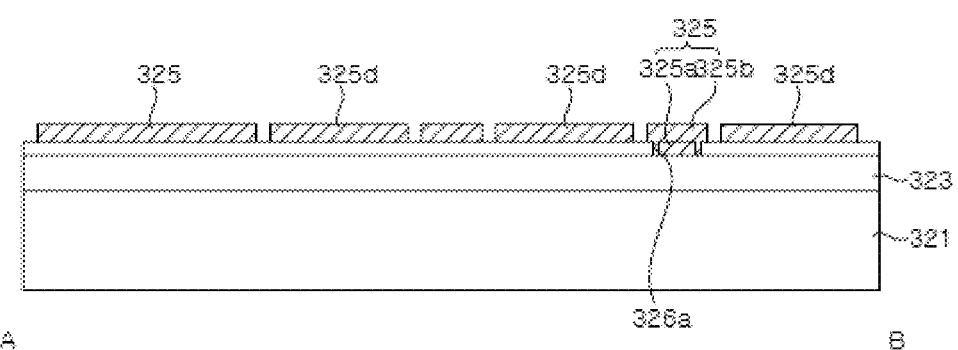

Referring to FIGS. 61A and 61B, the first LED stack 323 is grown on a first substrate 321. The first substrate 321 may be, for example, a GaAs substrate. The first LED stack 323 may be formed of AlGaInP based semiconductor layers, and includes an n-type semiconductor layer, an active layer, and a p-type semiconductor layer.

The insulation layer 326 having openings 326*a* is formed on the first LED stack 323, and the ohmic contact layer 325*a* and the reflective layer 325*b* are formed, such that the first reflective electrode 325 is formed. The first reflective electrode 325 is formed in each pixel region, and is electrically connected to the p-type semiconductor layer of the first LED stack 323. The ohmic contact layer 325*a* may be formed in the openings of the insulation layer 326 by a lift-off technology or the like.

The reflective layer 325*b* is formed on the insulation layer 326, and covers the ohmic contact layer 325*a*. The reflective layer 325*b* may be formed in regions except for three corner portions in each pixel region. The reflective layer 325*b* may be formed by a lift-off technology or the like. When the reflective layer 325*b* includes an ohmic contact material, the ohmic contact layer 325*a* may be omitted in some exemplary embodiments.

The first auxiliary electrodes 325*d* are formed together with the reflective layer 325*b* on the insulation layer 326. The first auxiliary electrodes 325*d* may be formed together with the reflective layer 325*b* using substantially the same material as that of the reflective layer 325*b* by the lift-off technology or the like. The first auxiliary electrodes 325*d* may be disposed in the vicinity of three corners of each pixel region.

Figure 62A:
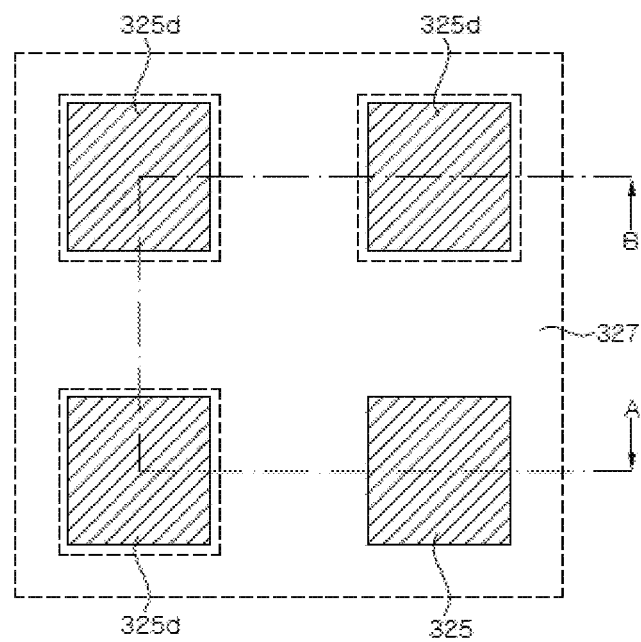
Figure 62B:
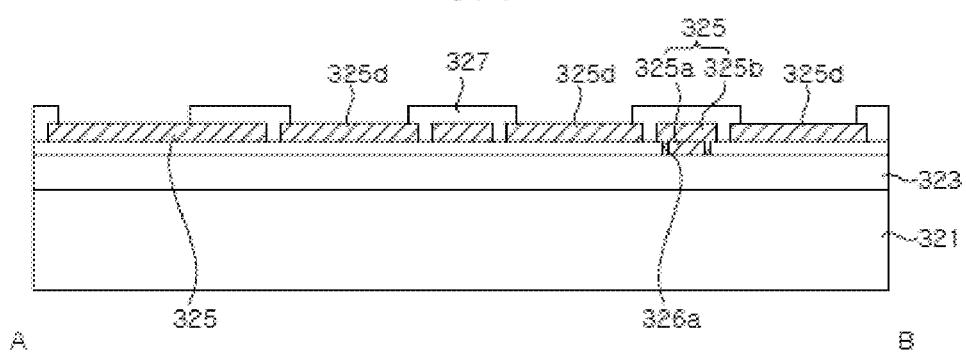

Referring to FIGS. 62A and 62B, the insulation layer 327 is formed on the reflective layer 325*b* and the first auxiliary electrodes 325*d*. The insulation layer 327 has openings exposing the reflective layer 325*b* and the first auxiliary electrodes 325*d*. The openings of the insulation layer 327 may have substantially a rectangular shape as illustrated in the drawings. However, the shape of the openings of the insulation layer 327 is not limited thereto, and may have another shape in some exemplary embodiments.

Figure 63A:
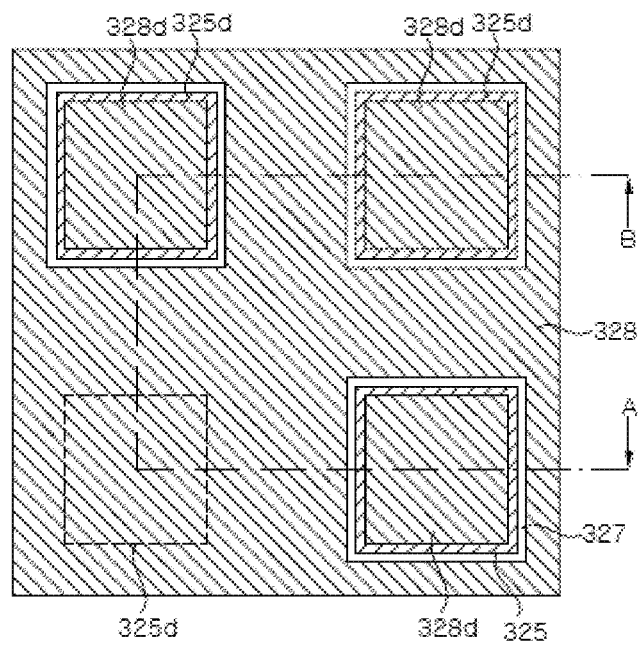
Figure 63B:
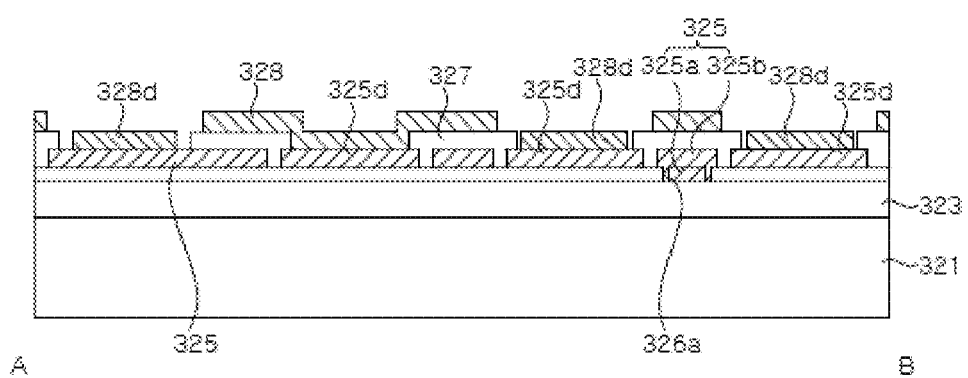

Referring to FIGS. 63A and 63B, the ground layer 328 and the second auxiliary electrodes 328*d* are formed on the insulation layer 327. The ground layer 328 may cover most of the pixel region, and may be connected to one of the first auxiliary electrodes 325*d*. One of the second auxiliary electrodes 328*d* may be connected to the first reflective electrode 325, and the remaining second auxiliary electrodes 328*d* may be disposed on the first auxiliary electrodes 325*d*, respectively. In some exemplary embodiments, the first auxiliary electrodes 325*d* and the second auxiliary electrodes 328*d* may be omitted.

The ground layer 328 may be formed in each pixel region. However, the inventive concepts are not limited thereto, and the ground layer 328 may be continuously formed in a plurality of pixel regions.

Figure 64A:
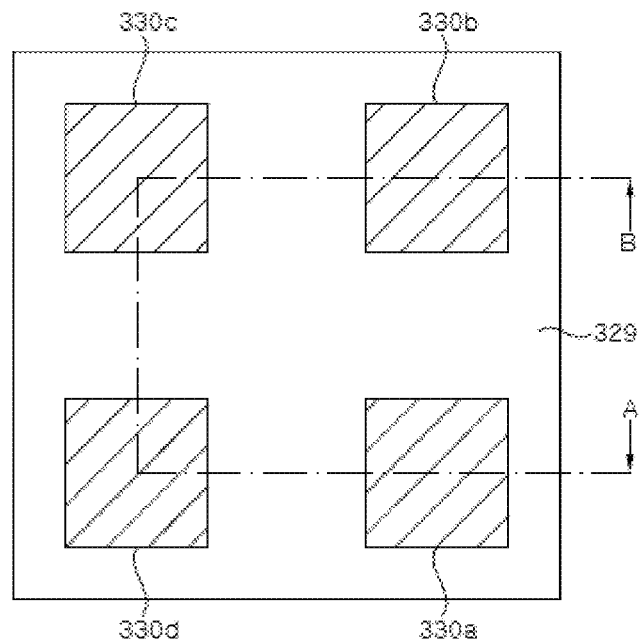
Figure 64B:
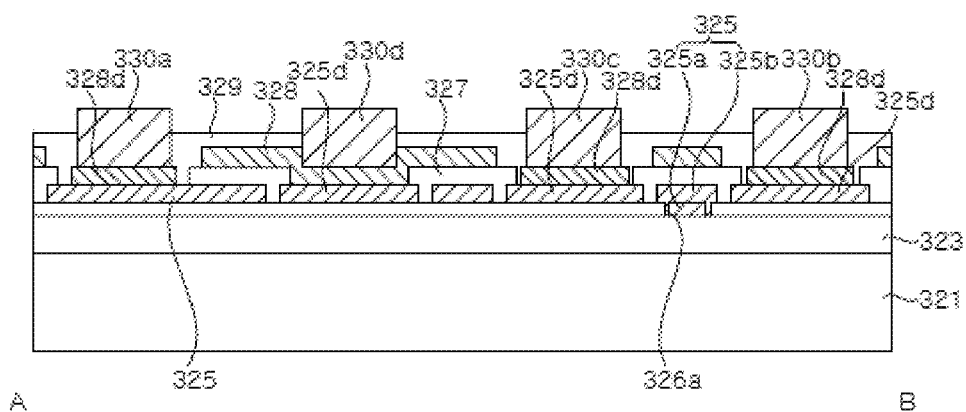

Referring to FIGS. 64A and 64B, the insulation layer 329 may be formed on the ground layer 328 and the second auxiliary electrodes 328*d*. The insulation layer 329 has openings exposing the ground layer 328 and the second auxiliary electrodes 328*d*.

The insulation layers 326, 327, and 328 described above may be formed of an electrically insulating material, for example, a silicon oxide or a silicon nitride.

Then, the bump pads 330*a*, 330*b*, 330*c*, and 330*d* are formed. The bump pads 330*a*, 330*b*, 330*c*, and 330*d* are disposed on the ground layer 328 and the second auxiliary electrode 328*d*, respectively, through the openings of the insulation layer 329. The bump pads 330*a*, 330*b*, and 330*c*, and the bump pad 330*d* may be formed in each pixel region. However, the inventive concepts are not limited thereto, and the bump pad 330*d* may be formed in some pixel regions or in only one pixel region.

Figure 65A:
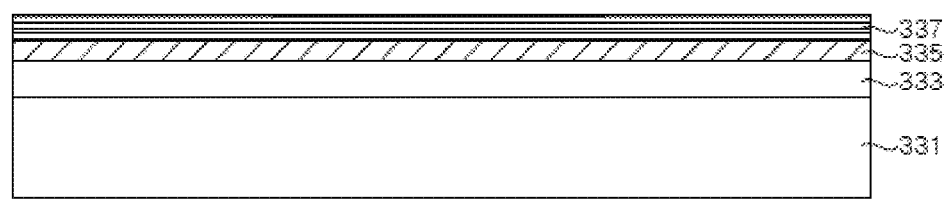

Referring to FIG. 65A, the second LED stack 333 is grown on a second substrate 331, and the second transparent electrode 335 and the first color filter 337 are formed on the second LED stack 333. The second LED stack 333 may be formed of gallium nitride based semiconductor layers, and includes a GaInN well layer. The second substrate 331 is a substrate on which a gallium nitride based semiconductor layer may be grown, and may be different from the first substrate 321. A composition ratio of GaInN may be determined so that the second LED stack 333 may emit green light, for example. Meanwhile, the second transparent electrode 335 is in ohmic contact with the p-type semiconductor layer.

Figure 65B:
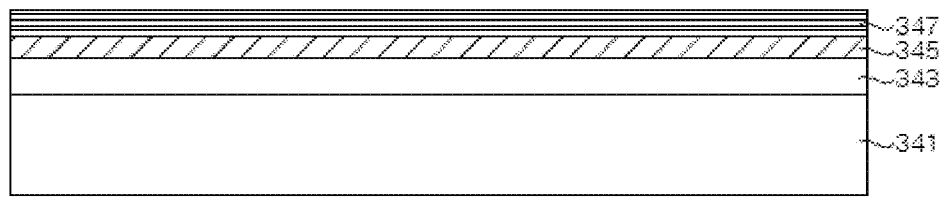

In addition, referring to FIG. 65B, the third LED stack 343 is grown on a third substrate 341, and the third transparent electrode 345 and the second color filter 347 are formed on the third LED stack 343. The third LED stack 343 may be formed of gallium nitride based semiconductor layers, and includes a GaInN well layer. The third substrate 341 is a substrate on which a gallium nitride based semiconductor layer may be grown, and may be different from the first substrate 321. A composition ratio of GaInN may be determined so that the third LED stack 343 may emit blue light, for example. Meanwhile, the third transparent electrode 345 is in ohmic contact with the p-type semiconductor layer.

The first color filter 337 and the second color filter 347 are substantially the same as those described with reference to FIGS. 59A and 59B, and thus, detailed descriptions thereof will be omitted in order to avoid redundancy.

Figure 66A:
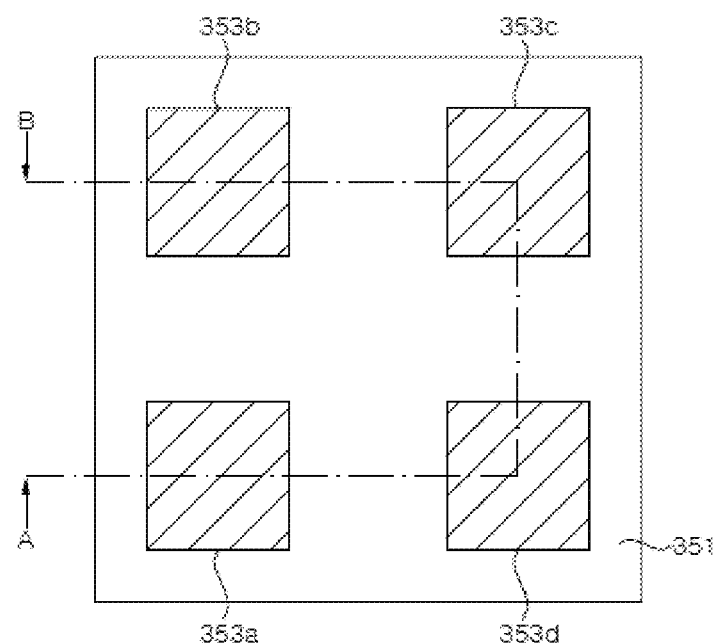
Figure 66B:
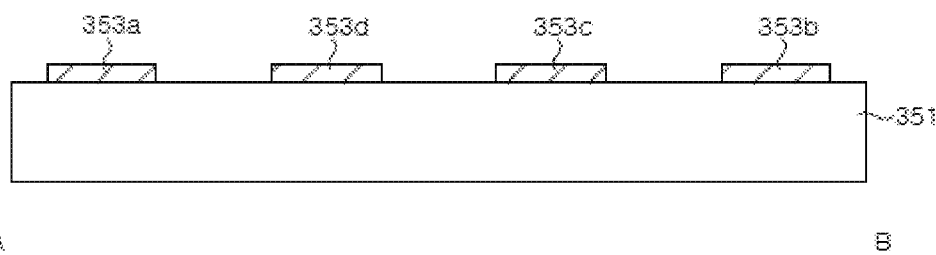

Referring to FIGS. 66A and 66B, the electrode pads 353*a*, 353*b*, 353*c*, and 353*d* are formed on the substrate 351. The substrate 351 may be an Si substrate in which thin film transistors are formed. The electrode pads 353*a*, 353*b*, 353*c*, and 353*d* may be distributed and disposed in four corner regions so as to correspond one pixel region. The electrode pad 353*d* may be formed in each pixel region. However, in some exemplary embodiments, the electrode pad 353*d* may be formed in only some pixel regions or be formed in only one pixel region.

The first LED stack 323, the second LED stack 333, the third LED stack 343, and the electrode pads 353*a*, 353*b*, 353*c*, and 353*d* are formed on different substrates, respectively, the order of forming the first LED stack 323, the second LED stack 333, the third LED stack 343, and the electrode pads 353*a*, 353*b*, 353*c*, and 353*d* is not particularly limited.

Figure 67A:
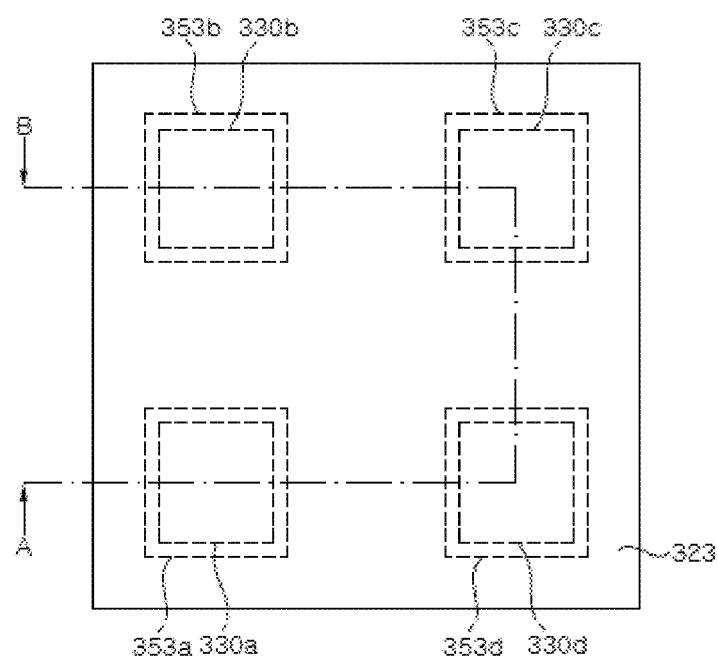
Figure 67B:
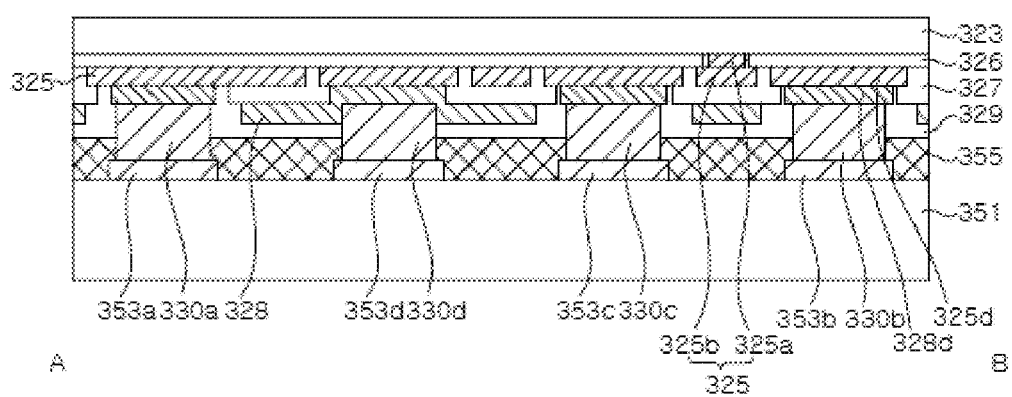

Referring to FIGS. 67A and 67B, the bump pads 330*a*, 330*b*, 330*c*, and 330*d* are bonded onto the substrate 351, such that the first LED stack 323 is coupled to the substrate 351. The underfill 355 may fill a space between the substrate 351 and the first LED stack 323. In some exemplary embodiments, an anisotropic conductive film (ACF) may be disposed between the bump pads 330*a*, 330*b*, 330*c*, and 330*d* and the substrate 351, instead of the underfill 355.

The first substrate 321 is removed from the first LED stack 323 by a chemical etching technology or the like. As such, the n-type semiconductor layer of the first LED stack 323 is exposed to the upper surface. A roughened surface may be formed on a surface of the exposed n-type semiconductor layer by surface texturing in order to improve light extraction efficiency.

Figure 68A:
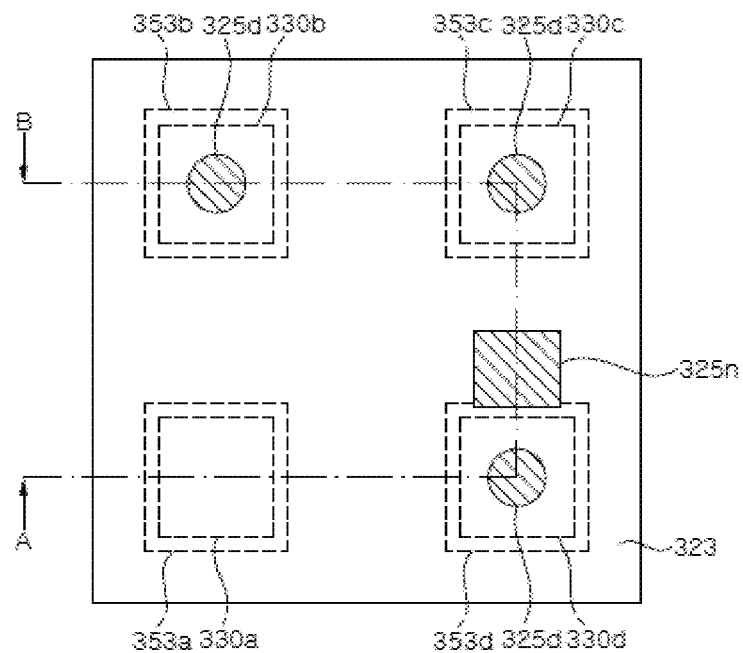
Figure 68B:
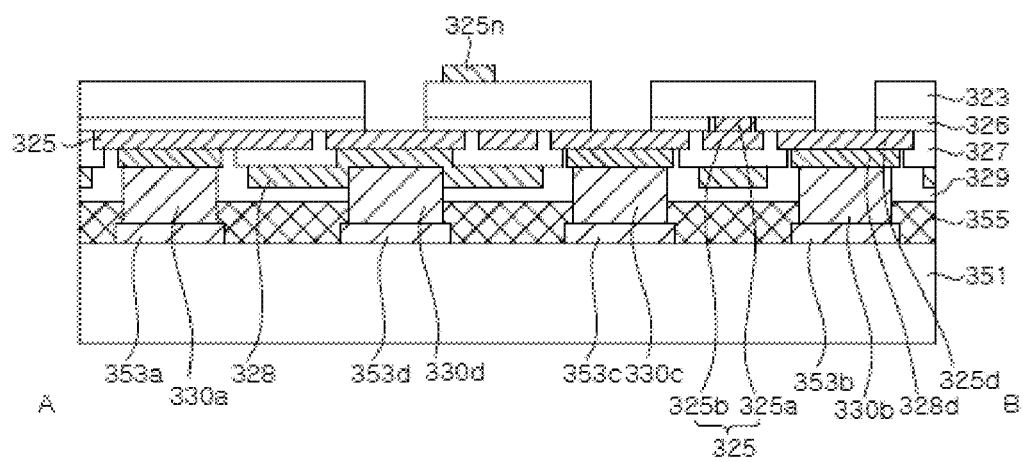

Referring to FIGS. 68A and 68B, the first ohmic electrode 325*n* may be formed on the exposed first LED stack 323. The first ohmic electrode 325*n* may be formed in each pixel region.

Then, the first LED stack 323 is patterned, such that openings exposing the first auxiliary electrodes 325*d* are formed. When the first LED stack 323 is patterned, the first LED stacks 323 may be separated from each other for each pixel region.

Figure 69A:
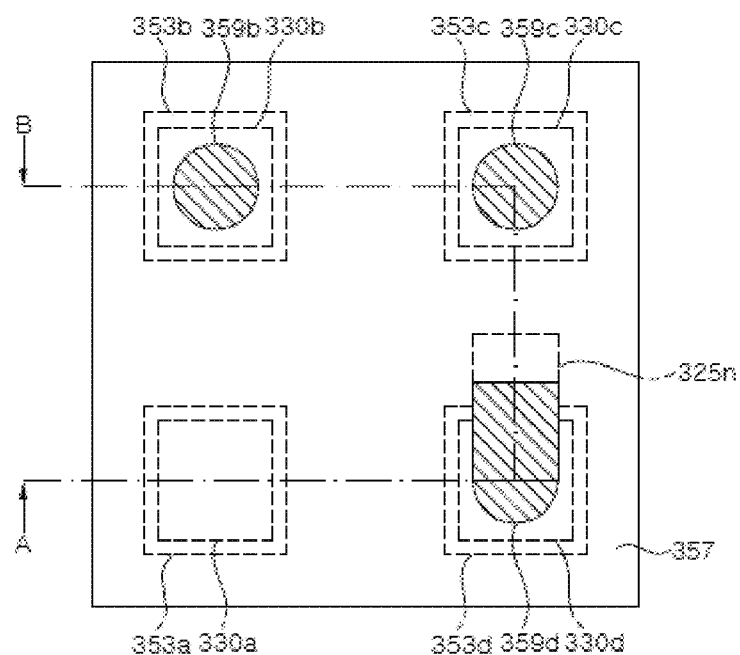
Figure 69B:
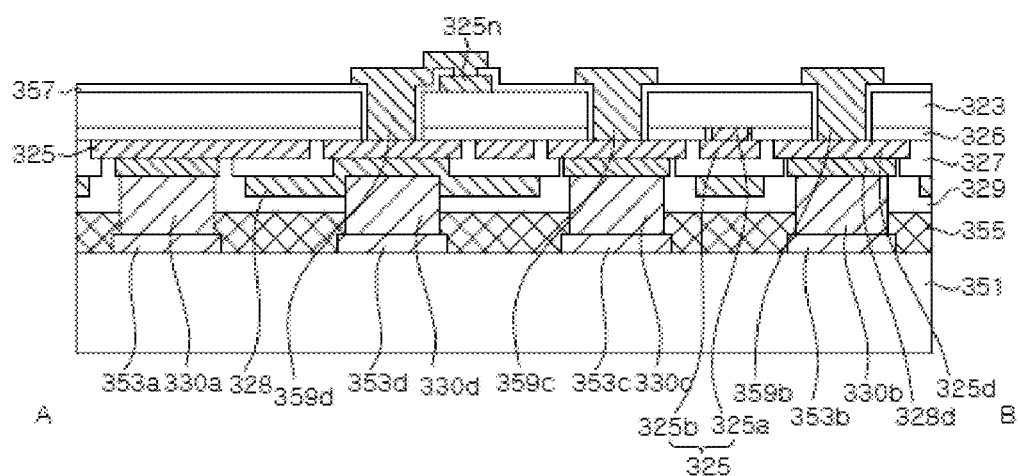

Referring to FIGS. 69A and 69B, the insulation layer 357 is formed to cover side surfaces of the first LED stack 323 in the openings. The insulation layer 357 may also at least partially cover the upper surface of the first LED stack 323. The insulation layer 357 is formed to expose the first auxiliary electrodes 325*d* and the first ohmic electrode 325*n*.

Then, the connectors 359*b*, 359*c*, and 359*d* each connected to the exposed first auxiliary electrodes 325*d* are formed. The 1-1-th connector 359*d* is connected to the first ohmic electrode 325*n*, and to the first auxiliary electrode 325*d* to which the ground layer 328 is connected. As such, the n-type semiconductor layer of the first LED stack 323 is electrically connected to the ground layer 328.

The 1-2-th connector 359*b* and the 1-3-th connector 359*c* are insulated from the first LED stack 323 by the insulation layer 357. The 1-2-th connector 359*b* is electrically connected to the electrode pad 353*b*, and the 1-3-th connector 359*c* is electrically connected to the electrode pad 353*c*.

Figure 70A:
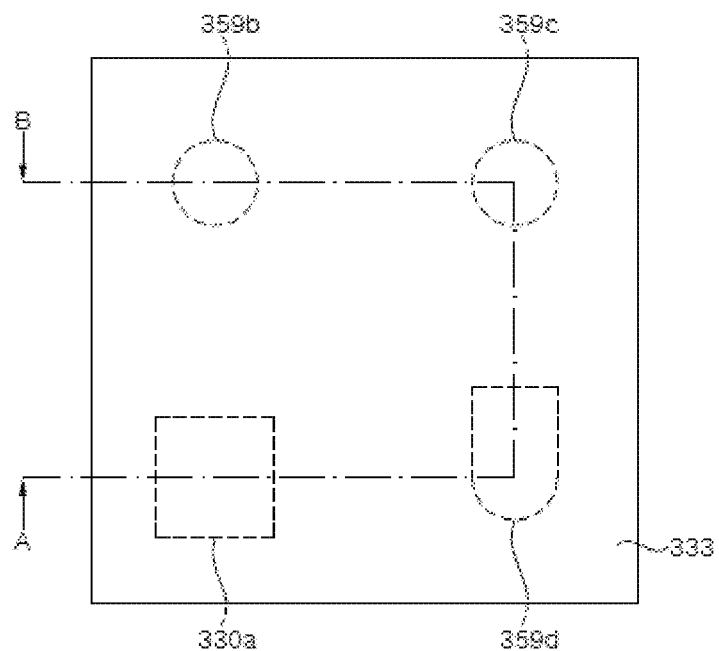
Figure 70B:
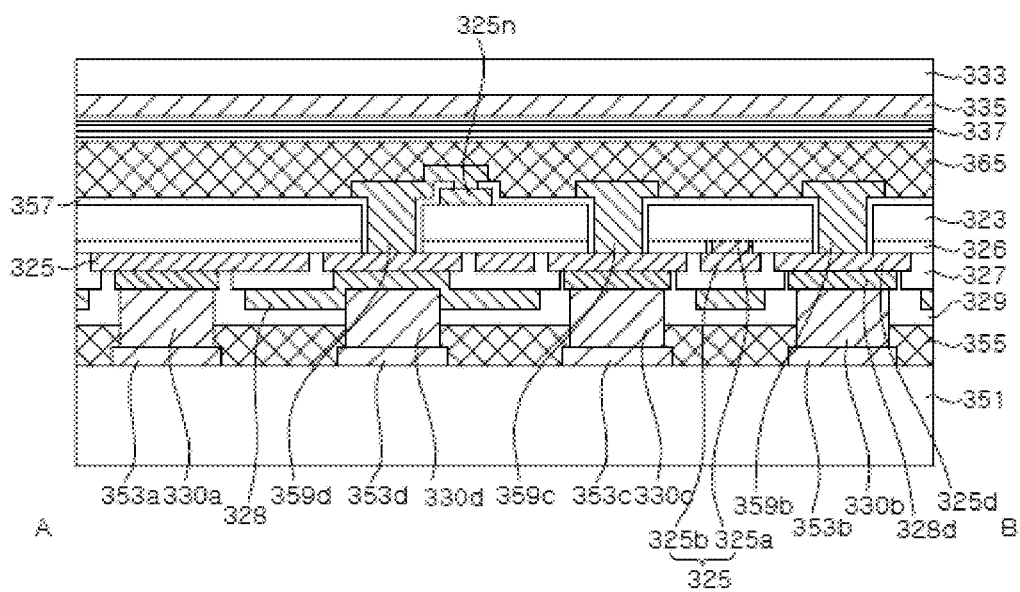

Referring to FIGS. 70A and 70B, the second LED stack 333 of FIG. 65A is coupled onto the first LED stack 323, in which the 1-1-th, 1-2-th, and 1-3-th connectors 359*d*, 359*b*, and 359*c* are formed, through the first bonding layer 365. The first color filter 337 is disposed to face the first LED stack 323 and is bonded to the first bonding layer 365. The first bonding layer 365 may be disposed in advance on the first LED stack 323, and the first color filter 337 may be disposed to face the first bonding layer 365 and be bonded to the first bonding layer 365. Alternatively, bonding material layers are formed on the first LED stack 323 and the first color filter 337, respectively, and are bonded to each other, such that the second LED stack 333 may be coupled to the first LED stack 323. Meanwhile, the second substrate 331 may be separated from the second LED stack 333 by a technique, such as a laser lift-off, a chemical lift-off, or others. As such, the n-type semiconductor layer of the second LED stack 333 is exposed. The exposed n-type semiconductor layer may be surface-textured by chemical etching or the like. However, in some exemplary embodiments, surface texturing for the second LED stack 333 may be omitted.

Figure 71A:
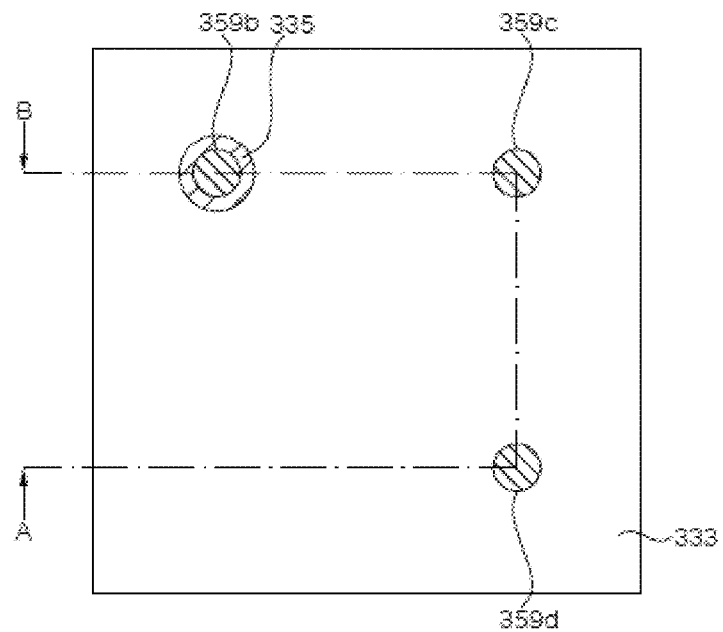
Figure 71B:
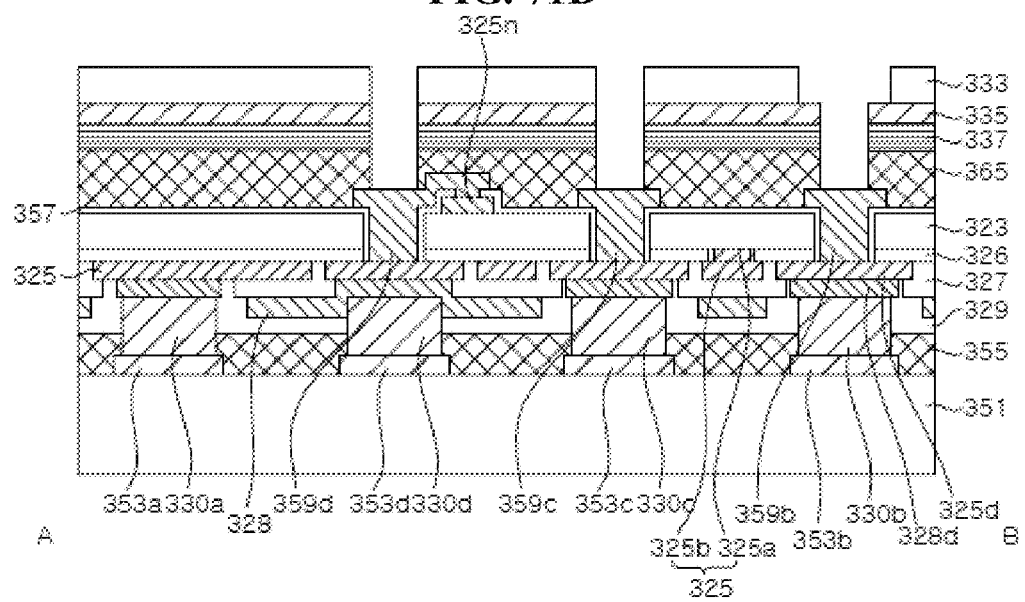

Referring to FIGS. 71A and 71B, the second LED stack 333 is patterned, such that the second transparent electrode 335 is exposed, the exposed second transparent electrode 335 is partially etched, and the first color filter 337 and the first bonding layer 365 are then etched, such that an opening exposing the 1-1-th connector 359d is formed. In addition, openings exposing the 1-2-th connector 359b and the 1-3-th connector 359c may be formed together by penetrating through the second LED stack 333, the second transparent electrode 335, the first color filter 337, and the first bonding layer 365. Furthermore, the second LED stacks 333 may be separated from each other for each pixel region.

Figure 72A:
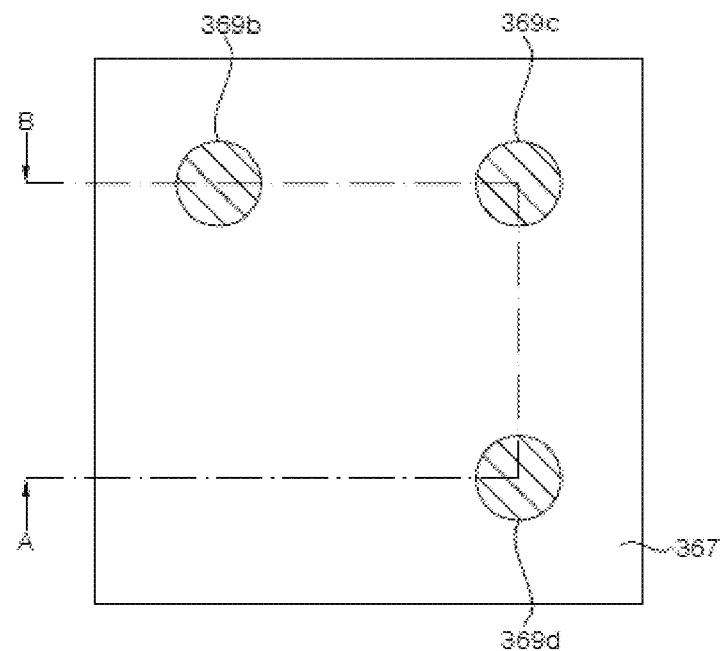
Figure 72B:
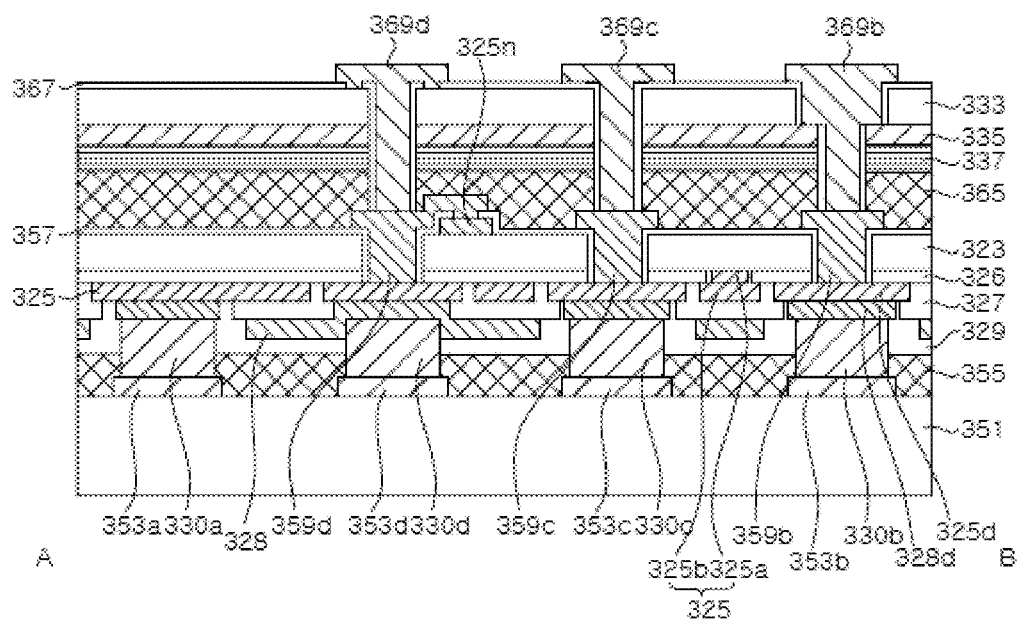

Referring to FIGS. 72A and 72B, the insulation layer 367 covering side surfaces of the exposed openings is formed. The insulation layer 367 may also cover the upper surface of the second LED stack 333. However, the insulation layer 367 exposes the second transparent electrode 335, and also exposes the 1-1-th connector 359d, the 1-2-th connector 359b, and the 1-3-th connector 359c. In addition, the insulation layer 367 partially exposes the upper surface of the second LED stack 333.

Then, the 2-1-th connector 369d, the 2-2-th connector 369b, and the 2-3-th connector 369c are formed in the openings. The 2-1-th connector 369d electrically connects the exposed upper surface of the second LED stack 333 to the 1-1-th connector 359d. As such, the n-type semiconductor layer of the second LED stack 333 is electrically connected to the ground layer 328. The 2-1-th connector 369d is insulated from the p-type semiconductor layer of the second LED stack 333 and the second transparent electrode layer 335 by the insulation layer 367.

The 2-2-th connector 369b electrically connects the second transparent electrode 335 and the 1-2-th connector 359b to each other, and is insulated from the upper surface of the second LED stack 333 by the insulation layer 367. The second transparent electrode 335 is electrically connected to the electrode pad 353b through the 2-2-th connector 369b, the 1-2-th connector 359b, the bump pad 330b, and the like. As such, the p-type semiconductor layer of the second LED stack 333 is electrically connected to the electrode pad 353b, and the n-type semiconductor layer of the second LED stack 333 is electrically connected to the electrode pad 353d.

The 2-3-th connector 369 is connected to the 1-3-th connector 359c, and is insulated from the second LED stack 333 and the second transparent electrode 335 by the insulation layer 367.

Figure 73A:
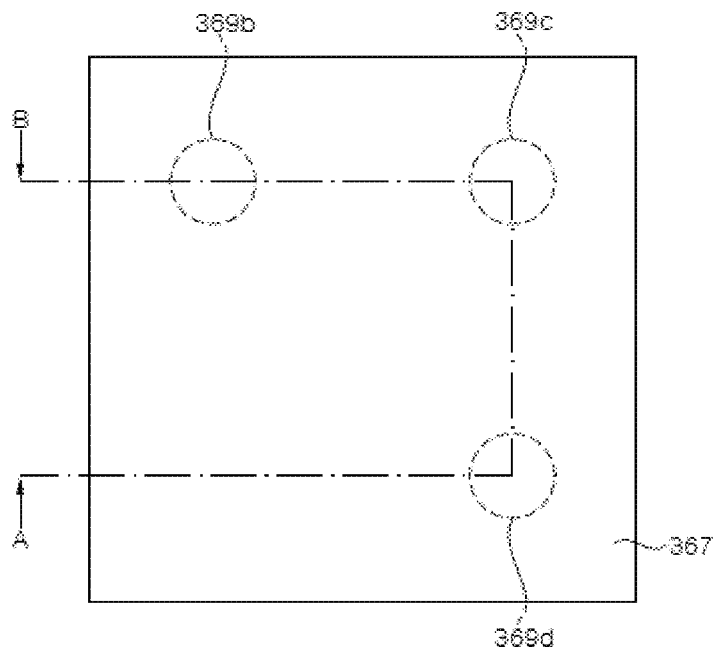
Figure 73B:
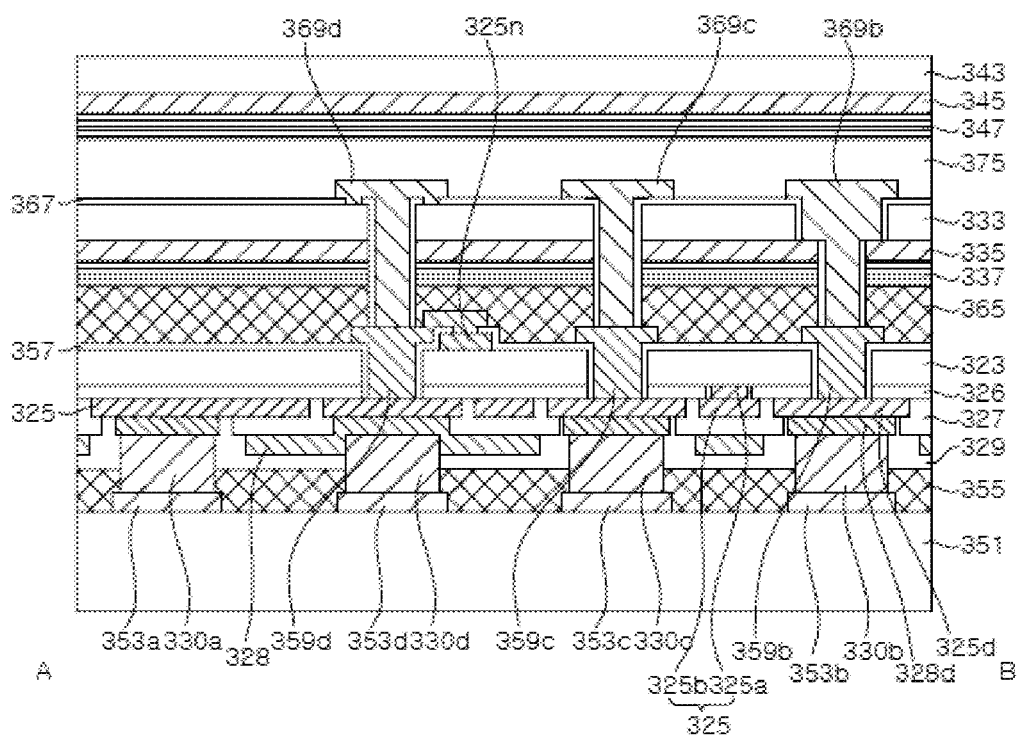

Referring to FIGS. 73A and 73B, the third LED stack 343 of FIG. 65B is coupled onto the second LED stack 333, in which the 2-1-th, 2-2-th, and 2-3-th connectors 369d, 369b, and 369c are formed, through the second bonding layer 375. The second color filter 347 may be disposed to face the second LED stack 333 and be bonded to the second bonding layer 375. The second bonding layer 375 may be disposed in advance on the second LED stack 333, and the second color filter 347 may be disposed to face the second bonding layer 375 and be bonded to the second bonding layer 375. Alternatively, bonding material layers are formed on the second LED stack 333 and the second color filter 347, respectively, and are bonded to each other, such that the third LED stack 343 may be bonded to the second LED stack 333. Meanwhile, the third substrate 341 may be separated from the third LED stack 343 by a technique such as a laser lift-off, a chemical lift-off, or others. As such, the n-type semiconductor layer of the third LED stack 343 is exposed. The exposed n-type semiconductor layer may be surface-textured by chemical etching or the like.

Figure 74A:
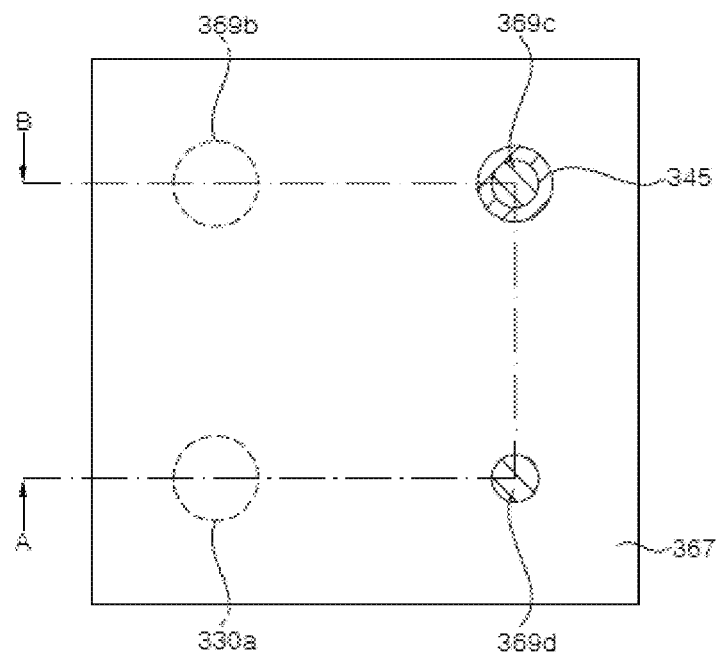
Figure 74B:
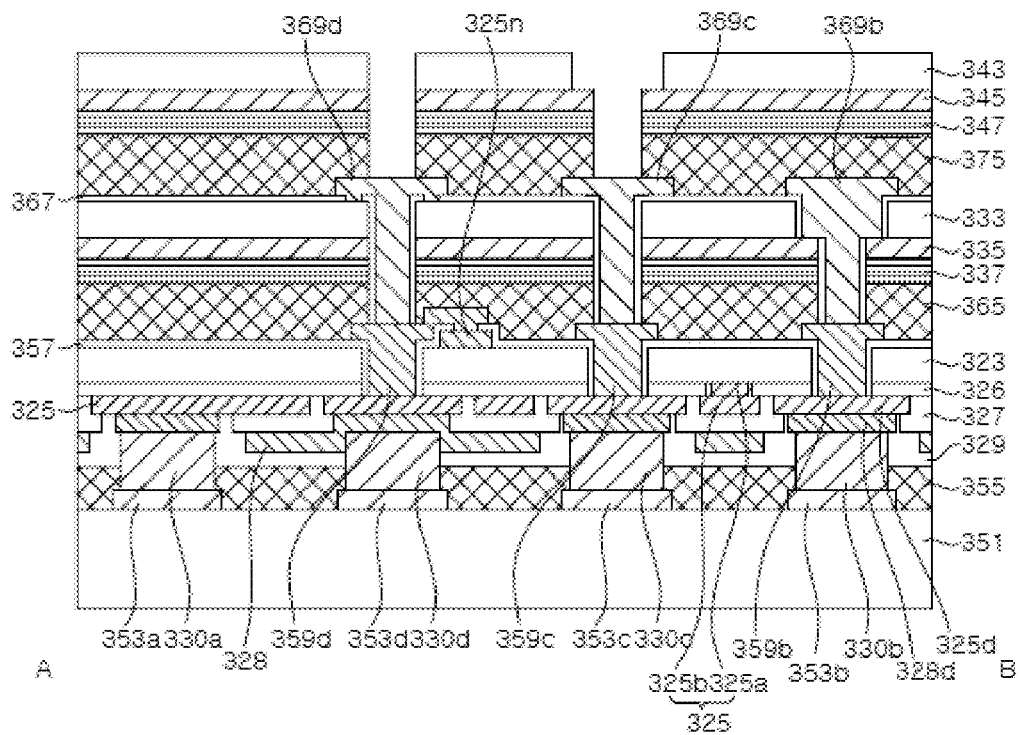

Referring to FIGS. 74A and 74B, the third LED stack 343 is patterned, such that the third transparent electrode 345 is exposed, the exposed third transparent electrode 345 is partially etched, and the second color filter 347 and the second bonding layer 375 are etched, such that an opening exposing the 2-1-th connector 369d is formed. In addition, an opening exposing the 2-3-th connector 369c is formed by penetrating through the third LED stack 343, the third transparent electrode 345, the second color filter 347, and the second bonding layer 375.

Figure 75A:
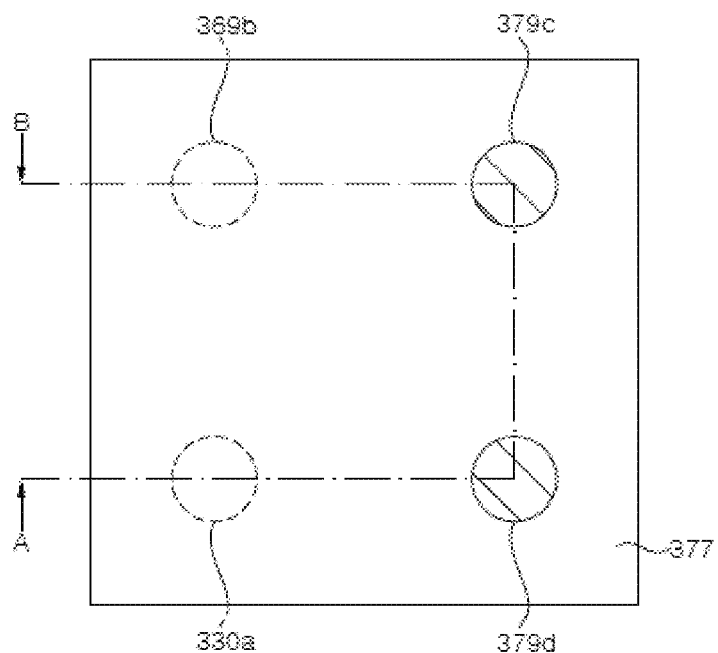
Figure 75B:
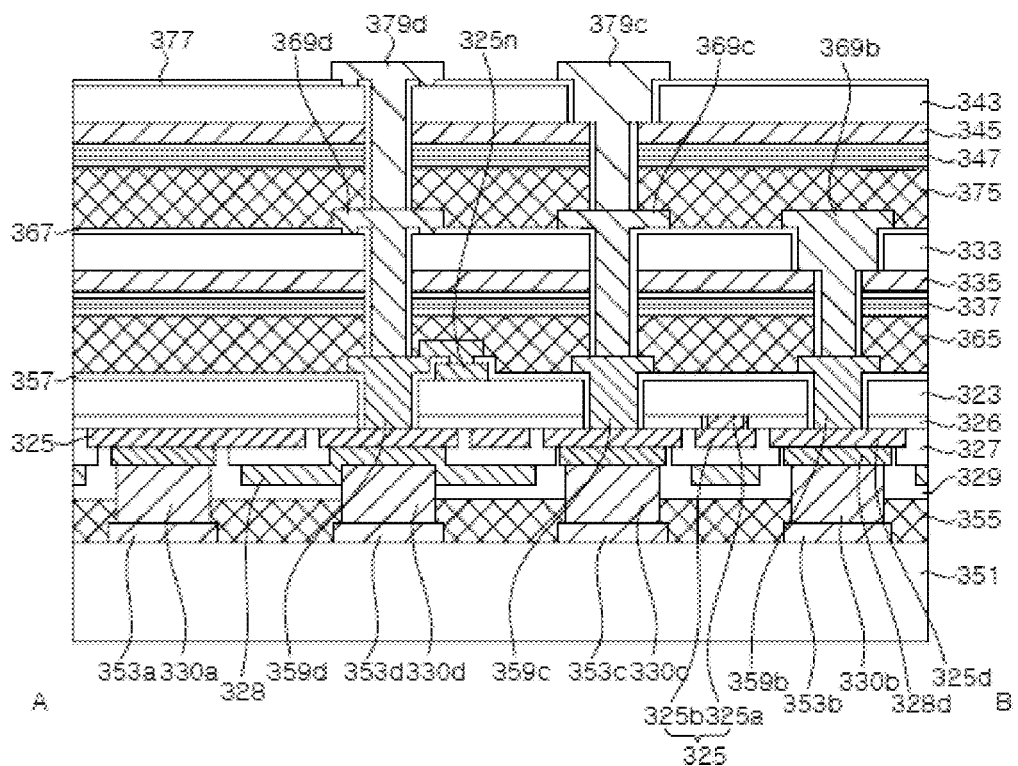

Referring to FIGS. 75A and 75B, the insulation layer 377 covering side surfaces of the exposed openings is formed. However, the insulation layer 377 exposes the third transparent electrode 345, and also exposes the 2-1-th connector 369d and the 2-3-th connector 369c. Furthermore, the insulation layer 377 may cover the upper surface of the LED stack 343, but partially expose the upper surface of the LED stack 343.

Then, the 3-1-th connector 379d and the 3-2-th connector 379c are formed in the openings. The 3-1-th connector 379d connects the upper surface, e.g., the n-type semiconductor layer of the third LED stack 343 to the 2-1-th connector 369d. As such, the n-type semiconductor layer of the third LED stack 343 is electrically connected to the ground layer 328.

The 3-2-th connector 379b electrically connects the third transparent electrode 345 and the 2-3-th connector 369c to each other, and is insulated from the upper surface of the third LED stack 343 by the insulation layer 377. The third transparent electrode 345 is electrically connected to the electrode pad 353c through the 3-2-th connector 379c, the 2-3-th connector 369c, the 1-3-th connector 359c, the bump pad 330c, and the like.

According to the illustrated exemplary embodiment, the cathodes of the first, second, and third LED stacks 323, 333, and 343 are electrically connected in common to the ground layer 328 and the electrode pad 353d, and the anodes of the first, second, and third LED stacks 323, 333, and 343 are independently connected to the electrode pads 353a, 353b, and 353c, respectively, is provided in a pixel.

Although FIGS. 61A to 75B show a method of manufacturing one unit pixel according to an exemplary embodiment, a plurality of unit pixels may be arranged in a matrix form on the substrate 351, and a display unit may be formed in substantially similar manner. The first, second, and third LED stacks 323, 333, and 343 are disposed to be separated from each other on the substrates 321, 331, and 341 so as to correspond the unit pixels. However, the ground layer 328 may be continuously disposed in a plurality of pixel regions. In this manner, since a plurality of pixels are formed at a wafer level, pixels having a small size may not need to be individually mounted.

Furthermore, a light reflecting layer or a light blocking material layer covering side surfaces of the pixels may be additionally formed to prevent optical interference between the pixels. For example, the light reflecting layer may include a distributed Bragg reflector (DBR) or an insulation layer formed of $SiO_2$, or the like, with a reflective metal layer or a highly reflective organic layer deposited thereon. For example, a black epoxy may be used as the light blocking layer, which may prevent optical interference between light emitting devices and increase a contrast of an image.

Figure 76A:
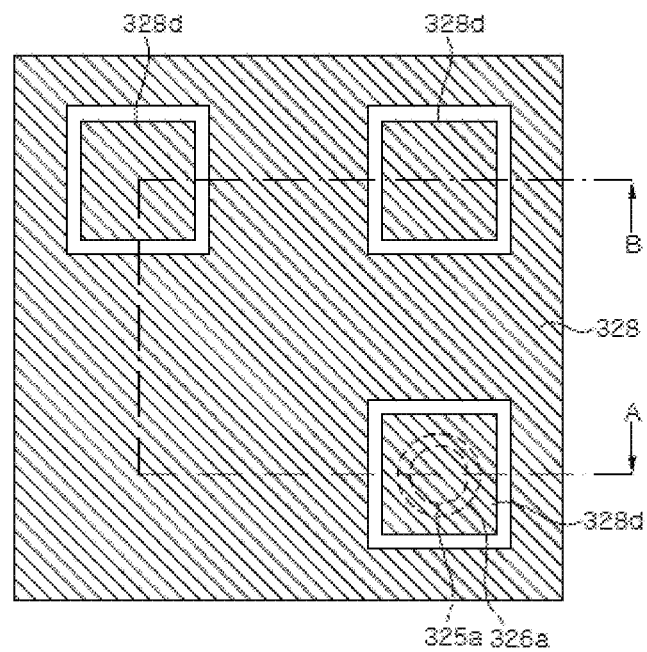
FIGS. 76A and 76B are a schematic plan view and cross-sectional view of a display apparatus according to another exemplary embodiment, respectively.
Figure 76B:
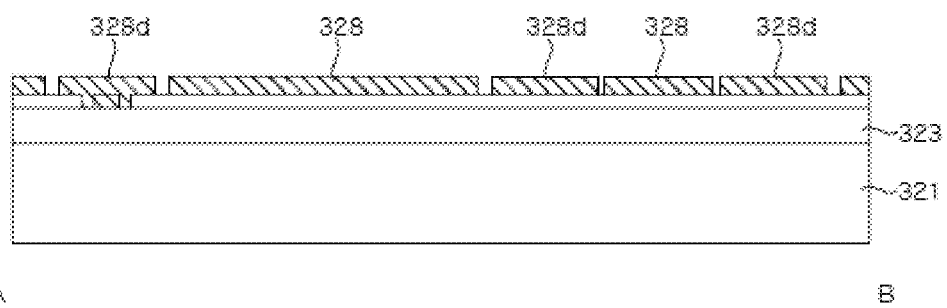

FIGS. 76A and 76B are, respectively, a schematic plan view and cross-sectional view of a display apparatus according to another exemplary embodiment.

Referring to FIGS. 76A and 76B, the display apparatus according to an exemplary embodiment is different from the display apparatus described above in that the reflective layer 325b, the first auxiliary electrodes 325d, and the insulation layer 327 are omitted, and the ground layer 328 and the second auxiliary electrodes 328d are formed on the ohmic contact layer 325a and the insulation layer 326.

The ground layer 328 and the second auxiliary electrodes 328d may be formed of substantially the same material as that of the reflective layer 325b. As such, the ground layer 328 and the second auxiliary electrodes 328d may serve as the reflective layer 325b. To this end, the ohmic contact layer 325a may be formed in only a region below one of the auxiliary electrodes 328d.

The insulation layer 329 and the bump pads 330a, 330b, 330c, and 330d are formed on the ground layer 328 and the second auxiliary electrodes 328d as described with reference to FIGS. 64A and 64B, and the subsequent processes may be performed in substantially the same manner described above. However, since the reflective layer 325b and the first auxiliary electrodes 325d are omitted, the 1-1-th connector 359d is directly connected to the ground layer 328, and the 1-2-th connector 359b and the 1-3-th connector 359c are connected to the second auxiliary electrodes 328d, respectively.

Figure 77A:
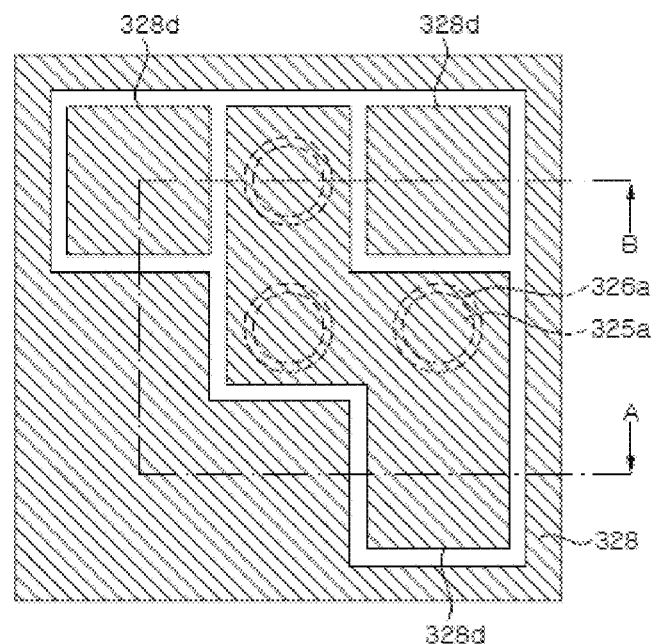
FIGS. 77A and 77B are a schematic plan view and cross-sectional view illustrating a display apparatus according to another exemplary embodiment, respectively.
Figure 77B:
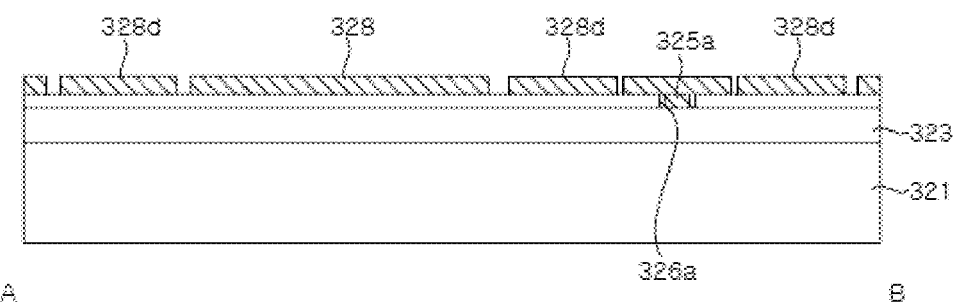

FIGS. 77A and 77B are, respectively, a schematic plan view and cross-sectional view of a display apparatus according to another exemplary embodiment.

Referring to FIGS. 77A and 77B, the display apparatus according to an exemplary embodiment is substantially the same as the display apparatus of FIGS. 76A and 76B in that the reflective layer 325b and the first auxiliary electrodes 325d are omitted. However, the display apparatus according to the illustrated exemplary embodiment is different in that ohmic contact layers 25a are disposed in a plurality of regions, and a shape of one of second auxiliary electrodes 328d is changed such that one of the second auxiliary electrodes 328d electrically connects the ohmic contact layers 25a to each other.

Figure 78:
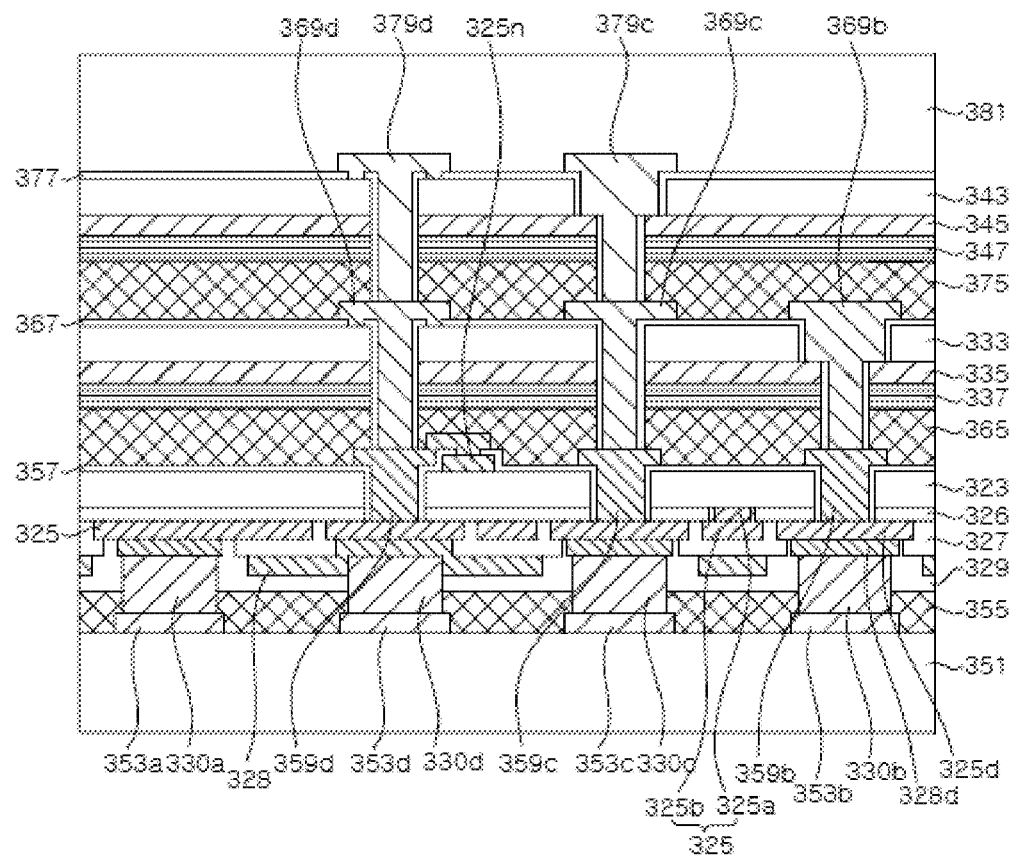
FIG. 78 is a schematic cross-sectional view of a display apparatus according to still another exemplary embodiment.

FIG. 78 is a schematic cross-sectional view of a display apparatus according to yet still another exemplary embodiment.

Referring to FIG. 78, the display apparatus according to an exemplary embodiment is substantially similar to the display apparatus described with reference to FIGS. 59A and 59B, except that it further includes a light guide layer 381 disposed above the third LED stack 343.

The light guide layer 381 may cover the third LED stack 343 and the insulation layer 377. The light guide layer 381 may guide light emitted through a surface of the third LED stack 343 to prevent optical interference between the pixels. The light guide layer 381 may include a material layer having a refractive index different from that of the third LED stack 343 and the insulation layer 377.

Figure 79:
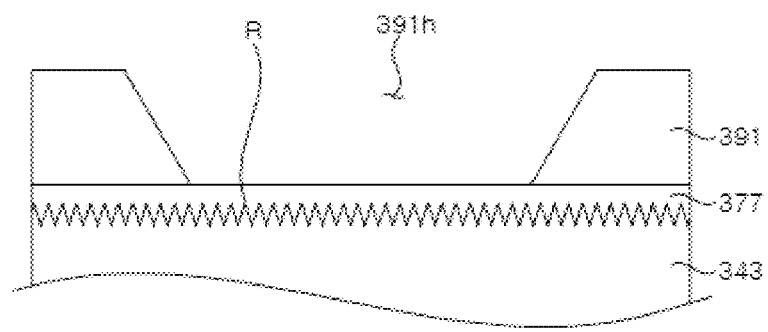
FIG. 79 is a schematic cross-sectional view illustrating a display apparatus according to yet still another exemplary embodiment.

FIG. 79 is a schematic cross-sectional view illustrating a display apparatus according to yet still another exemplary embodiment.

Referring to FIG. 79, the display apparatus according to an exemplary embodiment is substantially similar to the display apparatus described with reference to FIG. 78 except that the light guide layer 391 includes a light guide hole 391h to guide light. The light guide layer 391 may be formed of a light reflecting material or a light absorbing material. As such, the light guide layer 391 may reflect or absorb and block light traveling toward an adjacent pixel region to prevent optical interference between the pixels. Examples of the light reflecting material may include a light reflecting material such as a white photo sensitive solder resistor (PSR), and examples of the light absorbing material may include a black epoxy, or others. In addition, a roughened surface R is formed on the upper surface of the third LED stack 343.

FIGS. 80A, 80B, 80C, and 80D are schematic cross-sectional views of a display apparatus according to exemplary embodiments.

Figure 80A:
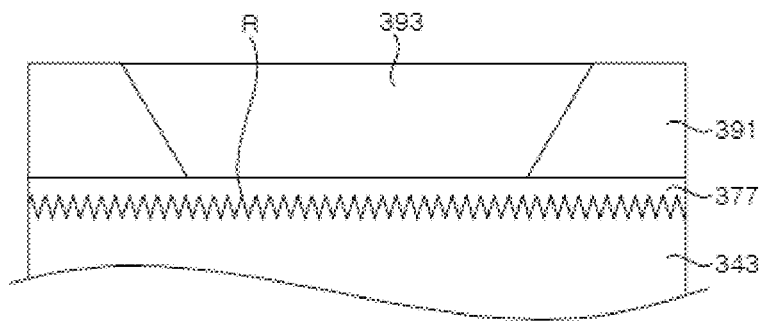
FIGS. 80A, 80B, 80C, and 80D are schematic cross-sectional views a display apparatus according to exemplary embodiments.

Referring to FIG. 80A, the display apparatus according to an exemplary embodiment is substantially similar to the display apparatus described with reference to FIG. 79 except that the hole 391h of the light guide layer 391 are filled with a transparent material 393. The transparent material 393 has a refractive index different from that of the light guide layer 391. As such, internal total reflection may occur on an interface between the transparent material 393 and the light guide layer 391, such that light emitted to the outside may be guided.

The hole is formed in the light guide layer 391, the light guide layer 391 is covered with the transparent material 393, and the transparent material 393 is flattened by chemical mechanical polishing until the light guide layer 391 is exposed, such that the hole of the light guide layer 391 may be filled with the transparent material 393.

Figure 80B:
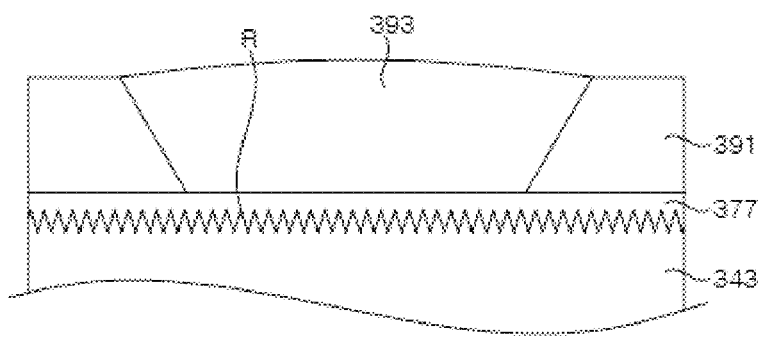
Figure 80C:
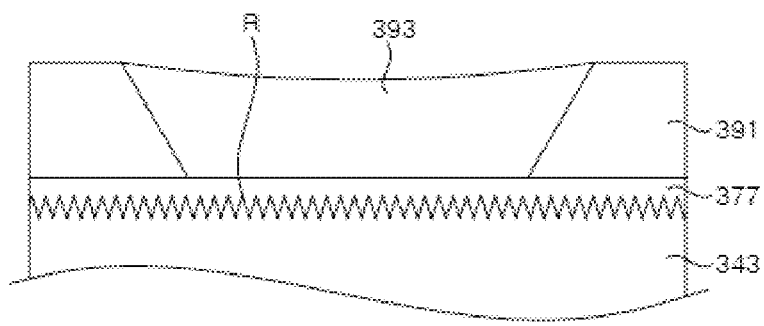

An upper surface of the transparent material 393 may be parallel to an upper surface of the light guide layer 391, but may have a convex surface that protrudes upwardly compared to the upper surface of the light guide layer 391 as shown in FIG. 80B, or may have a concave surface that is depressed downwardly compared to the upper surface of the light guide layer 391 as shown in FIG. 80C. When the upper surface of the transparent material 393 has a convex surface, light may be concentrated to improve illuminance, and when the upper surface of the transparent material 393 has a concave surface, a direction angle of light may be increased. A shape of the upper surface of the transparent material 393 may be adjusted through a polishing speed of a chemical mechanical polishing process, for example.

Figure 80D:
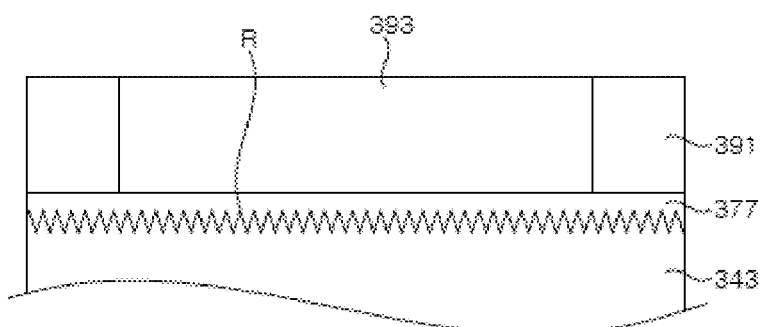

In addition, although inner walls of the hole of the light guide layer 391 are described as being inclined, in some exemplary embodiments, the inner walls of the hole of the light guide layer 391 may be various modified, such as being vertically formed, as illustrated in FIG. 80D.

Figure 81:
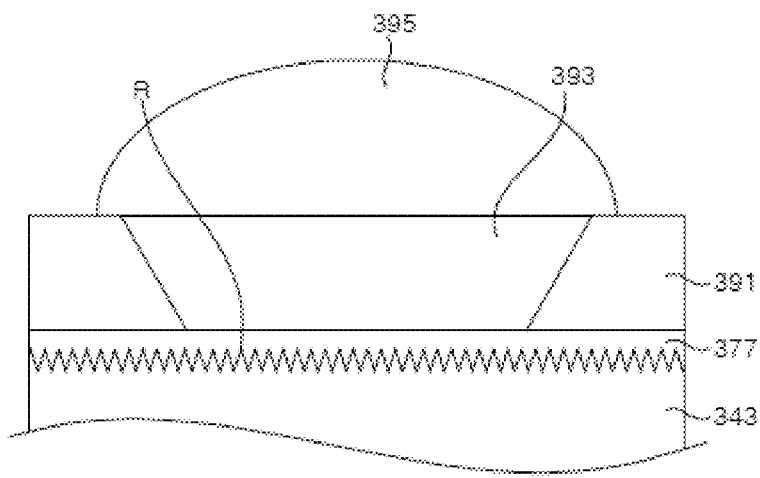
FIG. 81 is a schematic cross-sectional view of a display apparatus according to yet still another exemplary embodiment.

FIG. 81 is a schematic cross-sectional view of a display apparatus according to yet still another exemplary embodiment.

Referring to FIG. 81, the display apparatus according to an exemplary embodiment is substantially similar to the display apparatus described with reference to FIGS. 80A, 80B, 80C, and 80D except that it further includes a micro lens 395.

An upper surface the micro lens 395 may have a convex lens shape, but the inventive concepts are not limited thereto. The micro lens 395 is disposed on each pixel region, and narrows a viewing angle of emitted light to prevent optical interference between the pixels.

The micro lens 395 may be formed by a photolithograph process, and may be formed of, for example, polyimide, silicone, or others. A width of the micro lens 395 may be about 200 micrometers or less, more specifically, 100 micrometers or less.

Although certain exemplary embodiments and implementations have been described herein, other embodiments and modifications will be apparent from this description.

Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting stacked structure comprising:
a first epitaxial stack including a first n-type semiconductor layer, a first p-type semiconductor layer, and a first active layer disposed between the first n-type semiconductor layer and the first p-type semiconductor layer;
a second epitaxial stack disposed on the first epitaxial stack and including a second n-type semiconductor layer, a second p-type semiconductor layer, and a second active layer disposed between the second n-type semiconductor layer and the second p-type semiconductor layer;
a third epitaxial stack disposed on the second epitaxial stack and including a third n-type semiconductor layer, a third p-type semiconductor layer, and a third active layer disposed between the third n-type semiconductor layer and the third p-type semiconductor layer; and
a shared electrical path disposed between two adjacent epitaxial stacks facing each other,
wherein two semiconductor layers of the two adjacent epitaxial stacks with the shared electrical path therebetween each has a polarity, and
wherein the shared electrical path is disposed between the second epitaxial stack and the third epitaxial stack.

2. The light emitting stacked structure of claim 1, wherein the shared electrical path comprises a transparent conductive oxide.

3. The light emitting stacked structure of claim 2, wherein the transparent conductive oxide comprises SnO, InO$_2$, ZnO, ITO, or ITZO.

4. The light emitting stacked structure of claim 2, wherein the same polarity is p-type.

5. The light emitting stacked structure of claim 4, wherein the shared electrical path comprises p-type contact electrodes.

6. The light emitting stacked structure of claim 5, wherein the p-type contact electrodes have a thickness of about 2000 Å to about 2 μm.

7. The light emitting stacked structure of claim 2, wherein the same polarity is n-type and the shared electrical path comprises n-type contact electrodes.

8. The light emitting stacked structure of claim 1, further comprising an adhesive layer disposed between the first epitaxial stack and the second epitaxial stack.

9. The light emitting stacked structure of claim 8, wherein the adhesive layer comprises a transparent conductive oxide.

10. The light emitting stacked structure of claim 8, wherein the adhesive layer comprises at least one of:
an organic material including at least one of epoxy polymer, photoresist, parylene, PMMA, BCB, and SUB; and
an inorganic material including at least one of silicon oxide, aluminum oxide, and melting glass.

11. The light emitting stacked structure of claim 1, wherein the first epitaxial stack is configured to emit red light.

12. The light emitting stacked structure of claim 11, wherein the second and third epitaxial stacks are configured to emit green light and blue light, respectively.

13. The light emitting stacked structure of claim 1, further comprising a substrate under the first epitaxial stack.

14. The light emitting stacked structure of claim 13, further comprising an adhesive layer disposed between the first epitaxial stack and the substrate.

15. The light emitting stacked structure of claim 14, wherein the adhesive layer comprises a conductive material.

16. The light emitting stacked structure of claim 14, wherein the adhesive layer comprises an opaque material configured to absorb light.

* * * * *